US009915870B2

(12) United States Patent

Takizawa et al.

(10) Patent No.: US 9,915,870 B2

(45) Date of Patent: Mar. 13, 2018

(54) PATTERN FORMING METHOD, COMPOSITION KIT AND RESIST FILM, AND METHOD FOR PRODUCING ELECTRONIC DEVICE USING THEM, AND ELECTRONIC DEVICE

(71) Applicant: FUJIFILM Corporation, Tokyo (JP)

(72) Inventors: Hiroo Takizawa, Shizuoka (JP); Kaoru Iwato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/854,035

(22) Filed: Sep. 14, 2015

(65) Prior Publication Data

US 2016/0018734 A1 Jan. 21, 2016

Related U.S. Application Data

(63) Continuation of application No. PCT/JP2014/053376, filed on Feb. 13, 2014.

(30) Foreign Application Priority Data

Mar. 15, 2013 (JP) ................................ 2013-053055

(51) Int. Cl.

| | |
|---|---|
| ***G03F 7/004*** | (2006.01) |
| ***G03F 7/11*** | (2006.01) |
| ***C08F 212/14*** | (2006.01) |
| ***C08F 12/24*** | (2006.01) |
| ***C08F 12/30*** | (2006.01) |
| ***G03F 7/20*** | (2006.01) |
| ***G03F 7/32*** | (2006.01) |
| ***G03F 7/039*** | (2006.01) |
| *C08F 20/28* | (2006.01) |
| *C08F 12/20* | (2006.01) |

(52) U.S. Cl.

CPC ................ *G03F 7/11* (2013.01); *C08F 12/24* (2013.01); *C08F 12/30* (2013.01); *C08F 212/14* (2013.01); *G03F 7/0045* (2013.01); *G03F 7/0046* (2013.01); *G03F 7/0392* (2013.01); *G03F 7/0397* (2013.01); *G03F 7/2004* (2013.01); *G03F 7/2037* (2013.01); *G03F 7/32* (2013.01); *C08F 12/20* (2013.01); *C08F 20/28* (2013.01)

(58) Field of Classification Search

CPC .......... G03F 7/092; G03F 7/26; G03F 7/0392; G03F 7/11

USPC .............................. 430/273.1, 296, 326, 942

See application file for complete search history.

(56) References Cited

U.S. PATENT DOCUMENTS

| | | | | |
|---|---|---|---|---|
| 8,241,832 | B2 * | 8/2012 | Wang | C09J 133/02 430/270.1 |
| 2005/0014089 | A1 | 1/2005 | Lee et al. | |
| 2011/0305979 | A1 | 12/2011 | Harada et al. | |
| 2012/0264053 | A1 * | 10/2012 | Wang | G03F 7/0046 430/273.1 |
| 2012/0288796 | A1 | 11/2012 | Katayama et al. | |
| 2013/0029255 | A1 | 1/2013 | Inasaki et al. | |
| 2013/0143163 | A1 | 6/2013 | Hatakeyama | |
| 2013/0209940 | A1 | 8/2013 | Sakamoto et al. | |
| 2014/0099572 | A1 | 4/2014 | Inasaki et al. | |
| 2015/0140490 | A1 | 5/2015 | Wang et al. | |

FOREIGN PATENT DOCUMENTS

| | | |
|---|---|---|
| JP | 2005-037877 | 2/2005 |
| JP | 2006-308647 | 11/2006 |
| JP | 2007-108463 | 4/2007 |
| JP | 2008-065304 | 3/2008 |
| JP | 2009-128409 | 6/2009 |
| JP | 2009-134177 | 6/2009 |
| JP | 2010-160283 | 7/2010 |
| JP | 2011-257713 | 12/2011 |
| JP | 2013-020226 | 1/2013 |
| JP | 2013-047784 | 3/2013 |
| JP | 2013-140319 | 7/2013 |
| JP | 2013-254109 | 12/2013 |
| WO | 2012/053302 | 4/2012 |

OTHER PUBLICATIONS

"Written Opinion of the International Searching Authority of PCT/JP2014/053376", this report contains the following items: Form PCT/ISA237(cover sheet), PCT/ISA237(Box No. I), PCT/ISA237(Box No. V) and PCT/ISA237(Box No. VI), dated May 13, 2014, which is an English translation of "Written Opinion of the International Searching Authority", pp. 1-15.

"International Search Report (Form PCT/ISA/210)", dated May 13, 2014, with English translation thereof, pp. 1-7.

"Office Action of Japan Counterpart Application" with machine English translation, dated Apr. 12, 2016, p. 1-p. 16.

"Office Action of Korea Counterpart Application" with English translation thereof, dated Nov. 8, 2016, p. 1-p. 12.

"Office Action of Taiwan Counterpart Application" with partial English translation thereof, dated Jun. 14, 2017, p. 1-p. 8.

* cited by examiner

*Primary Examiner* — John S Chu

(74) *Attorney, Agent, or Firm* — JCIPRNET

(57) ABSTRACT

There is provided a pattern forming method comprising (a) a step of forming a film on a substrate using an electron beam-sensitive or extreme ultraviolet radiation-sensitive resin composition, (b) a step of forming a top coat layer on the film using a top coat composition containing a resin (T) containing at least any one of repeating units represented by formulae (I-1) to (I-5) shown below, (c) a step of exposing the film having the top coat layer using an electron beam or an extreme ultraviolet radiation, and (d) a step of developing the film having the top coat layer after the exposure to form a pattern.

18 Claims, No Drawings

PATTERN FORMING METHOD, COMPOSITION KIT AND RESIST FILM, AND METHOD FOR PRODUCING ELECTRONIC DEVICE USING THEM, AND ELECTRONIC DEVICE

CROSS REFERENCE TO RELATED APPLICATION

This is a continuation of International Application No. PCT/JP2014/053376 filed on Feb. 13, 2014, and claims priority from Japanese Patent Application No. 2013-053055 filed on Mar. 15, 2013, the entire disclosures of which are incorporated therein by reference.

TECHNICAL FIELD

The present invention relates to a pattern forming method, which is suitably used in an ultra-micro lithography process, for example, the production of VLSI and high capacity microchip, and other photo-fabrication processes, an electron beam-sensitive or extreme ultraviolet radiation-sensitive resin composition, a composition kit and a resist film, and a method for producing an electronic device using them, and an electronic device. More particularly, it relates to a pattern forming method, which is suitably used in microfabrication of semiconductor device using an electron beam or EUV light (wavelength: around 13 nm), a composition kit and a resist film, and a method for producing an electronic device using them, and an electronic device.

BACKGROUND ART

Heretofore, in processes for the production of semiconductor device, for example, IC or LSI, microfabrication has been conducted by means of lithography using a photoresist composition. In recent years, as the degree of integration in integrated circuits increases, it has been requested to form an ultrafine pattern in the submicron region or the quarter micron region. With such a trend, an exposure wavelength tends to become shorter, for instance, from g-line to i-line and further to a KrF excimer laser beam. Moreover, the development of lithography using an electron beam, an X ray or EUV light also proceeds at present in addition to the use of an excimer laser beam.

The lithography using an electron beam, an X ray or EUV light as the light source is positioned as the pattern formation technique of next generation or next-next generation, and a resist composition having high sensitivity and high resolution is demanded.

In particular, for reducing wafer processing time, increase in the sensitivity is a very important problem. However, when the increase in the sensitivity is tried to pursue, pattern profile, line width roughness (LWR) or resolution represented by limiting resolution line width is deteriorated, and development of a resist composition satisfying all of these properties at the same time is strongly demanded.

The high sensitivity is in a trade-off relationship with the high resolution, line width roughness (LWR) or good pattern profile, and it is important how to satisfy all of these properties at the same time.

On the other hand, for example, in Patent Document 1, from the standpoint of preventing the generation of outgas for avoiding exposure device contamination it is described to provide a top coat layer on a resist film.

Also, in Patent Document 2, it is described to suppress development defects by incorporating a resin having an acid group into a top coat layer.

Further, in recent years, the need for forming a fine pattern is drastically increased, and in response thereto, further performance improvements in high sensitivity, high resolution, line width roughness (LWR) and good pattern profile have been requested in the formation of fine pattern having a line width of 60 nm or less.

PRIOR ART DOCUMENT

Patent Document

Patent Document 1: JP-A-2010-160283

Patent Document 2: JP-A-2009-134177

DISCLOSURE OF THE INVENTION

Problems that the Invention is to Solve

An object of the present invention is to provide a pattern forming method excellent in sensitivity, resolution, LWR and pattern profile in the formation of fine pattern having a line width of 60 nm or less, a composition kit, a resist film using the same, a method for producing an electronic device, and an electronic device.

Means for Solving the Problems

Specifically, the present invention is as follows.

[1] A pattern forming method comprising:

(a) a step of forming a film on a substrate using an electron beam-sensitive or extreme ultraviolet radiation-sensitive resin composition, (b) a step of forming a top coat layer on the film using a top coat composition containing a resin (T) containing at least any one of repeating units represented by formulae (I-1) to (I-5) shown below, (c) a step of exposing the film having the top coat layer using an electron beam or an extreme ultraviolet radiation, and (d) a step of developing the film having the top coat layer after the exposure to form a pattern:

[Chem. 1]

Formula (I-1)

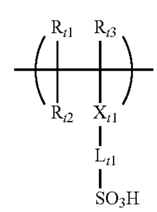

Formula (I-2)

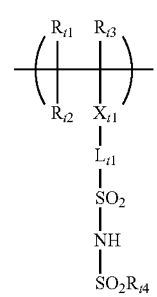

-continued

Formula (I-3)

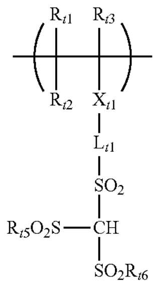

Formula (I-4)

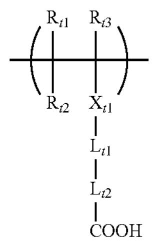

Formula (I-5)

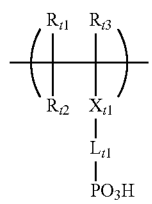

wherein in formulae (I-1) to (I-5) above, each of $R_{t1}$, $R_{t2}$ and $R_{t3}$ independently represents a hydrogen atom, an alkyl group, a cycloalkyl group, a halogen atom, a cyano group or an alkoxycarbonyl group, provided that $R_{t2}$ may be connected to $L_{t1}$ to form a ring, each $X_{t1}$ independently represents a single bond, —COO— or —CONH$R_{t7}$—, $X_{t7}$ represents a hydrogen atom or an alkyl group, each $L_{t1}$ independently represents a single bond, an alkylene group, an arylene group or a combination thereof, and may be intervened with —O— or —COO—, when $L_{t1}$ is connected to $L_{t2}$, $L_{t1}$ may be connected to $L_{t2}$ through —O—, each of $R_{t4}$, $R_{t5}$ and $R_{t6}$ independently represents an alkyl group or an aryl group, and $L_{t2}$ represents an alkylene group or arylene group having at least one electron withdrawing group.

[2] The pattern forming method as described in [1], wherein the resin (T) contains a repeating unit having an aromatic ring.

[3] The pattern forming method as described in [1] or [2], wherein the electron beam-sensitive or extreme ultraviolet radiation-sensitive resin composition contains (A) a resin capable of decomposing by an action of an acid to change dissolution rate in a developer.

[4] The pattern forming method as described in [3], wherein the electron beam-sensitive or extreme ultraviolet radiation-sensitive resin composition further contains (B) a compound capable of generating an acid by an electron beam or an extreme ultraviolet radiation, and the compound (B) is a compound capable of generating an acid having a size of 240 Å$^3$ or more.

[5] The pattern forming method as described in [3], wherein the resin (A) is a resin containing a repeating unit represented by formula (1) shown below and a repeating unit represented by formula (3) or (4) shown below:

[Chem. 2]

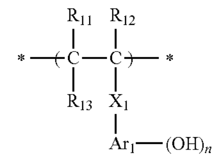

(1)

wherein in formula (1) above, each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may be connected to $Ar_1$ to form a ring and in this case $R_{13}$ represents an alkylene group, $X_1$ represents a single bond or a divalent connecting group, $Ar_1$ represents an (n+1) valent aromatic ring group, when $Ar_1$ is connected to $R_{13}$ to form a ring, $Ar_1$ represents an (n+2) valent aromatic ring group, and n represents an integer from 1 to 4:

[Chem. 3]

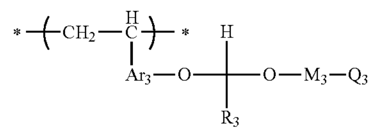

(3)

wherein in formula (3), $Ar_3$ represents an aromatic ring group, $R_3$ represents an alkyl group, a cycloalkyl group, an aryl group, an aralkyl group, an alkoxy group, an acyl group or a heterocyclic group, $M_3$ represents a single bond or a divalent connecting group, $Q_3$ represents an alkyl group, a cycloalkyl group, an aryl group or a heterocyclic group, at least two of $Q_3$, $M_3$ and $R_3$ may be connected to form a ring:

[Chem. 4]

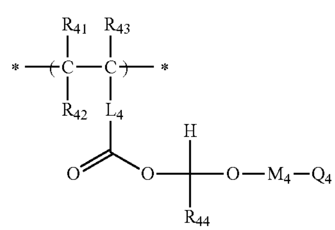

(4)

wherein in formula (4), each of $R_{41}$, $R_{42}$ and $R_{43}$ independently represents a hydrogen atom, an alkyl group, a cycloalkyl group, a halogen atom, a cyano group or an alkoxycarbonyl group, $R_{42}$ may be connected to $L_4$ to form a ring and in this case $R_{42}$ represents an alkylene group, $L_4$ represents a single bond or a divalent connecting group, when $L_4$ is connected to $R_{42}$ to form a ring, $L_4$ represents a trivalent connecting group, $R_{44}$ represents an alkyl group, a cycloalkyl group, an aryl group, an aralkyl group, an alkoxy group, an acyl group or a heterocyclic group, $M_4$ represents a single bond or a divalent connecting group, $Q_4$ represents an alkyl group, a cycloalkyl group, an aryl group or a heterocyclic group, at least two of $Q_4$, $M_4$ and $R_{44}$ may be connected to form a ring.

[6] The pattern forming method as described in [5], wherein the resin (A) is a resin containing a repeating unit represented by formula (1) shown above and a repeating unit represented by formula (3) shown above, and $R_3$ in formula (3) is a group having 2 or more carbon atoms.

[7] The pattern forming method as described in [6], wherein the resin (A) is a resin containing a repeating unit represented by formula (1) shown above and a repeating unit represented by formula (3) shown above, and $R_3$ in formula (3) is a group represented by formula (3-2) shown below:

[Chem. 5]

(3-2)

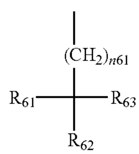

wherein in formula (3-2) above, each of $R_{61}$, $R_{62}$ and $R_{63}$ independently represents an alkyl group, an alkenyl group, a cycloalkyl group or an aryl group, n61 represents 0 or 1, at least two of $R_{61}$ to $R_{63}$ may be connected to each other to form a ring.

[8] The pattern forming method as described in any one of [1] to [7], wherein an optical image by the exposure is an optical image having a line portion having a line width of 60 nm or less or a hole portion having a hole diameter of 60 nm or less as an exposed area or an unexposed area.

[9] A composition kit containing a top coat composition for use in the pattern forming method as described in any one of [1] to [8] and an electron beam-sensitive or extreme ultra-violet radiation-sensitive resin composition.

[10] A resist film formed by using the composition kit as described in [9].

[11] A method for producing an electronic device containing the pattern forming method as described in any one of [1] to [8].

[12] An electronic device produced by the method for producing an electronic device as described in [11].

Further, the present invention preferably has the constitution described below.

(13) The pattern forming method as described in any one of (1) to (8) above, wherein the repeating unit which is contained in the resin (T) is a repeating unit represented by formula (I-1), (I-2), (I-3) or (I-5).

(14) The pattern forming method as described in any one of (1) to (8) and (13) above, wherein the resin (T) further contains a repeating unit (d) having a plurality of aromatic rings represented by formula (c1) shown below:

[Chem. 6]

(c1)

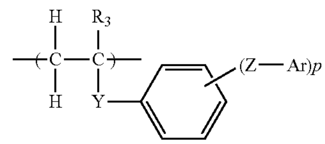

in formula (c1), $R_3$ represents a hydrogen atom, an alkyl group, a halogen atom, a cyano group or a nitro group, Y represents a single bond or a divalent connecting group, Z represents a single bond or a divalent connecting group, Ar represents an aromatic ring group, and p represents an integer of 1 or more.

Advantage of the Invention

According to the invention, a pattern forming method excellent in sensitivity, resolution, LWR and pattern profile in the formation of fine pattern having a line width of 60 nm or less, a composition kit, a resist film using the same, a method for producing an electronic device, and an electronic device can be provided.

MODE FOR CARRYING OUT THE INVENTION

With respect to the description of a group (atomic group) in the specification, the group, which is not particularly referred to whether it is substituted or not, encompasses both a group having no substituent and a group having a substituent. For instance, the description of an "alkyl group" encompasses not only an alkyl group having no substituent (an unsubstituted alkyl group) but also an alkyl group having a substituent (a substituted alkyl group).

In the specification, light encompasses not only an extreme ultraviolet radiation (EUV light) but also an electron beam.

Also, in the specification, unless otherwise noted, the "exposure" encompasses not only exposure with an extreme ultraviolet radiation (EUV light) but also lithography with an electron beam.

<Pattern Forming Method>

The pattern forming method according to the invention includes:

(a) a step of forming a film (resist film) on a substrate using an electron beam-sensitive or extreme ultraviolet radiation-sensitive resin composition, (b) a step of forming a top coat layer on the film using a top coat composition containing a resin (T) containing at least any one of repeating units represented by formulae (I-1) to (I-5) shown above, (c) a step of exposing the film having the top coat layer using an electron beam or an extreme ultraviolet radiation, and (d) a step of developing the film having the top coat layer after the exposure to form a pattern.

The reason why the sensitivity, resolution LWR and pattern profile are excellent in the formation of fine pattern having a line width of 60 nm or less according to the fine forming method of the invention is not necessarily clear, but it is estimated as follows.

It is estimated that by incorporating the resin containing a repeating unit satisfying any one of formulae (I-1) to (I-5) into the top coat layer, solubility in developer is increased, thereby improving the sensitivity.

Also, it is estimated that by incorporating the resin containing a repeating unit satisfying any one of formulae (I-1) to (I-5) into the top coat layer, since formation of T-top profile is suppressed and collapse of pattern or bridge is suppressed, the resolution and LWR are excellent and the pattern profile is rectangular. Further, it is estimated that by using a resin having a small surface active energy as the resin (A), a capillary force between the patterns is small, thereby suppressing the collapse of pattern.

The resist film is formed from the electron beam-sensitive or extreme ultraviolet radiation-sensitive resin composition described hereinafter and is preferably formed on a substrate.

As a method for coating the electron beam-sensitive or extreme ultraviolet radiation-sensitive resin composition on a substrate, a spin coating is preferred and the rotation number thereof is preferably from 1,000 to 3,000 rpm.

For instance, the electron beam-sensitive or extreme ultraviolet radiation-sensitive resin composition is coated on a substrate (for example, silicon/silicon dioxide coating) as used for the production of a precise integrated circuit device by an appropriate coating method, for example, a spinner or a coater, and dried to form a resist film. Also, it is possible to previously provide a known anti-reflection film. Further it is preferred to dry the resist film before the formation of top coat layer.

Then, on the resist film obtained, a top coat composition is coated in the same manner as in the formation of the resist film described above and, if desired, dried, so that the top coat layer can be formed.

The thickness of the resist film is preferably from 10 to 200 nm, more preferably from 10 to 100 nm, from the standpoint of increasing the resolution.

Such a thickness can be achieved by setting the solid content concentration of the composition to a suitable range to impart an appropriate viscosity, thereby improving the coating property and film-forming property.

The thickness of the top coat layer is preferably from 10 to 200 nm, more preferably from 20 to 100 nm, and particularly preferably from 30 to 80 nm.

The resist film having the top coat layer as the upper layer is irradiated with an electron beam (EB), an X-ray or EUV light, if desired, through a mask, preferably subjected to baking (heating) and then developed. Thus, good pattern can be obtained.

The substrate on which the film is formed in the invention is not particularly limited, and a substrate commonly used in the production process of semiconductor, for example, IC, in the production process of circuit board, for example, liquid crystal or thermal head, or lithography process of other photo-fabrication, for instance, an inorganic substrate, for example, silicon, SiN, $SiO_2$ or SiN or a coating-type inorganic substrate, for example, SOG can be used. Further, if desired, an organic anti-reflection film may be formed between the film and the substrate.

Prior to the formation of the resist film, an anti-reflection film may be previously provided on the substrate. As the anti-reflection film, any of an inorganic film type, for example, titanium, titanium dioxide, titanium nitride, chromium oxide, carbon or amorphous silicon, and an organic film type composed of a light-absorbing agent and a polymer material can be used. Also, as the organic anti-reflection film, commercially available organic anti-reflection film, for example, DUV 30 Series and DUV 40 Series produced by Brewer Science, Inc. or AR-2, AR-3 and AR-5 produced by Shipley Co., Ltd. can be used.

The pattern forming method according to the invention preferably includes after the exposure step (c), (e) a heating step.

It is also preferred to include after film formation and before the exposure step, a pre-heating step (PB; Prebake). Further, it is also preferred to include after the exposure step and before the development step, a post-exposure heating step (PEB; Post Exposure Bake).

The heating temperature in both PB and PEB is preferably from 70 to 120° C., and more preferably from 80 to 110° C.

The heating time is preferably from 30 to 300 seconds, more preferably from 30 to 180 seconds, and still more preferably from 30 to 90 seconds.

The heating can be performed by means which is equipped in a conventional exposure-development device, and may be performed by using a hot plate or the like.

The reaction after the exposure is accelerated by the baking so that the sensitivity and pattern profile are improved.

Further, it is also preferred to include after the rinse step, a heating step (Post Bake). By the baking, a developer and a rinsing solution remaining between the patterns and in the inside of the pattern are removed.

The pattern forming method according to the invention is suitable for the formation of fine pattern in which an optical image by the exposure in the step (c) is an optical image having a line portion having a line width of 60 nm or less or a hole portion having a hole diameter of 60 nm or less as an exposed area or an unexposed area. In particular, by using an extreme ultraviolet radiation (EUV light) or an electron beam (EB), formation of a fine pattern having a line width of 40 nm or less is possible, formation of a fine pattern having a line width of 30 nm or less is preferred, and formation of a fine pattern having a line width of 20 nm or less is more preferred.

The exposure in the step (c) is performed by an extreme ultraviolet radiation (EUV light) or an electron beam (EB). In the case where the extreme ultraviolet radiation (EUV light) is an exposure light source, it is preferred for the film formed to be irradiated with the EUV light (around 13 nm) through a predetermined mask. In the case of irradiation with the electron beam (EB), lithography (direct lithography) without a mask is preferred. The exposure is preferably performed by using the extreme ultraviolet radiation.

Also, the exposure in the step (c) may be immersion exposure.

The developer in the step (d) may be an alkali developer or a developer containing an organic solvent, and is preferably the alkali developer.

In the pattern forming method according to the invention, a step (organic solvent developing step) of developing using a developer containing an organic solvent and a step (alkali developing step) of developing using an aqueous alkali solution may be combined to use. In this manner, a finer pattern can be formed.

In the invention, a portion of weak exposure intensity is removed by the organic solvent developing step, and further, a portion of strong exposure intensity is also removed by performing the alkali developing step. By a multiple development process in which plural times of developments are conducted as above, pattern formation can be performed without dissolving only a region of an intermediate exposure intensity so that a finer pattern than usual can be formed (the same mechanism as in [0077] of JP-A-2008-292975).

In the pattern forming method, the order of the alkali developing step and the organic solvent developing step is not particularly limited, and it is preferred to perform the alkali developing step before the organic solvent developing step.

In the case where the pattern forming method according to the invention includes a step of developing using an alkali developer, as the alkali developer, for example, an aqueous alkaline solution of an inorganic alkali, for example, sodium hydroxide, potassium hydroxide, sodium carbonate, sodium silicate, sodium metasilicate or aqueous ammonia, a primary amine, for example, ethylamine or n-propylamine, a secondary amine, for example, diethylamine or di-n-butylamine, a tertiary amine, for example, triethylamine or methyldiethylamine, an alcohol amine, for example, dimethylethanolamine or triethanolamine, a quaternary ammonium salt, for example, tetramethylammonium hydroxide or tetraethylammonium hydroxide, or a cyclic amine, for example, pyrrole or piperidine can be used.

Further, the aqueous alkaline solution may also be used after adding thereto an alcohol or a surfactant in an appropriate amount.

The alkali concentration of the alkali developer is usually from 0.1 to 20% by mass.

The pH of the alkali developer is usually from 10.0 to 15.0.

In particular, a 2.38% by mass aqueous solution of tetramethylammonium hydroxide is preferred.

As a rinsing solution in the rinse treatment performed after the alkali development, pure water is used, and pure water may also be used after adding a surfactant in an appropriate amount.

Further, after the development processing or the rinse treatment, a treatment of removing the developer or the rinsing solution adhered on the pattern with a supercritical fluid can be performed.

In the case where the pattern forming method according to the invention includes a step of developing using a developer containing an organic solvent, in the developer (hereinafter, also referred to as organic developer) a polar solvent, for example, a ketone-based solvent, an ester-based solvent, an alcohol-based solvent, an amide-based solvent or an ether-based solvent or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol, for example, methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol or n-decanol, a glycol-based solvent, for example, ethylene glycol, diethylene glycol or triethylene glycol, and a glycol ether-based solvent, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

Examples of the ether-based solvent include, in addition to the glycol ether-based solvent described above, dioxane and tetrahydrofuran.

Examples of the amide-based solvent include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent, for example, toluene or xylene and an aliphatic hydrocarbon-based solvent, for example, pentane, hexane, octane or decane.

A plurality of the solvents described above may be mixed, or the solvent may be mixed with a solvent other than those described above or with water and used. However, in order to sufficiently achieve the effect of the invention, the water content in the entire developer is preferably less than 10% by mass, and it is more preferred to contain substantially no water.

More specifically, the amount of the organic solvent used relative to the organic developer is preferably from 90 to 100% by mass, more preferably from 95 to 100% by mass, based on the total amount of the developer.

In particular, the organic developer is preferably a developer containing at least one kind of organic solvent selected from the group consisting of the ketone-based solvent, ester-based solvent, alcohol-based solvent, amide-based solvent and ether-based solvent.

Also, the organic developer may contain a basic compound in an appropriate amount, if desired. Examples of the basic compound include those described in the section [5] Basic compound above.

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) can be applied.

<Top Coat Composition>

The top coat composition used in the formation of the top coat layer in the pattern forming method according to the invention will be described.

The top coat composition according to the invention contains a resin (T) containing at least any one of repeating units represented by formulae (I-1) to (I-5) shown below.

[Chem. 7]

Formula (I-1)

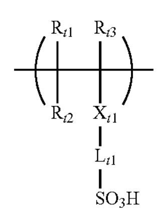

-continued

Formula (I-2)

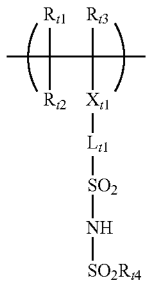

Formula (I-3)

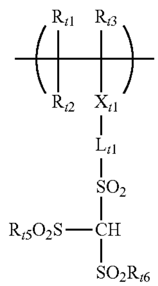

Formula (I-4)

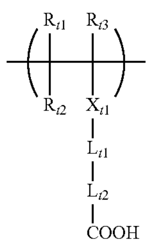

Formula (I-5)

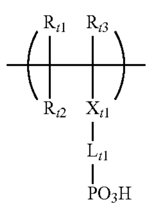

In formulae (I-1) to (I-5) above, each of $R_{t1}$, $R_{t2}$ and $R_{t3}$ independently represents a hydrogen atom, an alkyl group, a cycloalkyl group, a halogen atom, a cyano group or an alkoxycarbonyl group, provided that $R_{t2}$ may be connected to $L_{t1}$ to form a ring, each $X_{t1}$ independently represents a single bond, —COO— or —CONHR$_{t7}$—, $X_{t7}$ represents a hydrogen atom or an alkyl group, each $L_{t1}$ independently represents a single bond, an alkylene group, an arylene group or a combination thereof, and may be intervened with —O— or —COO—, and when $L_{t1}$ is connected to $L_{t2}$, $L_{t1}$ may be connected to $L_{t2}$ through —O—, each of $R_{t4}$, $R_{t5}$ and $R_{t6}$ independently represents an alkyl group or an aryl group, and $L_{t2}$ represents an alkylene group or arylene group having at least one electron withdrawing group.

The alkyl group represented by any of $R_{t1}$ to $R_{t3}$ may have a substituent, includes an alkyl group having 20 or less carbon atoms, for example, a methyl group, an ethyl group, a propyl group, an isopropyl group, an n-butyl group, a sec-butyl group, a hexyl group, a 2-ethylhexyl group, an octyl group or a dodecyl group, and is preferably an alkyl group having 8 or less carbon atoms.

The alkyl group contained in the alkoxycarbonyl group is preferably the same as the alkyl group represented by any of $R_{t1}$ to $R_{t3}$.

The cycloalkyl group may be a monocyclic type or a polycyclic type, and is preferably a monocyclic type cycloalkyl group having from 3 to 10 carbon atoms which may have a substituent, for example, a cyclopropyl group, a cyclopentyl group or a cyclohexyl group.

The halogen atom includes a fluorine atom, a chlorine atom, a bromine atom and an iodine atom, and is preferably a fluorine atom.

Each of $R_{t1}$ and $R_{t2}$ is preferably a hydrogen atom, and $R_{t3}$ is preferably a hydrogen atom or a methyl group.

The alkyl group represented by $R_{t7}$ includes the same as the alkyl group represented by any of $R_{t1}$ to $R_{t3}$.

$X_{t1}$ is preferably a single bond or —COO—.

Each $L_{a}$ independently represents a single bond, an alkylene group, an arylene group or a combination thereof, and may be intervened with —O— or —COO—, and when $L_{t1}$ is connected to $L_{t2}$, $L_{t1}$ may be connected to $L_{t2}$ through —O—.

The alkylene group as to $L_{t1}$ may be straight-chain or branched, may have a substituent, is preferably an alkylene group having from 1 to 8 carbon atoms, and includes, for example, a methylene group, an ethylene group, a propylene group, a butylene group, a hexylene group and an octylene group.

The arylene group as to $L_{t1}$ may have a substituent, is preferably a 1,4-phenylene group, a 1,3-phenylene group, a 1,2-phenylene group or a 1,4-naphthylene group, and is more preferably a 1,4-phenylene group.

When $X_{t1}$ is a single bond, $L_{t1}$ is preferably a group containing an arylene group, more preferably an arylene group, from the standpoint of removing the out-of-band light from the EUV light (so-called EUV out-of-band light filter).

When $X_{t1}$ is —COO—, $L_{t1}$ is preferably a group containing an alkylene group.

The alkyl group as to any of $R_{t4}$, $R_{t5}$ and $R_{t6}$ may have a substituent, and is preferably the same as the alkyl group represented by any of $R_{t1}$ to $R_{t3}$.

The aryl group as to any of $R_{t4}$, $R_{t5}$ and $R_{t6}$ is preferably an aryl group having from 6 to 20 carbon atoms, may be monocyclic or polycyclic, and may have a substituent. The aryl group includes, for example, a phenyl group, a 1-naphthyl group, a 2-naphthyl group, a 4-methylphenyl group and a 4-methoxyphenyl group.

Preferred substituents in the groups described above include, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The number of carbon atoms in the substituent is preferably 8 or less, and a fluorine atom is more preferred.

The an alkylene group having at least one electron withdrawing group as to $L_{t2}$ is preferably an alkylene group having from 1 to 8 carbon atoms and at least one electron withdrawing group, and includes, for example, a methylene group, an ethylene group, a propylene group, a butylene group, a hexylene group and an octylene group each having at least one electron withdrawing group.

The an arylene group having at least one electron withdrawing group as to $L_{t2}$ is preferably a 1,4-phenylene group, a 1,3-phenylene group, a 1,2-phenylene group and a 1,4-naphthylene group each having at least one electron withdrawing group, and is more preferably a 1,4-phenylene group having at least one electron withdrawing group.

The electron withdrawing group is preferably a halogen atom, a cyano group, a nitro group, a heterocyclic group, an alkoxycarbonyl group, a carboxyl group, an acyl group, an alkylsulfonyl group, an arylsulfonyl group, a sulfamoyl group or a sulfonic acid group, preferably a fluorine atom, a chlorine atom, a cyano group, an alkoxycarbonyl group, a carboxyl group, an acyl group, an alkylsulfonyl group or an arylsulfonyl group, and most preferably a fluorine atom.

Of the repeating units represented by formulae (I-1) to (I-5), the repeating unit represented by formula (I-1), (I-2), (I-3) or (I-5) is preferred, the repeating unit represented by formula (I-1), (I-2) or (I-3) is more preferred, and the repeating unit represented by formula (I-1) or (I-2) is still more preferred.

The resin (T) contained in the top coat composition according to the invention can contain various repeating units in addition to the repeating unit described above for the purpose of adjusting (1) solubility in a coating solvent, (2) film-forming property (glass transition temperature), (3) developing property (particularly, alkali-developing property) and the like.

Such a repeating structural unit includes a repeating unit derived from the monomer described below.

The monomer includes, for example, a compound having one addition polymerizable unsaturated bond selected from (meth) acrylic acid, a (meth) acrylic acid ester, a vinyl ester (for example, vinyl acetate), a styrene (for example, styrene or p-hydroxystyrene), vinylpyrrolidone, a (meth) acrylamide, an allyl compound, a vinyl ether and a crotonic acid ester, but the monomer should not be construed as being limited thereto.

In addition, an addition polymerizable unsaturated compound capable of copolymerizing with the monomer corresponding to the various repeating units described above may be copolymerized.

According to the invention, the resin (T) preferably contains a repeating unit having an aromatic ring from the standpoint of functioning as a filter for out-of-band light.

From this standpoint, as described above, $L_{t1}$ in formulae (I-1) to (I-5) described above is preferably a group containing an arylene group, and more preferably an arylene group. It is also preferred that the resin (T) contains a repeating unit having an aromatic ring in addition to the repeating units represented by formulae (I-1) to (I-5) described above. The repeating unit having an aromatic ring includes a repeating unit derived from a monomer, for example, styrene, p-hydroxystyrene, phenyl acrylate and phenyl methacrylate. Among them, it is preferred to further contain a repeating unit (d) having a plurality of aromatic rings represented by formula (c1) shown below.

[Chem. 8]

(c1)

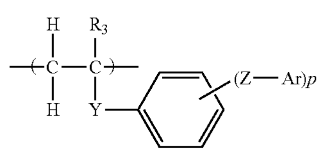

In formula (c1), $R_3$ represents a hydrogen atom, an alkyl group, a halogen atom, a cyano group or a nitro group, Y represents a single bond or a divalent connecting group, Z represents a single bond or a divalent connecting group, Ar represents an aromatic ring group, and p represents an integer of 1 or more.

The alkyl group as to $R_3$ may be any of straight-chain or branched-chain, and includes, for example, a methyl group, an ethyl group, a n-propyl group, an isopropyl group, a n-butyl group, a sec-butyl group, a tert-butyl group, a n-pentyl group, a n-hexyl group, a n-heptyl group, a n-octyl group, a n-nonyl group, n-decanyl group and isobutyl group. The alkyl group may have a substituent, and a preferred substituent includes, for example, an alkoxy group, a hydroxyl group, a halogen atom and a nitro group. Among them, the alkyl group having a substituent preferably includes a $CF_3$ group, an alkyloxycarbonylmethyl group, an alkylcarbonyloxymethyl group, a hydroxymethyl group and an alkoxymethyl group.

The halogen atom as to $R_3$ includes a fluorine atom, a chlorine atom, a bromine atom and an iodine atom, and is particularly preferably a fluorine atom.

Y represents a single bond or a divalent connecting group, and the divalent connecting group includes, for example, an ether group (oxygen atom), a thioether group (sulfur atom), an alkylene group, an arylene group, a carbonyl group, a sulfido group, a sulfone group, —COO—, —CONH—, $—SO_2NH—$, $—CF_2—$, $—CF_2CF_2—$, $—OCF_2O—$, $—CF_2OCF_2—$, —SS—, $—CH_2SO_2CH_2—$, $—CH_2COCH_2—$, $—COCF_2CO—$, —COCO—, —OCOO—, $—OSO_2O—$, an amino group (nitrogen atom), an acyl group, an alkylsulfonyl group, —CH=CH—, —C≡C—, an aminocarbonylamino group, a aminosulfonylamino group, and a group composed of a combination of these groups. Y has preferably 15 or less carbon atoms, more preferably 10 or less carbon atoms.

Y is preferably a single bond, a —COO— group, a —COS— group or a —CONH— group, more preferably a —COO— group or a —CONH— group, and particularly preferably a —COO— group.

Z represents a single bond or a divalent connecting group, and the divalent connecting group includes, for example, an ether group (oxygen atom), a thioether group (sulfur atom), an alkylene group, an arylene group, a carbonyl group, a sulfido group, a sulfone group, —COO—, —CONH—, $—SO_2NH—$, an amino group (nitrogen atom), an acyl group, an alkylsulfonyl group, —CH=CH—, an aminocarbonylamino group, a aminosulfonylamino group, and a group formed by combination of these groups.

Z is preferably a single bond, an ether group, a carbonyl group or —COO—, more preferably a single bond or an ether group, and particularly preferably a single bond.

Ar represents an aromatic ring group, specifically includes, for example, a phenyl group, a naphthyl group, an anthracenyl group, a phenanthrenyl group, a quinolinyl group, a furanyl group, a thiophenyl group, a fluorenyl-9-on-yl group, an anthraquinonyl group, a phenanthraquinonyl group and a pyrrole group, and is preferably a phenyl group. The aromatic ring group may have a substituent, and a preferred substituent includes, for example, an alkyl group, an alkoxy group, a hydroxyl group, a halogen atom, a nitro group, an acyl group, an acyloxy group, an acylamino group, a sulfonylamino group, an aryl group, for example, a phenyl group, an aryloxy group, an arylcarbonyl group and a heterocyclic residue. Among them, a phenyl group is preferred from the standpoint of suppressing the deterioration of exposure latitude and pattern profile resulting from the out-of-band light.

p is an integer of 1 or more, and is preferably an integer from 1 to 3.

The repeating unit (d) is more preferably a repeating unit represented by formula (c2) shown below.

[Chem. 9]

(c2)

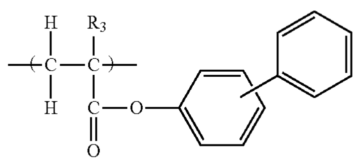

In formula (c2), $R_3$ represents a hydrogen atom or an alkyl group. Preferred examples of the alkyl group represented by $R_3$ are same as those in formula (c1).

Here, with respect to the extreme ultraviolet radiation (EUV light) exposure, leakage light (out-of-band light) occurred in the ultraviolet region having a wavelength from 100 to 400 nm deteriorates the surface roughness and as a result, the resolution and LWR performance tend to be decreased due to bridge between patterns or disconnection of pattern.

However, the aromatic ring in repeating unit (d) functions as an internal filter capable of absorbing the out-of-band light described above.

Specific examples of the repeating unit (d) are set forth below, but the invention should not be construed as being limited thereto.

[Chem. 10]

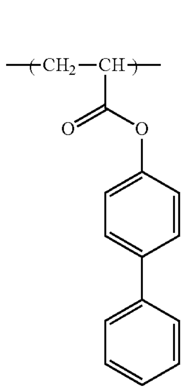

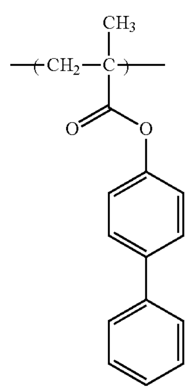

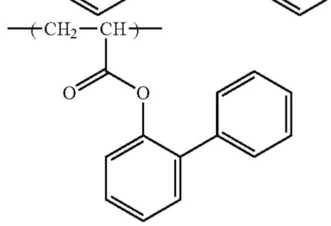

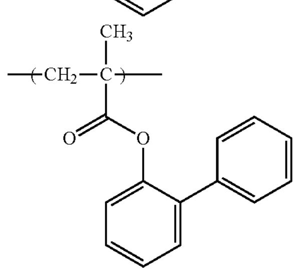

-continued

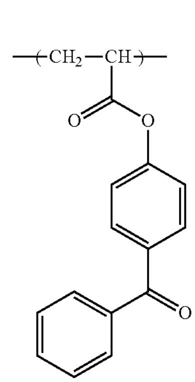

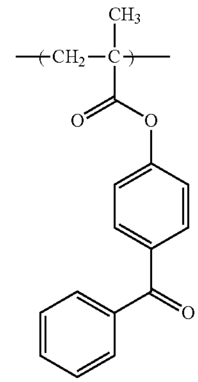

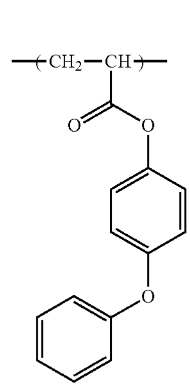

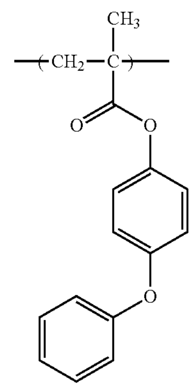

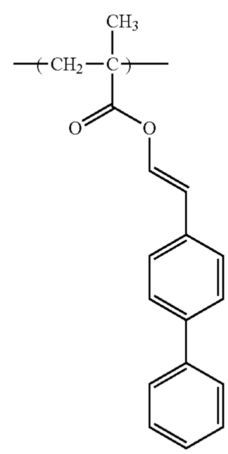

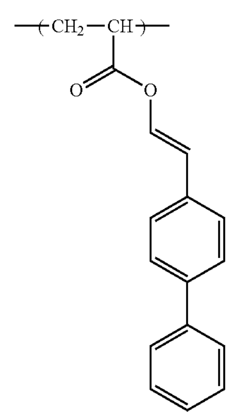

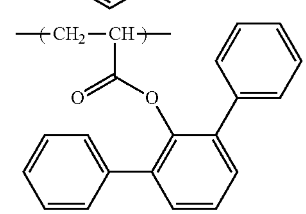

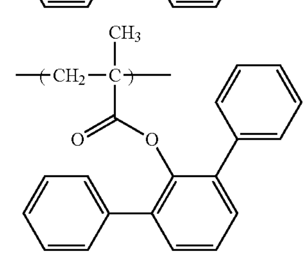

-continued
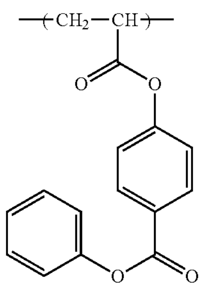
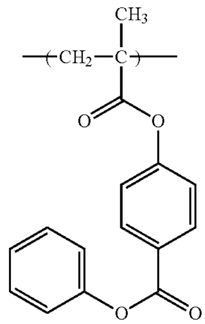
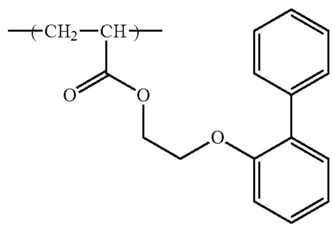
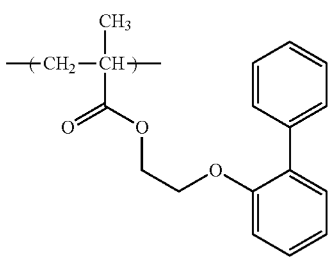
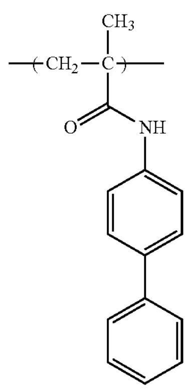
[Chem. 11]
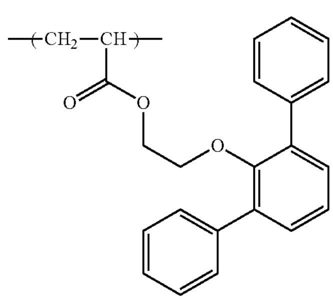
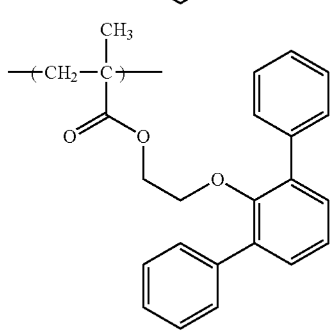
-continued
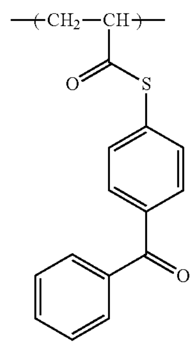
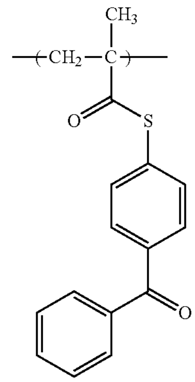
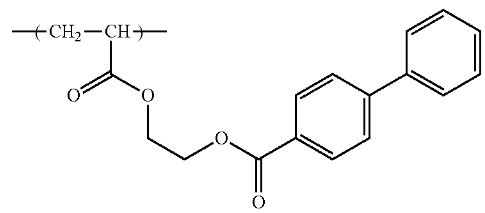
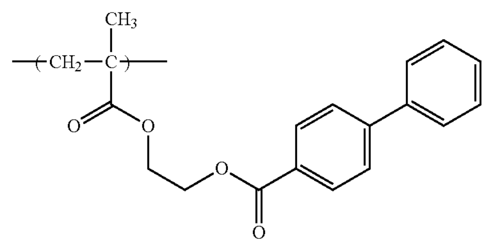
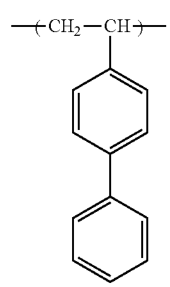
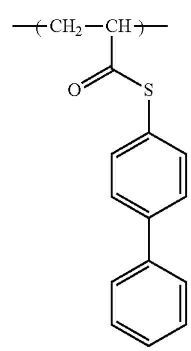
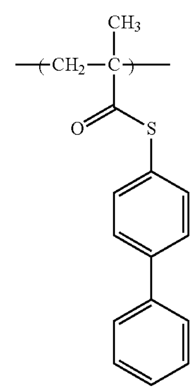
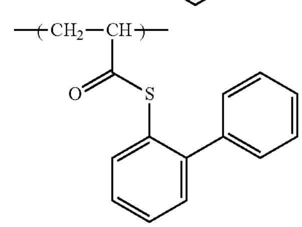
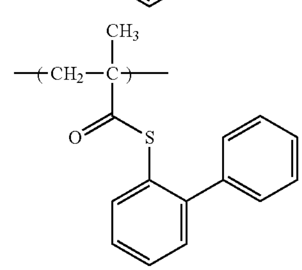

-continued
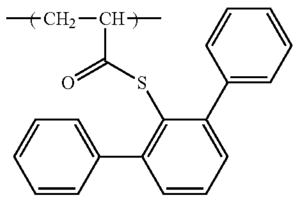
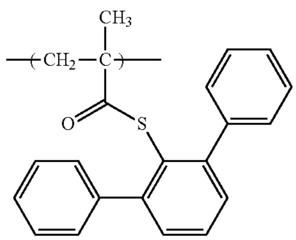
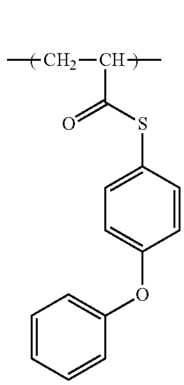
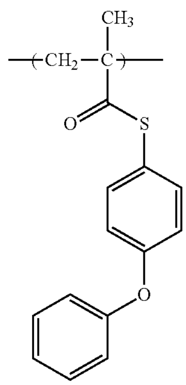
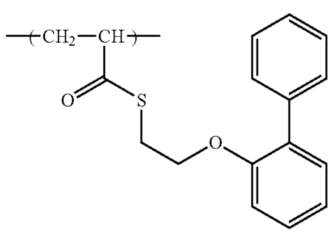
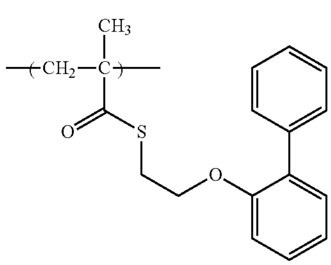
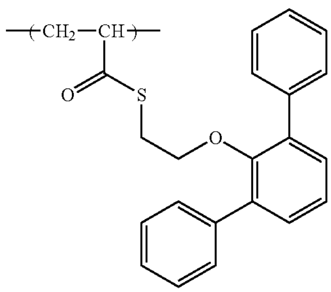
-continued
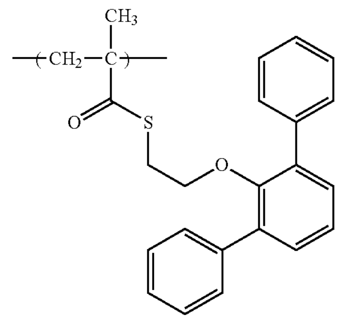
[Chem. 12]
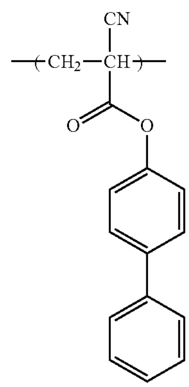
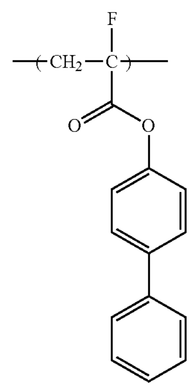
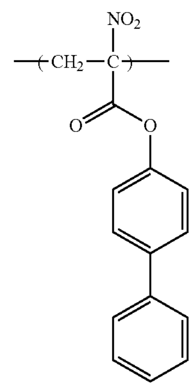
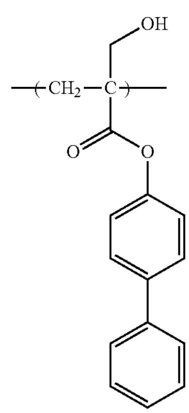
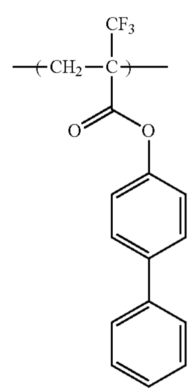
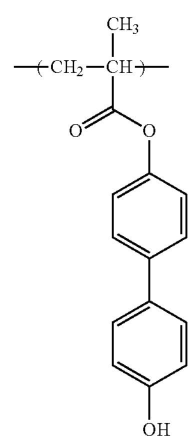
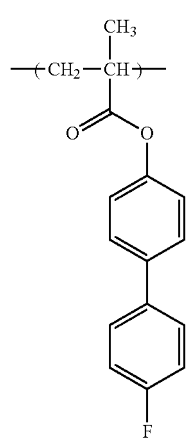
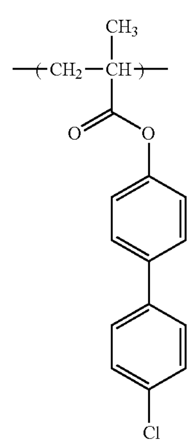
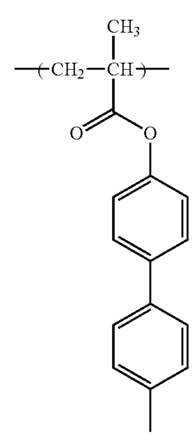

-continued

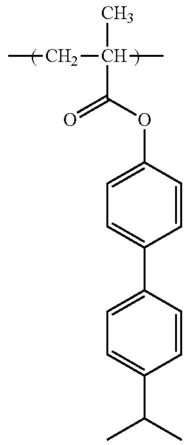

The resin (T) may contain or may not contain the repeating unit (d), and in the case where the resin (T) contains the repeating unit (d), the content of repeating unit (d) is preferably in a range from 1 to 30% by mole, more preferably in a range from 1 to 20% by mole, based on the total repeating units of the resin (T). The resin (T) may contain two or more kinds of the repeating units (d) in combination.

The weight average molecular weight of the resin (T) is not particularly limited, and is preferably from 2,000 to 1,000,000, more preferably from 5,000 to 100,000, and particularly preferably from 6,000 to 50,000. Here, the weight average molecular weight of the resin indicates a polystyrene equivalent molecular weight measured by GPC (carrier: THF or N-methyl-2-pyrrolidone (NMP)).

Also, the polydispersity (Mw/Mn) is preferably from 1.00 to 5.00, more preferably from 1.00 to 3.50, and still more preferably from 1.00 to 2.50.

The top coat composition may contain a component other than the resin (T), and the content of the resin (T) is preferably from 80 to 100% by mass, more preferably from 90 to 100% by mass, particularly preferably from 95 to 100% by mass, based on the solid content of the top coat composition.

Specific examples of the resin (T) contained in the top coat composition are set forth below, but the invention should not be construed as being limited thereto. In each of the specific examples, the composition ratio of the respective repeating units is indicated by a molar ratio.

[Chem. 13]

T-1

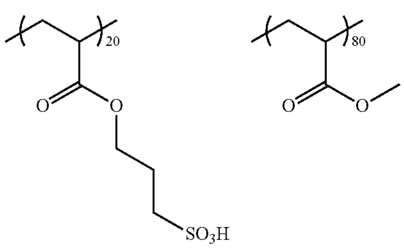

-continued

T-2

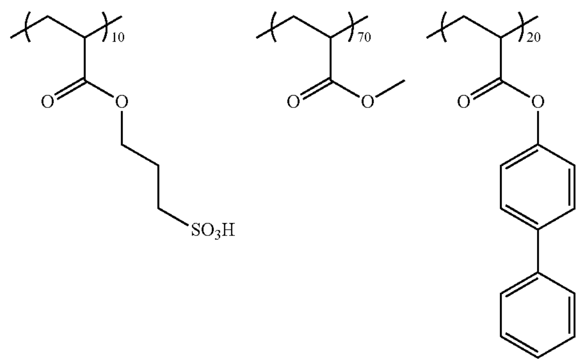

T-3

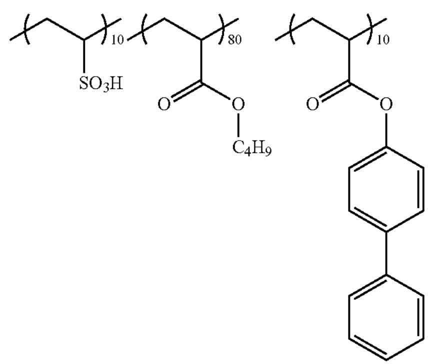

T-4

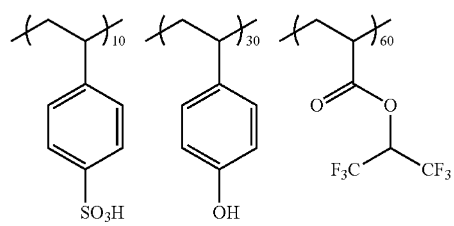

T-5

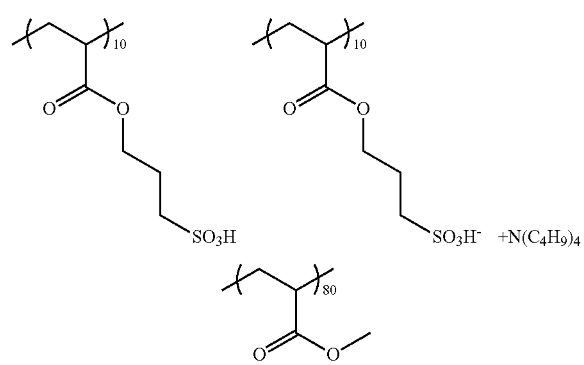

T-6

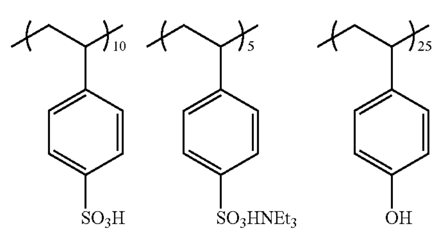

-continued
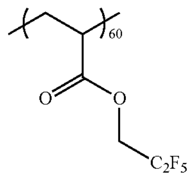
T-7
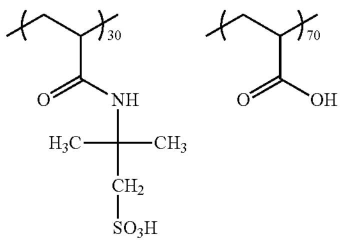
T-8
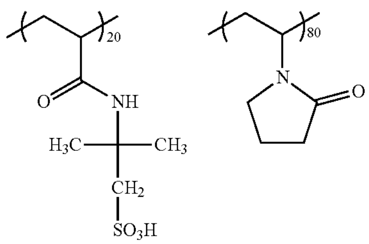
T-9
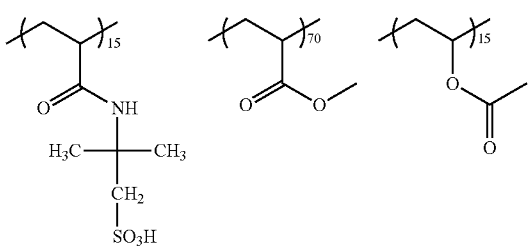
T-10
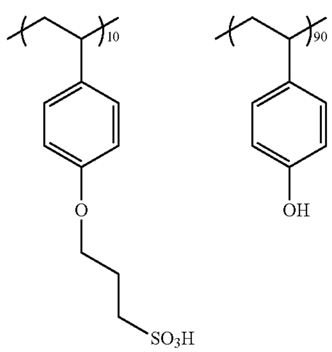
T-11
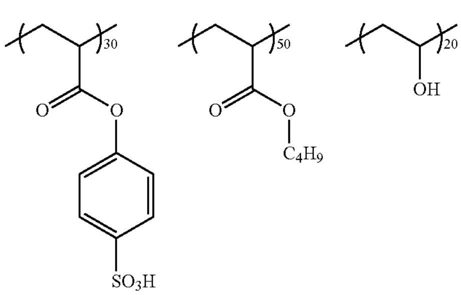
-continued
T-12
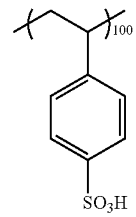
[Chem. 14]
T-13
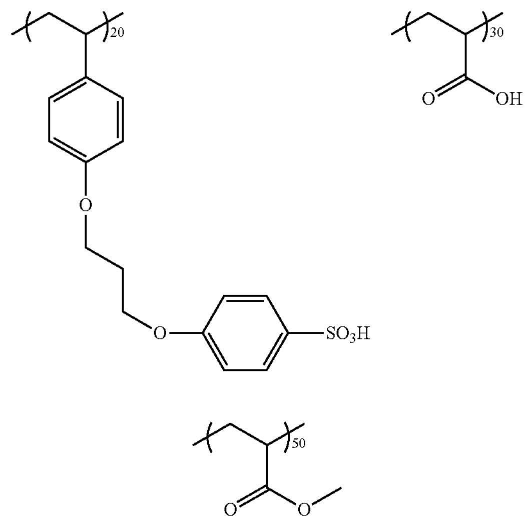
T-14
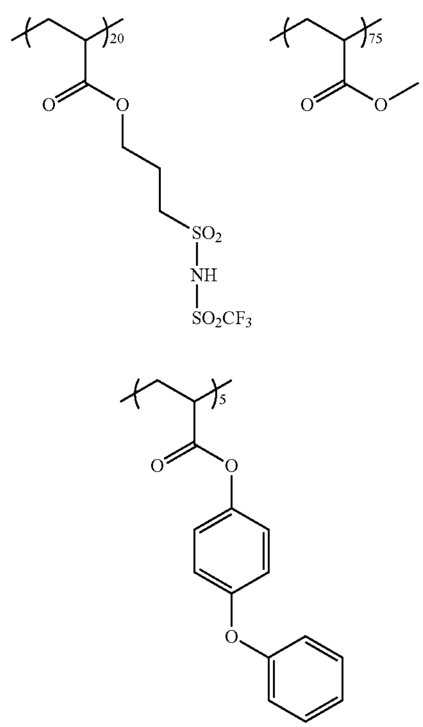

-continued
T-15
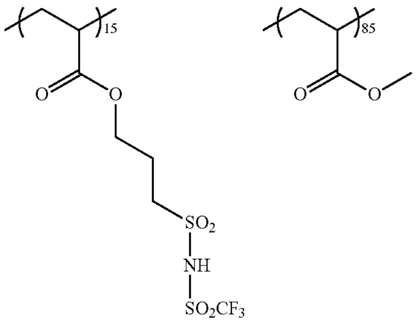
T-16
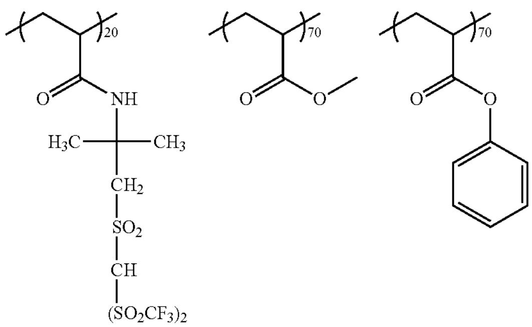
T-17
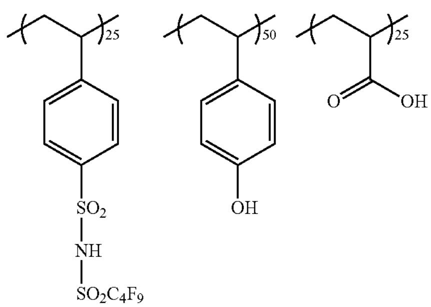
T-18
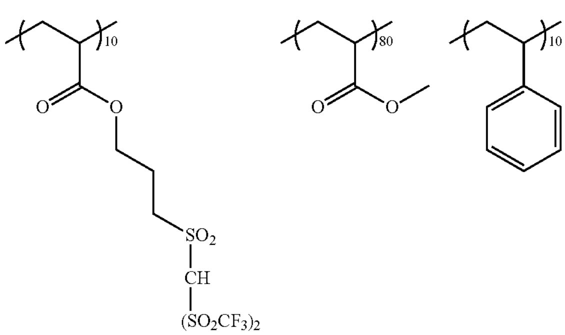
T-19
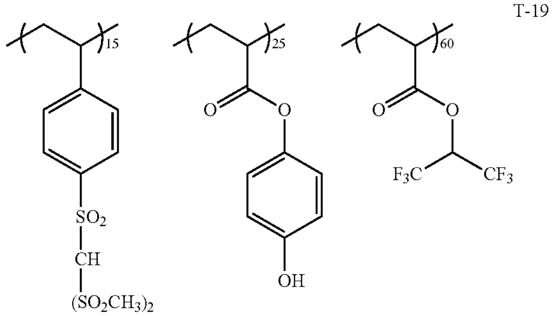
-continued
T-20
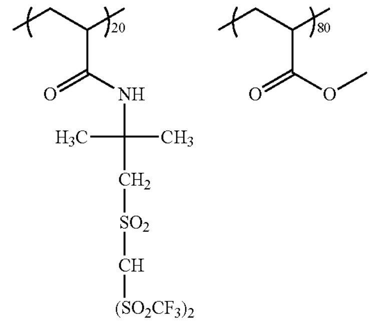
T-21
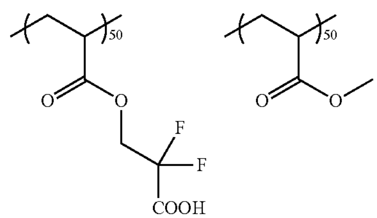
T-22
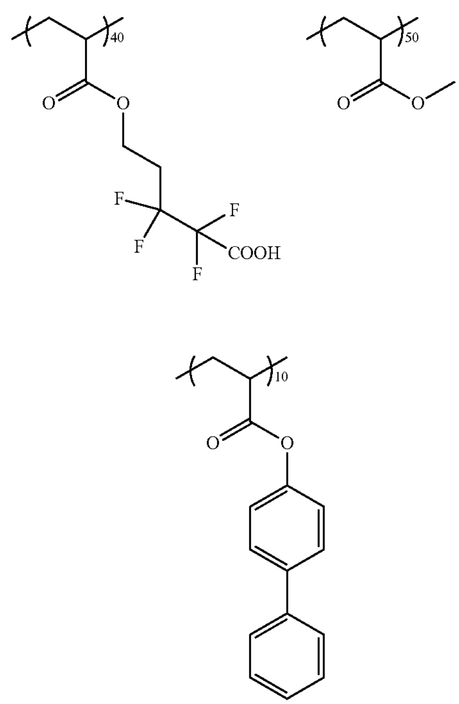
T-23
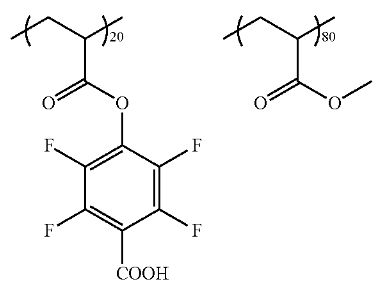

-continued

T-24

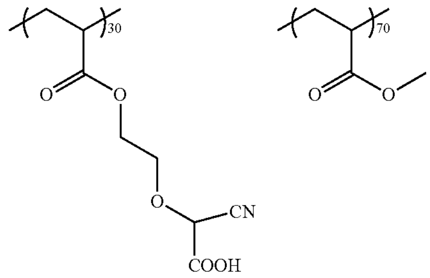

T-25

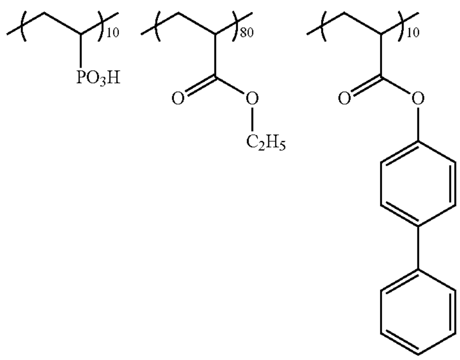

T-26

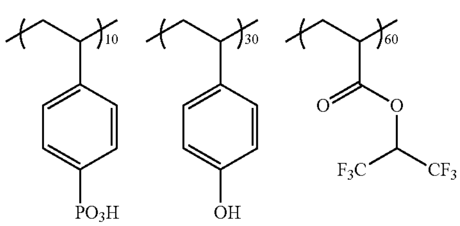

T-27

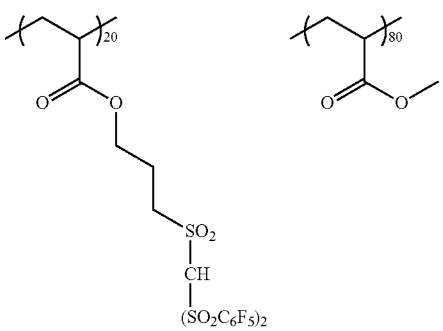

T-28

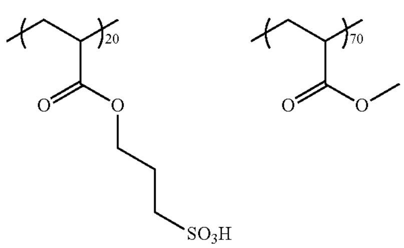

-continued

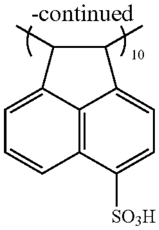

The component other than the resin (T) contained in the top coat composition includes, for example, a water-soluble resin, a hydrophobic resin, a surfactant, a compound capable of generating an acid upon irradiation with an electron beam or an extreme ultraviolet radiation, and a basic compound. In the case of containing the compound capable of generating an acid upon irradiation with an electron beam or an extreme ultraviolet radiation and the basic compound, the specific examples and the contents thereof include the same compounds and the contents thereof as the compound (B) capable of generating an acid upon irradiation with an electron beam or an extreme ultraviolet radiation and the basic compound described in the section of the electron beam-sensitive or extreme ultraviolet radiation-sensitive resin composition.

In the case where the solvent of the top coat composition is water or an alcohol-based solvent, the composition may contain a water-soluble resin other than the resin (T). It is believed that by incorporating the water-soluble resin other than the resin (T), the uniformity of solubility in the developer can be more increased. Preferred water-soluble resin includes, for example, polyacrylic acid, polymethacrylic acid, polyhydroxystyrene, polyvinyl pyrrolidone, polyvinyl alcohol, polyvinyl ether, polyvinyl acetal, polyacrylimide, polyethylene glycol, polyethylene oxide, polyethyleneimine, polyester polyol, polyether polyol and a polysaccharide. Polyacrylic acid, polymethacrylic acid, polyhydroxystyrene, polyvinyl pyrrolidone or polyvinyl alcohol is particularly preferred. The water-soluble resin is not limited to a homopolymer and may be a copolymer. For example, it may be a copolymer of a monomer corresponding to a repeating unit of the homopolymer described above and a monomer other than the monomer. Specifically, for example, an acrylic acid-methacrylic acid copolymer or an acrylic acid hydroxystyrene copolymer can be used in the invention.

The content of the water-soluble resin other than the resin (T) can be appropriately controlled to such an extent that the effect of the invention is not impaired.

In the case of using a surfactant, the amount of surfactant used is preferably from 0.0001 to 2% by mass, more preferably from 0.001 to 1% by mass, based on the total solid content of the top coat composition.

By adding the surfactant to the top coat composition, the coating property in the coating of the top coat composition may be improved. The surfactant includes nonionic, anionic, cationic and amphoteric surfactants.

As the nonionic surfactant, for example, Plufarac Series produced by BASF, ELEBASE Series, Finesurf Series and Blaunon Series produced by Aoki Oil Industrial Co., Ltd., Adeka Pluronic P-103 produced by Asahi Denka Co., Ltd., Emulgen Series, Amiet Series, Aminon PK-02S, Emanon CH-25 and Rheodol Series produced by Kao Corp., Surflon S-141 produced by AGC Seimi Chemical Co., Ltd., Noigen Series produced by Dai-ichi Kogyo Seiyaku Co., Ltd., Newcalgen Series produced by Takemoto Oil & Fat Co., Ltd., DYNOL 604, EnviroGem AD01, Olfine EXP Series and Surfynol Series produced by Nisshin Chemical Industry Co., Ltd., and Ftergent 300 produced by Ryoko Chemical Co., Ltd. can be used.

As the anionic surfactant, for example, Emal 20T and Poiz 532A produced by Kao Corp., Phosphanol ML-200 produced by Toho Chemical Industry Co., Ltd., EMULSOGEN Series produced by Clariant Japan K.K., Surflon S-111N and Surflon S-211 produced by AGC Seimi Chemical Co., Ltd., Plysurf Series produced by Dai-ichi Kogyo Seiyaku Co., Ltd., Pionin Series produced by Takemoto Oil & Fat Co., Ltd., Olfine PD-201 and Olfine PD-202 produced by Nisshin Chemical Industry Co., Ltd., AKYPO RLM45 and ECT-3 produced by Nihon Surfactant Kogyo K.K., and Lipon produced by Lion Corp. can be used.

As the cationic surfactant, for example, Acetamin 24 and Acetamin 86 produced by Kao Corp. can be used.

As the amphoteric surfactant, for example, Surflon S-131 produced by AGC Seimi Chemical Co., Ltd., and Enagicol C-40H and Lipomin LA produced by Kao Corp. can be used. Also, the surfactants may be used as a mixture.

The top coat composition preferably has coating aptitude to the upper portion of the resist film and more preferably does not mixed with the resist film and can be uniformly coated on the upper portion of the resist film.

The top coat composition according to the invention preferably contains water or an organic solvent, and preferably contains water.

In the case where the solvent is an organic solvent, the organic solvent is preferably an organic solvent which does not dissolve the resist film. The solvent which can be used is preferably an alcohol-based solvent, a fluorine-based solvent and a hydrocarbon-based solvent, and more preferably a non-fluorine-based alcohol-based solvent. The alcohol-based solvent is preferably a primary alcohol, more preferably a primary alcohol having from 4 to 8 carbon atoms from the standpoint of coating property. The primary alcohol having from 4 to 8 carbon atoms includes a straight-chain, branched or cyclic alcohol, and is preferably a straight-chain or branched alcohol. Specifically, it includes, for example, 1-butanol, 1-hexanol, 1-pentanol and 3-methyl-1-butanol.

The pKa of the acidic group in the resin (T) of the top coat composition is preferably from −10 to 5, more preferably from −10 to 4, and particularly preferably from −4 to 3.

The pH of the top coat composition is preferably from 0 to 5, more preferably from 0 to 4, and preferably from 0 to 3.

In the case where the solvent of the top coat composition is an organic solvent, the top coat composition may contain a hydrophobic resin. As the hydrophobic resin, the hydrophobic resin (FIR) described later in the section of the electron beam-sensitive or extreme ultraviolet radiation-sensitive resin composition can be used.

Also, the hydrophobic resin may be used one kind or in combination of plural kinds.

The content of the hydrophobic resin in the top coat composition is preferably from 0.01 to 10% by mass, more preferably from 0.05 to 8% by mass, still more preferably from 0.1 to 5% by mass, based on the total solid content of the composition.

The solid content concentration of the top coat composition according to the invention is preferably from 0.1 to 10% by mass, more preferably from 0.2 to 6% by mass, and still more preferably from 0.3 to 5% by mass. By setting the solid content concentration to the range described above, the top coat composition can be uniformly coated on the resist film.

[Electron Beam-Sensitive or Extreme Ultraviolet Radiation-Sensitive Resin Composition]

In the pattern forming method according to the invention, the electron beam-sensitive or extreme ultraviolet radiation-sensitive resin composition preferably contains (A) a resin capable of decomposing by an action of an acid to change dissolution rate in a developer, and more preferably further contains (B) a compound capable of generating an acid by an electron beam or an extreme ultraviolet radiation described later.

The electron beam-sensitive or extreme ultraviolet radiation-sensitive resin composition is typically a resist composition, although it can be used in a negative type development (development in which upon exposure solubility in a developer decreases and the exposed area remains as a pattern and the unexposed area is removed), it is preferably a positive type resist because a particularly large effect can be obtained. Also, the composition according to the invention is typically a chemical amplification resist composition.

Although the electron beam-sensitive or extreme ultraviolet radiation-sensitive resin composition according to the invention is able to be an electron beam-sensitive or extreme ultraviolet radiation-sensitive resin composition used in development using a developer containing an organic solvent, it is preferably an electron beam-sensitive or extreme ultraviolet radiation-sensitive resin composition used in development using an alkali developer.

[1] Resin Capable of Decomposing by an Action of Acid to Change Dissolution Rate in Developer (A)

The electron beam-sensitive or extreme ultraviolet radiation-sensitive resin composition preferably contains a resin capable of decomposing by an action of an acid to change dissolution rate in a developer (A) (hereinafter, also referred to as "Resin (A)").

The resin (A) is more preferably a resin (A) having a group capable of decomposing by an action of an acid to generate a polar group (hereinafter, also referred to as an "acid-decomposable group") in the main chain or the side chain, or both of the main chain and the side chain of the resin. The resin (A) more preferably contains a repeating unit having the acid-decomposable group.

Also, the definition of the polar group is same as the definition described in the section of the repeating unit (c) later, and examples of the polar group which is generated by the decomposition of the acid-decomposable group includes, for example, an alkali-soluble group, an amino group and an acidic group, and the polar group is preferably an alkali-soluble group.

The alkali-soluble group is not particularly limited as long as it is a group which is solubilized in an alkali developer, and preferably includes, for example, a phenolic hydroxyl group, a carboxylic acid group, a sulfonic acid group, a fluorinated alcohol group, a sulfonamido group, a sulfonylimido group, an (alkylsulfonyl) (alkylcarbonyl)methylene group, an (alkylsulfonyl) (alkylcarbonyl)imido group, a bis(alkylcarbonyl)methylene group, a bis(alkylcarbonyl) imido group, a bis(alkylsulfonyl)methylene group, a bis (alkylsulfonyl)imido group, a tris(alkylcarbonyl)methylene group and a tris(alkylsulfonyl)methylene group, and more preferably an acidic group (a group dissociating in a 2.38% by mass aqueous solution of tetramethyl ammonium hydroxide, which is conventionally used as a developer of resist), for example, a carboxylic acid group, a fluorinated alcohol group (preferably a hexafluoropropanol group), a phenolic hydroxyl group or a sulfonic acid group.

A group preferred as the acid-decomposable group is a group where a hydrogen atom of such an alkali-soluble group is substituted with a group capable of leaving by an action of an acid.

The group capable of leaving by an action of an acid includes, for example, —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, a group composed of a combination of an alkylene group and an aryl group or an alkenyl group. $R_{36}$ and $R_{37}$ may be connected to each other to form a ring.

Each of $R_{01}$ and $R_{02}$ independently represents a hydrogen atom, an alkyl group, a cycloalkyl group, an aryl group, a group composed of a combination of an alkylene group and an aryl group, or an alkenyl group.

The acid-decomposable group preferably includes, for example, a cumyl ester group, an enol ester group, an acetal ester group and a tertiary alkyl ester group.

(a) Repeating Unit Having Acid-Decomposable Group

The repeating unit (a) is more preferably a repeating unit represented by formula (V) shown below.

[Chem. 15]

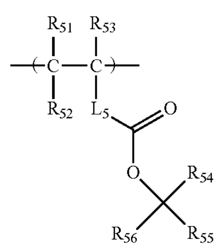

(V)

In formula (V), each of $R_{51}$, $R_{52}$ and $R_{53}$ independently represents a hydrogen atom, an alkyl group, a cycloalkyl group, a halogen atom, a cyano group or an alkoxycarbonyl group, or $R_{52}$ may be connected to $L_5$ to form a ring, and in this case $R_{52}$ represents an alkylene group.

$L_5$ represents a single bond or a divalent connecting group, when $L_5$ is connected to $R_{52}$ to form a ring, $L_5$ represents a trivalent connecting group.

$R_{54}$ represents an alkyl group, and each of $R_{55}$ and $R_{56}$ independently represents a hydrogen atom, an alkyl group, a cycloalkyl group, an aryl group or an aralkyl group, or $R_{55}$ and $R_{56}$ may be connected to each other to form a ring, and provided that $R_{55}$ and $R_{56}$ are not hydrogen atoms at the same time.

Formula (V) will be described in more detail below.

The alkyl group represented by any of $R_{51}$ to $R_{53}$ in formula (V) is preferably an alkyl group having 20 or less carbon atoms which may have a substituent, for example, a methyl group, an ethyl group, a propyl group, an isopropyl group, an n-butyl group, a sec-butyl group, a hexyl group, a 2-ethylhexyl group, an octyl group or a dodecyl group, more preferably an alkyl group having 8 or less carbon atoms, and particularly preferably an alkyl group having 3 or less carbon atoms.

The alkyl group contained in the alkoxycarbonyl group is preferably the same as the alkyl group represented by any of $R_{51}$ to $R_{53}$ above.

The cycloalkyl group may be a monocyclic type or a polycyclic type. The cycloalkyl group is preferably a monocyclic type cycloalkyl group having from 3 to 10 carbon atoms which may have a substituent, for example, a cyclopropyl group, a cyclopentyl group or a cyclohexyl group.

Examples of the halogen atom include a fluorine atom, a chlorine atom, a bromine atom and an iodine atom, and particularly preferably a fluorine atom.

Preferred substituents in the groups described above include, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The number of carbon atoms in the substituent is preferably 8 or less.

Also, in the case where $R_{52}$ is an alkylene group and forms a ring together with $L_5$, the alkylene group is preferably an alkylene group having from 1 to 8 carbon atoms, for example, a methylene group, an ethylene group, a propylene group, a butylene group, a hexylene group or an octylene group. An alkylene group having from 1 to 4 carbon atoms is more preferred, and an alkylene group having from 1 to 2 carbon atoms is particularly preferred. The ring formed by connecting $R_{52}$ and $L_5$ is particularly preferably a 5-membered or 6-membered ring.

In formula (V), each of $R_{51}$ and $R_{53}$ is more preferably a hydrogen atom, an alkyl group or a halogen atom, and particularly preferably a hydrogen atom, a methyl group, an ethyl group, a trifluoromethyl group (—$CF_3$), a hydroxymethyl group (—$CH_2$—OH), a chloromethyl group ($CH_2$—Cl) or a fluorine atom (—F). $R_{52}$ is more preferably a hydrogen atom, an alkyl group, a halogen atom or an alkylene group (forming a ring together with $L_5$), and particularly preferably a hydrogen atom, a methyl group, an ethyl group, a trifluoromethyl group (—$CF_3$), a hydroxymethyl group (—$CH_2$—OH), a chloromethyl group ($CH_2$—Cl), a fluorine atom (—F), a methylene group (forming a ring together with $L_5$) or an ethylene group (forming a ring together with $L_5$).

The divalent connecting group represented by $L_5$ includes, for example, an alkylene group, a divalent aromatic ring group, —COO-$L_1$-, —O-$L_1$- and a group composed of a combination of two or more thereof. In the formulae, $L_1$ represents an alkylene group, a cycloalkylene group, a divalent aromatic ring group or a group composed of a combination of an alkylene group and a divalent aromatic ring group.

$L_5$ is preferably a single bond, a group represented by —COO-$L_1$- or a divalent aromatic ring group. $L_1$ is preferably an alkylene group having from 1 to 5 carbon atoms, and more preferably a methylene group or a propylene group. The divalent aromatic ring group is preferably a 1,4-phenylene group, a 1,3-phenylene group, a 1,2-phenylene group or a 1,4-naphthylene group, and more preferably a 1,4-phenylene group.

In the case where $L_5$ is connected to $R_{52}$ to form a ring, the trivalent group represented by $L_5$ preferably includes groups formed by removing one appropriate hydrogen atom from the specific examples of the divalent connecting group represented by L5 described above.

The alkyl group represented by each of $R_{54}$ to $R_{56}$ is preferably an alkyl group having from 1 to 20 carbon atoms, more preferably an alkyl group having from 1 to 10 carbon atoms and particularly preferably an alkyl group having from 1 to 4 carbon atoms, for example, a methyl group, an ethyl group, an n-propyl group, an isopropyl group, an n-butyl group, an isobutyl group or a tert-butyl group.

The cycloalkyl group represented by each of $R_{55}$ and $R_{56}$ is preferably a cycloalkyl group having from 3 to 20 carbon atoms, and may be a monocyclic cycloalkyl group, for example, a cyclopentyl group or a cyclohexyl group, or a polycyclic cycloalkyl group, for example, a norbornyl group, an adamantyl group, a tetracyclodecanyl group or a tetracyclododecanyl group.

Also, the ring formed by connecting $R_{55}$ and $R_{56}$ to each other is preferably a ring having from 3 to 20 carbon atoms, and may be a monocyclic ring, for example, a cyclopentyl group or a cyclohexyl group, or a polycyclic ring, for example, a norbornyl group, an adamantyl group, a tetracyclodecanyl group or a tetracyclododecanyl group. In the case where $R_{55}$ and $R_{56}$ are connected to each other to form a ring, $R_{54}$ is preferably an alkyl group having from 1 to 3 carbon atoms, more preferably a methyl group or an ethyl group.

The aryl group represented by each of $R_{55}$ and $R_{56}$ is preferably an aryl group having from 6 to 20 carbon atoms, and may be a monocyclic or polycyclic, and may have a substituent. The aryl group include, for example, a phenyl group, a 1-naphthyl group, 2-naphthyl group, 4-methylphenyl group and 4-methoxyphenyl group. When either $R_{55}$ or $R_{56}$ is a hydrogen atom, the other is preferably an aryl group.

The aralkyl group represented by each of $R_{55}$ and $R_{56}$ may be a monocyclic or polycyclic, and may have a substituent. The aralkyl group having from 7 to 21 carbon atoms is preferred, and includes a benzyl group and a 1-naphthylmethyl group.

As to a synthesis method of monomer corresponding to the repeating unit represented by formula (V), a common synthesis method of a polymerizable group-containing ester is able to be applied, and the method is not particularly limited.

Specific examples of the repeating unit (a) represented by formula (V) are set forth below, but the invention should not be construed as being limited thereto.

In the specific examples, each of Rx and $Xa_1$ represents a hydrogen atom, $CH_3$, $CF_3$ or $CH_2OH$. Each of Rxa and Rxb independently represents an alkyl group having from 1 to 4 carbon atoms, an aryl group having from 6 to 18 carbon atoms or an aralkyl group having from 7 to 19 carbon atoms. Z represents a substituent. p represents an integer of 0 or a positive integer, and is preferably from 0 to 2, and more preferably 0 or 1. When a plurality of Z are present, each Z may be the same as or different from every other Z. Z preferably includes a group composed of only a hydrogen atom and a carbon atom, for example, a straight-chain or branched alkyl group or a cycloalkyl group, from the standpoint of increasing dissolution contrast for a developer containing an organic solvent before and after the acid decomposition.

[Chem. 16]

1

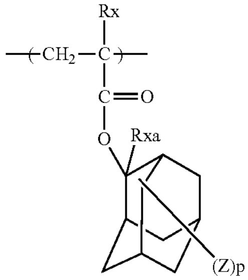

-continued

2

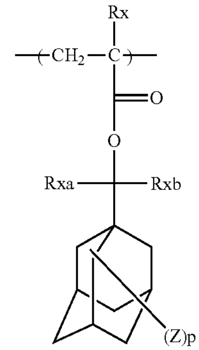

3

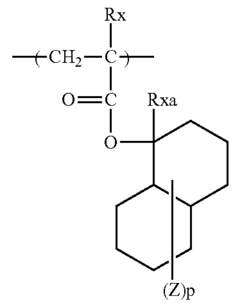

4

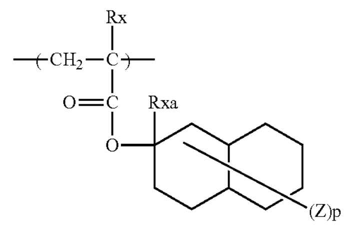

5

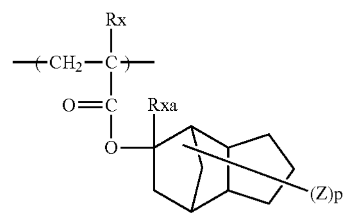

6

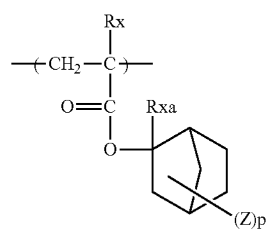

7

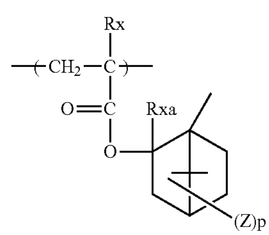

-continued
8
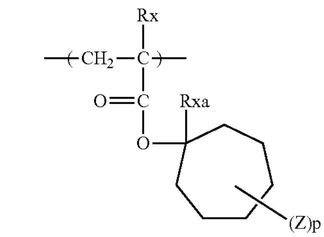
9
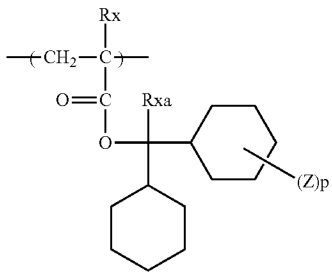
10
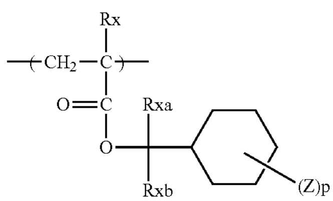
11
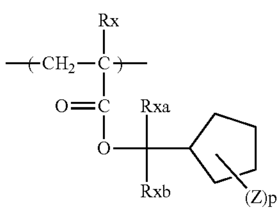
12
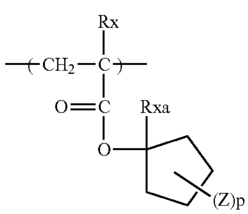
13
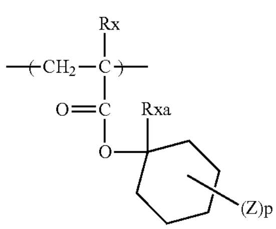
14
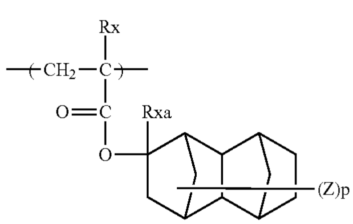
-continued
15
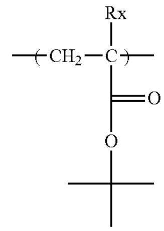
16
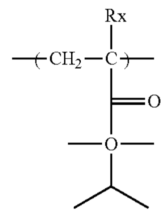
17
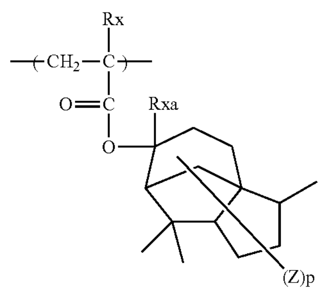
18
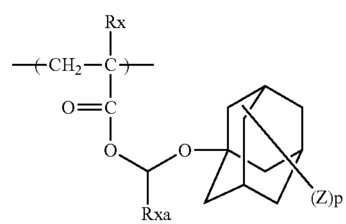
19
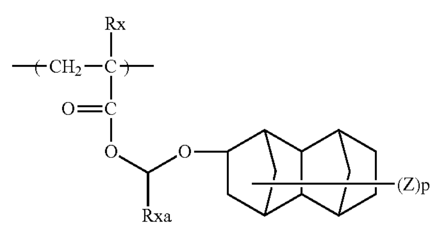
20
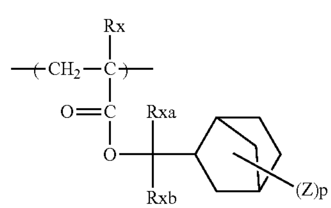

-continued
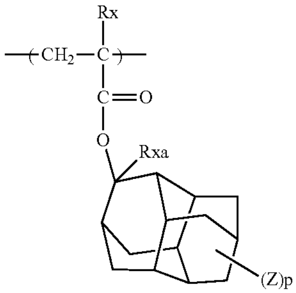
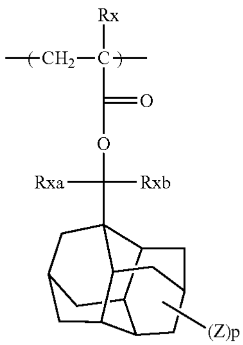
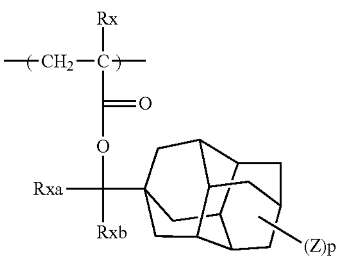
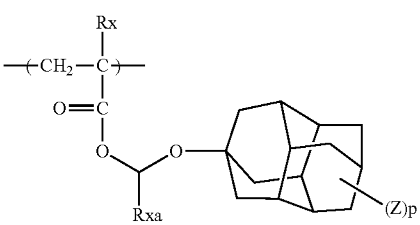
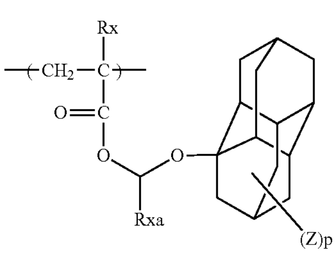
-continued
21 [Chem. 17]
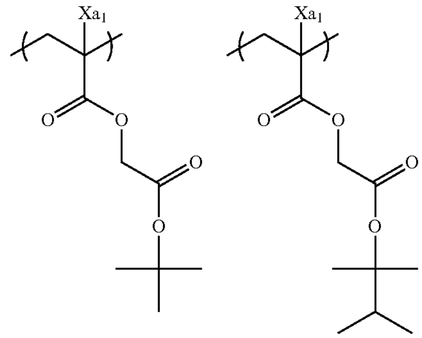
22
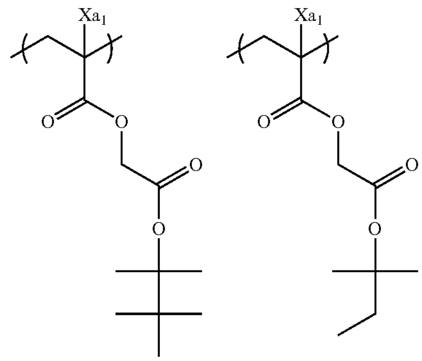
23
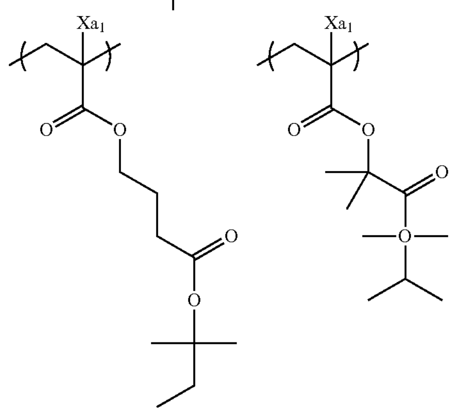
24
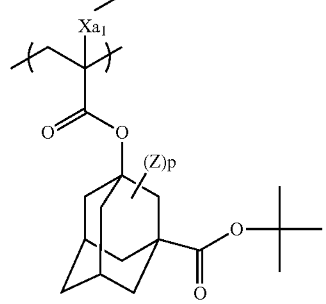
25
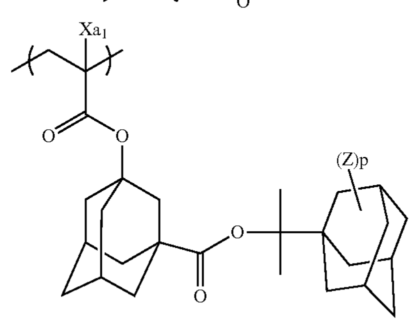

-continued
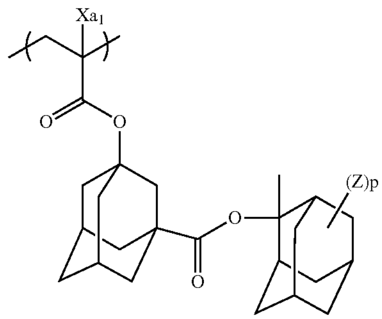
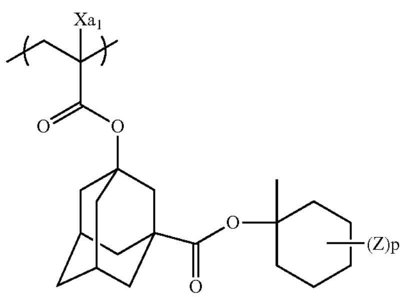
[Chem. 18]
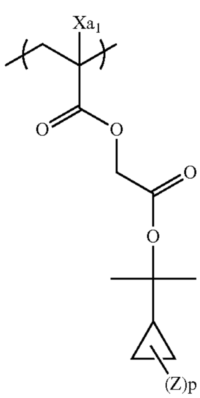
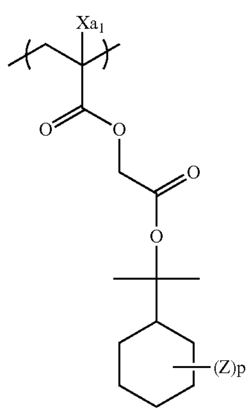
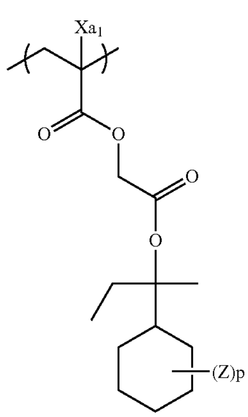
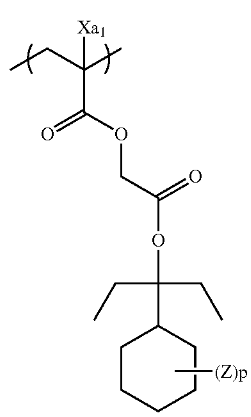
-continued
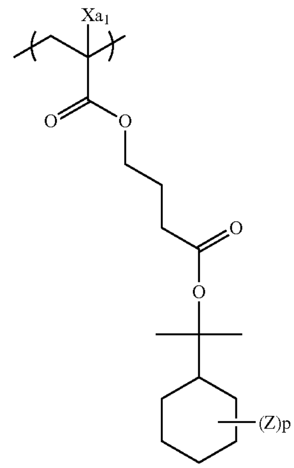
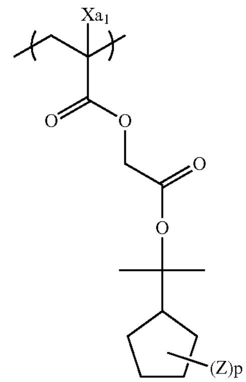
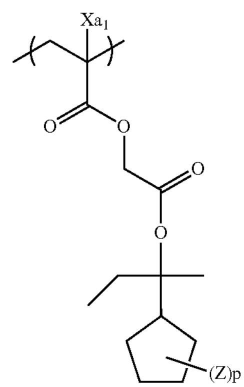
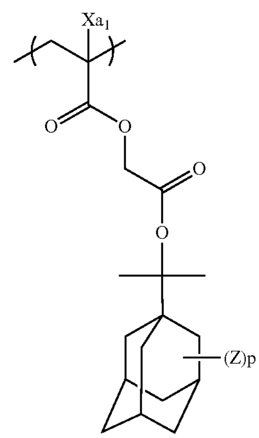
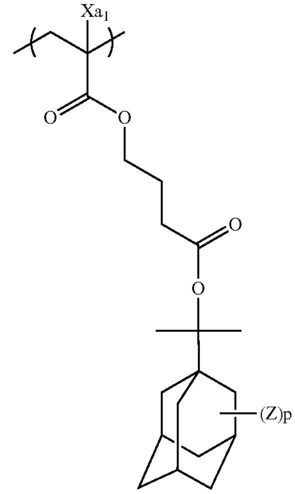

-continued
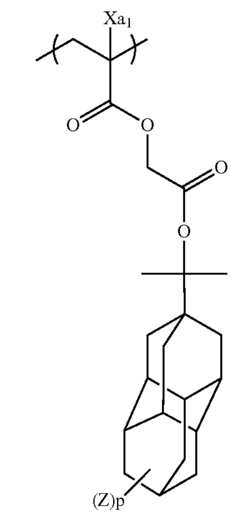
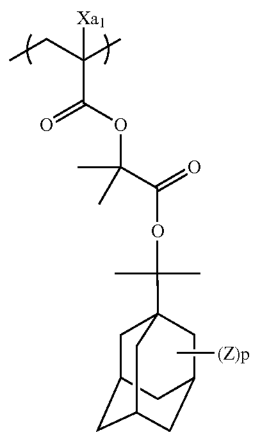
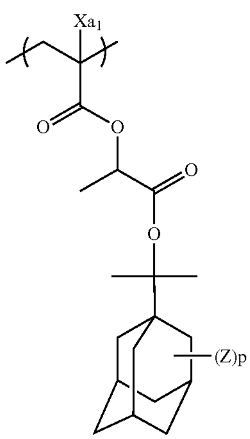
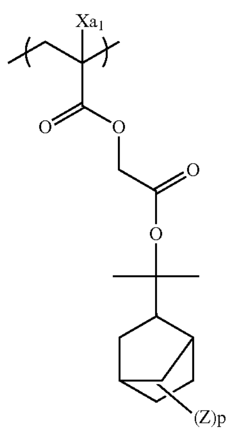
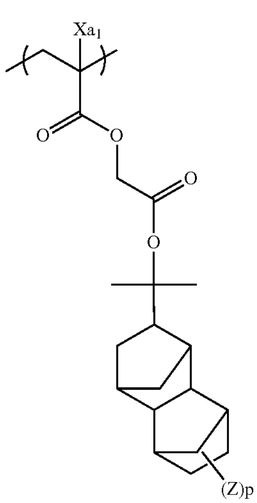
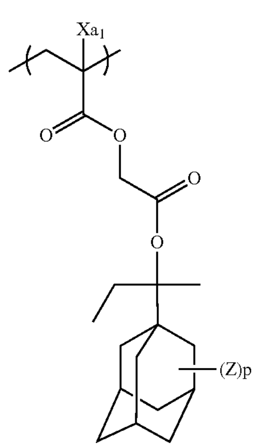
-continued
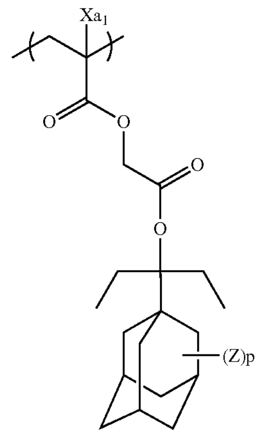
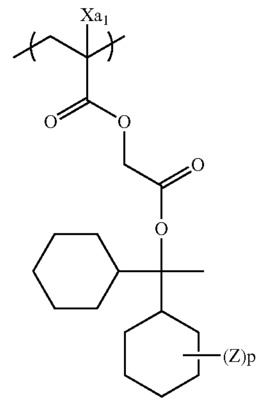
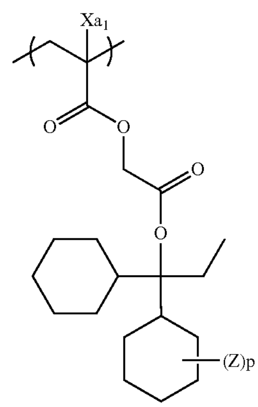
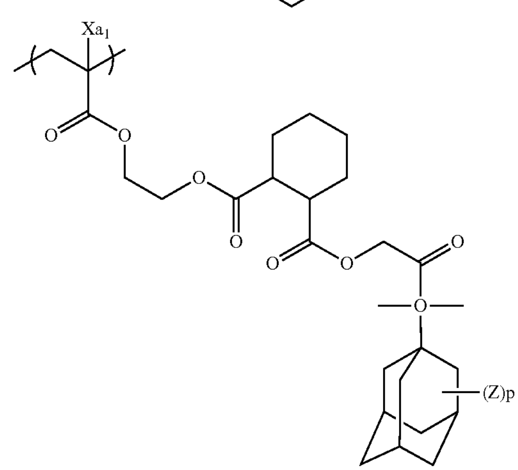
[Chem. 19]
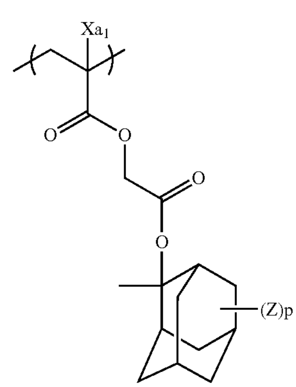

-continued
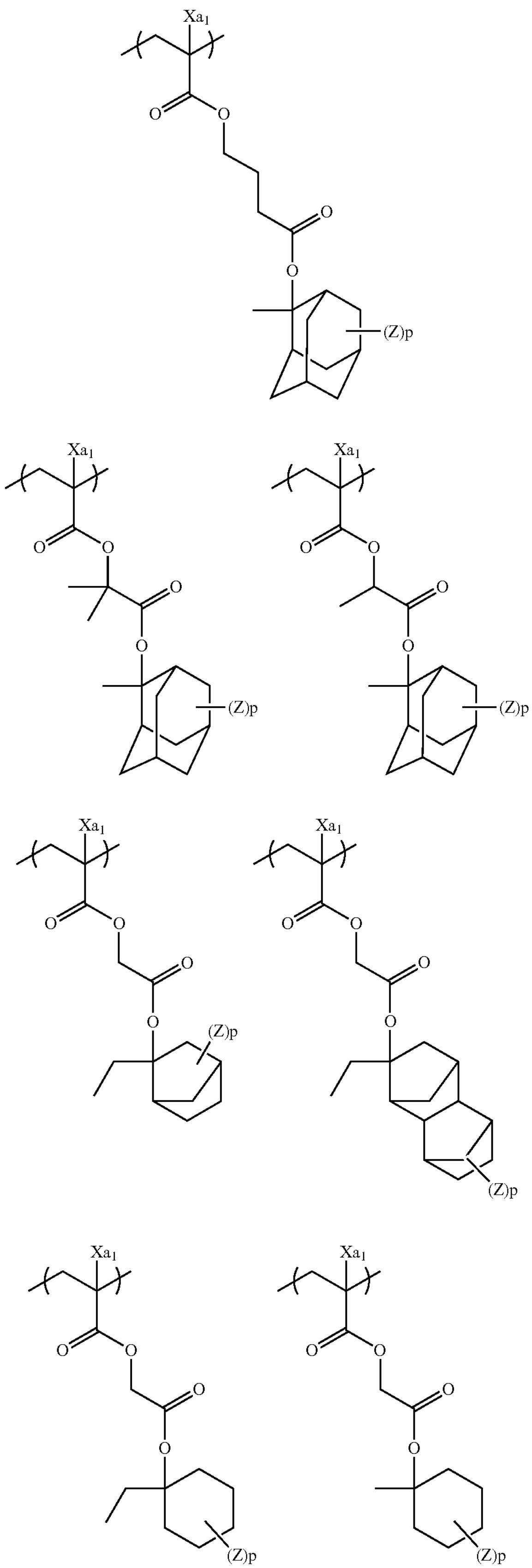
-continued
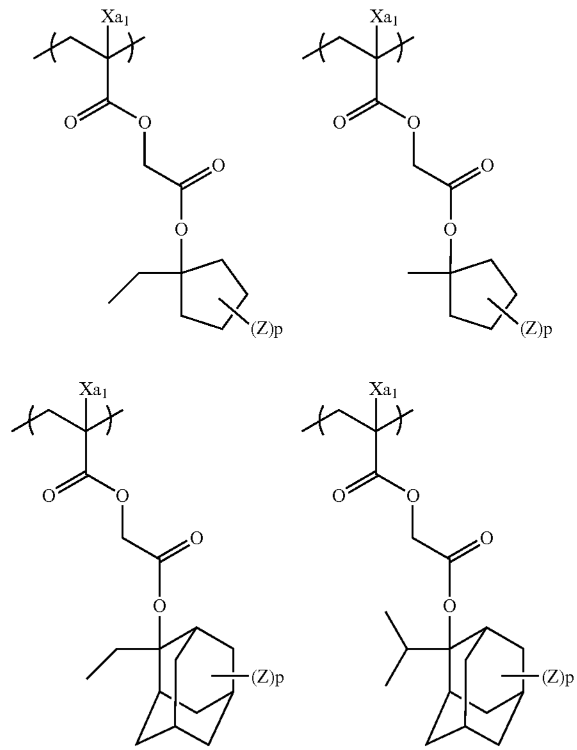
[Chem. 20]
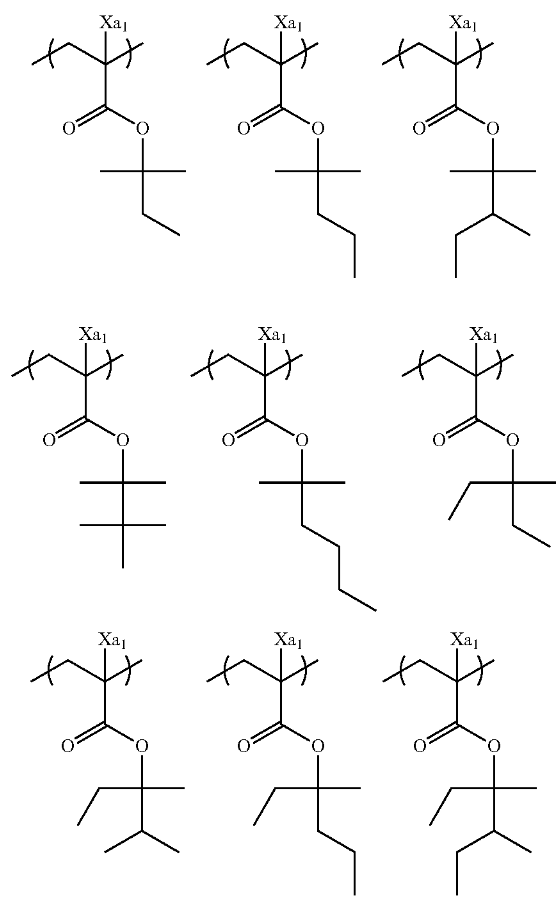

-continued
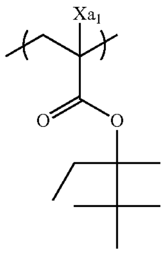
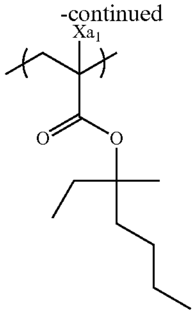
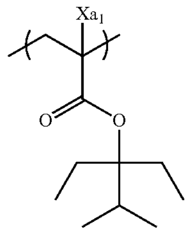
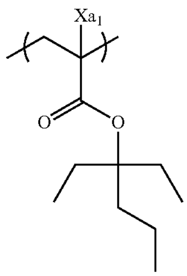
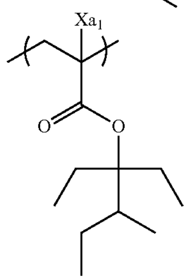
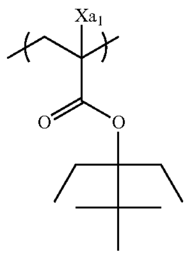
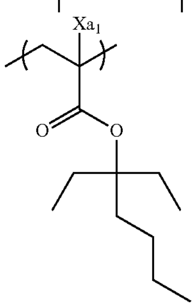
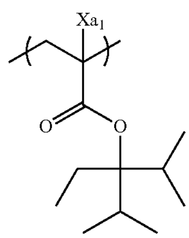
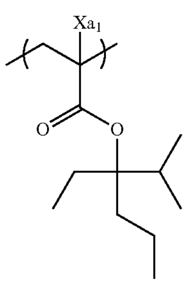
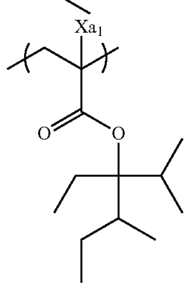
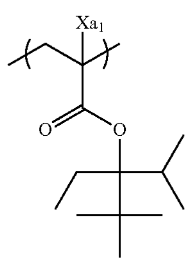
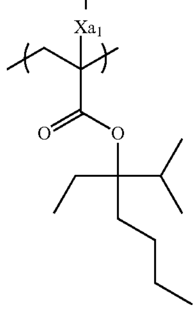
[Chem. 21]
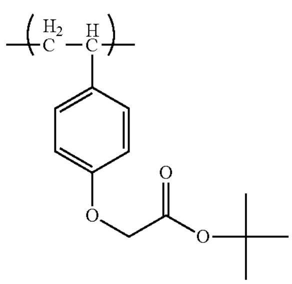
-continued
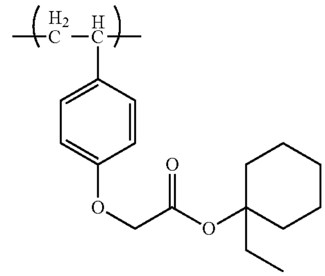
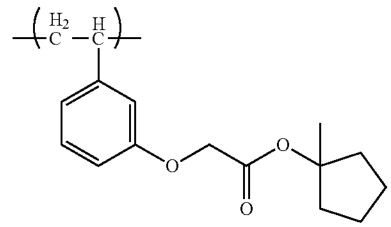
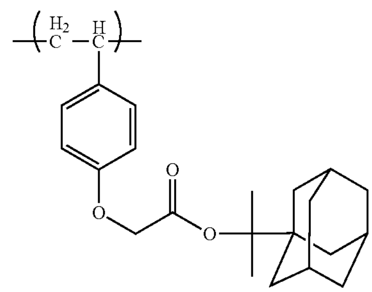
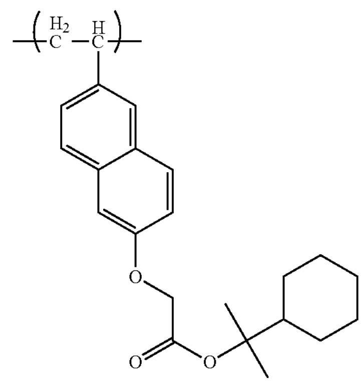
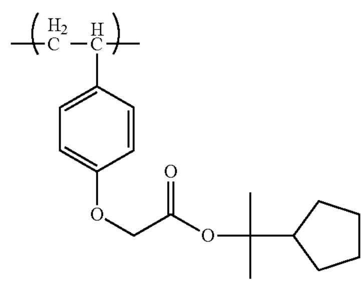
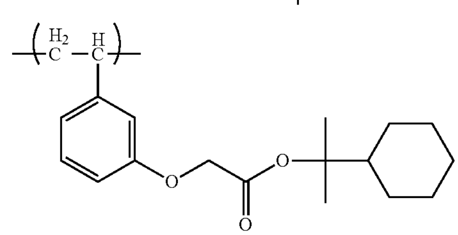

-continued

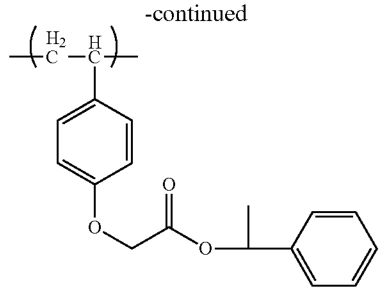

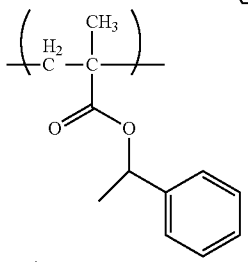

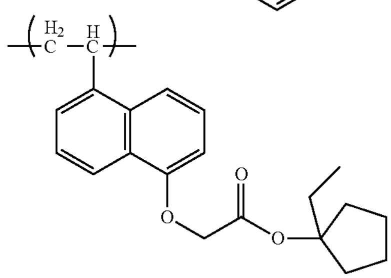

Further, the resin (A) may contain a repeating unit represented by formula (VI) shown below as the repeating unit (a).

[Chem. 22]

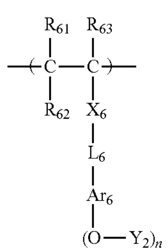

(VI)

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group, or $R_{62}$ may be connected to $Ar_6$ to form a ring, and in this case $R_{62}$ represents a single bond or an alkylene group.

$X_6$ represents a single bond, —COO— or —CONR$_{64}$—. $R_{64}$ represents a hydrogen atom or an alkyl group.

$L_6$ represents a single bond or an alkylene group.

$Ar_6$ represents an (n+1) valent aromatic ring group, and when $Ar_6$ is connected to $R_{62}$ to form a ring, $Ar_6$ represents an (n+2) valent aromatic ring group.

When n≥2, each $Y_2$ independently represents a hydrogen atom or a group capable of leaving by an action of an acid, provided that at least one of $Y_2$ represents the group capable of leaving by an action of an acid.

n represents an integer from 1 to 4.

Formula (VI) will be described in more detail below.

$R_{61}$ to $R_{63}$ in formula (VI) have the same meanings as $R_{51}$, $R_{52}$ and $R_{53}$ in formula (V) described above, and preferred ranges are also the same.

In the case where $R_{62}$ represents an alkylene group, the alkylene group is preferably an alkylene group having from 1 to 8 carbon atoms which may have a substituent, for example, a methylene group, an ethylene group, a propylene group, a butylene group, a hexylene group or an octylene group.

The alkyl group for $R_{64}$ of the —CONR$_{64}$— ($R_{64}$ represents a hydrogen atom or an alkyl group) represented by $X_6$ is the same as the alkyl group represented by any of $R_{61}$ to $R_{63}$.

$X_6$ is preferably a single bond, —COO— or —CONH—, and more preferably a single bond or —COO—.

The alkylene group represented by $L_6$ is preferably an alkylene group having from 1 to 8 carbon atoms which may have a substituent, for example, a methylene group, an ethylene group, a propylene group, a butylene group, a hexylene group or an octylene group. The ring formed by connecting $R_{62}$ and $L_6$ is particularly preferably a 5-membered or 6-membered ring.

$Ar_6$ represents an (n+1) valent aromatic ring group. In the case where n is 1, the divalent aromatic ring group may have a substituent, preferred examples thereof include, for example, an arylene group having from 6 to 18 carbon atoms, for example, a phenylene group, a tolylene group or a naphthylene group, and a divalent aromatic ring group containing a hetero ring, for example, thiophene, furan, pyrrole, benzothiophene, benzofuran, benzopyrrole, triazine, imidazole, benzimidazole, triazole, thiadiazole or thiazole.

Specific examples of the (n+1) valent aromatic ring group in the case where n is an integer of 2 or more preferably include groups formed by removing an (n−1) number of appropriate hydrogen atoms from the specific examples of the divalent aromatic ring group described above.

The (n+1) valent aromatic ring group may further has a substituent.

Substituents which the alkyl group, cycloalkyl group, alkoxycarbonyl group, alkylene group and (n+1) valent aromatic ring group may have include the specific examples of the substituents which the respective groups represented by $R_{51}$ to $R_{53}$ in formula (V) described above may have.

n is preferably 1 or 2, and more preferably 1.

Each of n number of $Y_2$ independently represents a hydrogen atom or a group capable of leaving by an action of an acid, provided that at least one of the number of $Y_2$ represents the group capable of leaving by an action of an acid.

The group capable of leaving by an action of an acid represented by $Y_2$ includes, for example, —C($R_{36}$)($R_{37}$)($R_{38}$), —C(=O)—O—C($R_{36}$)($R_{37}$)($OR_{38}$), —C($R_{01}$)($R_{02}$)($OR_{39}$), —C($R_{01}$)($R_{02}$)—C(=O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, a group composed of a combination of an alkylene group and an aryl group or an alkenyl group. $R_{36}$ and $R_{37}$ may be connected to each other to form a ring.

Each of $R_{01}$ and $R_{02}$ independently represents a hydrogen atom, an alkyl group, a cycloalkyl group, an aryl group, a group composed of a combination of an alkylene group and an aryl group, or an alkenyl group.

Ar represents an aryl group.

The alkyl group represented by any of $R_{36}$ to $R_{39}$, $R_{01}$ and $R_{02}$ may be straight-chain or branched, and is preferably an alkyl group having from 1 to 8 carbon atoms, and includes, for example, a methyl group, an ethyl group, a propyl group, an n-butyl group, a sec-butyl group, a hexyl group and an octyl group.

The cycloalkyl group represented by any of $R_{36}$ to $R_{39}$, $R_{01}$ and $R_{02}$ may be a monocyclic type or a polycyclic type. The monocyclic type is preferably a cycloalkyl group having from 3 to 10 carbon atoms, and includes, for example, a cyclopropyl group, a cyclobutyl group, a cyclopentyl group, a cyclohexyl group and a cyclooctyl group. The polycyclic type is preferably a cycloalkyl group having from 6 to 20 carbon atoms, and includes, for example, an adamantyl group, a norbornyl group, an isobornyl group, a camphanyl group, a dicyclopentyl group, an α-pinel group, a tricyclodecanyl group, a tetracyclododecyl group and an androstanyl group. Further, the carbon atoms in the cycloalkyl group may be partially substituted with a hetero atom, for example, an oxygen atom.

The aryl group represented by any of $R_{36}$ to $R_{39}$, $R_{01}$ and $R_{02}$ is preferably an aryl group having from 6 to 10 carbon atoms, and includes, for example, an aryl group, for example, a phenyl group, a naphthyl group or an anthryl group, and a divalent aromatic ring group containing a hetero ring, for example, thiophene, furan, pyrrole, benzothiophene, benzofuran, benzopyrrole, triazine, imidazole, benzimidazole, triazole, thiadiazole or thiazole.

The group composed of a combination of an alkylene group and an aryl group represented by any of $R_{36}$ to $R_{39}$, $R_{01}$ and $R_{02}$ is preferably an aralkyl group having from 7 to 12 carbon atoms, and includes, for example, a benzyl group, a phenethyl group and a naphthylmethyl group.

The alkenyl group represented by any of $R_{36}$ to $R_{39}$, $R_{01}$ and $R_{02}$ is preferably an alkenyl group having from 2 to 8 carbon atoms, and includes, for example, a vinyl group, an allyl group, a butenyl group and a cyclohexenyl group.

The ring formed by connecting $R_{36}$ and $R_{37}$ to each other may be a monocyclic type or a polycyclic type. The monocyclic type is preferably a cycloalkyl structure having from 3 to 10 carbon atoms, and includes, for example, a cyclopropane structure, a cyclobutane structure, a cyclopentane structure, a cyclohexane structure and a cyclooctane structure. The polycyclic type is preferably a cycloalkyl structure having from 6 to 20 carbon atoms, and includes, for example, an adamantane structure, a norbornane structure, a dicyclopentane structure, a tricyclodecane structure and a tetracyclododecane structure. Further, the carbon atoms in the cycloalkyl structure may be partially substituted with a hetero atom, for example, an oxygen atom.

The respective groups described above for $R_{36}$ to $R_{39}$, $R_{01}$, $R_{02}$ and Ar may have a substituent. The substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The number of carbon atoms in the substituent is preferably 8 or less.

The group capable of leaving by an action of an acid represented by $Y_2$ is more preferably a structure represented by formula (VI-A) shown below.

[Chem. 23]

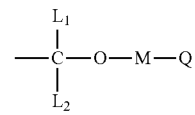

(VI-A)

In the formula, each of $L_1$ and $L_2$ independently represents a hydrogen atom, an alkyl group, a cycloalkyl group, an aryl group or a group composed of a combination of an alkylene group and an aryl group.

M represents a single bond or a divalent connecting group.

Q represents an alkyl group, a cycloalkyl group which may contain a hetero atom, an aryl group which may contain a hetero atom, an amino group, an ammonium group, a mercapto group, a cyano group or an aldehyde group.

At least two of Q, M and $L_1$ may be connected to each other to form a ring (preferably, a 5-membered or 6-membered ring).

The alkyl group represented by any of $L_1$ and $L_2$ is, for example, an alkyl group having from 1 to 8 carbon atoms, and specifically preferably includes a methyl group, an ethyl group, a propyl group, an n-butyl group, a sec-butyl group, a hexyl group and an octyl group.

The cycloalkyl group represented by any of $L_1$ and $L_2$ is, for example, a cycloalkyl group having from 3 to 15 carbon atoms, and specifically preferably includes, for example, a cyclopentyl group, a cyclohexyl group, a norbornyl group and an adamantyl group.

The aryl group represented by any of $L_1$ and $L_2$ is, for example, an aryl group having from 6 to 15 carbon atoms, and specifically preferably includes, for example, a phenyl group, a tolyl group, a naphthyl group and an anthryl group.

The group composed of a combination of an alkylene group and an aryl group represented by any of $L_1$ and $L_2$ is the group having from 6 to 20 carbon atoms, and includes an aralkyl group, for example, a benzyl group or a phenethyl group.

The divalent connecting group represented by M is, for example, an alkylene group (for example, a methylene group, an ethylene group, a propylene group, a butylene group, a hexylene group or an octylene group), a cycloalkylene group (for example, a cyclopentylene group, a cyclohexylene group or an adamantylene group), an alkenylene group (for example, an ethylene group, a propenylene group or a butenylene group), a divalent aromatic ring group (for example, a phenylene group, a tolylene group or a naphthylene group), —S—, —O—, —CO—, —$SO_2$—, —N($R_0$)— or a divalent connecting group composed of a combination of these plural groups. $R_0$ represents a hydrogen atom or an alkyl group (for example, an alkyl group having from 1 to 8 carbon atoms, specifically, for example, a methyl group, an ethyl group, a propyl group, an n-butyl group, a sec-butyl group, a hexyl group or an octyl group).

The alkyl group represented by Q is the same as the respective groups represented by any of $L_1$ and $L_2$ described above.

In the cycloalkyl group which may contain a hetero atom and the aryl group which may contain a hetero atom represented by Q, an aliphatic hydrocarbon group containing no hetero atom and the aryl group containing no hetero atom include, for example, the cycloalkyl group and the aryl group represented by $L_1$ and $L_2$ described above, and preferably have from 3 to 15 carbon atoms, respectively.

The cycloalkyl group containing a hetero atom and the aryl group containing a hetero atom include, for example, groups having a heterocyclic structure, for example, thiirane, cyclothiolane, thiophene, furan, pyrrole, benzothiophene, benzofuran, benzopyrrole, triazine, imidazole, benzimidazole, triazole, thiadiazole, thiazole and pyrrolidone, but they are not limited to these as long as a structure commonly known as a hetero ring (ring formed by carbon and a hetero atom, or ring formed by hetero atoms) is included.

The ring which may be formed by connecting at least two of Q, M and $L_1$ to each other includes a case where at least two of Q, M and $L_1$ are connected to each other to form, for example, a propylene group or a butylene group so as to form a 5-membered or 6-membered ring containing an oxygen atom.

The groups represented by $L_1$, $L_2$, M and Q in formula (VI-A) may have a substituent, and the substituents include, for example, those described as the substituents which $R_{36}$ to $R_{39}$, $R_{01}$, $R_{02}$ and Ar may have described above. The number of carbon atoms in the substituent is preferably 8 or less.

The group represented by -M-Q is preferably a group constituting from 1 to 30 carbon atoms.

The repeating unit represented by formula (VI) described above is preferably a repeating unit represented by formula (3) shown below.

[Chem. 24]

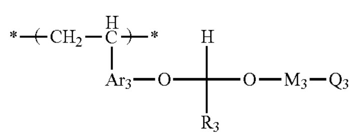

(3)

In formula (3), $Ar_3$ represents an aromatic ring group.

$R_3$ represents an alkyl group, a cycloalkyl group, an aryl group, an aralkyl group, an alkoxy group, an acyl group or a heterocyclic group.

$M_3$ represents a single bond or a divalent connecting group.

$Q_3$ represents an alkyl group, a cycloalkyl group, an aryl group or a heterocyclic group.

At least two of $Q_3$, $M_3$ and $R_3$ may be connected to form a ring.

The aromatic ring group represented by $Ar_3$ is same as $Ar_6$ in formula (VI) described above in the case where n is 1 in formula (VI), and is more preferably a phenylene group or a naphthylene group, and still more preferably a phenylene group.

$Ar_3$ may have a substituent, and the substituent which $Ar_3$ may have includes the same as the substituent which $Ar_6$ in formula (IV) described above may have.

The alkyl group or the cycloalkyl group represented by $R_3$ has the same meaning as the alkyl group or the cycloalkyl group represented by any of $R_{36}$ to $R_{39}$, $R_{01}$ and $R_{02}$ described above.

The aryl group represented by $R_3$ has the same meaning as the aryl group represented by any of $R_{36}$ to $R_{39}$, $R_{01}$ and $R_{02}$ described above, and the preferred range is also the same.

The aralkyl group represented by $R_3$ is preferably an aralkyl group having from 7 to 12 carbon atoms, and includes, for example, a benzyl group, a phenethyl group and a naphthylmethyl group.

The alkyl group moiety in the alkoxy group represented by $R_3$ is same as the alkyl group represented by any of $R_{36}$ to $R_{39}$, $R_{01}$ and $R_{02}$ described above, and the preferred range is also the same.

The acyl group represented by $R_3$ includes an aliphatic acyl group having from 1 to 10 carbon atoms, for example, a formyl group, an acetyl group, a propionyl group, a butyryl group, an isobutyryl group, a valeryl group, a pivaloyl group, a benzoyl group or a naphthoyl group, and is preferably an acetyl group or a benzoyl group.

The heterocyclic group represented by $R_3$ includes the cycloalkyl group containing a hetero atom and the aryl group containing a hetero atom described above, and is preferably a pyridine ring group or a pyran ring group.

$R_3$ is preferably a straight-chain or branched alkyl group having from 1 to 8 carbon atoms (specifically, a methyl group, an ethyl group, a propyl group, an isopropyl group, an n-butyl group, a sec-butyl group, a tert-butyl group, a neopentyl group, a hexyl group, a 2-ethylhexyl group or an octyl group), or a cycloalkyl group having from 3 to 15 carbon atoms (specifically, a cyclopentyl group, a cyclohexyl group, a norbornyl group, an adamantyl group or the like), and is preferably the group having 2 or more carbon atoms. $R_3$ is more preferably an ethyl group, an isopropyl group, a sec-butyl group, a tert-butyl group, a neopentyl group, a cyclohexyl group, an adamantyl group, a cyclohexylmethyl group or an adamantanemethyl group, and still more preferably a tert-butyl group, a sec-butyl group, a neopentyl group, a cyclohexylmethyl group or an adamantanemethyl group.

The alkyl group, cycloalkyl group, aryl group, aralkyl group, alkoxy group, acyl group or heterocyclic group described above may further has a substituent, and the substituent which each of these groups may have includes the same as the substituent which any of $R_{36}$ to $R_{39}$, $R_{01}$, $R_{02}$ and Ar described above may have.

The divalent group represented by $M_3$ has the same meaning as M in the structure represented by formula (VI-A) described above, and the preferred range is also the same. $M_3$ may have a substituent, and the substituent which $M_3$ may have includes the same as the substituent which M in the group represented by formula (VI-A) described above may have.

The alkyl group, cycloalkyl group and aryl group represented by $Q_3$ have the same meanings as those for Q in the structure represented by formula (VI-A) described above, and the preferred range is also the same.

The heterocyclic group represented by $Q_3$ includes the cycloalkyl group containing a hetero atom and the aryl group containing a hetero atom for Q in the structure represented by formula (VI-A) described above, and the preferred range is also the same.

$Q_3$ may have a substituent, and the substituent which $Q_3$ may have includes the same as the substituent which Q in the group represented by formula (VI-A) described above may have.

The ring formed by connecting at least two of $Q_3$, $M_3$ and $R_3$ has the same meaning as the ring which may be formed by connecting at least two of Q, M and $L_1$ in formula (VI-A) described above, and the preferred range is also the same.

$R_3$ in formula (3) described above is preferably a group represented by formula (3-2) shown below.

[Chem. 25]

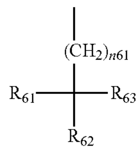

(3-2)

In formula (3-2), each of $R_{61}$, $R_{62}$ and $R_{63}$ independently represents an alkyl group, an alkenyl group, a cycloalkyl group or an aryl group. $n_{61}$ represents 0 or 1.

At least two of $R_{61}$ to $R_{63}$ may be connected to each other to form a ring.

The alkyl group represented by any of $R_{61}$ to $R_{63}$ may be straight-chain or branched, and is preferably an alkyl group having from 1 to 8 carbon atoms.

The alkenyl group represented by any of $R_{61}$ to $R_{63}$ may be straight-chain or branched, and is preferably an alkenyl group having from 1 to 8 carbon atoms.

The cycloalkyl group represented by any of $R_{61}$ to $R_{63}$ has the same meaning as the cycloalkyl group represented by any of $R_{36}$ to $R_{39}$, $R_{01}$ and $R_{02}$ described above.

The aryl group represented by any of $R_{61}$ to $R_{63}$ has the same meaning as the aryl group represented by any of $R_{36}$ to $R_{39}$, $R_{01}$ and $R_{02}$ described above, and the preferred range is also the same.

Any of $R_{61}$ to $R_{63}$ is preferably an alkyl group, and more preferably a methyl group.

The ring which may be formed by at least two of $R_{61}$ to $R_{63}$ is preferably a cyclopentyl group, a cyclohexyl group, a norbornyl group or an adamantyl group.

As preferred specific examples of the repeating unit represented by formula (a), specific examples of the repeating unit represented by formula (VI) are set forth below, but the invention should not be construed as being limited thereto.

[Chem. 26]

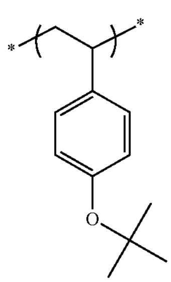

(VI-1)

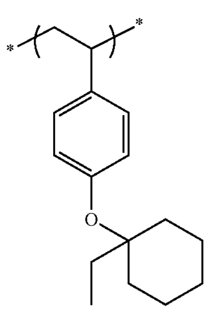

(VI-2)

-continued

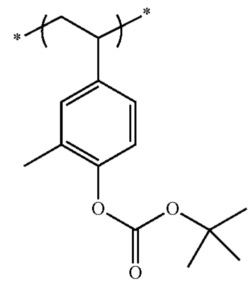

(VI-3)

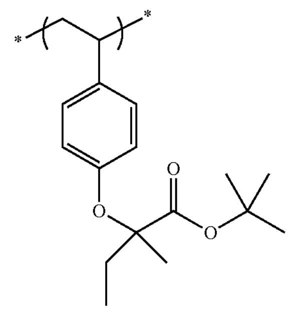

(VI-4)

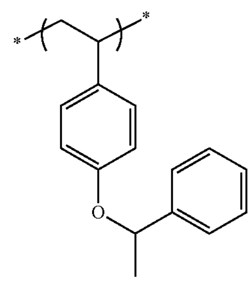

(VI-5)

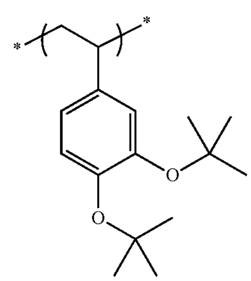

(VI-6)

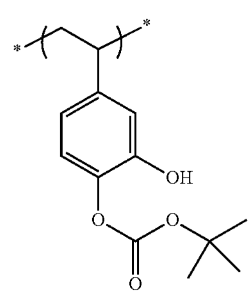

(VI-7)

-continued
(VI-8)
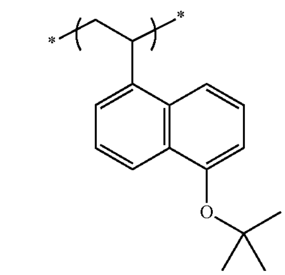
(VI-9)
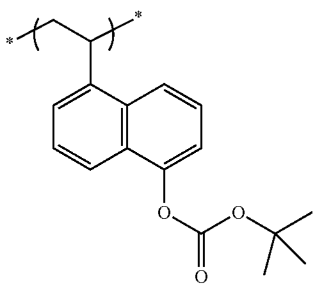
(VI-10)
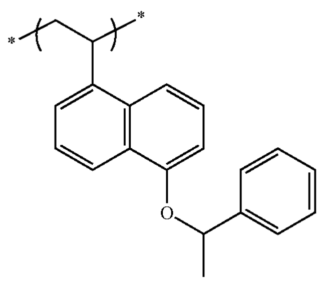
(VI-11)
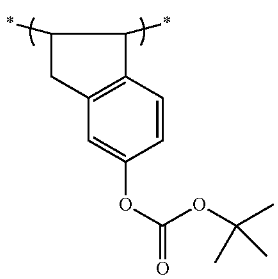
(VI-12)
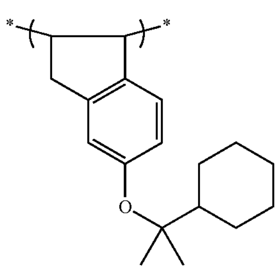
(VI-13)
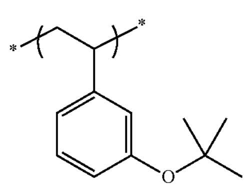
-continued
(VI-14)
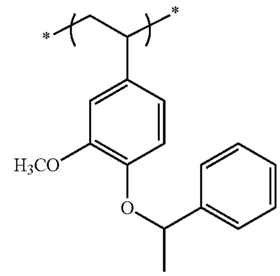
(VI-15)
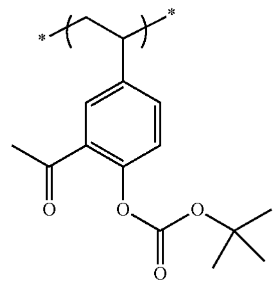
(VI-16)
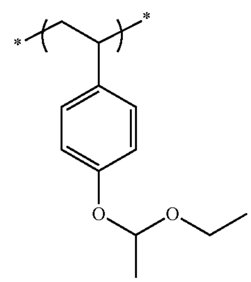
(VI-17)
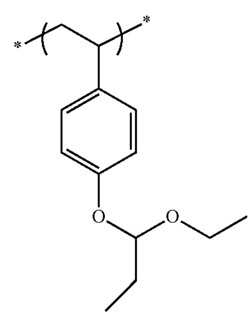
(VI-18)
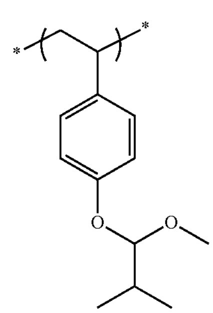

-continued
(VI-19)
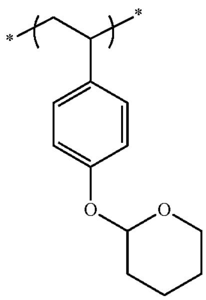
(VI-20)
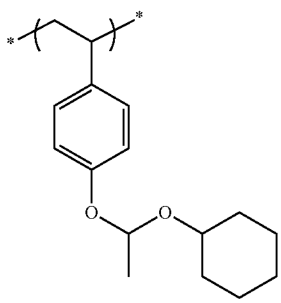
(VI-21)
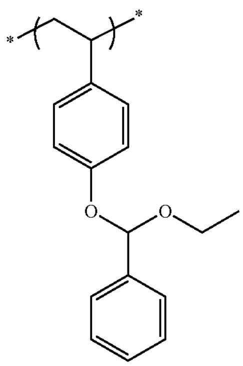
(VI-22)
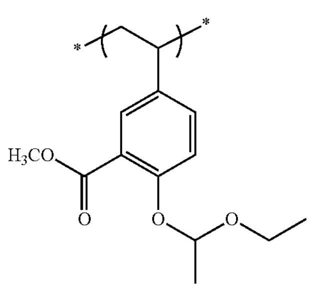
(VI-23)
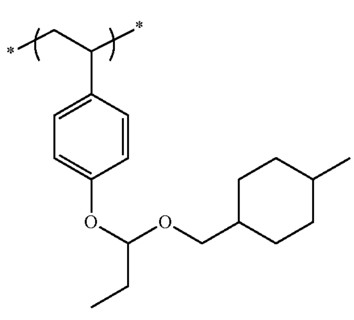
-continued
(VI-24)
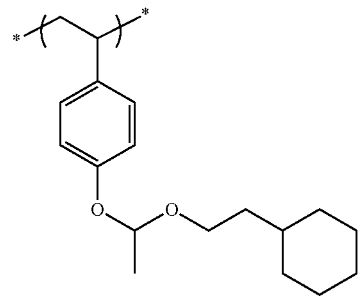
(VI-25)
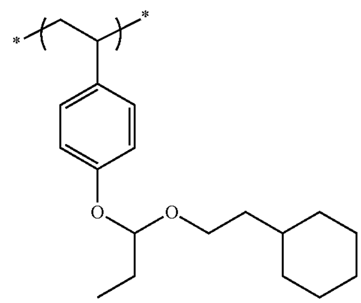
(VI-26)
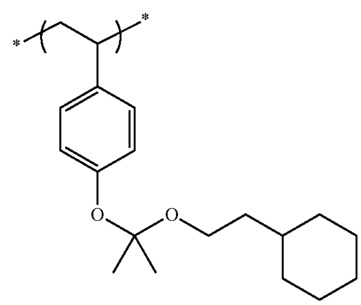
(VI-27)
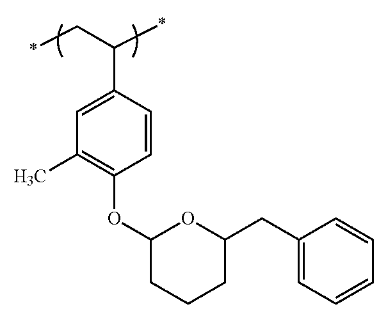
(VI-28)
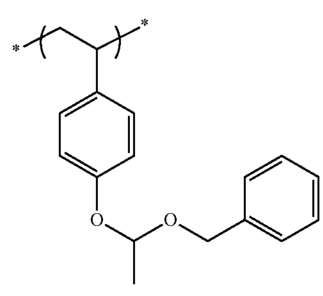

-continued
(VI-29)
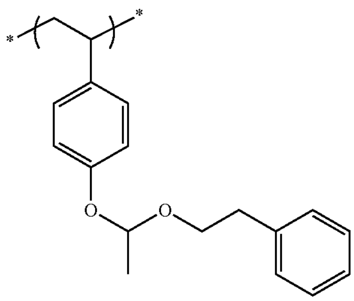
(VI-30)
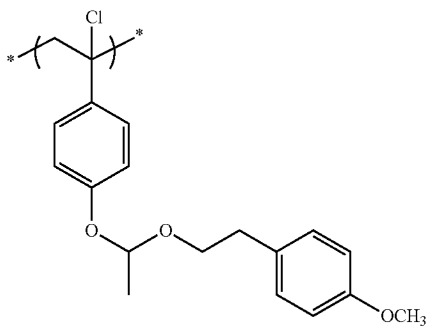
(VI-31)
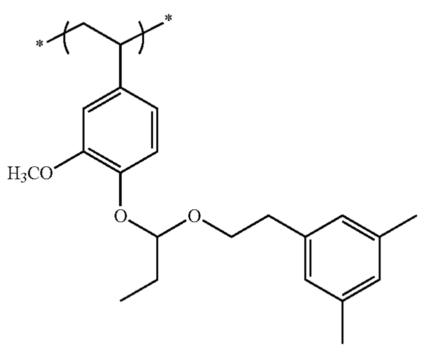
(VI-32)
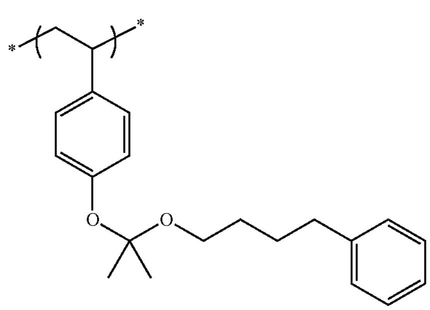
(VI-33)
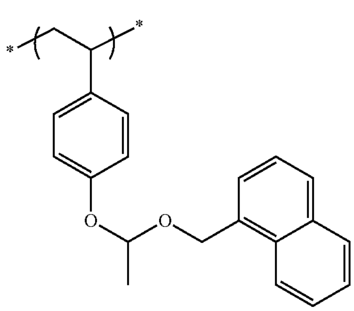
-continued
(VI-34)
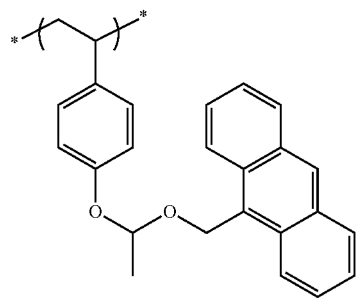
(VI-35)
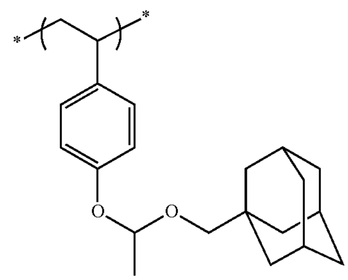
[Chem. 27]
(VI-36)
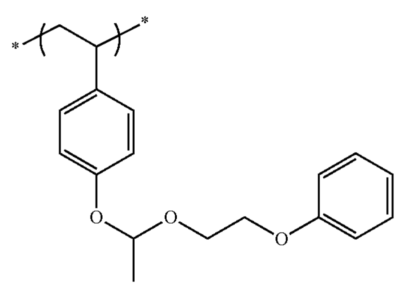
(VI-37)
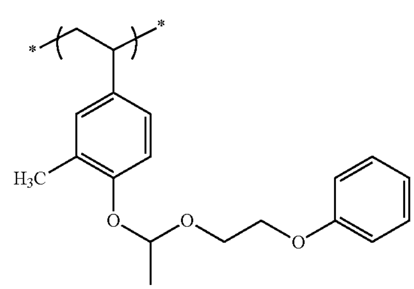
(VI-38)
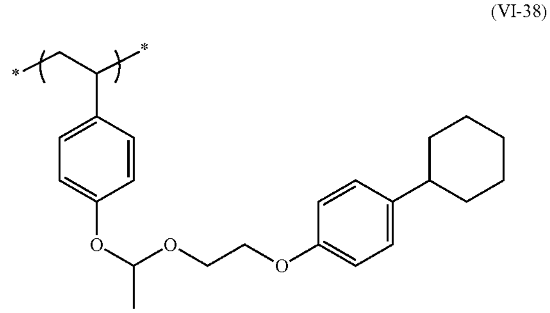

-continued
(VI-39)
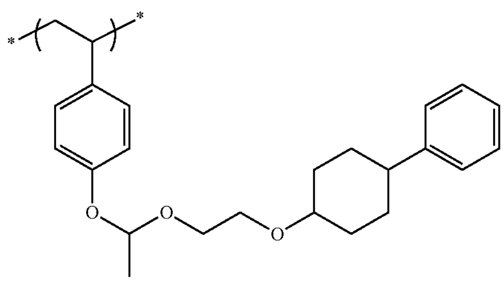
(VI-40)
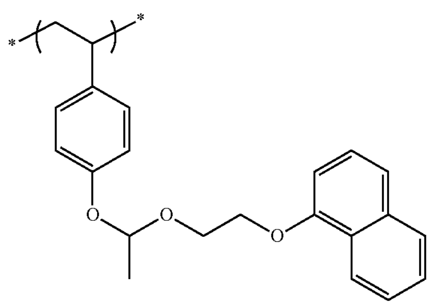
(VI-41)
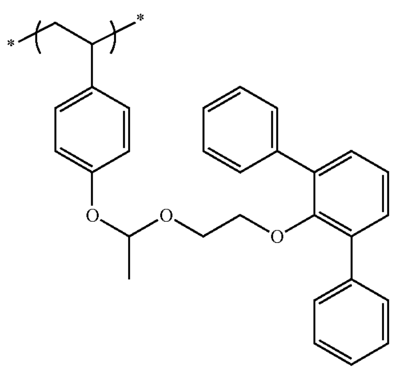
(VI-42)
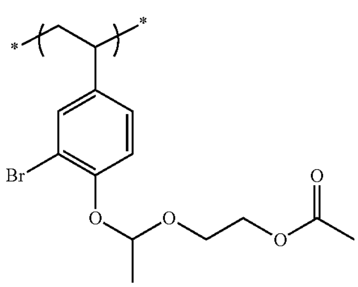
(VI-43)
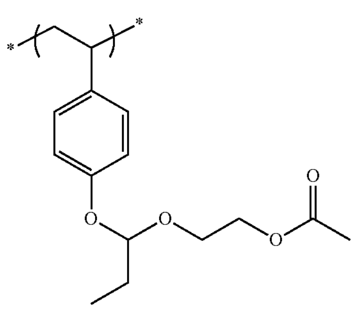
-continued
(VI-44)
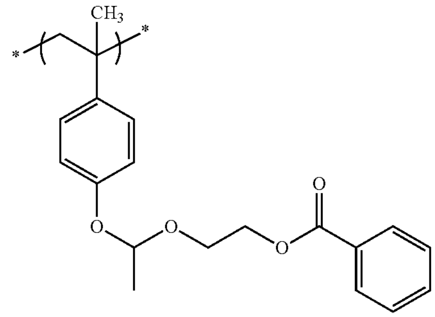
(VI-45)
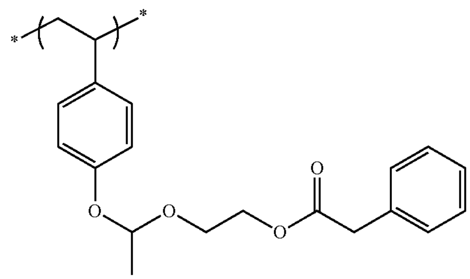
(VI-46)
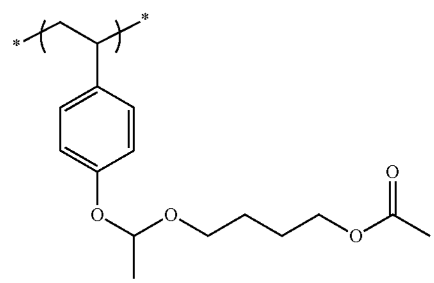
(VI-47)
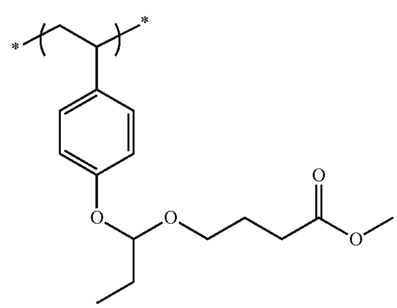
(VI-48)
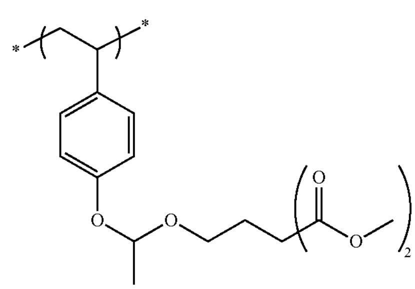

-continued
(VI-49)
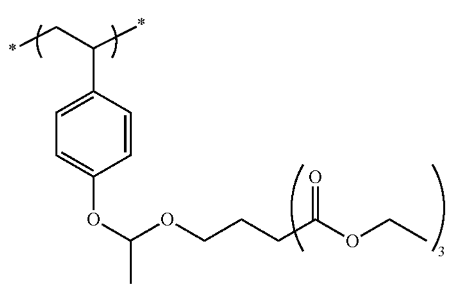
(VI-50)
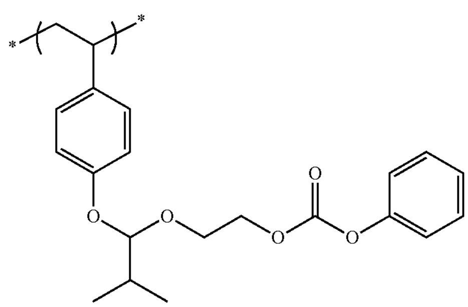
(VI-51)
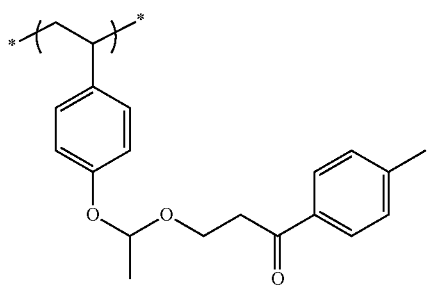
(VI-52)
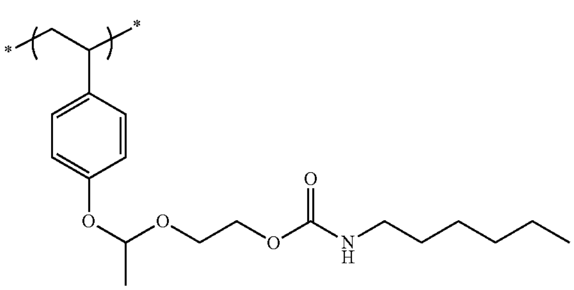
(VI-53)
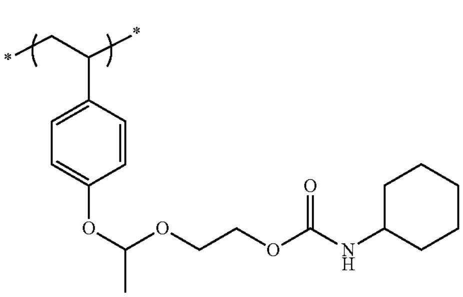
-continued
(VI-54)
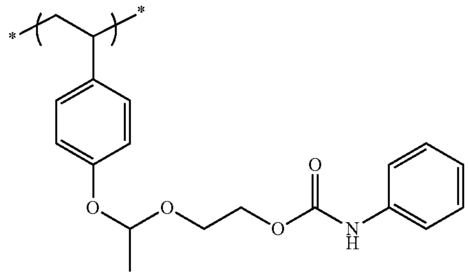
(VI-55)
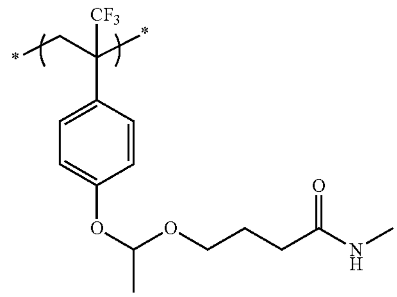
(VI-56)
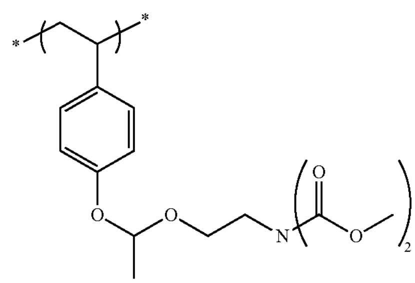
(VI-57)
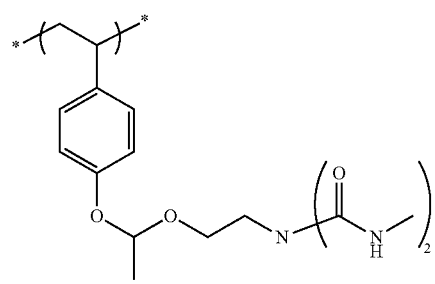
(VI-58)
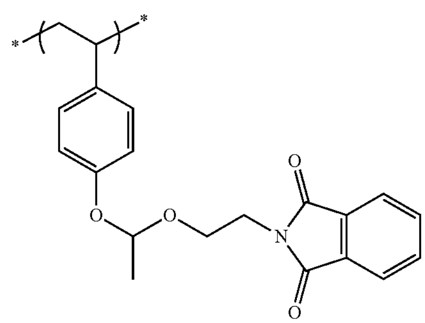

-continued
(VI-59)
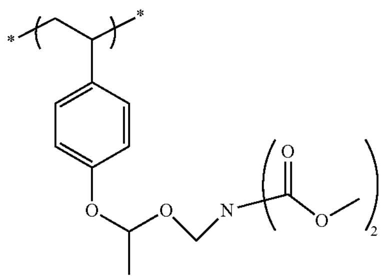
[Chem. 28]
(VI-60)
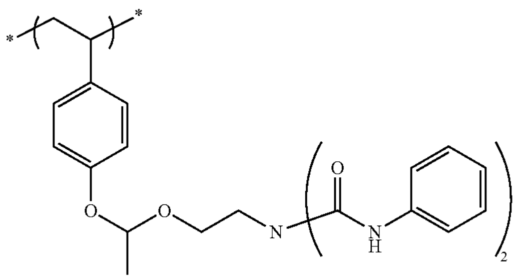
(VI-61)
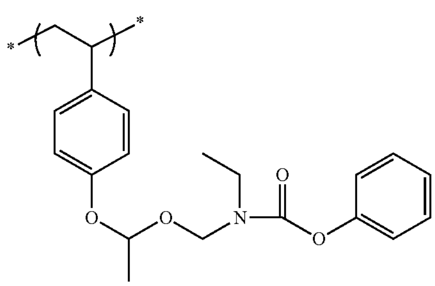
(VI-62)
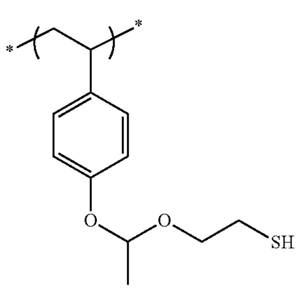
(VI-63)
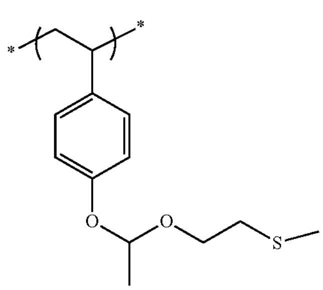
-continued
(VI-64)
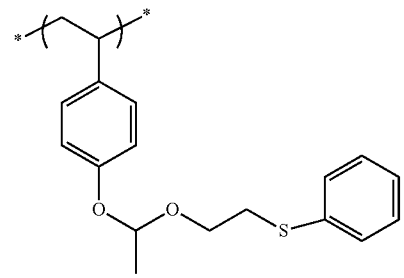
(VI-65)
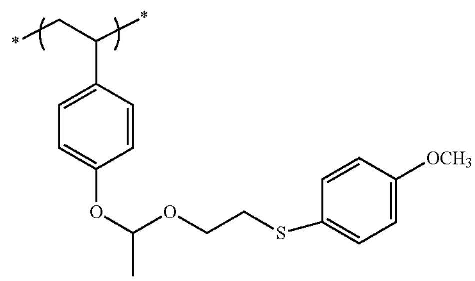
(VI-66)
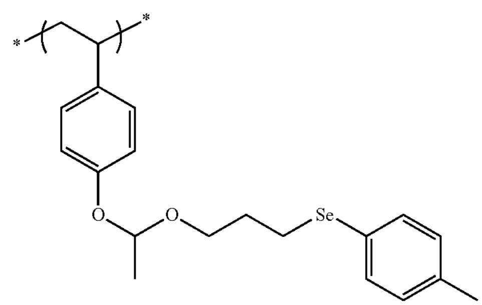
(VI-67)
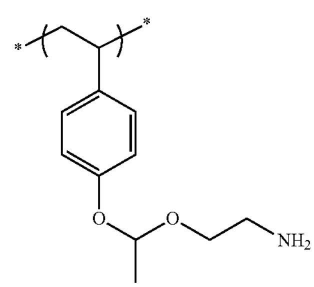
(VI-68)
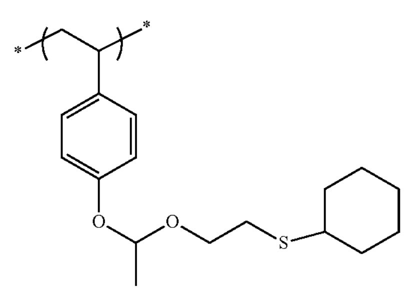

-continued
(VI-69)
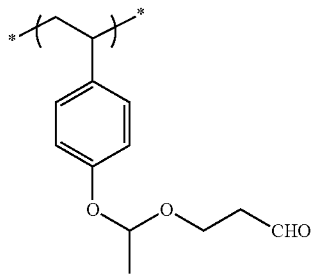
(VI-70)
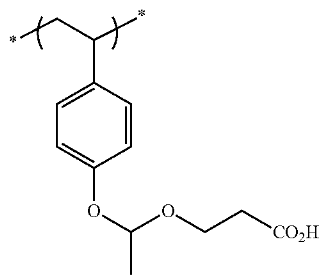
(VI-71)
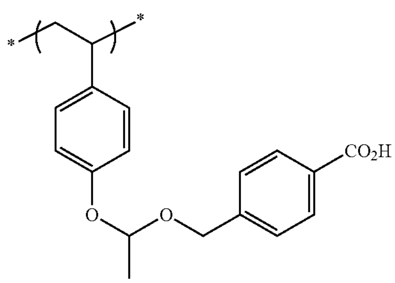
(VI-72)
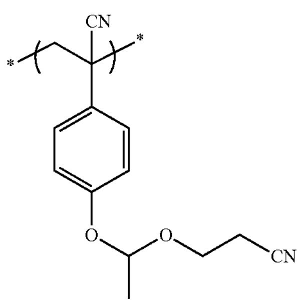
(VI-73)
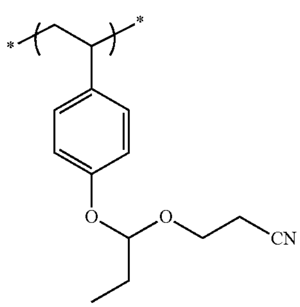
-continued
(VI-74)
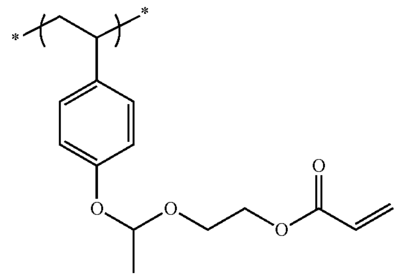
(VI-75)
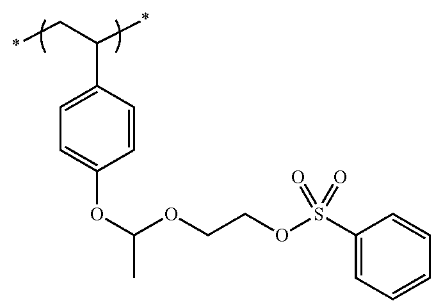
(VI-76)
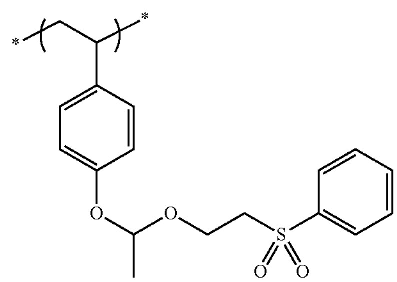
(VI-77)
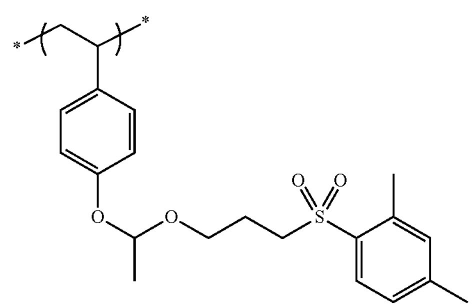
(VI-78)
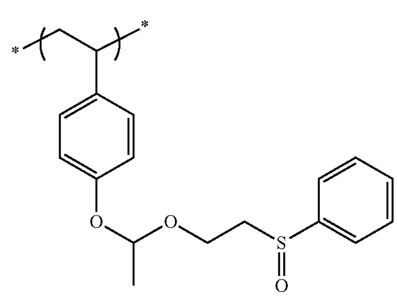

-continued
(VI-79)
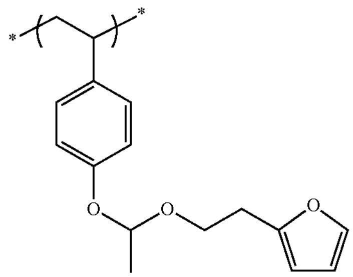
(VI-80)
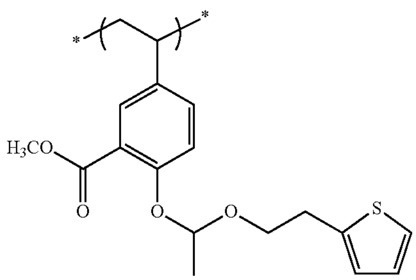
(VI-81)
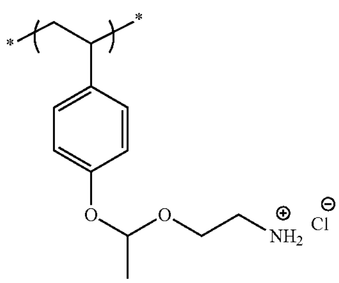
(VI-82)
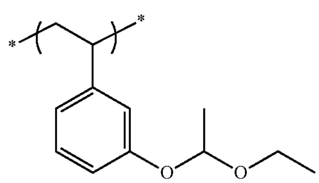
(VI-83)
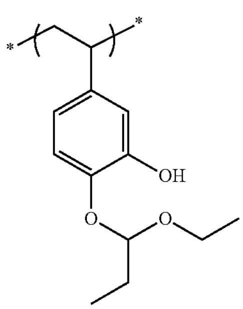
-continued
[Chem. 29]
(VI-84)
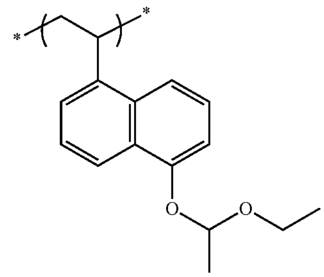
(VI-85)
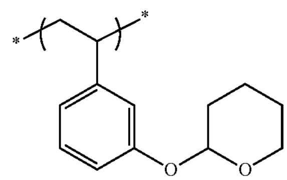
(VI-86)
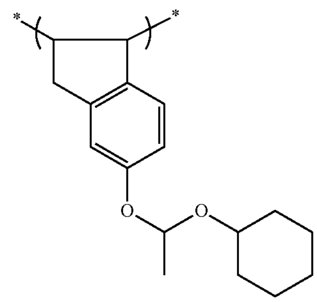
(VI-87)
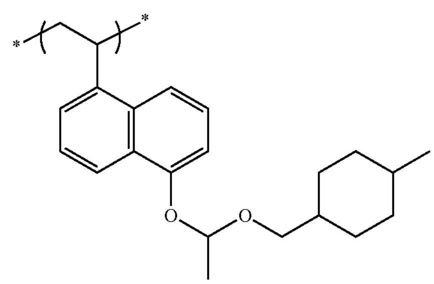
(VI-88)
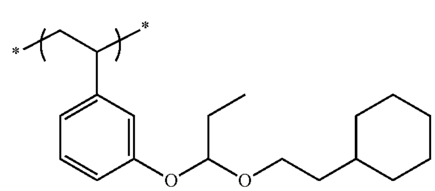
(VI-89)
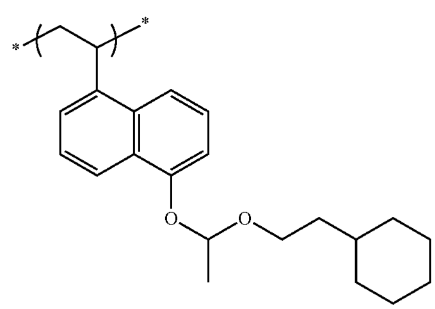

-continued
(VI-90)
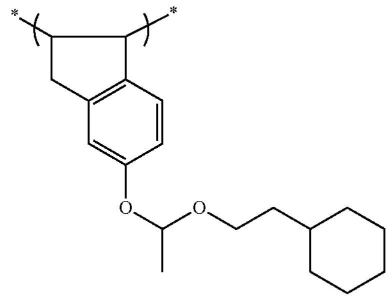
(VI-91)
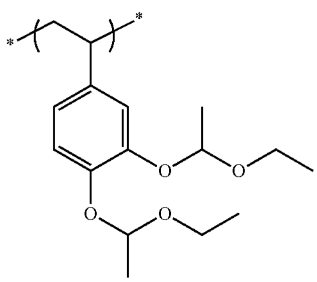
(VI-92)
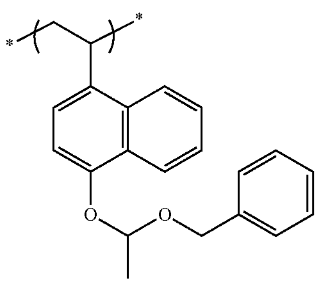
(VI-93)
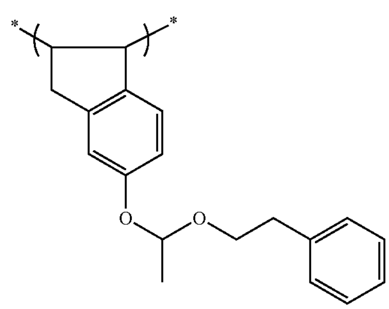
(VI-94)
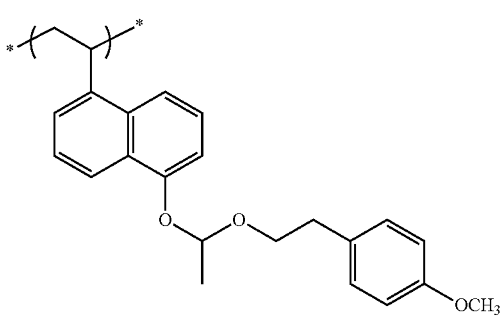
-continued
(VI-95)
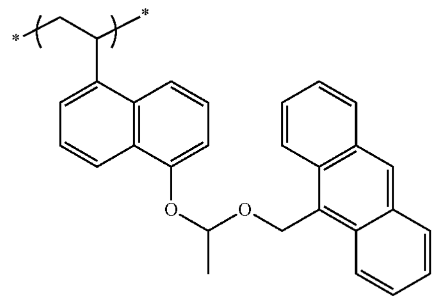
(VI-96)
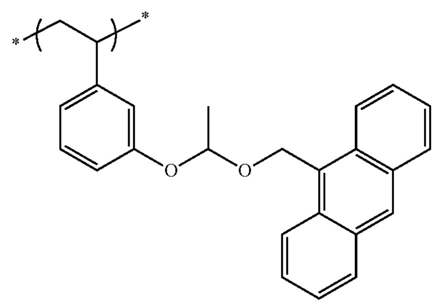
(VI-97)
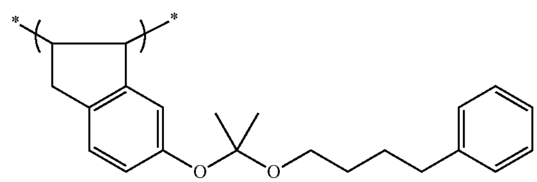
(VI-98)
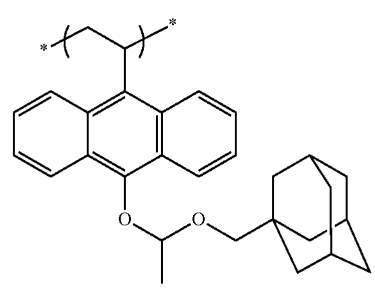
(VI-99)
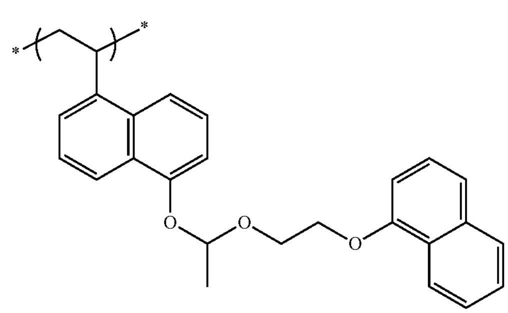

-continued
(VI-100)
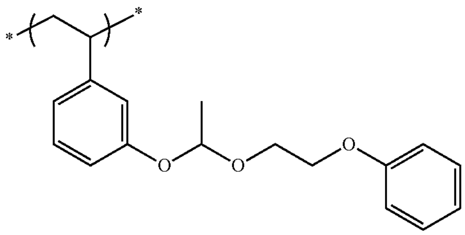
(VI-101)
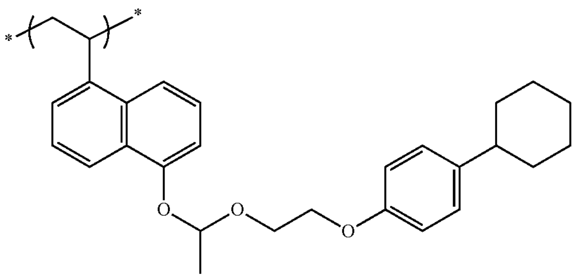
(VI-102)
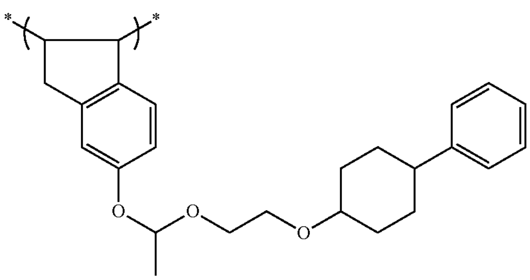
(VI-103)
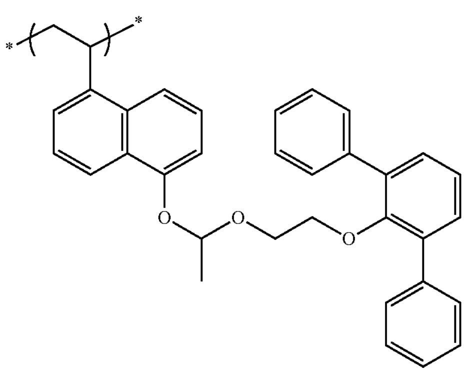
(VI-104)
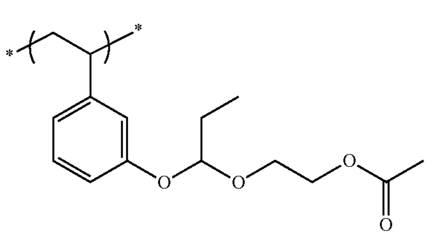
-continued
(VI-105)
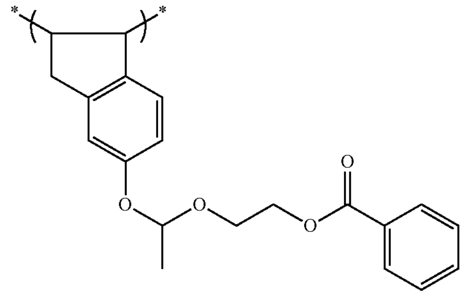
(VI-106)
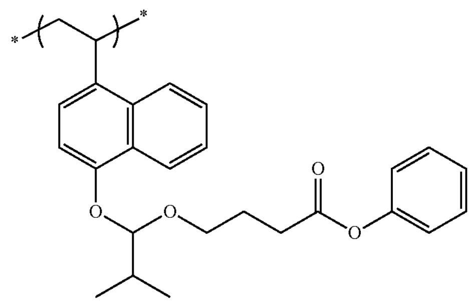
(VI-107)
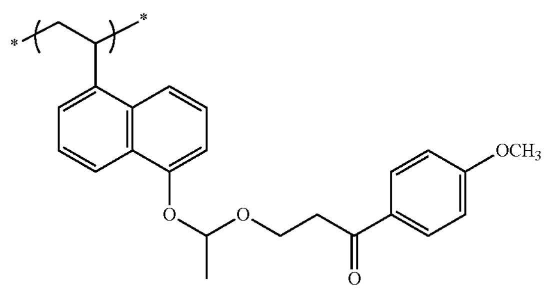
(VI-108)
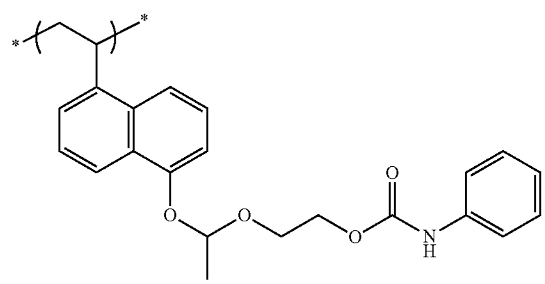
(VI-109)
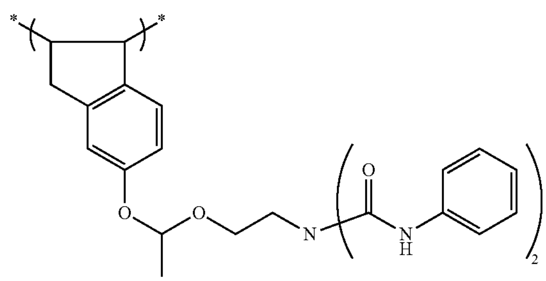

-continued (VI-110)

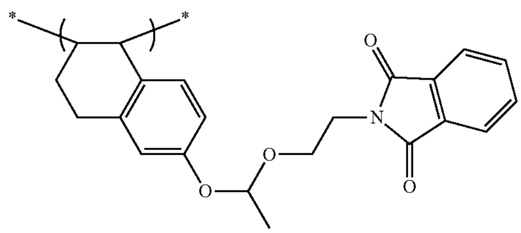

(VI-111)

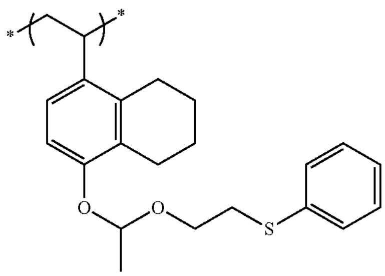

(VI-112)

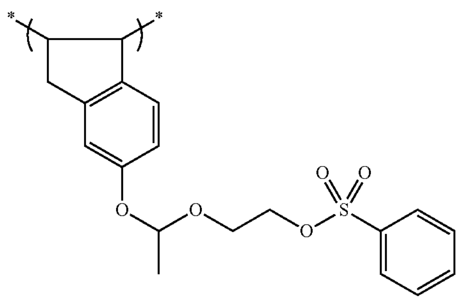

The resin (A) also preferably contains a repeating unit represented by formula (4) shown below.

[Chem. 33]

(4)

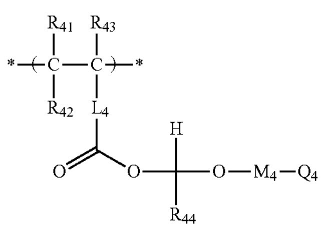

In formula (4), each of $R_{41}$, $R_{42}$ and $R_{43}$ independently represents a hydrogen atom, an alkyl group, a cycloalkyl group, a halogen atom, a cyano group or an alkoxycarbonyl group, or $R_{42}$ may be connected to $L_4$ to form a ring, and in this case $R_{42}$ represents an alkylene group.

$L_4$ represents a single bond or a divalent group, and when $L_4$ is connected to $R_{42}$ to form a ring, $L_4$ represents a trivalent connecting group.

$R_{44}$ represents an alkyl group, a cycloalkyl group, an aryl group, an aralkyl group, an alkoxy group, an acyl group or a heterocyclic group.

$M_4$ represents a single bond or a divalent group.

$Q_4$ represents an alkyl group, a cycloalkyl group, an aryl group or a heterocyclic group.

At least two of $Q_4$, $M_4$ and $R_{44}$ may be connected to form a ring.

$R_{41}$, $R_{42}$ and $R_{43}$ have the same meanings as $R_{51}$, $R_{52}$ and $R_{53}$ in formula (V) described above, and the preferred range is also the same.

$L_4$ has the same meaning as $L_5$ in formula (V) described above, and the preferred range is also the same.

$R_{44}$ has the same meaning as $R_3$ in formula (3) described above, and the preferred range is also the same.

$M_4$ has the same meaning as $M_3$ in formula (3) described above, and the preferred range is also the same.

$Q_4$ has the same meanings as $Q_3$ in formula (3) described above, and the preferred range is also the same. The ring which is formed by connecting at least two of $Q_4$, $M_4$ and $R_{44}$ includes the ring which is formed by connecting at least two of $Q_3$, $M_3$ and $R_3$, and the preferred range is also the same.

Specific examples of the repeating unit represented by formula (4) are set forth below, but the invention should not be construed as being limited thereto.

[Chem, 34]

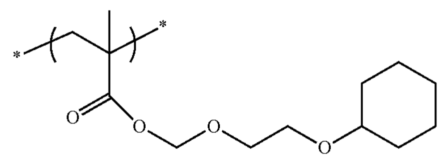

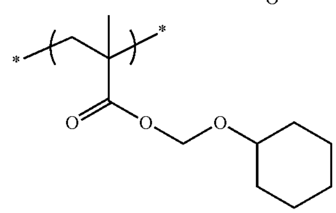

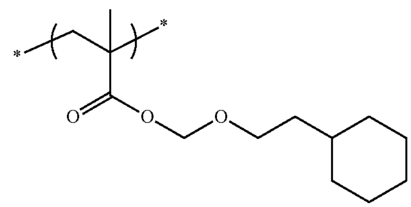

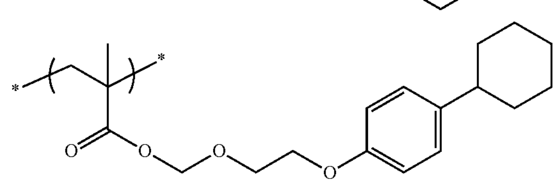

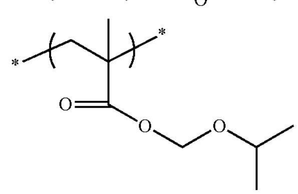

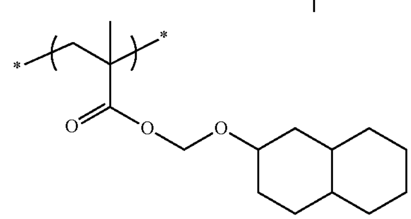

-continued
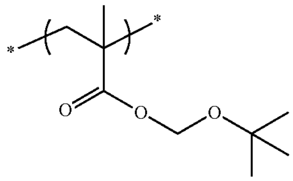
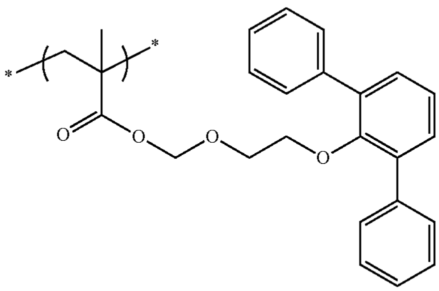
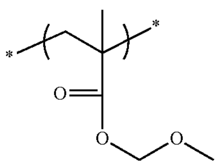
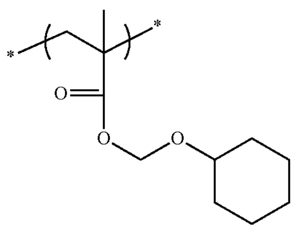
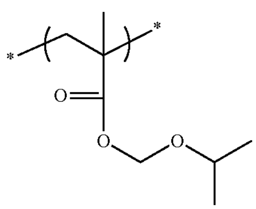
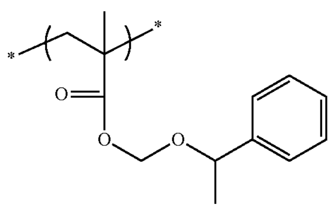
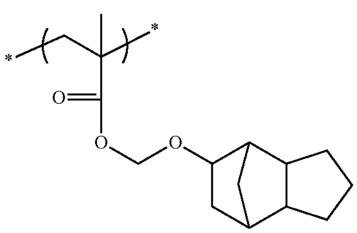
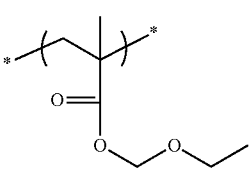
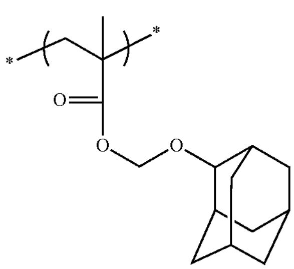
-continued
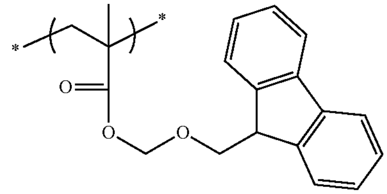
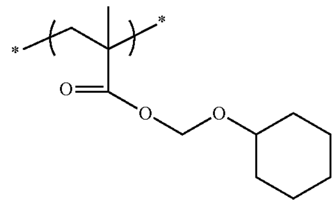
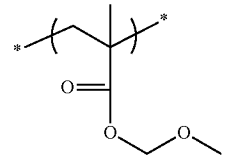
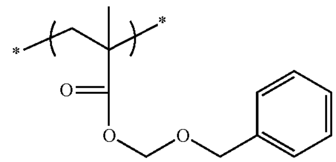
[Chem. 35]
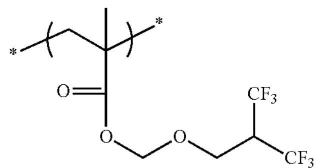
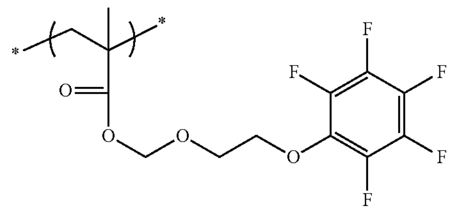
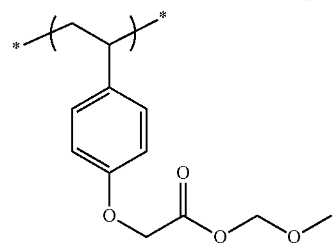
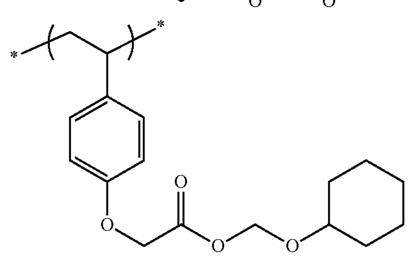
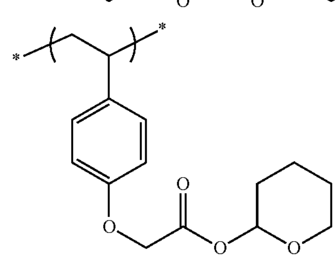

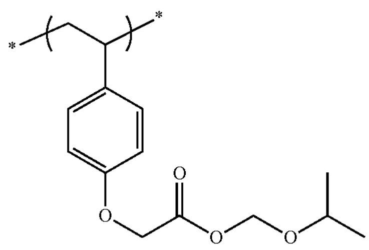
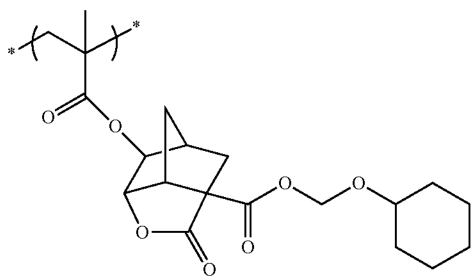
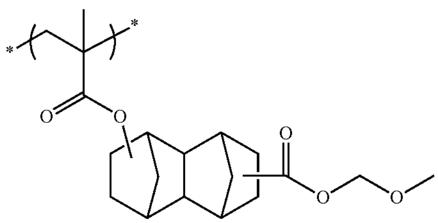
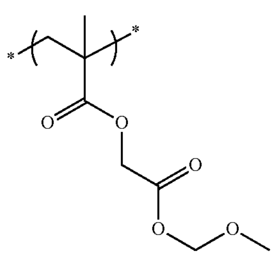
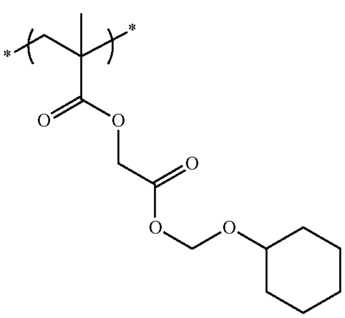
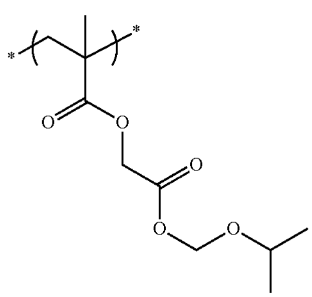
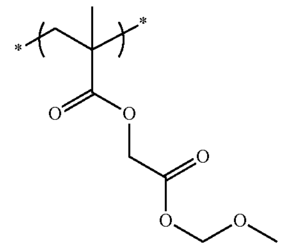
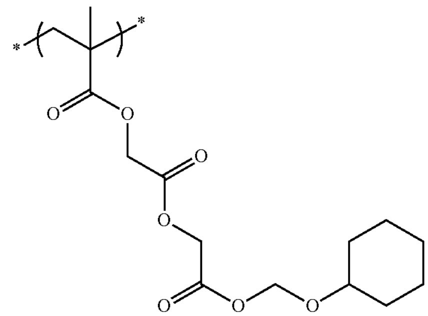
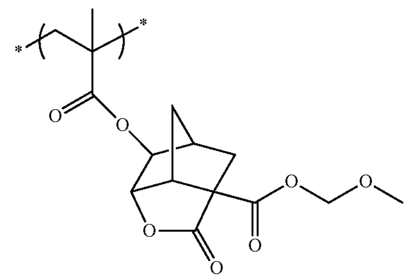
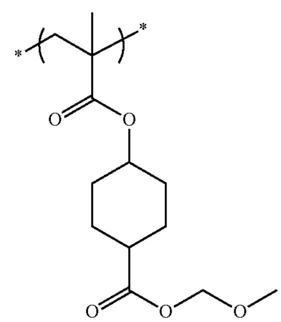
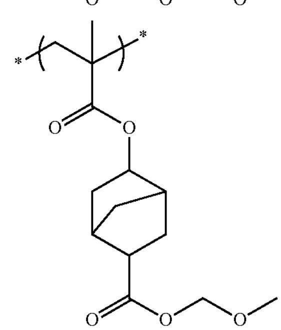
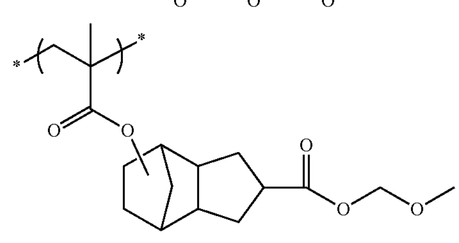

-continued

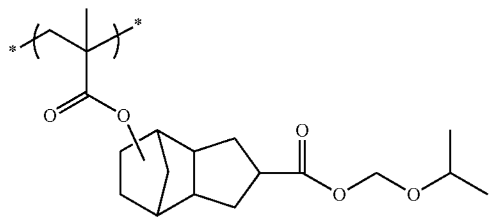

[Chem. 36]

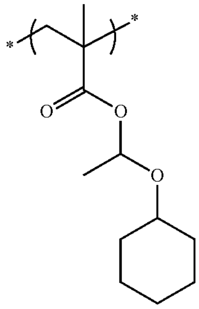

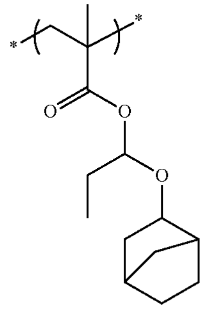

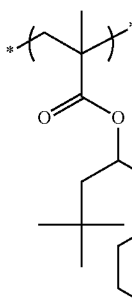

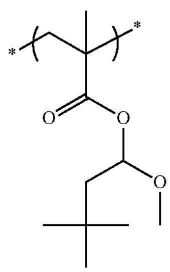

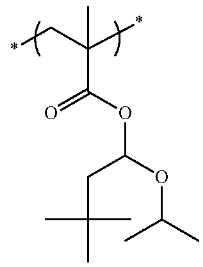

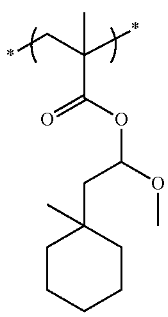

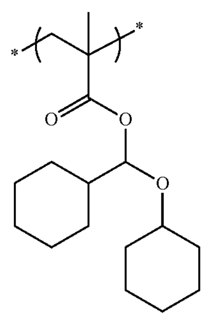

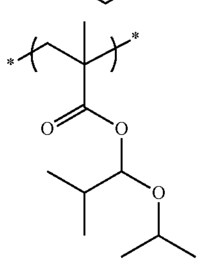

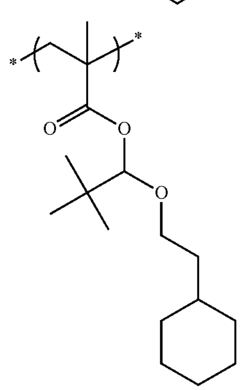

-continued

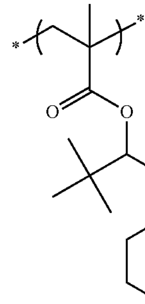

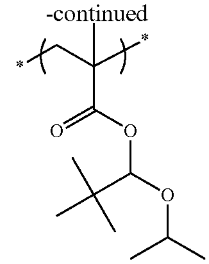

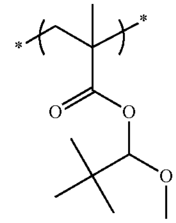

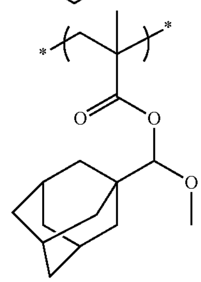

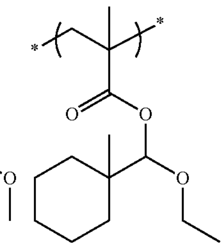

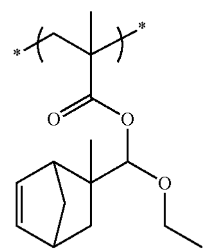

Further, the resin (A) may contain a repeating unit represented by formula (BZ) shown below as the repeating unit (a).

[Chem. 37]

(BZ)

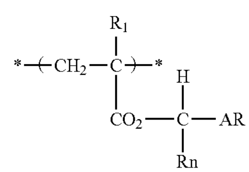

In formula (BZ), AR represents an aryl group. Rn represents an alkyl group, a cycloalkyl group or an aryl group. Rn and AR may be connected to each other to form a non-aromatic ring.

$R_1$ represents a hydrogen atom, an alkyl group, a cycloalkyl group, a halogen atom, a cyano group or an alkyloxycarbonyl group.

The aryl group represented by AR is preferably an aryl group having from 6 to 20 carbon atoms, for example, a phenyl group, a naphthyl group, an anthryl group or a fluorene group, and more preferably an aryl group having from 6 to 15 carbon atoms.

When AR is a naphthyl group, an anthryl group or a fluorene group, the connecting position where the carbon atom to which Rn is connected and ART are connected is not particularly limited. For example, when AR is a naphthyl group, the carbon atom may be connected to the α-position or β-position of the naphthyl group. When AR is an anthryl group, the carbon atom may be connected to the 1-position, 2-position or 9-position of the anthryl group.

The aryl group represented by AR may have one or more substituents. Specific examples of the substituent include a straight-chain or branched alkyl group having from 1 to 20 carbon atoms, for example, a methyl group, an ethyl group, a propyl group, an isopropyl group, an n-butyl group, an isobutyl group, a tert-butyl group, a pentyl group, a hexyl group, an octyl group or a dodecyl group, an alkoxy group containing the alkyl group moiety described above, a cycloalkyl group, for example, a cyclopentyl group or a cyclohexyl group, a cycloalkoxy group containing the cycloalkyl group moiety described above, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue, for example, a pyrrolidone residue. Of these substituents, a straight-chain or branched alkyl group having from 1 to 5 carbon atoms and an alkoxy group containing the alkyl group moiety described above are preferred, and a para-methyl group and a para-methoxy group are more preferred.

When the aryl group represented by AR has a plurality of substituents, at least two of the plurality of substituents may be connected to each other to form a ring. The ring is preferably a 5-membered to 8-membered ring, and more preferably a 5-membered or 6-membered ring. Also, the ring may be a hetero ring containing a hetero atom, for example, an oxygen atom, a nitrogen atom or a sulfur atom, as a ring member.

Further, the ring may have a substituent. The substituent includes the same as the further substituent which Rn may have described below.

Also, the repeating unit (a) represented by formula (BZ) preferably contains two or more aromatic rings from the standpoint of roughness performance. Ordinarily, the number of the aromatic rings contained in the repeating unit is preferably 5 or less, and more preferably 3 or less.

Also, from the standpoint of roughness performance, in the repeating unit (a) represented by formula (BZ), AR preferably has 2 or more aromatic rings, and AR is more preferably a naphthyl group or a biphenyl group. Ordinarily, the number of the aromatic rings contained in AR is preferably 5 or less, and more preferably 3 or less.

Rn represents an alkyl group, a cycloalkyl group or an aryl group, as described above.

The alkyl group represented by Rn may be a straight-chain alkyl group or a branched alkyl group. The alkyl group preferably includes an alkyl group having from 1 to 20 carbon atoms, for example, a methyl group, an ethyl group, a propyl group, an isopropyl group, an n-butyl group, an isobutyl group, a tert-butyl group, a pentyl group, a hexyl group, a cyclohexyl group, an octyl group or a dodecyl group. The alkyl group represented by Rn is preferably an alkyl group having from 1 to 5 carbon atoms, and more preferably an alkyl group having from 1 to 3 carbon atoms.

The cycloalkyl group represented by Rn includes a cycloalkyl group having from 3 to 15 carbon atoms, for example, a cyclopentyl group or a cyclohexyl group.

The aryl group represented by Rn preferably includes an aryl group having from 6 to 14 carbon atoms, for example, a phenyl group, a xylyl group, a tolyl group, a cumenyl group, a naphthyl group or an anthryl group.

Each of the alkyl group, cycloalkyl group and aryl group represented by Rn may further have a substituent. The substituent includes, for example, an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group and a heterocyclic residue, for example, a pyrrolidone residue. Of the substituents, an alkoxy group, a hydroxyl group, a halogen atom, a nitro group, an acyl group, an acyloxy group, an acylamino group and a sulfonylamino group are particularly preferred.

$R_1$ represents a hydrogen atom, an alkyl group, a cycloalkyl group, a halogen atom, a cyano group or an alkyloxycarbonyl group, as described above.

The alkyl group and the cycloalkyl group represented by $R_1$ include, for example, the same as those described as to Rn above. Each of the alkyl group and the cycloalkyl group may have a substituent. The substituent includes, for example, the same as those described as to Rn above.

When the $R_1$ is the alkyl group having a substituent or the cycloalkyl group having a substituent, $R_1$ particularly preferably includes, for example, trifluoromethyl group, an alkyloxycarbonylmethyl group, an alkylcarbonyloxymethyl group, a hydroxymethyl group and an alkoxymethyl group.

The halogen atom represented by $R_1$ includes a fluorine atom, a chlorine atom, a bromine atom and an iodine atom. Of the halogen atoms, a fluorine atom is particularly preferred.

As the alkyl group moiety contained in the alkyloxycarbonyl group represented by $R_1$, for example, the constitution described for the alkyl group represented by $R_1$ above can be employed.

It is preferred that Rn and AR are connected to each other to form a non-aromatic ring and particularly it is able to more improve the roughness performance.

The non-aromatic ring which may be formed by connecting Rn and AR to each other is preferably a 5-membered to 8-membered ring, and more preferably a 5-membered or 6-membered ring.

The non-aromatic ring may be an aliphatic ring or may be a hetero ring containing a hetero atom, for example, an oxygen atom, a nitrogen atom or a sulfur atom, as a ring member.

The non-aromatic ring may have a substituent. The substituent includes, for example, the same as the further substituent which Rn may have described above.

Specific examples of the repeating unit (a) represented by formula (BZ) are set forth below, but the invention should not be construed as being limited thereto.

[Chem. 38]

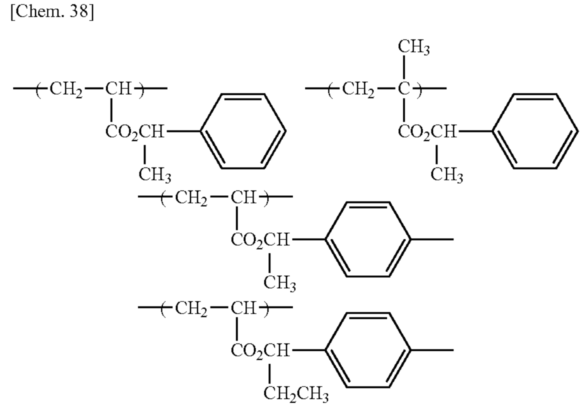

-continued
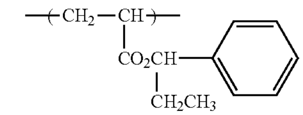
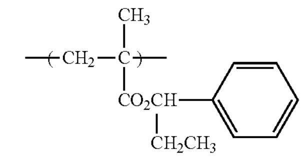
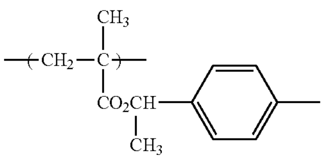
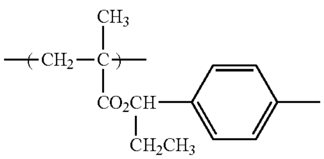
[Chem. 39]
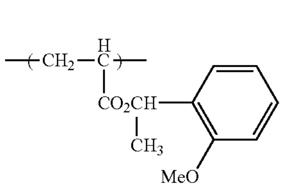
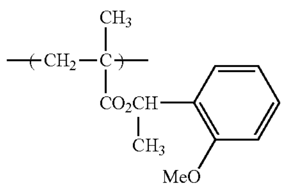
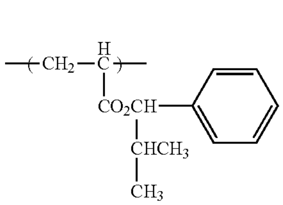
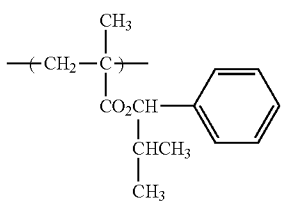
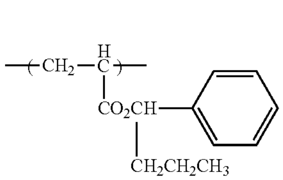
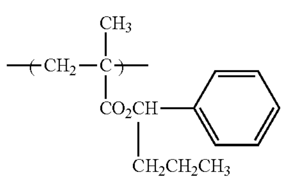
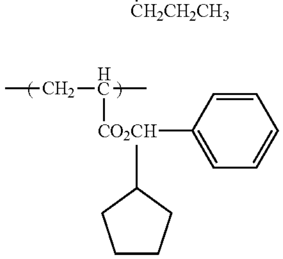
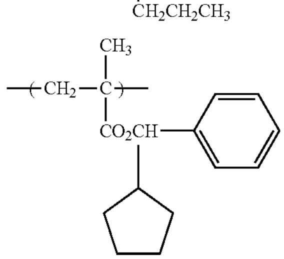
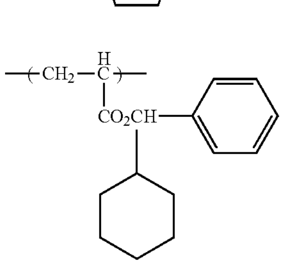
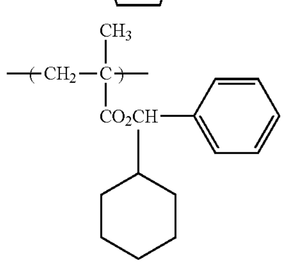
-continued
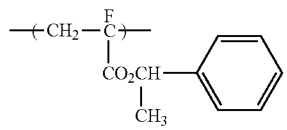
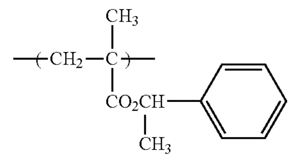
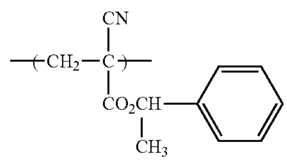
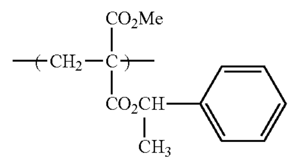
[Chem. 40]
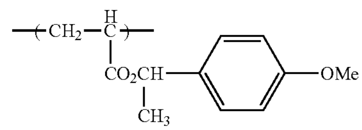
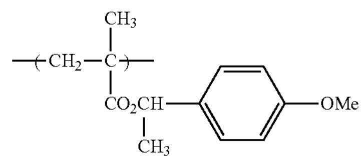
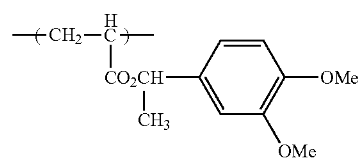
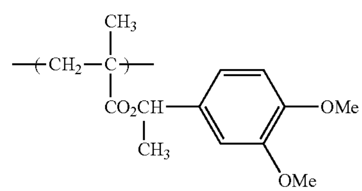
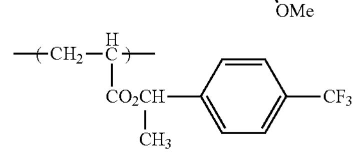
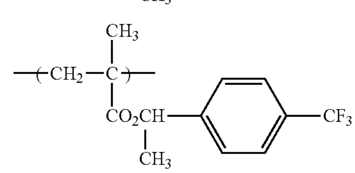
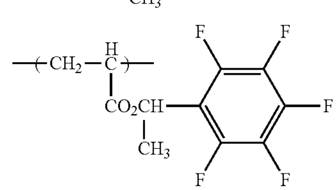
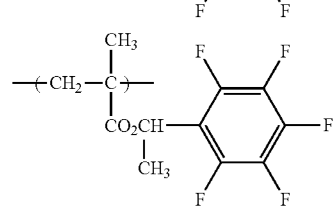

-continued
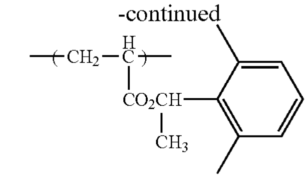
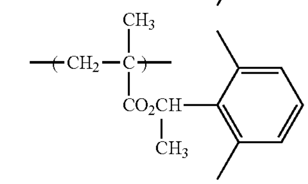
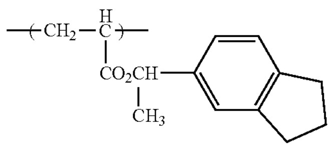
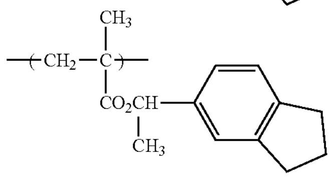
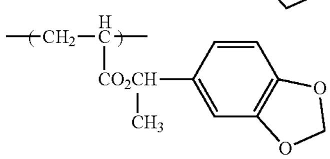
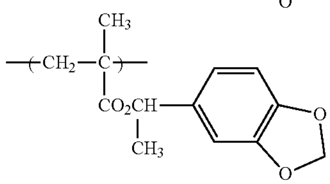
[Chem. 41]
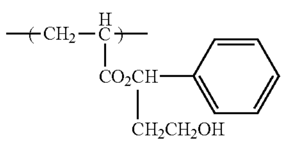
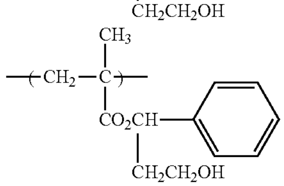
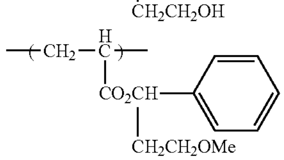
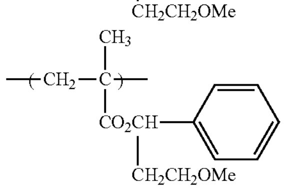
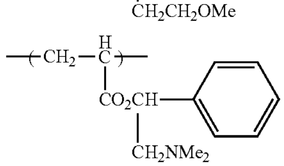
-continued
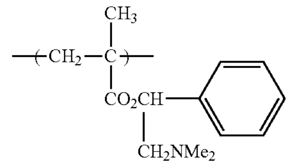
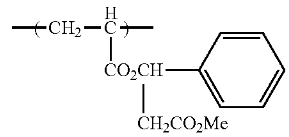
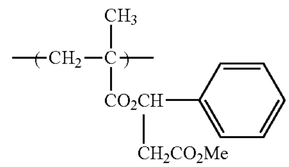
[Chem. 42]
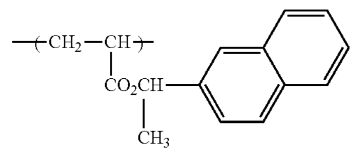
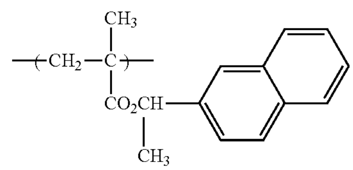
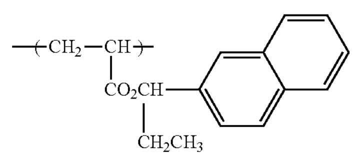
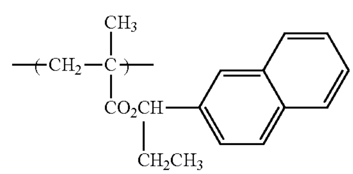
[Chem. 43]
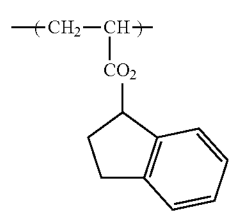
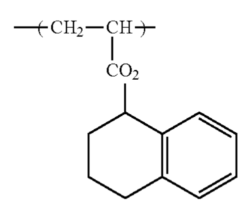
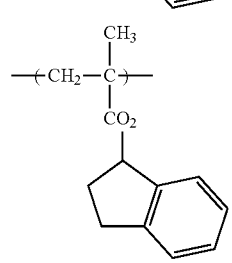
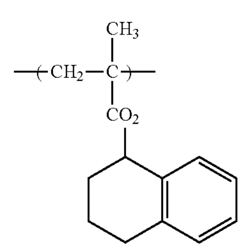

-continued
[Chem. 44]
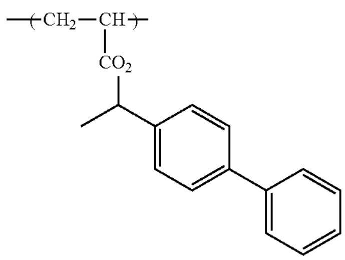
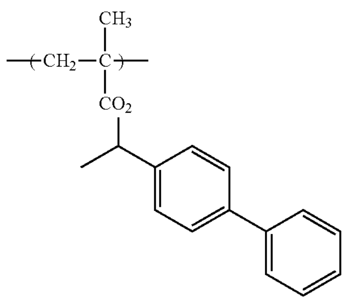
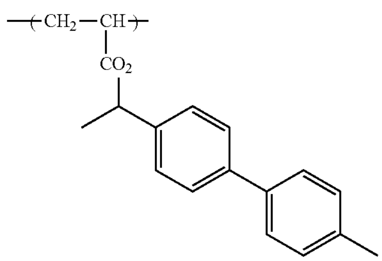
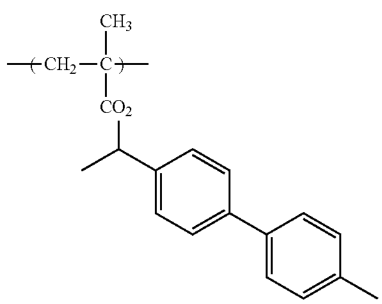
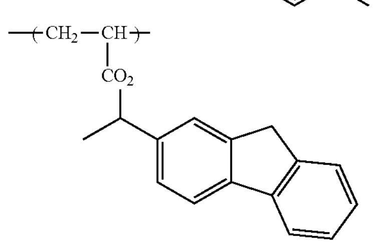
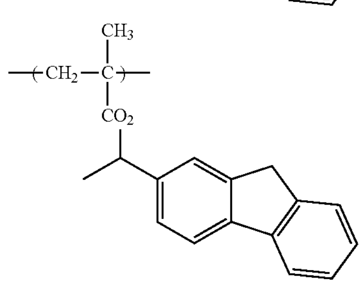
-continued
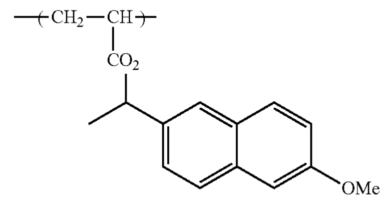
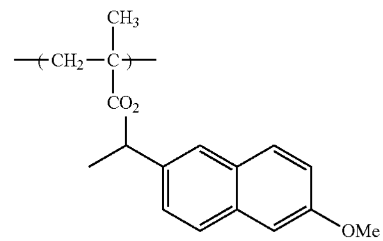
[Chem. 45]
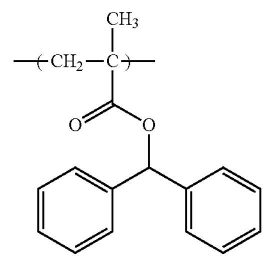
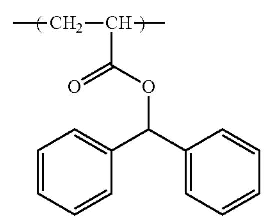
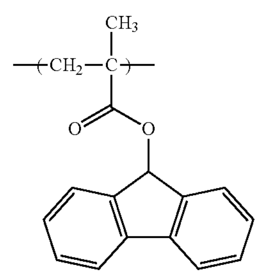
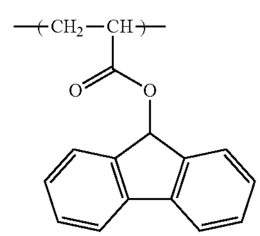
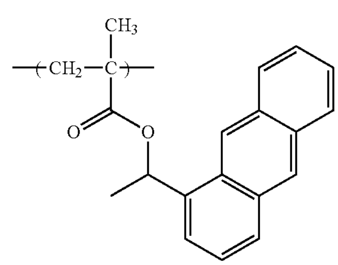
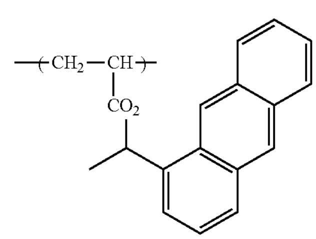

-continued

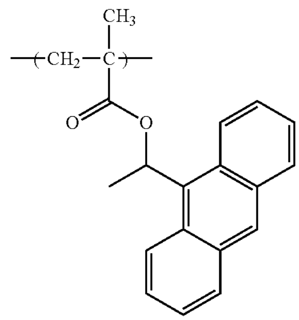

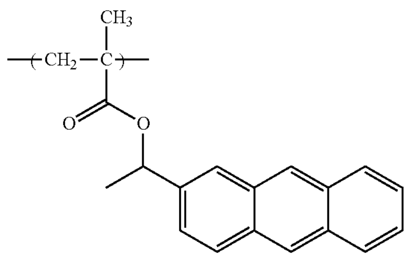

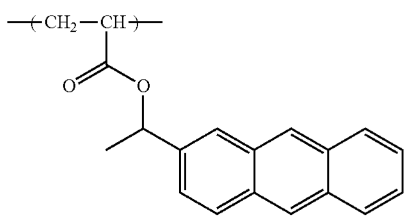

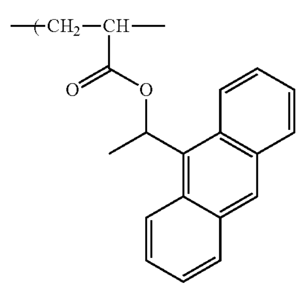

[Chem. 46]

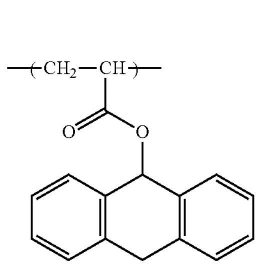

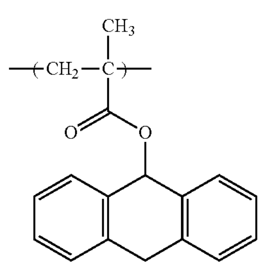

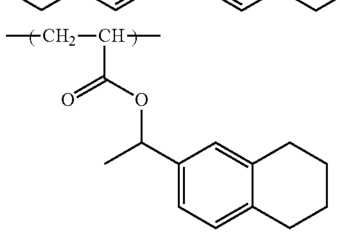

-continued

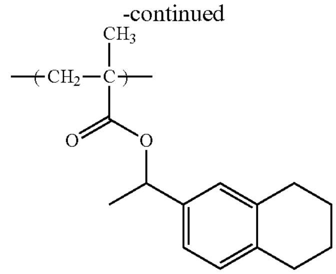

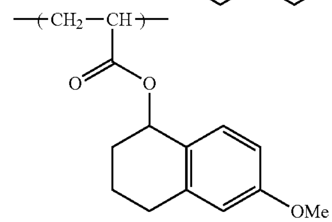

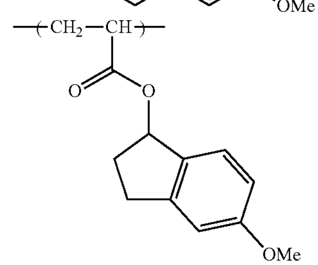

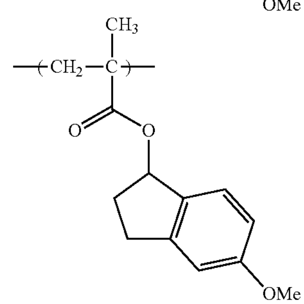

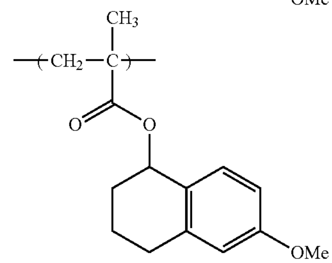

The repeating unit having an acid-decomposable group may be used one kind or in combination of two or more kinds thereof.

The content of the repeating unit having an acid-decomposable group (in the case of containing plural kinds of repeating units, the total thereof) in the resin (A) is preferably from 5 to 80% by mole, more preferably from 5 to 75% by mole, still more preferably from 10 to 65% by mole, based on the total repeating units in the resin (A).

The resin (A) is particularly preferably a resin containing a repeating unit represented by formula (1) shown below and the repeating unit represented by formula (3) or (4) described above.

(b) Repeating Unit Represented by Formula (1)

The resin (A) according to the invention preferably contains a repeating unit represented by formula (1) shown below.

[Chem. 47]

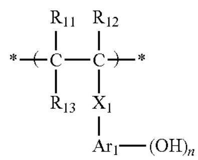

(1)

In formula (1), each of $R_{11}$, $R_{12}$ and $R_{13}$ independently represents a hydrogen atom, an alkyl group, a cycloalkyl group, a halogen atom, a cyano group or an alkoxycarbonyl group, or $R_{13}$ may be connected to $Ar_1$ to form a ring and in this case $R_{13}$ represents an alkylene group.

$X_1$ represents a single bond or a divalent connecting group.

$Ar_1$ represents an (n+1) valent aromatic ring group, and when $Ar_1$ is connected to $R_{13}$ to form a ring, $Ar_1$ represents an (n+2) valent aromatic ring group.

n represents an integer from 1 to 4.

Specific examples of the alkyl group, cycloalkyl group, halogen atom and alkoxycarbonyl group represented by any of $R_{11}$, $R_{12}$ and $R_{13}$ in formula (1) and the substituents which these groups may have are same as the specific examples described for these groups represented by $R_{51}$, $R_{52}$ and $R_{53}$ in formula (V) described above.

$Ar_1$ represents an (n+1) valent aromatic ring group. In the case where n is 1, the divalent aromatic ring group may have a substituent, preferred examples thereof include an arylene group having from 6 to 18 carbon atoms, for example, a phenylene group, a tolylene group, a naphthylene group or a anthracenyl group, and an aromatic ring group containing a hetero ring, for example, thiophene, furan, pyrrole, benzothiophene, benzofuran, benzopyrrole, triazine, imidazole, benzimidazole, triazole, thiadiazole or thiazole.

Specific examples of the (n+1) valent aromatic ring group in the case where n is an integer of 2 or more preferably include groups formed by removing an (n−1) number of appropriate hydrogen atoms from the specific examples of the divalent aromatic ring group described above.

The (n+1) valent aromatic ring group may further have a substituent.

The substituents which the alkylene group and (n+1) valent aromatic ring group may have include the alkyl group represented by any of $R_{51}$ to $R_{53}$ in formula (V), an alkoxy group, for example, a methoxy group, an ethoxy group, a hydroxyethoxy group, a propoxy group, a hydroxypropoxy group or a butoxy group, and an aryl group, for example, a phenyl group.

The divalent connecting group represented by $X_1$ includes —COO— and —$CONR_{64}$—. The alkyl group for $R_{64}$ of the —$CONR_{64}$— ($R_{64}$ represents a hydrogen atom or an alkyl group) represented by $X_1$ is the same as the alkyl group represented by any of $R_{61}$ to $R_{63}$.

$X_1$ is preferably a single bond, —COO— or —CONH—, and more preferably a single bond or —COO—.

$Ar_1$ is more preferably an aromatic ring group having from 6 to 18 carbon atoms which may have a substituent, and particularly preferably a benzene ring group, a naphthalene ring group or a biphenylene ring group.

The repeating unit (b) preferably has a hydroxystyrene structure. That is, $Ar_1$ is preferably a benzene ring group.

n represents an integer from 1 to 4, preferably 1 or 2, and more preferably 1.

Specific examples of the repeating unit represented by formula (1) are set forth below, but the invention should not be construed as being limited thereto. In the formulae, a represents 1 or 2.

[Chem. 48]

(B-1)

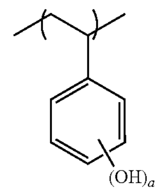

(B-2)

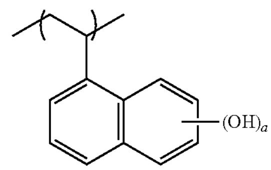

(B-3)

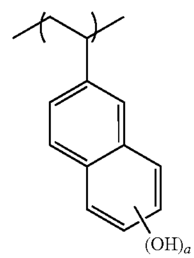

(B-4)

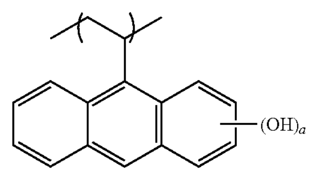

(B-5)

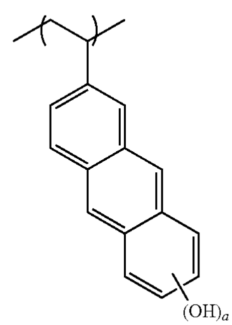

(B-6)

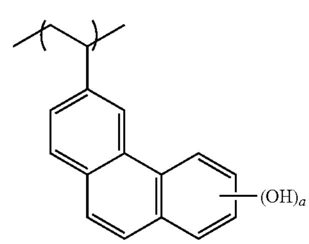

-continued
(B-7)
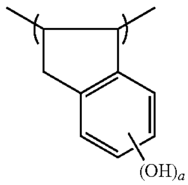
(B-8)
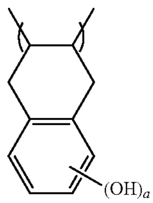
(B-9)
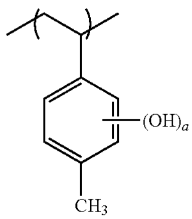
(B-10)
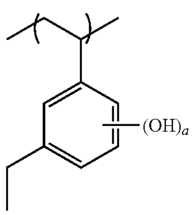
(B-11)
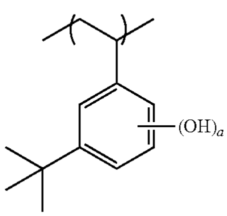
(B-12)
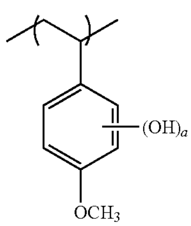
(B-13)
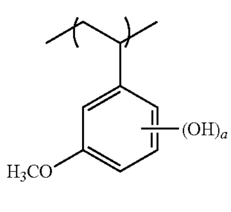
-continued
(B-14)
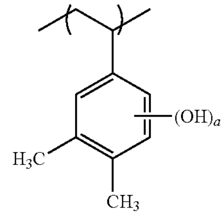
(B-15)
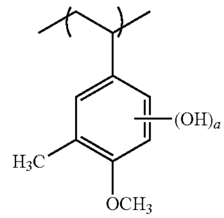
(B-16)
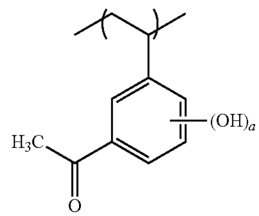
(B-17)
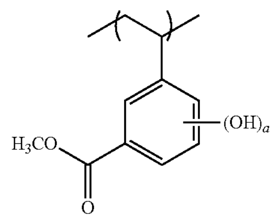
(B-18)
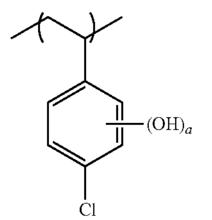
(B-19)
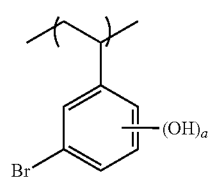
(B-20)
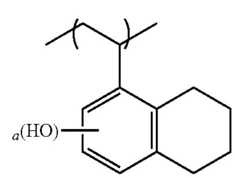

-continued
(B-21)
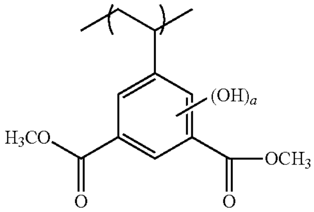
(B-22)
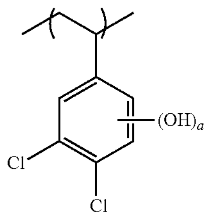
(B-23)
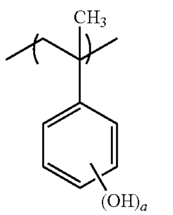
(B-24)
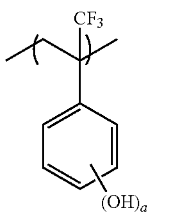
(B-25)
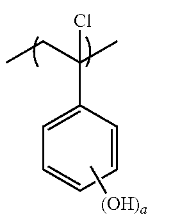
(B-26)
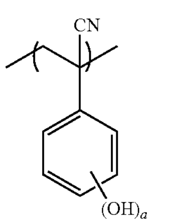
(B-27)
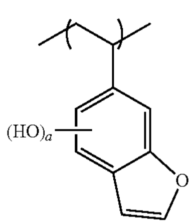
-continued
(B-28)
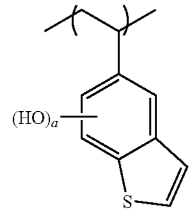
(B-29)
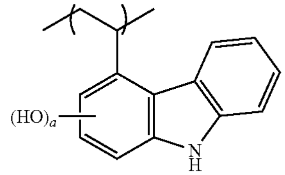
(B-30)
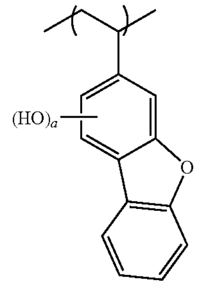
(B-31)
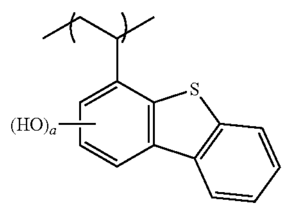
(B-32)
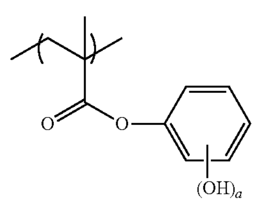
(B-33)
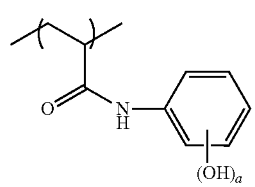
(B-34)
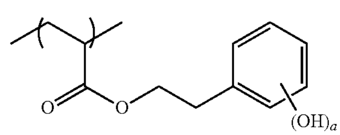

-continued

[Chem. 49]

(B-35)

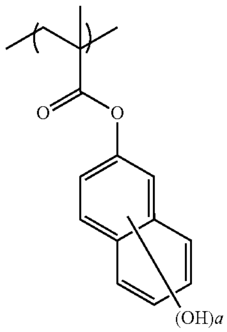

(B-36)

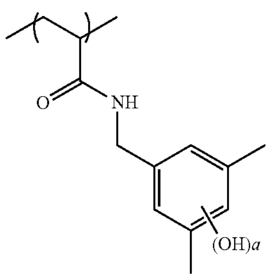

(B-37)

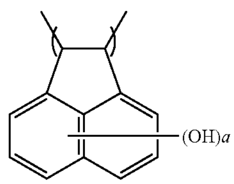

(B-38)

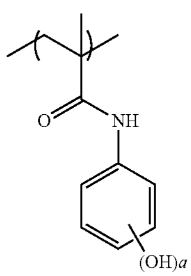

The resin (A) may contain two or more kinds of the repeating units represented by formula (1).

The content of the repeating unit represented by formula (1) (in the case of containing plural kinds of repeating units, the total thereof) is preferably in a range from 3 to 98% by mole, more preferably in a range from 10 to 80% by mole, still more preferably in a range from 25 to 70% by mole, based on the total repeating units in the resin (A).

(c) Repeating Unit Having a Polar Group Other than Repeating Unit Represented by Formula (1)

The resin (A) preferably contains (c) a repeating unit having a polar group. By containing the repeating unit (c), for example, the sensitivity of the composition containing the resin can be enhanced. The repeating unit (c) is preferably a non-acid-decomposable repeating unit (that is, has no acid-decomposable group).

The "polar group" which can be contained in the repeating unit (c) includes, for example, the following (1) to (4). In the following, the "electronegativity" means a Pauling's value.

(1) Functional Group Containing a Structure where an Oxygen Atom and an Atom Having an Electronegativity Difference from Oxygen Atom of 1.1 or More are Connected Through a Single Bond Examples of such a polar group include a group containing a structure represented by O—H, for example, a hydroxyl group.

(2) Functional Group Containing a Structure where a Nitrogen Atom and an Atom Having an Electronegativity Difference from Nitrogen Atom of 0.6 or More are Connected Through a Single Bond Examples of such a polar group include a group containing a structure represented by N—H, for example, an amino group.

(3) Functional Group Containing a Structure where Two Atoms Differing in the Electronegativity by 0.5 or More are Connected Through a Double Bond or a Triple Bond Examples of such a polar group include a group containing a structure represented, for example, by C≡N, C═O, N═O, S═O or C═N.

(4) Functional Group Having an Ionic Moiety

Examples of such a polar group include a group containing a moiety represented, for example, by $N^+$ or $S^+$.

Specific examples of the partial structure which can be contained in the "polar group" are set forth below.

[Chem. 50]

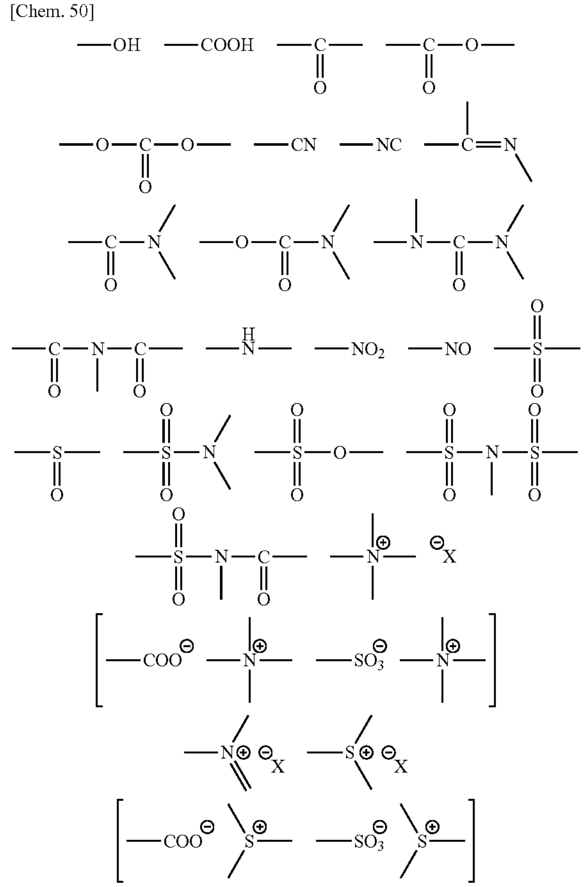

The polar group which can be contained in the repeating unit (c) is preferably selected from a hydroxyl group, a cyano group, a lactone group, a sultone group, a carboxylic acid group, a sulfonic acid group, an amido group, a sulfonamido group, an ammonium group, a sulfonium group, a carbonate group (—O—CO—O—) and a group composed of a combination of two or more thereof, and particularly preferably an alcoholic hydroxyl group, a cyano group, a lactone group, a sultone group or a group containing a cyanolactone structure.

When a repeating unit having an alcoholic hydroxyl group is further incorporated into the resin, the exposure latitude (EL) of the composition containing the resin can be more enhanced.

When a repeating unit having a cyano group is further incorporated into the resin, the sensitivity of the composition containing the resin can be more enhanced.

When a repeating unit having a lactone group is further incorporated into the resin, the dissolution contrast for a developer containing an organic solvent can be more enhanced. Also, the composition containing the resin can be more improved in the dry etching resistance, coating property and adhesion property to a substrate.

When a repeating unit having a group containing a lactone structure having a cyano group is further incorporated into the resin, the dissolution contrast for a developer containing an organic solvent can be more enhanced. Also, the composition containing the resin can be further improved in the sensitivity, dry etching resistance, coating property and adhesion property to a substrate. In addition, a single repeating unit can play functions attributable to a cyano group and a lactone group, respectively, and the degree of freedom in designing the resin can also be more increased.

In the case where the polar group contained in the repeating unit (c) is an alcoholic hydroxyl group, the repeating unit is preferably represented by at least one formula selected from the group consisting of formulae (I-1H) to (I-10H) shown below. In particular, the repeating unit is more preferably represented by at least one formula selected from the group consisting of formulae (I-1H) to (I-3H) shown below, and still more preferably represented by formula (I-1H) shown below.

[Chem. 51]

(I-1H)

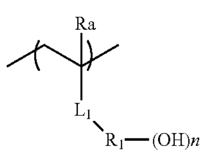

(I-2H)

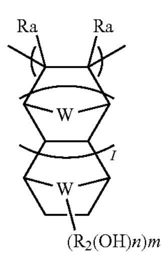

(I-3H)

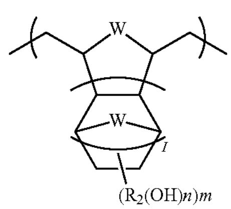

-continued (I-4H)

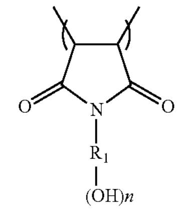

(I-5H)

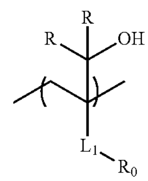

(I-6H)

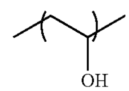

(I-7H)

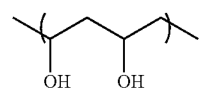

(I-8H)

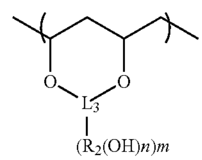

(I-9H)

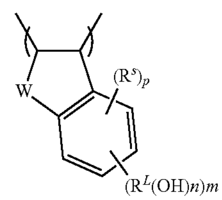

(I-10H)

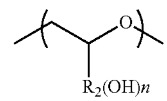

In the formulae, each Ra independently represents a hydrogen atom, an alkyl group or a group represented by $—CH_2—O—Ra_2$, wherein $Ra_2$ represents a hydrogen atom, an alkyl group or an acyl group.

$R_1$ represents an (n+1) valent organic group.

When m≥2, each $R_2$ independently represents a single bond or an (n+1) valent organic group.

W represents a methylene group, an oxygen atom or a sulfur atom.

Each of n and m represents an integer of 1 or more. In the case where $R_2$ in formula (I-2H), (I-3H) or (I-8H) represents a single bond, n is 1.

l represents an integer of 0 or more.

$L_1$ represents a connecting group represented by —COO—, —OCO—, —CONH—, —O—, —Ar—, $—SO_3—$ or $—SO_2NH—$, wherein Ar represents a divalent aromatic ring group.

Each R independently represents a hydrogen atom or an alkyl group.

$R_0$ represents a hydrogen atom or an organic group.

$L_3$ represents an (m+2) valent connecting group.

When m≥2, each $R^L$ independently represents an (n+1) valent connecting group.

When p≥2, each $R^S$ independently represents a substituent, and when p≥2, a plurality of $R^S$ may be connected to each other to form a ring.

p represents an integer from 0 to 3.

Ra represents a hydrogen atom, an alkyl group or a group represented by —$CH_2$—O—$Ra_2$. Ra is preferably a hydrogen atom or an alkyl group having from 1 to 10 carbon atoms, more preferably a hydrogen or a methyl group.

W represents a methylene group, an oxygen atom or a sulfur atom. W is preferably a methylene group or an oxygen atom.

$R_1$ represents an (n+1) valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1) valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ is a chain hydrocarbon group, the chain hydrocarbon group may be strait-chain or branched. The number of carbon atoms in the chain hydrocarbon group is preferably from 1 to 8. For example, when $R_1$ and/or $R_2$ is an alkylene group, $R_1$ and/or $R_2$ is preferably a methylene group, an ethylene group, an n-propylene group, an isopropylene group, an n-butylene group, an isobutylene group or a sec-butylene group.

In the case where $R_1$ and/or $R_2$ is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The number of carbon atoms in the alicyclic hydrocarbon group is ordinarily 5 or more, preferably from 6 to 30, and more preferably from 7 to 25.

The alicyclic hydrocarbon group includes, for example, those having a partial structure enumerated below. Each of the partial structures may have a substituent. Also, in each of the partial structures, the methylene group (—$CH_2$—) may be replaced with an oxygen atom (—O—), a sulfur atom (—S—), a carbonyl group [—C(=O)—], a sulfonyl group [—$S(=O)_2$—], a sulfinyl group [—S(=O)—] or an imino group [—N(R)—] (wherein R is a hydrogen atom or an alkyl group).

[Chem. 52]

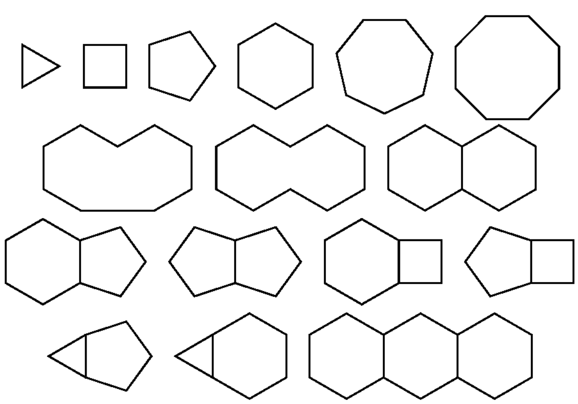

-continued

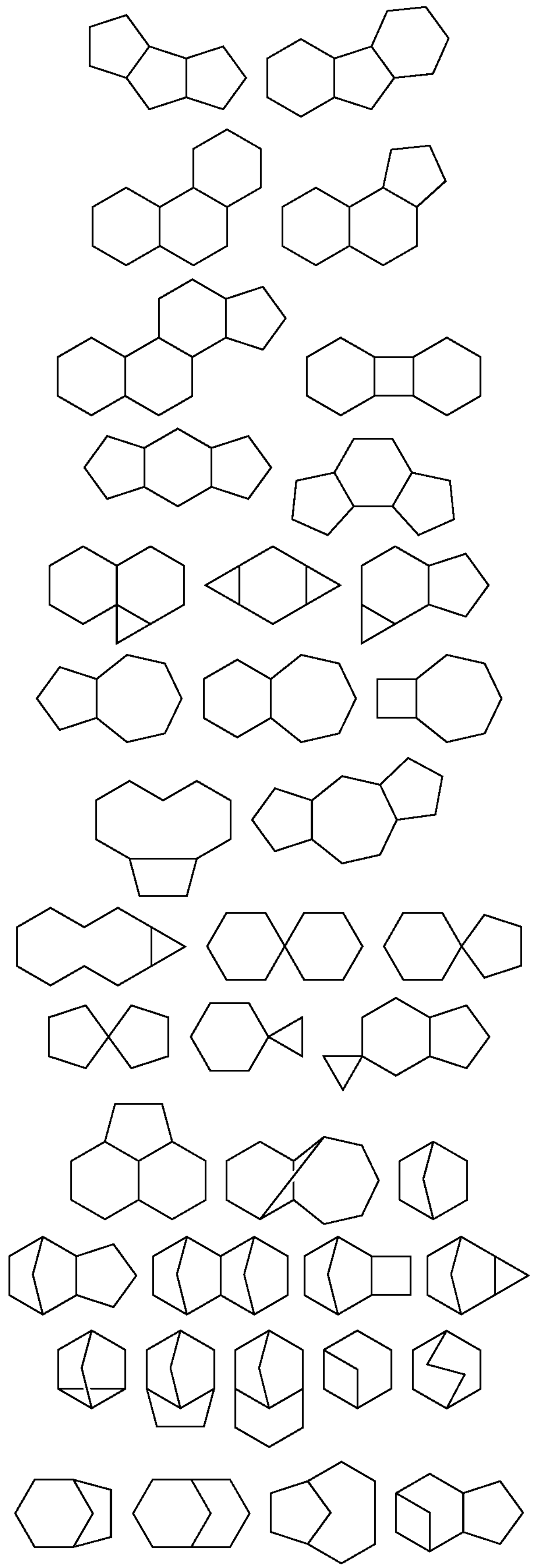

-continued

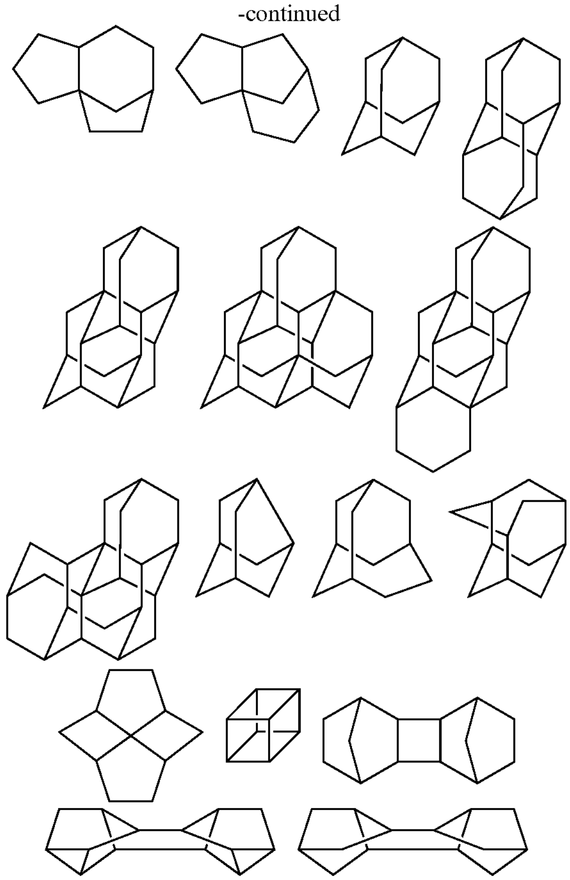

For example, when $R_1$ and/or $R_2$ is a cycloalkylene group, $R_1$ and/or $R_2$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, and more preferably an adamantylene group, a norbornylene group, a cyclohexylene group, a cyclopentylene group, a tetracyclododecanylene group or a tricyclodecanylene group.

The non-aromatic hydrocarbon group for $R_1$ and/or $R_2$ may have a substituent. Examples of the substituent include an alkyl group having from 1 to 4 carbon atoms, a halogen atom, a hydroxyl group, an alkoxy group having from 1 to 4 carbon atoms, a carboxyl group and an alkoxycarbonyl group having from 2 to 6 carbon atoms. The alkyl group, alkoxy group and alkoxycarbonyl group may further have a substituent. Examples of the substituent include a hydroxyl group, a halogen atom and an alkoxy group.

$L_1$ represents a connecting group represented by —COO—, —OCO—, —CONH—, —O—, —Ar—, —$SO_3$— or —$SO_2$NH—, wherein Ar represents a divalent aromatic ring group. $L_1$ is preferably a connecting group represented by —COO—, —CONH— or —Ar—, and more preferably a connecting group represented by —COO— or —CONH—.

R represents a hydrogen atom or an alkyl group. The alkyl group may be straight-chain or branched. The number of carbon atoms in the alkyl group is preferably from 1 to 6, and more preferably from 1 to 3. R is preferably a hydrogen atom or a methyl group, and more preferably a hydrogen atom.

$R_0$ represents a hydrogen atom or an organic group. Examples of the organic group include an alkyl group, a cycloalkyl group, an aryl group, an alkynyl group and an alkenyl group. $R_0$ is preferably a hydrogen atom or an alkyl group, and more preferably a hydrogen atom or a methyl group.

$L_3$ represents an (m+2) valent connecting group. That is, $L_3$ represents a trivalent or higher valent connecting group. Examples of such a connecting group include corresponding groups in specific examples described later.

$R^L$ represents an (n+1) valent connecting group. That is, $R^L$ represents a divalent or higher valent connecting group. Examples of such a connecting group include, for example, an alkylene group, a cycloalkylene group and corresponding groups in specific examples described later. $R^L$ may be connected to another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group and a halogen atom.

n is an integer of 1 or more. n is preferably an integer from 1 to 3, and more preferably 1 or 2. Also, when n is an integer of 2 or more, the dissolution contrast for a developer containing an organic solvent can be more enhanced and thus, the limiting resolution and roughness performance can be more improved.

m is an integer of 1 or more. m is preferably an integer from 1 to 3, and more preferably 1 or 2.

l is an integer of 0 or more. l is preferably 0 or 1.

p is an integer from 0 to 3.

When a repeating unit having a group capable of decomposing by the action of an acid to generate an alcoholic hydroxyl group and a repeating unit represented by at least one formula selected from the group consisting of formulae (I-1H) to (I-10H) are used in combination, for example, the acid diffusion is suppressed by the alcoholic hydroxyl group and the sensitivity is increased by the group capable of decomposing by the action of an acid to generate an alcoholic hydroxyl group, so that the exposure latitude (EL) can be improved without deteriorating other performances.

The content of the repeating unit having an alcoholic hydroxyl group is preferably from 1 to 60% by mole, more preferably from 3 to 50% by mole, still more preferably from 5 to 40% by mole, based on the total repeating units in the resin (A).

Specific examples of the repeating unit represented by any one of formulae (I-1H) to (I-10H) are set forth below. In the specific examples, Ra has the same meaning as in formulae (I-1H) to (I-10H).

[Chem. 53]

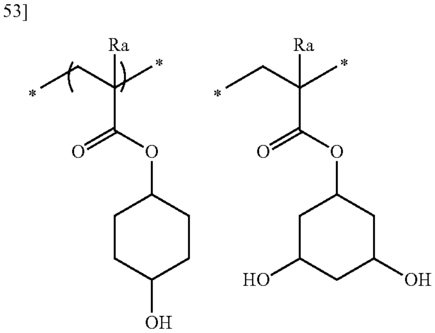

-continued
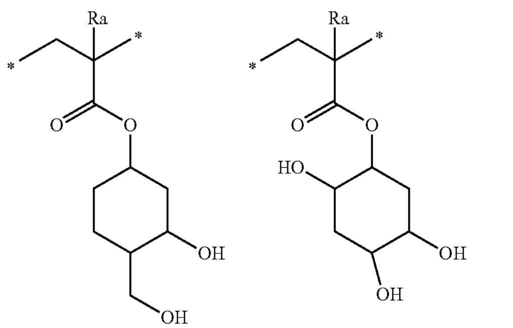
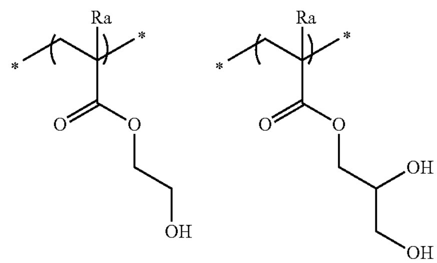
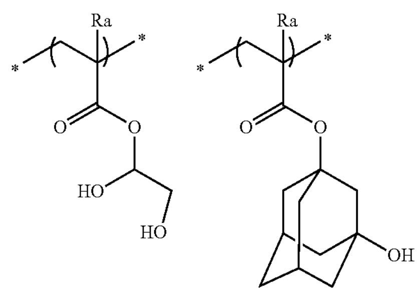
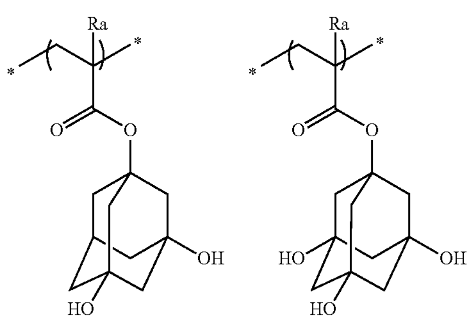
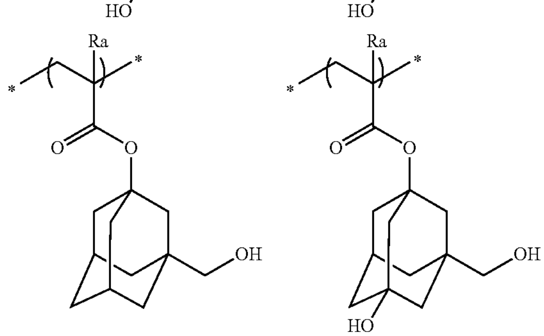
-continued
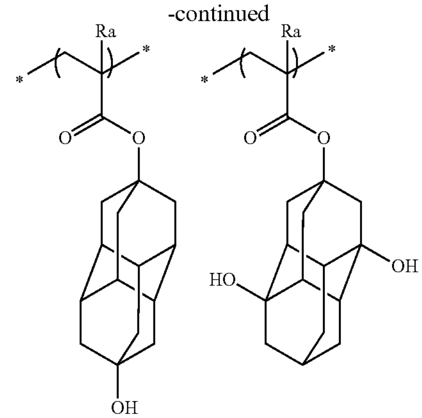
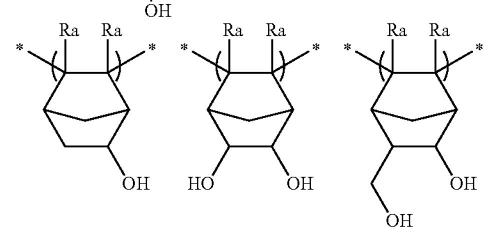
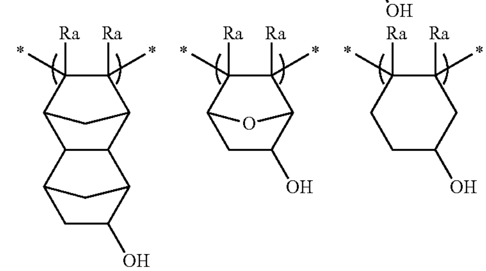
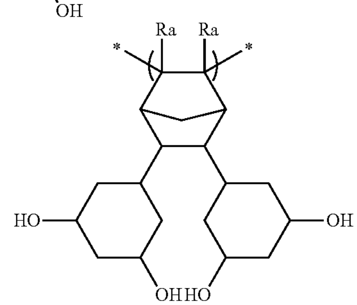
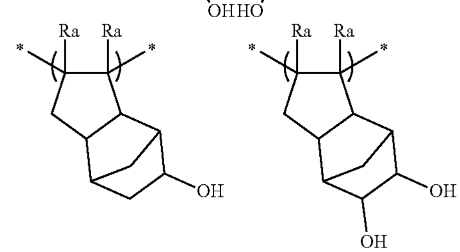
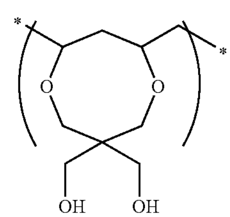
In the case where the polar group contained in the repeating unit (c) is an alcoholic hydroxyl group or a cyano group, one preferred embodiment of the repeating unit is a repeating unit having an alicyclic hydrocarbon structure substituted with a hydroxyl group or a cyano group. At this time, the repeating unit preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by formulae (VIIa) to (VIIc) shown below. By the repeating unit, adhesion property to a substrate and affinity for developer are enhanced.

[Chem. 54]

(VIIa)

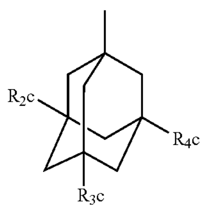

(VIIb)

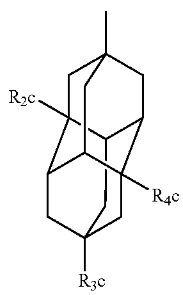

(VIIc)

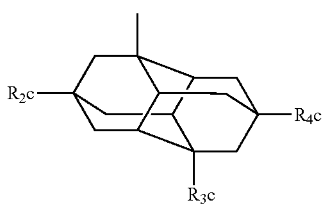

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. Preferably, one or two of $R_2c$ to $R_4c$ are hydroxyl groups and the remainder is a hydrogen atom. In formula (VIIa), it is more preferred that two members of $R_2c$ to $R_4c$ are hydroxyl groups and the remainder is a hydrogen atom.

The repeating unit having a partial structure represented by formulae (VIIa) to (VIIc) includes repeating units represented by formulae (AIIa) to (AIIc) shown below.

[Chem. 55]

(AIIa)

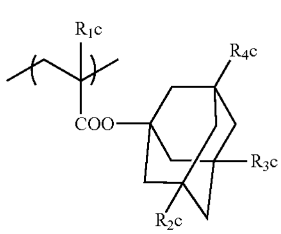

-continued (AIIb)

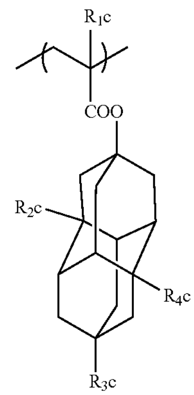

(AIIc)

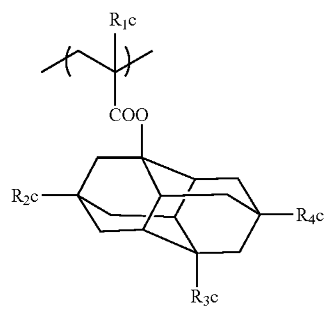

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIe).

The resin (A) may or may not contain a repeating unit having a hydroxyl group or a cyano group, and in the case of containing the repeating unit having a hydroxyl group or a cyano group, the content thereof is preferably from 1 to 60% by mole, more preferably from 3 to 50% by mole, still more preferably from 5 to 40% by mole, based on the total repeating units in the resin (A).

Specific examples of the repeating unit having a hydroxyl group or a cyano group are set forth below, but the invention should not be construed as being limited thereto.

[Chem. 56]

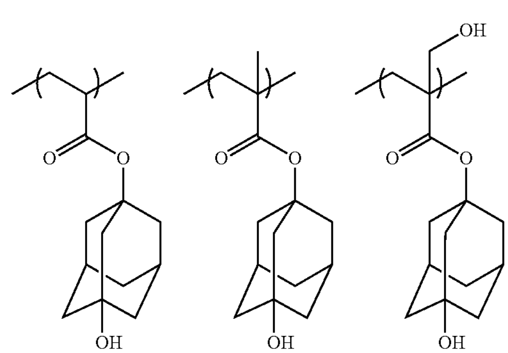

-continued

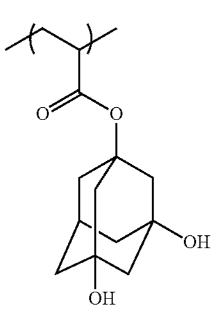

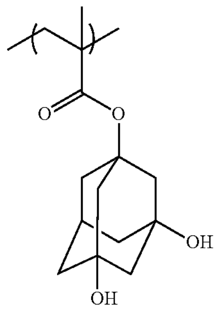

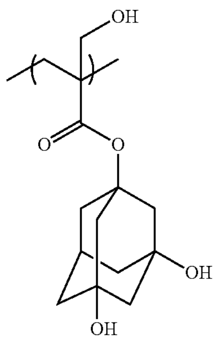

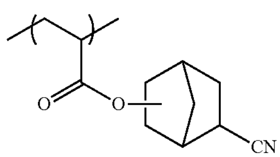

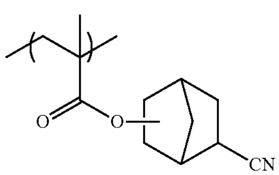

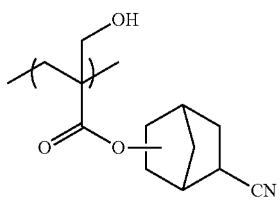

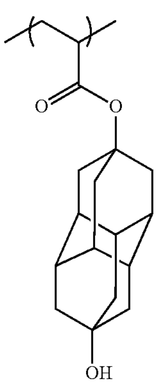

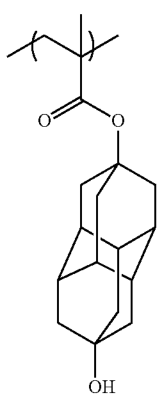

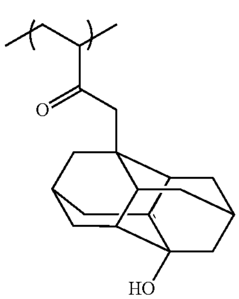

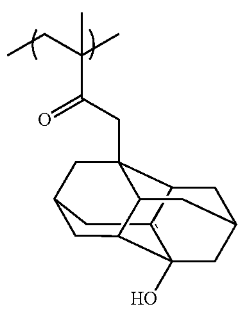

The repeating unit (c) may be a repeating unit having a lactone structure as the polar group.

The repeating unit having a lactone structure is more preferably a repeating unit represented by formula (AII) shown below.

[Chem. 57]

(AII)

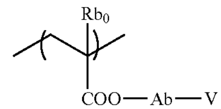

In formula (AII), $Rb_0$ represents a hydrogen atom, a halogen atom or an alkyl group (preferably having from 1 to 4 carbon atoms) which may have a substituent.

Preferred substituents which the alkyl group for $Rb_0$ may have include a hydroxyl group and a halogen atom. The halogen atom for $Rb_0$ includes a fluorine atom, a chlorine atom, a bromine atom and an iodine atom. $Rb_0$ is preferably a hydrogen atom, a methyl group, a hydroxymethyl group or a trifluoromethyl group, and particularly preferably a hydrogen atom or a methyl group.

Ab represents a single bond, an alkylene group, a divalent connecting group having a monocyclic or polycyclic cycloalkyl structure, an ether bond, an ester bond, a carbonyl group or a divalent connecting group composed of a combination of these groups. Ab is preferably a single bond or a divalent connecting group represented by $-Ab_1-CO_2-$.

$Ab_1$ is a straight-chain or branched alkylene group or a monocyclic or polycyclic cycloalkylene group, and is preferably a methylene group, an ethylene group, a cyclohexylene group, an adamantylene group or a norbornylene group.

V represents a group having a lactone structure.

As the group having a lactone structure, any group can be used as long as it has a lactone structure, and a 5-membered to 7-membered ring lactone structure is preferred and a 5-membered to 7-membered ring lactone structure to which another ring structure is fused to form a bicyclo or spiro structure is preferred. It is more preferred to contain a repeating unit having a lactone structure represented by any one of formulae (LC1-1) to (LC1-17) shown below. The lactone structure may be directly connected to the main chain. Preferred lactone structures are (LC1-1), (LC1-4), (LC1-5), (LC1-6), (LC1-8), (LC1-13) and (LC1-14).

[Chem. 58]

LC1-1

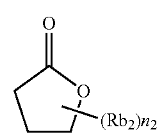

LC1-2

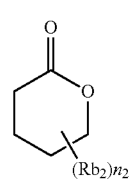

LC1-3

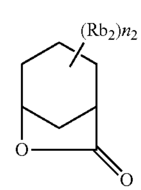

-continued

LC1-4

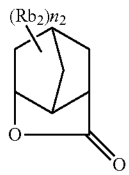

LC1-5

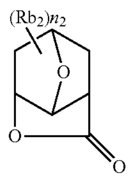

LC1-6

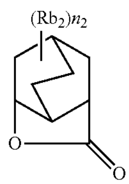

LC1-7

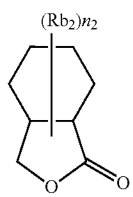

LC1-8

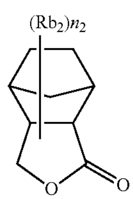

LC1-9

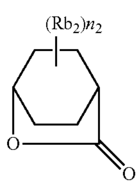

LC1-10

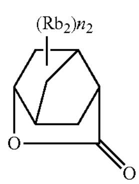

LC1-11

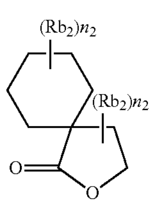

-continued

LC1-12

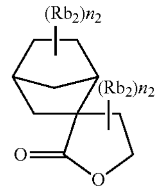

LC1-13

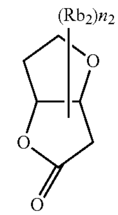

LC1-14

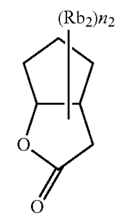

LC1-15

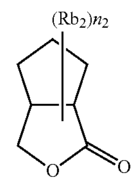

LC1-16

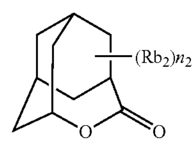

LC1-17

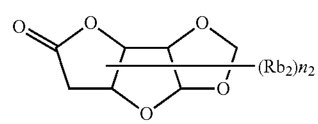

The lactone structure moiety may or may not have a substituent ($Rb_2$). Preferred substituents ($Rb_2$) include, for example, an alkyl group having from 1 to 8 carbon atoms, a monovalent cycloalkyl group having from 4 to 7 carbon atoms, an alkoxy group having from 1 to 8 carbon atoms, an alkoxycarbonyl group having from 2 to 8 carbon atoms, a carboxyl group, a halogen atom, a hydroxyl group, a cyano group and an acid-decomposable group. An alkyl group having from 1 to 4 carbon atoms, a cyano group and an acid-decomposable group are more preferred. $n_2$ represents an integer from 0 to 4. When $n_2$ is 2 or more, each substituent ($Rb_2$) may be the same as or different from every other substituents ($Rb_2$) and also, the plurality of substituents ($Rb_2$) may be connected to each other to form a ring.

The repeating unit having a lactone group ordinarily has an optical isomer, and any optical isomer may be used. One optical isomer may be used alone, or a plurality of optical isomers may be used as a mixture. In the case of mainly using one optical isomer, the optical purity (ee) thereof is preferably 90% or more, and more preferably 95% or more.

The resin (A) may or may not contain a repeating unit having a lactone structure, and in the case of containing the repeating unit having a lactone structure, the content of the repeating unit in the resin (A) is preferably from 1 to 70% by mole, more preferably from 3 to 65% by mole, still more preferably from 5 to 60% by mole, based on the total repeating units.

Specific examples of the repeating unit having a lactone structure contained in the resin (A) are set forth below, but the invention should not be construed as being limited thereto. In the formulae, Rx represents H, $CH_3$, $CH_2OH$ or $CF_3$.

[Chem. 59]

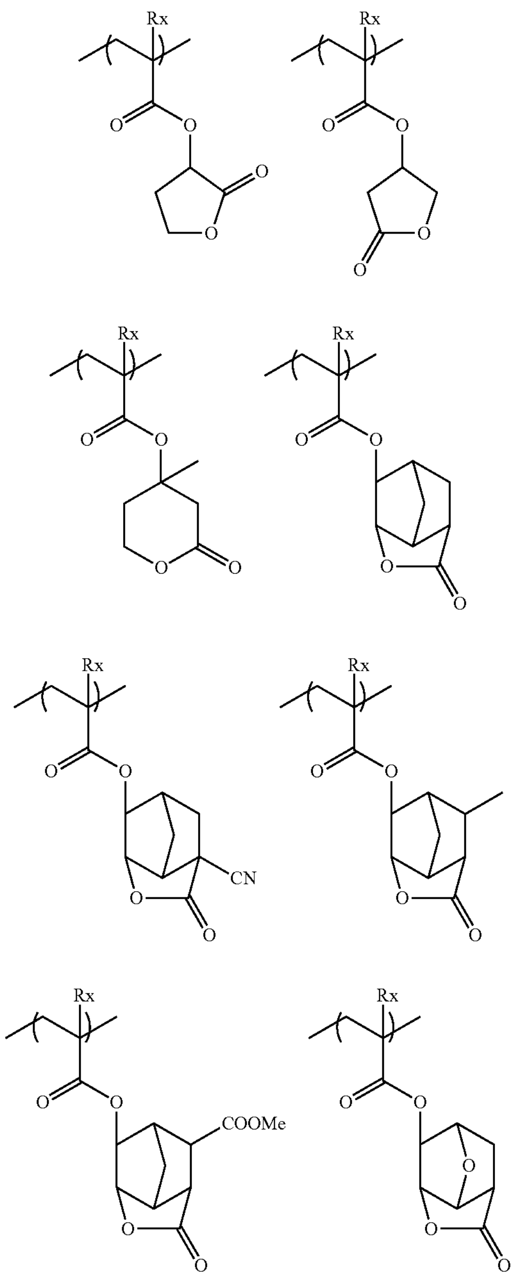

-continued

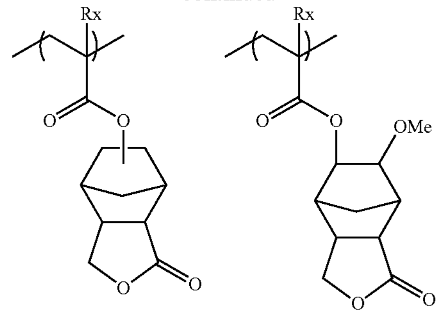

[Chem. 60]

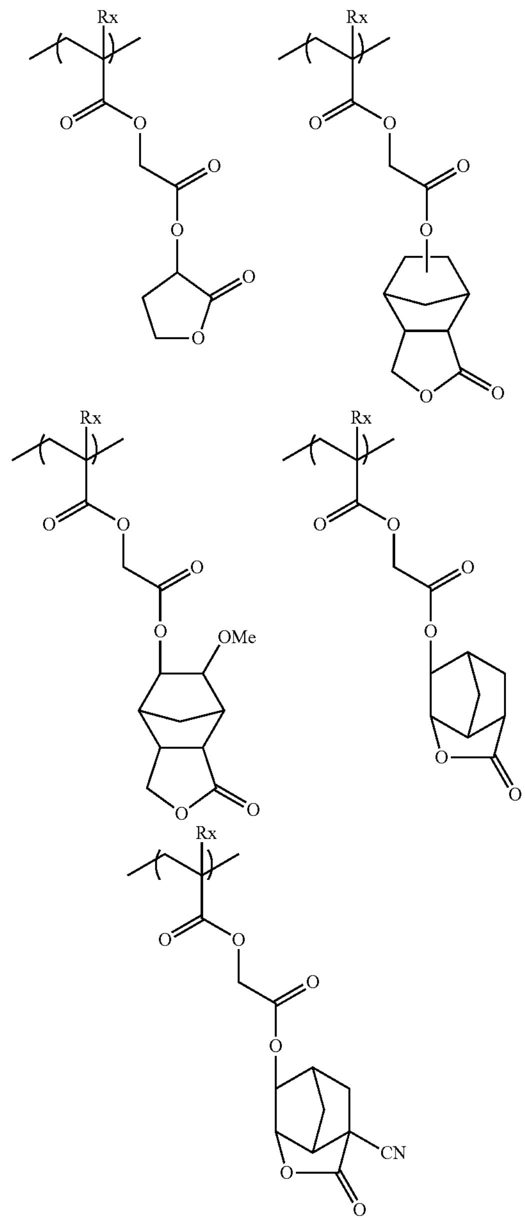

Also, the sultone group which is contained in the resin (A) is preferably represented by formulae (SL-1) and (SL-2) shown below. In the formulae, $Rb_2$ and $n^2$ have the same meanings as those in formulae (LC1-1) to (LC1-17) described above.

[Chem. 61]

SL1-1

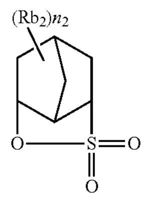

SL1-2

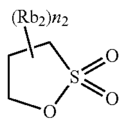

A repeating unit having a sultone group which is contained in the resin (A) is preferably a repeating unit in which a lactone group in the repeating unit having a lactone structure is replaced with the sultone group.

It is also one of particularly preferred embodiments that the polar group which can be contained in the repeating unit (c) is an acidic group. Preferred acidic groups include a phenolic hydroxyl group, a carboxylic acid group, a sulfonic acid group, a fluorinated alcohol group (for example, hexafluoroisopropanol group), a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfonyl)methylene group, a bis (alkylsulfonyl)imido group, a tris(alkylcarbonyl)methylene group and a tris(alkylsulfonyl)methylene group. Among them, the repeating unit (c) is more preferably a repeating unit having a carboxyl group. As the repeating unit having an acidic group, any of a repeating unit where an acidic group is directly connected to the main chain of the resin, for example, a repeating unit derived from an acrylic acid or a methacrylic acid, a repeating unit where an acidic group is connected to the main chain of the resin through a connecting group, and a repeating unit where an acidic group is introduced into the terminal of the polymer chain by using an acidic group-containing polymerization initiator or chain transfer agent at the polymerization, is preferred. In particular, a repeating unit derived from an acrylic acid or a methacrylic acid is preferred.

The acidic group which can be contained in the repeating unit (c) may or may not contain an aromatic ring, and in the case of containing an aromatic ring, the acidic group is preferably selected from those other than a phenolic hydroxyl group. In the case where the repeating unit (c) contains an acidic group, the content of the repeating unit having an acidic group is preferably 30% by mole or less, more preferably 20% by mole or less, based on the total repeating units in the resin (A). In the case where the resin (A) contains a repeating unit having an acidic group, the content of the repeating unit having an acidic group in the resin (A) is ordinarily 1% by mole or more.

Specific examples of the repeating unit having an acidic group are set forth below, but the invention should not be construed as being limited thereto.

In the specific examples, Rx represents H, $CH_3$, $CH_2OH$ or $CF_3$.

[Chem. 62]

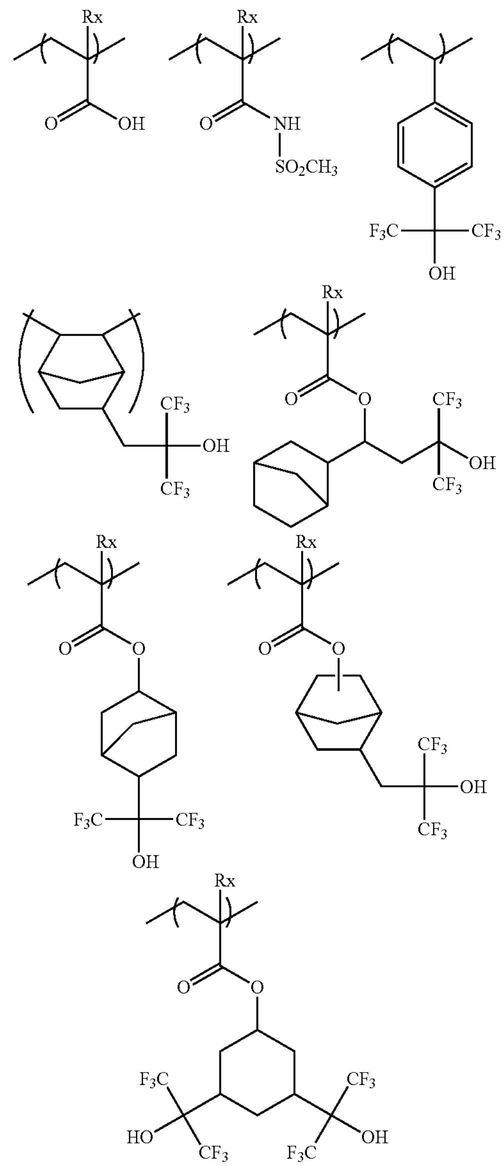

(d) Repeating Unit Having Plurality of Aromatic Rings

The resin (A) may contain a repeating unit (d) having a plurality of aromatic rings. The repeating unit (d) having a plurality of aromatic rings includes a repeating unit same as the repeating unit (d) having a plurality of aromatic rings represented by formula (c1) described above which can be contained in the resin (T).

It is also the same that of the repeating units, the repeating unit represented by formula (c2) described above is preferred.

Here, with respect to the extreme ultraviolet radiation (EUV light) exposure, leakage light (out-of-band light) occurred in the ultraviolet region having a wavelength from 100 to 400 nm deteriorates the surface roughness and as a result, the resolution and LWR performance tend to be decreased due to bridge between patterns or disconnection of pattern.

However, the aromatic ring in repeating unit (d) functions as an internal filter capable of absorbing the out-of-band light described above. Therefore, from the standpoint of high resolution and low LWR, the resin (A) preferably contains the repeating unit (d).

Here, from the standpoint of obtaining high resolution, the repeating unit (d) preferably contains no phenolic hydroxyl group (a hydroxyl group directly connected to the aromatic ring).

Specific examples of the repeating unit (d) are also same as those described for the specific examples of the repeating unit (d) which can be contained in the resin (T) above.

The resin (A) may or may not contain the repeating unit (d), and in the case of containing the repeating unit (d), the content of the repeating unit (d) is preferably in a range from 1 to 30% by mole, more preferably in a range from 1 to 20% by mole, still more preferably in a range from 1 to 15% by mole, based on the total repeating units in the resin (A). As to the repeating unit (d) contained in the resin (A), two or more kinds of the repeating units may be contained in combination.

The resin (A) according to the invention may appropriately contain a repeating unit other than the repeating units (a) to (d) described above. As an example of such a repeating unit, the resin can further contain a repeating unit having an alicyclic hydrocarbon structure having no polar group (for example, the acid group, hydroxyl group or cyano group described above) and not exhibiting acid decomposability. Thus, the solubility of the resin at the development using a developer containing an organic solvent can be appropriately adjusted. Such a repeating unit includes a repeating unit represented by formula (IV).

[Chem. 63]

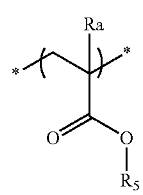

(IV)

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having from 3 to 12 carbon atoms, for example, a cyclopentyl group, a cyclohexyl group, cycloheptyl group or cyclooctyl group, and a cycloalkenyl group having from 3 to 12 carbon atoms, for example, a cyclohexenyl group. The monocyclic hydrocarbon group is preferably a monocyclic hydrocarbon group having from 3 to 7 carbon atoms, and more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring, for example, a pinane ring, a bornane ring, a norpinane ring, a norbornane ring or a bicyclooctane ring (for example, a bicyclo[2.2.2]octane ring or a bicyclo[3.2.1]octane ring), a tricyclic hydrocarbon ring, for example, a homobledane ring, an adamantane ring, a tricyclo[5.2.1.$0^{2,6}$]decane ring or a tricyclo[4.3.1.$1^{2,5}$]undecane ring, and a tetracyclic hydrocarbon ring, for example, a tetracyclo[4.4.0.$1^{2,5}$.$1^{7,10}$]dodecane ring or a perhydro-1,4-methano-5,8-methanonaphthalene ring. Also, the crosslinked cyclic hydrocarbon ring includes a condensed cyclic hydrocarbon ring, for example, a condensed ring formed by fusing a plurality of 5-membered to 8-membered cycloalkane rings, for example, a perhydronaphthalene (decalin) ring, a perhydroanthracene ring, a perhydrophenathrene ring, a perhydroacenaphthene ring, a perhydrofluorene ring, a perhydroindene ring or a perhydrophenalene ring.

Preferred examples of the crosslinked cyclic hydrocarbon ring include a norbornyl group, an adamantyl group, a bicyclooctanyl group and a tricyclo[5,2,1,$0^{2,6}$]decanyl group. More referred examples of the crosslinked cyclic hydrocarbon ring include a norbornyl group and an adamantyl group.

Such an alicyclic hydrocarbon group may have a substituent, and preferred examples of the substituent include a halogen atom, an alkyl group, a hydroxyl group in which the hydrogen atom is substituted and an amino group in which the hydrogen atom is substituted. The halogen atom preferably includes a bromine atom, a chlorine atom and a fluorine atom. The alkyl group preferably includes a methyl group, an ethyl group, a butyl group or a tert-butyl group. The alkyl group may further have a substituent, and the substituent which may be further substituted on the alkyl group includes a halogen atom, an alkyl group, a hydroxyl group in which the hydrogen atom is substituted and an amino group in which the hydrogen atom is substituted.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group preferably includes an alkyl group having from 1 to 4 carbon atoms; the substituted methyl group preferably includes a methoxymethyl group, a methoxythiomethyl group, a benzyloxymethyl group, a tert-butoxymethyl group and a 2-methoxyethoxymethyl group; the substituted ethyl group preferably includes a 1-ethoxyethyl group and a 1-methyl-1-methoxyethyl group; the acyl group preferably includes an aliphatic acyl group having from 1 to 6 carbon atoms, for example, a formyl group, an acetyl group, a propionyl group, a butyryl group, an isobutyryl group, a valeryl group or a pivaloyl group; and the alkoxycarbonyl group preferably includes, for example, an alkoxycarbonyl group having from 1 to 4 carbon atoms.

The resin (A) may or may not contain a repeating unit having an alicyclic hydrocarbon structure having no polar group and exhibiting no acid decomposability, and in the case of containing the repeating unit, the content the repeating unit is preferably from 1 to 20% by mole, more preferably from 5 to 15% by mole, based on the total repeating units in the resin (A).

Specific examples of the repeating unit having an alicyclic hydrocarbon structure having no polar group and exhibiting no acid decomposability are set forth below, but the invention should not be construed as being limited thereto. In the formulae, Ra represents H, $CH_3$, $CH_2OH$ or $CF_3$.

[Chem. 64]

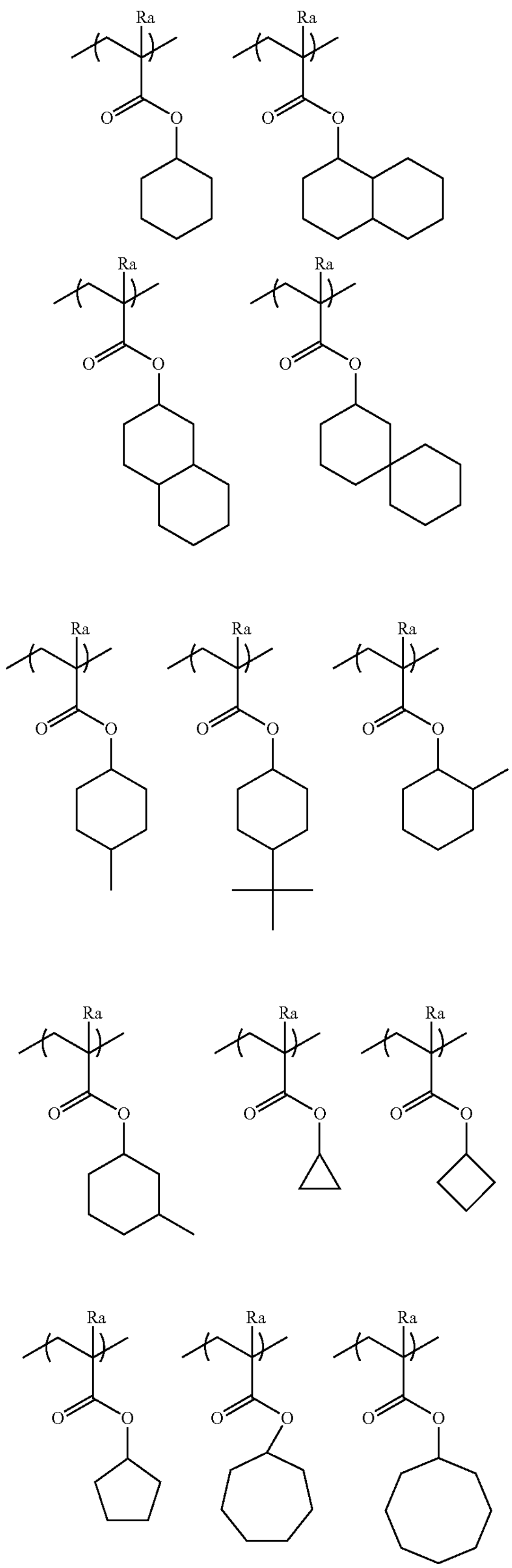

-continued

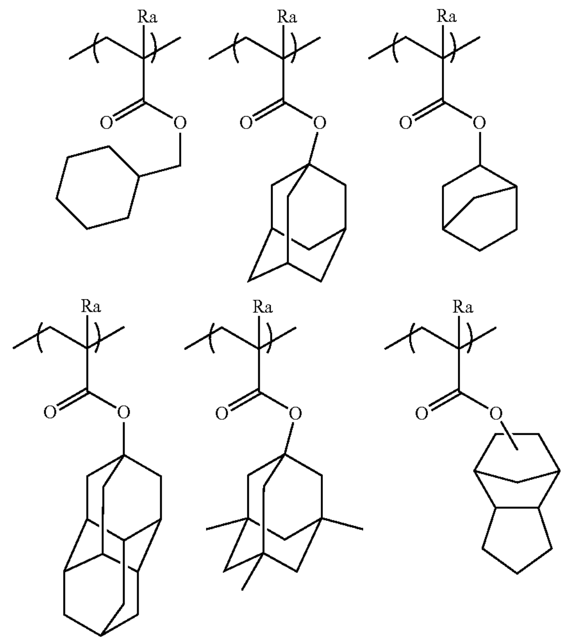

Also, the resin (A) may further contain a repeating unit represented by formula (P) shown below.

[Chem. 65]

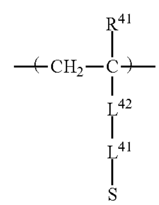

(P)

$R^{41}$ represents a hydrogen atom or a methyl group. $L^{41}$ represents a single bond or a divalent connecting group. $L^{42}$ represents a divalent connecting group. S represents a structural moiety capable of decomposing upon irradiation with an electron beam or an extreme ultraviolet radiation to generate an acid on the side chain.

Specific examples of the repeating unit represented by formula (P) are set forth below, but the invention should not be construed as being limited thereto.

[Chem. 66]

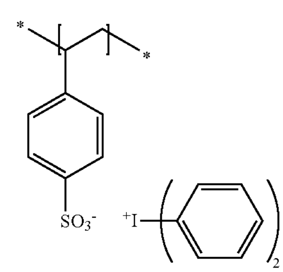

-continued
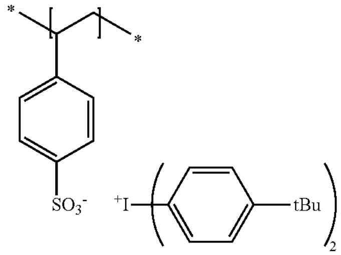
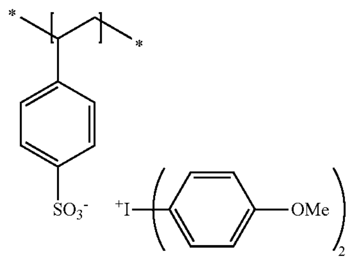
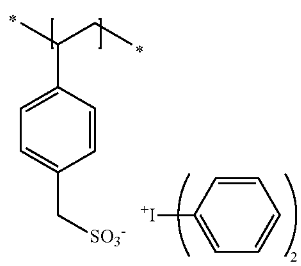
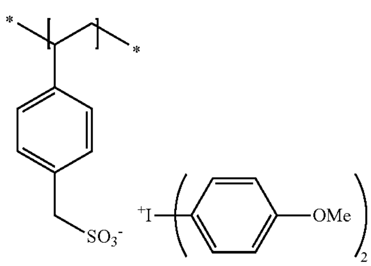
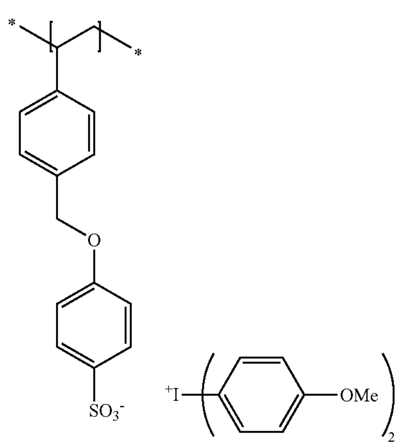
-continued
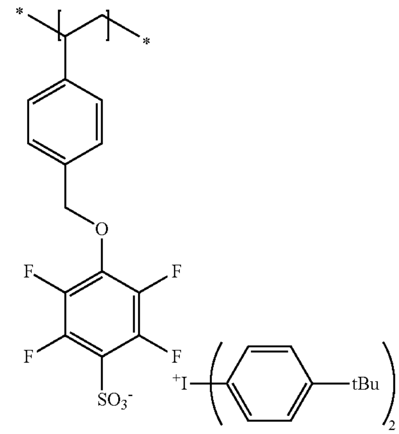
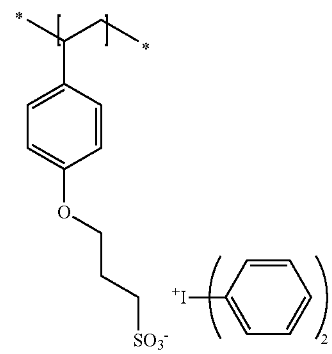
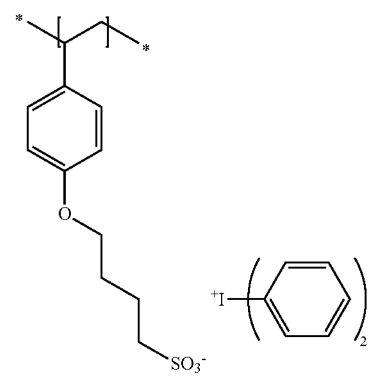
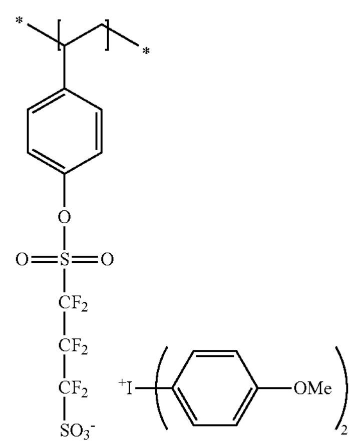

-continued
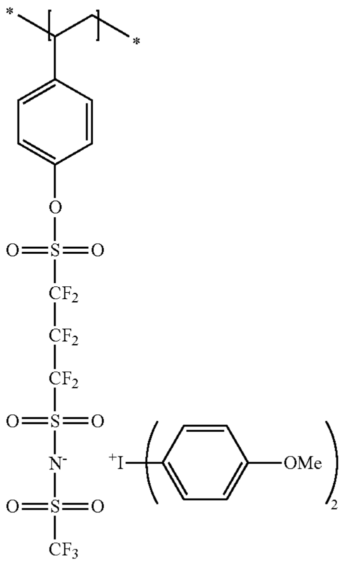
[Chem. 67]
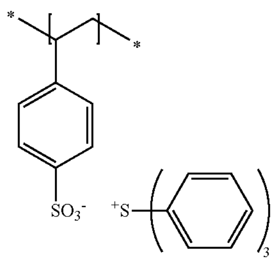
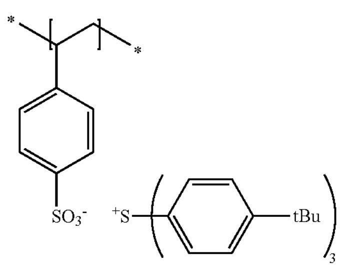
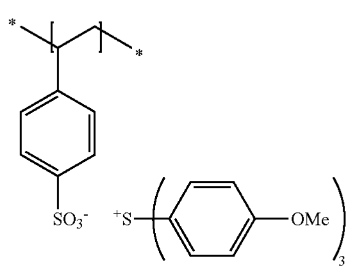
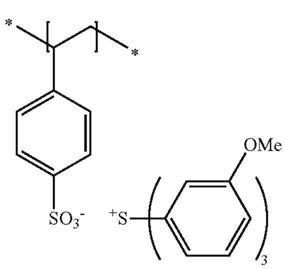
-continued
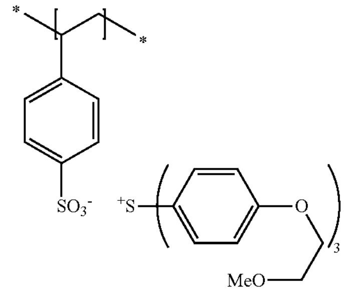
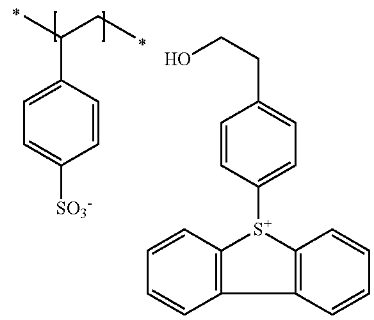
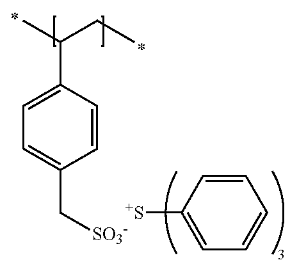
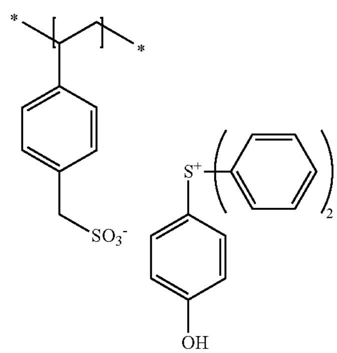
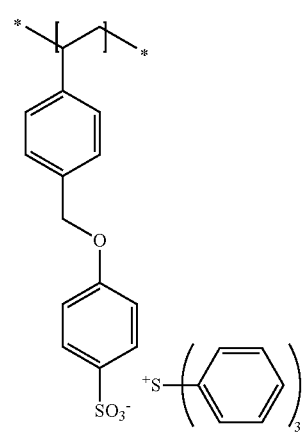

-continued
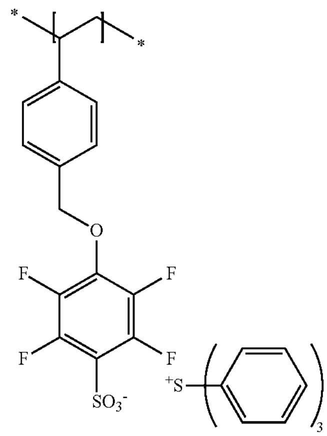
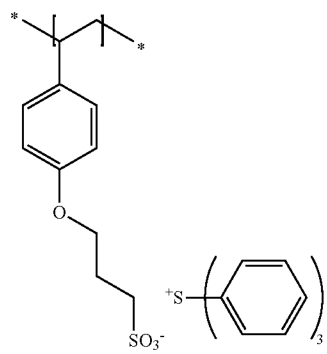
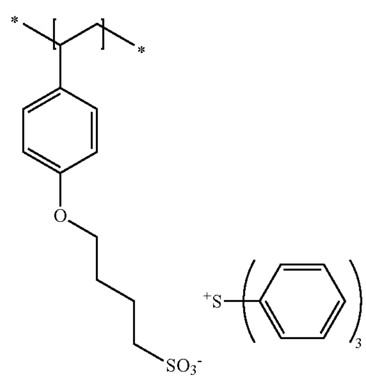
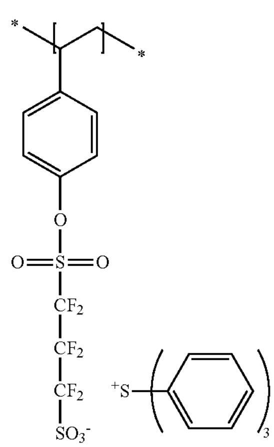
-continued
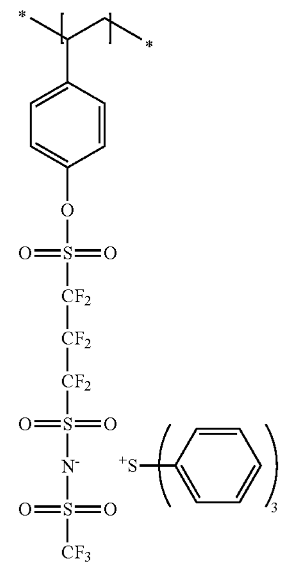
[Chem. 68]
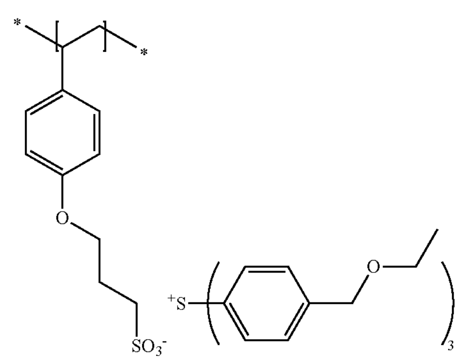
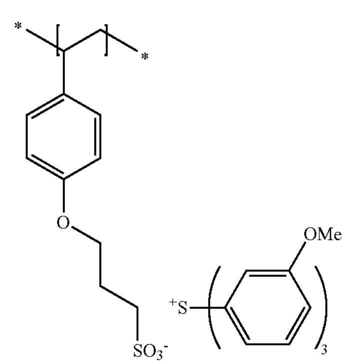

-continued
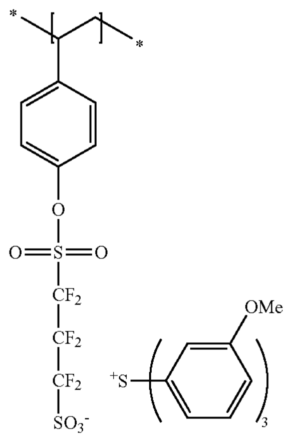
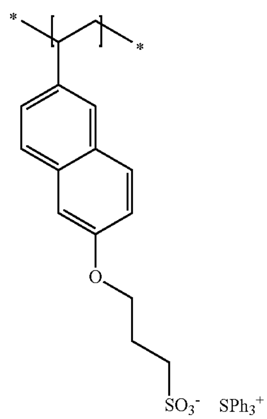
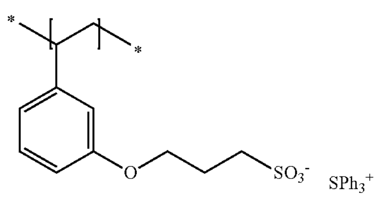
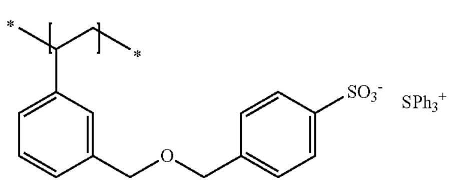
[Chem. 69]
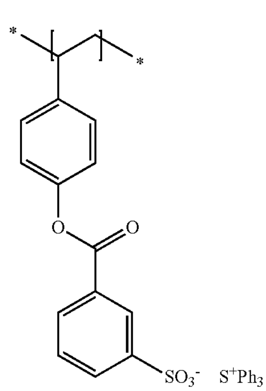
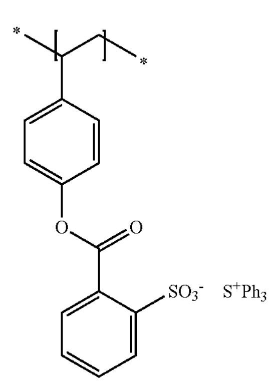
-continued
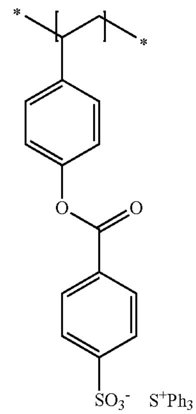
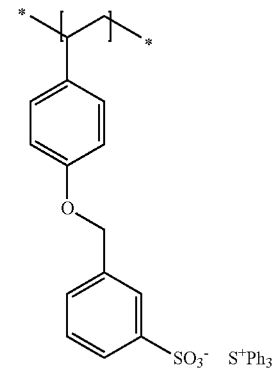
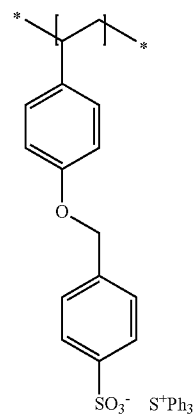
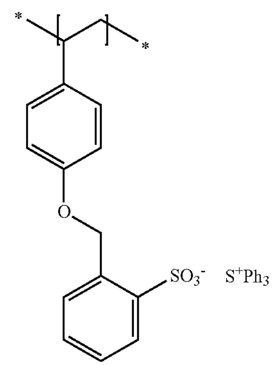
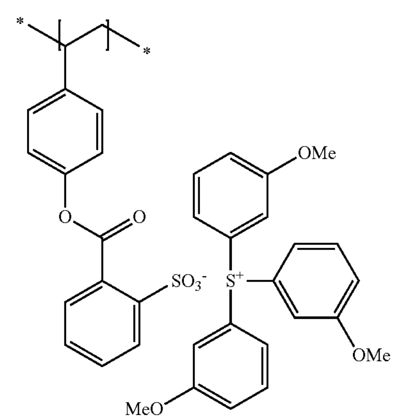
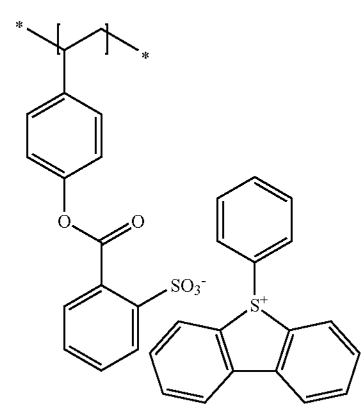

-continued
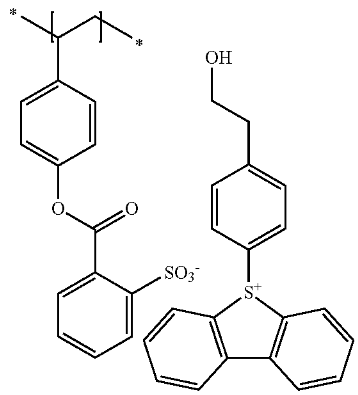
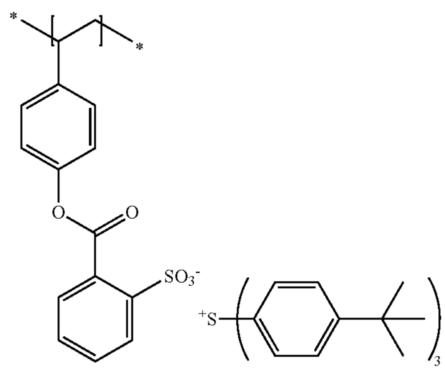
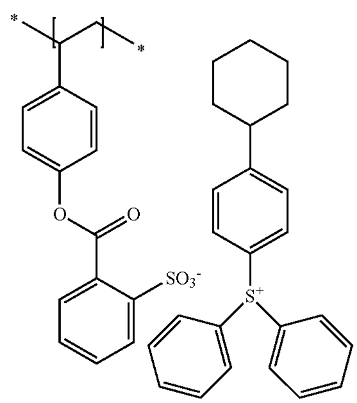
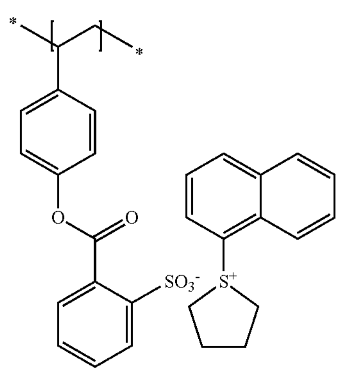
-continued
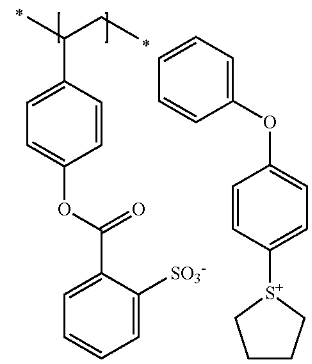
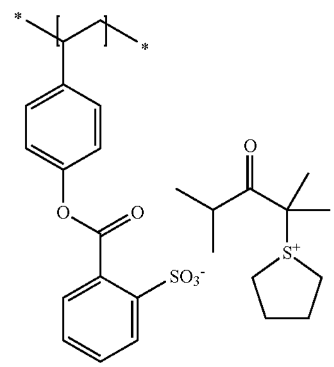
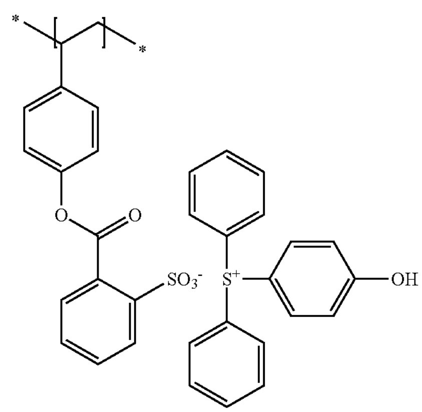
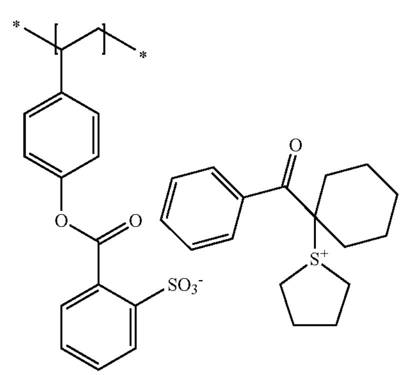

-continued
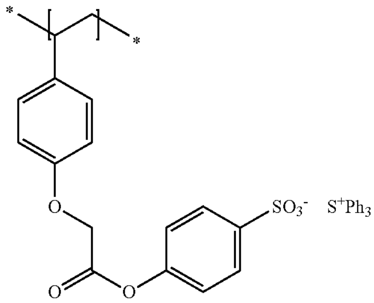
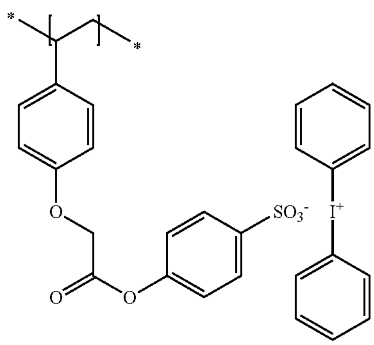
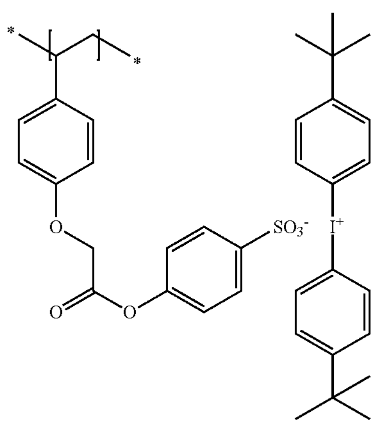
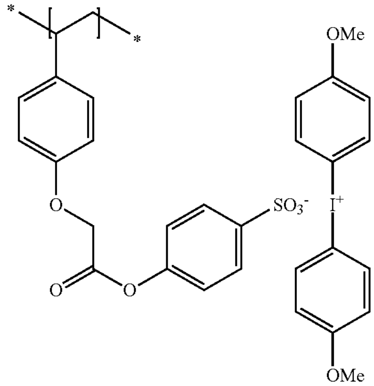
-continued
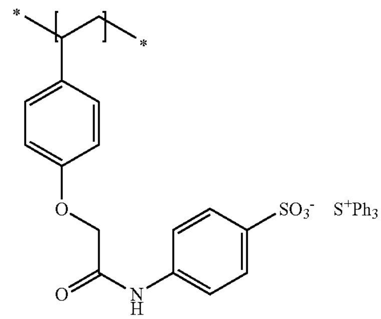
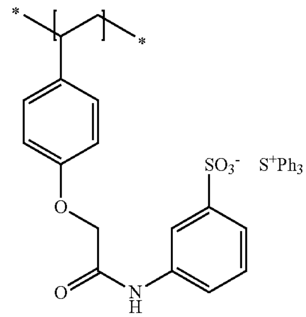
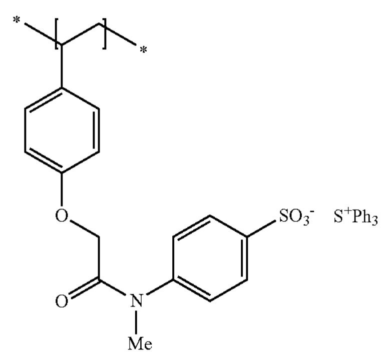
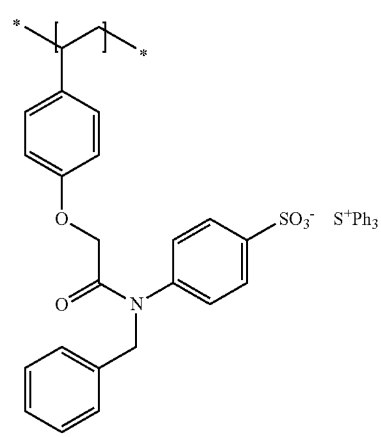

-continued
[Chem. 70]
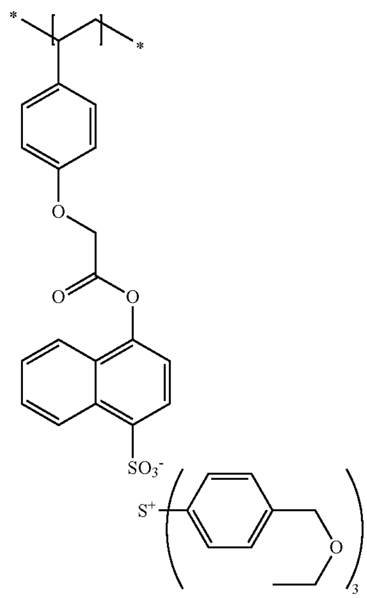
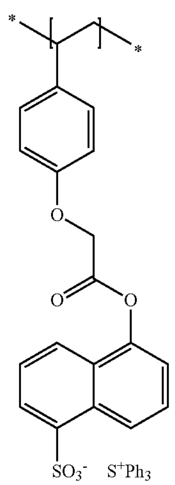
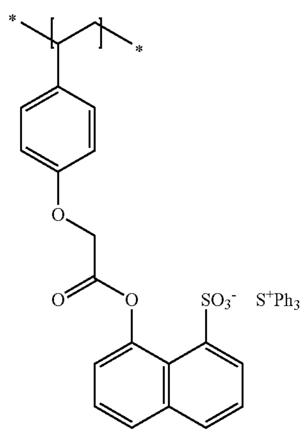
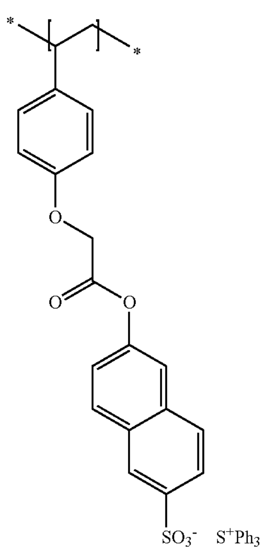
-continued
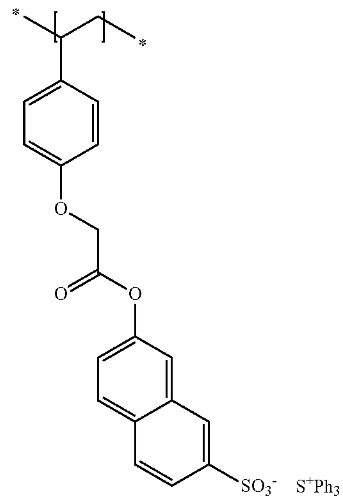
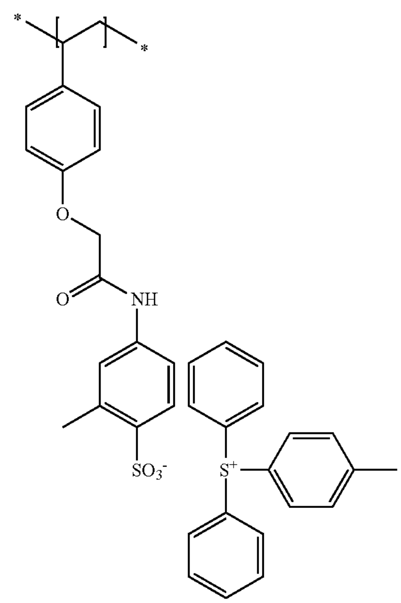
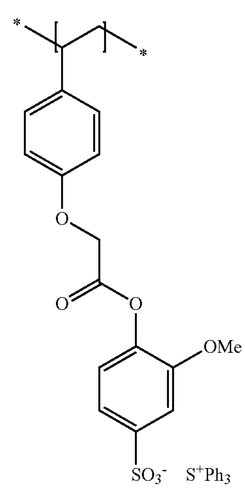
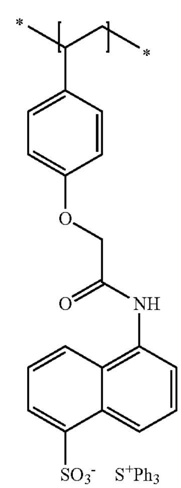

-continued
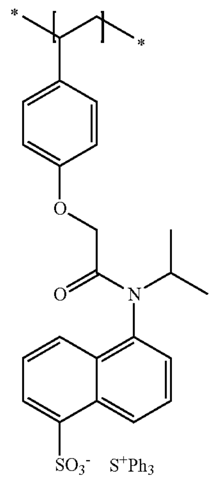
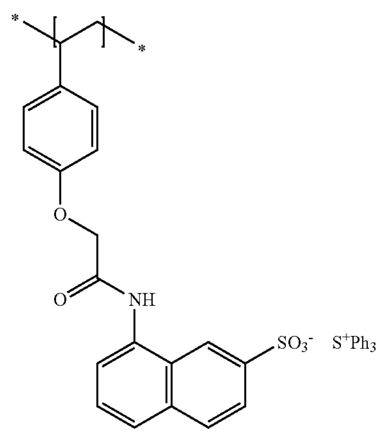
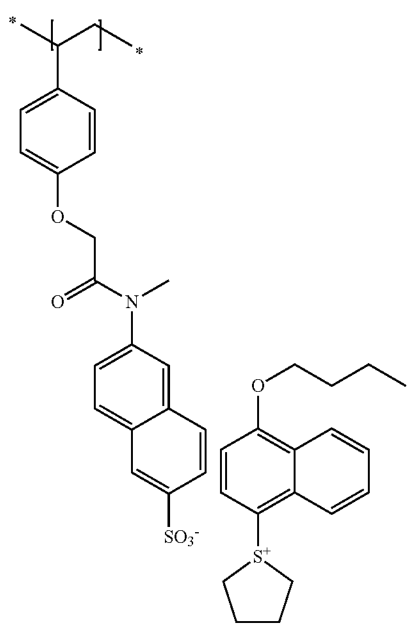
-continued
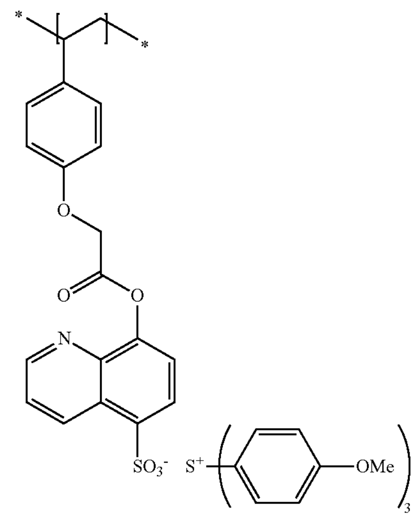
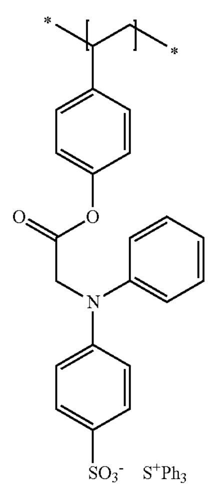
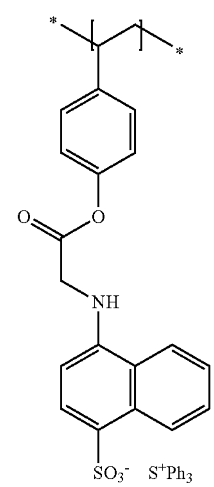
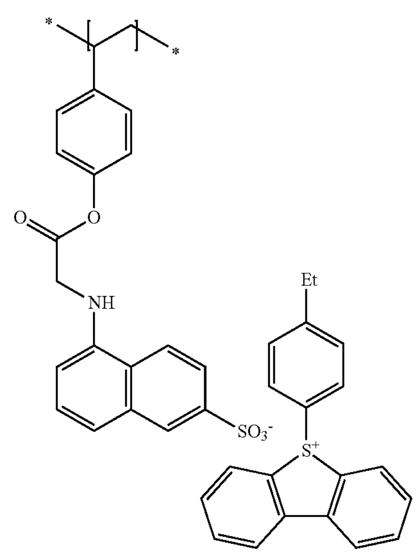

-continued
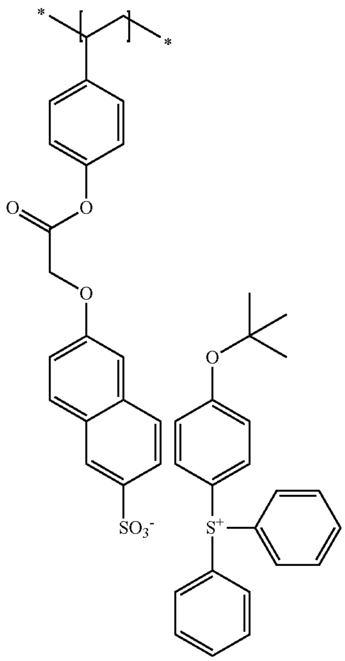
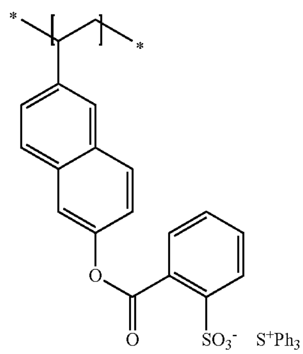
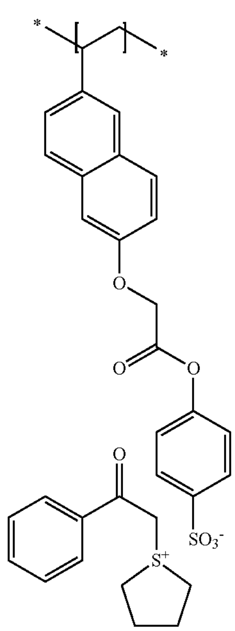
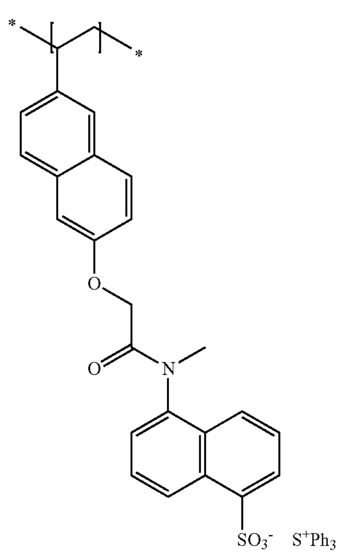
-continued
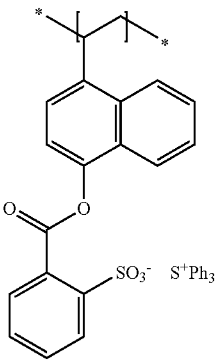
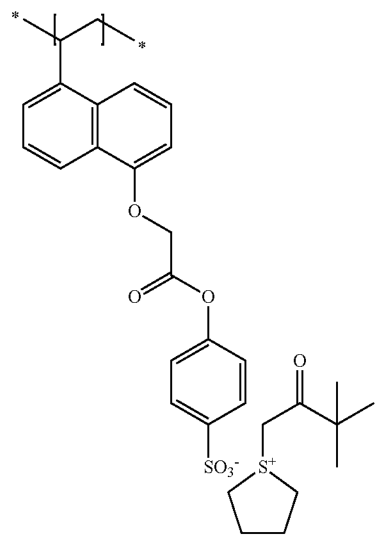
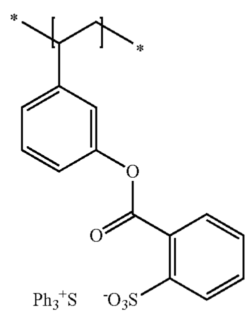
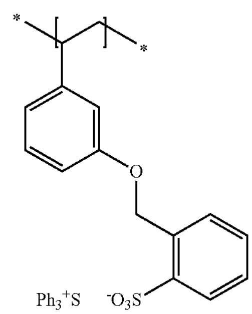
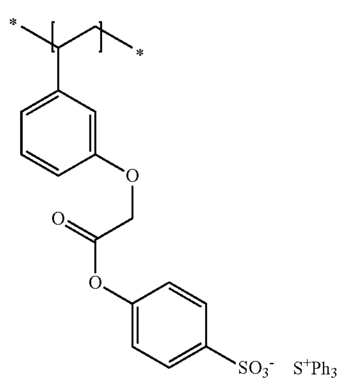

-continued
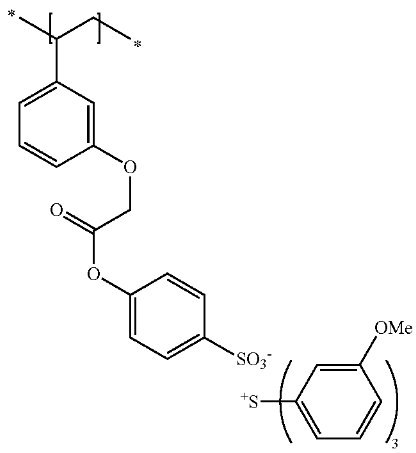
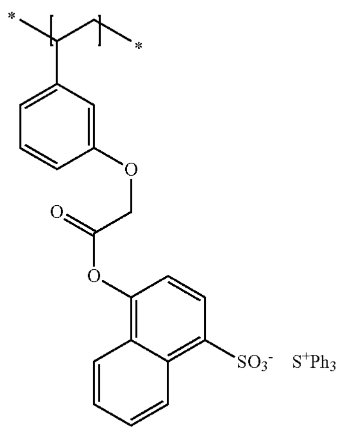
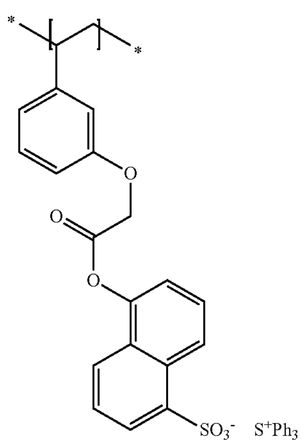
-continued
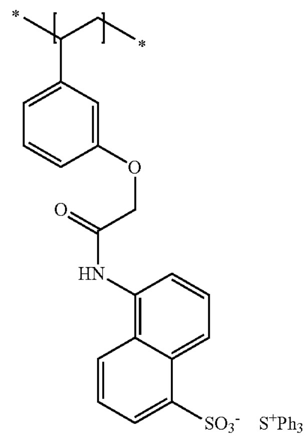
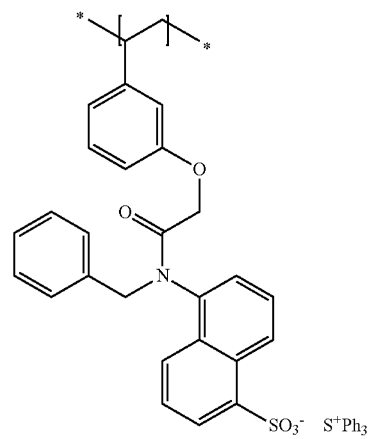
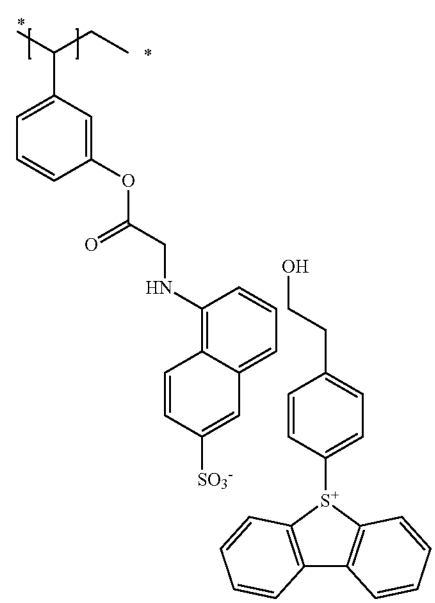

-continued
[Chem. 71]
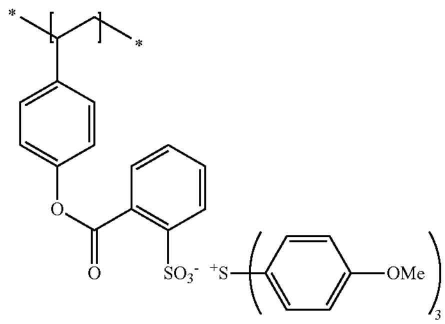
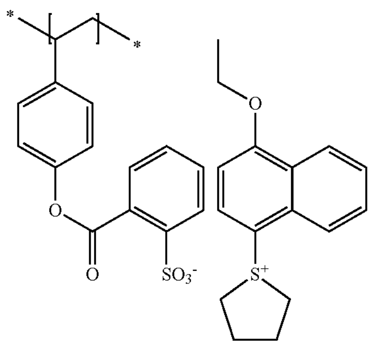
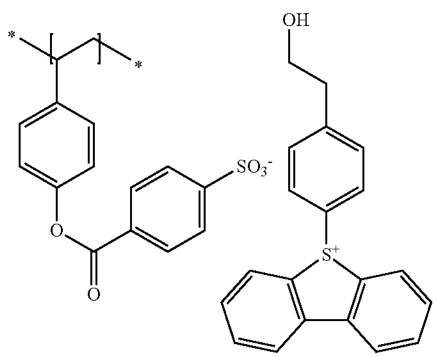
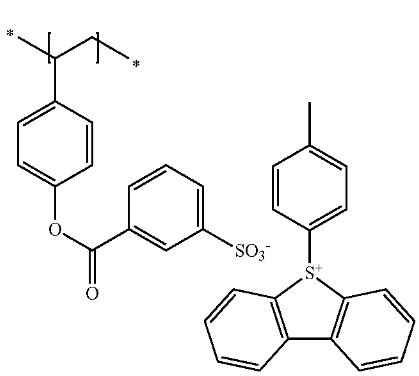
-continued
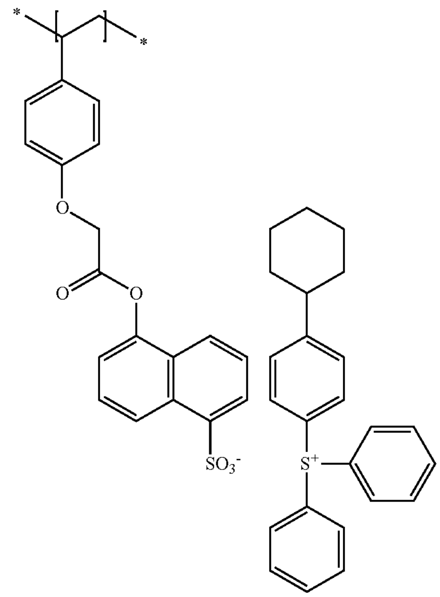
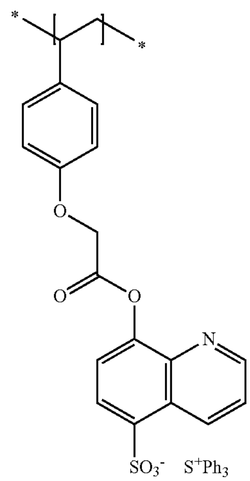
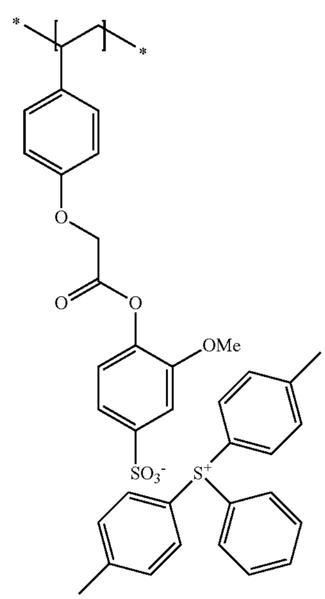

-continued
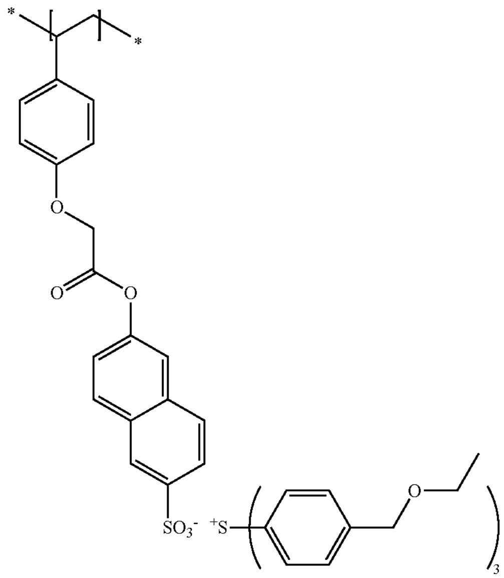
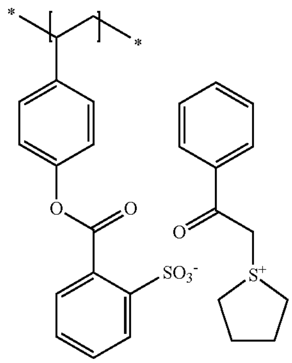
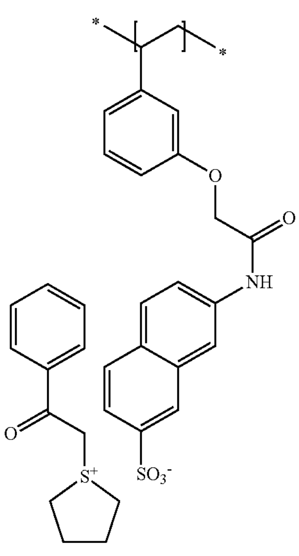
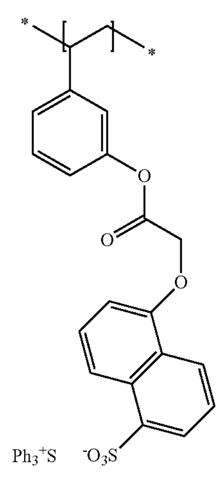
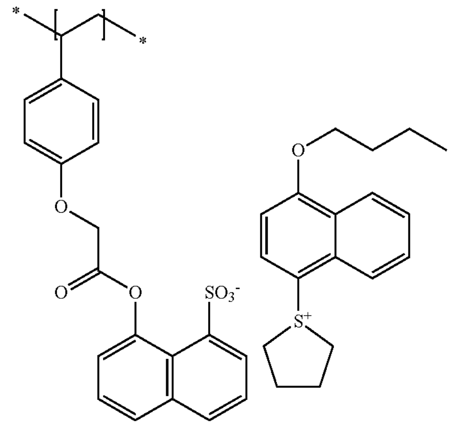
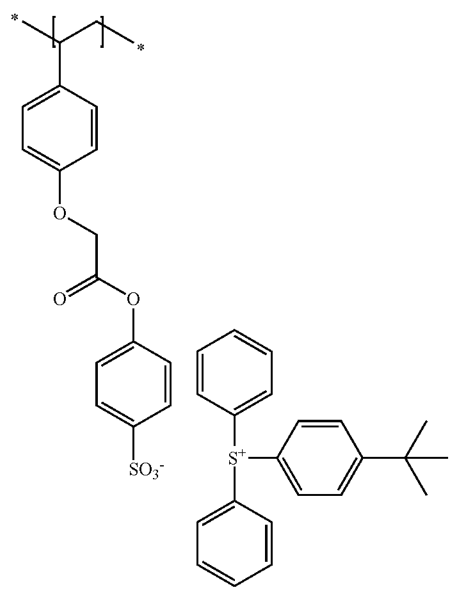
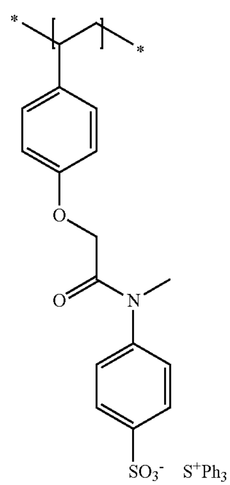

-continued
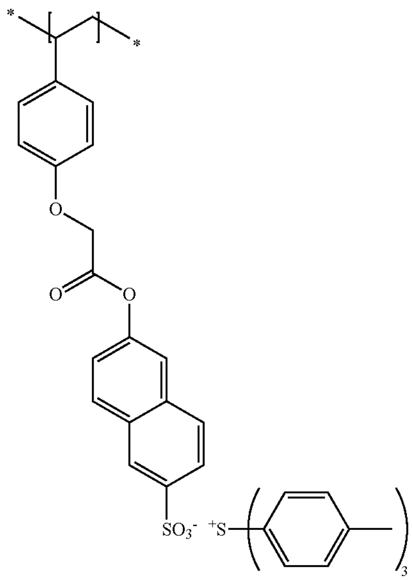
[Chem. 72]
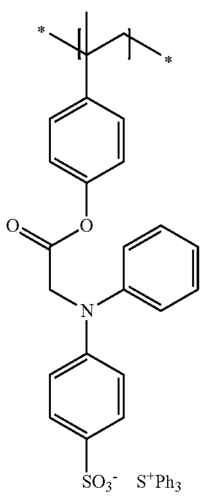
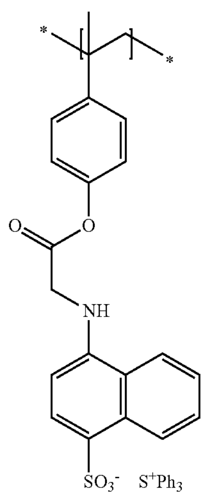
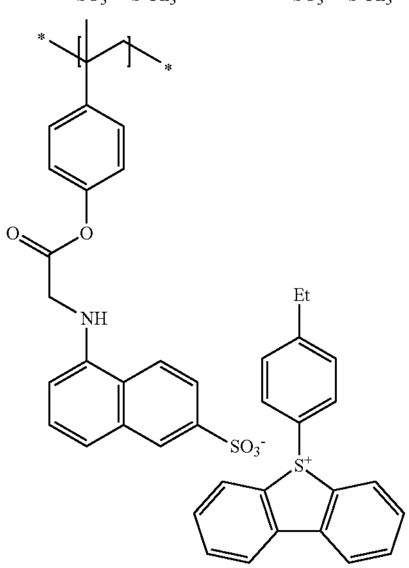
-continued
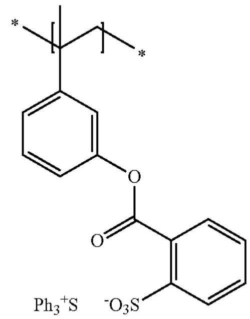
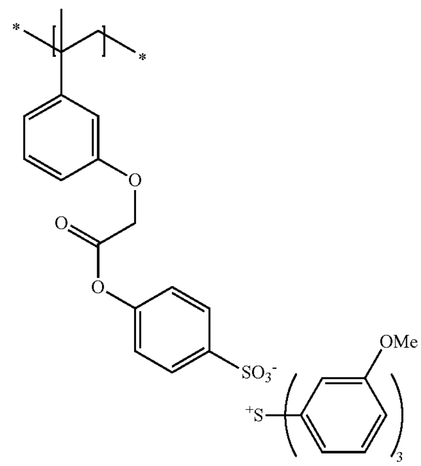
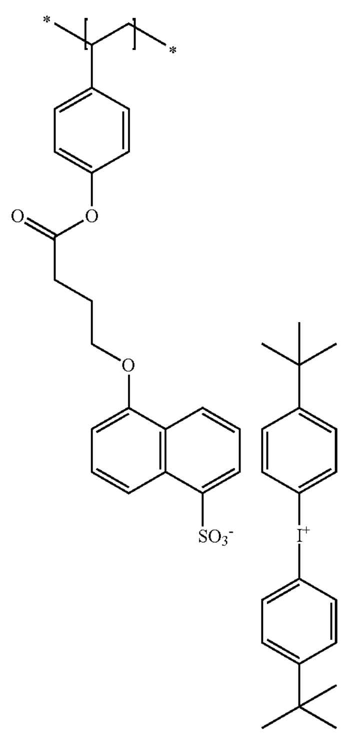

-continued
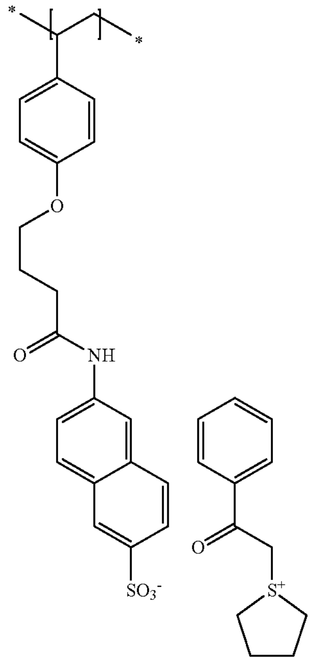
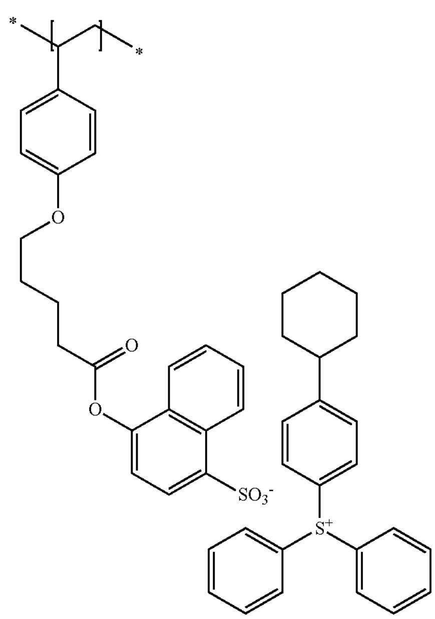
-continued
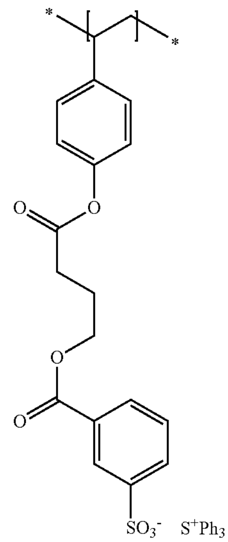
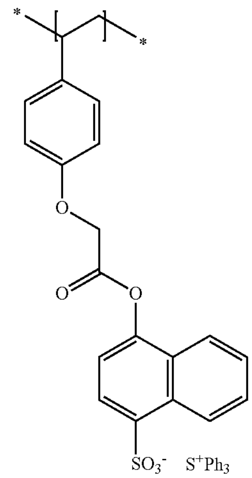
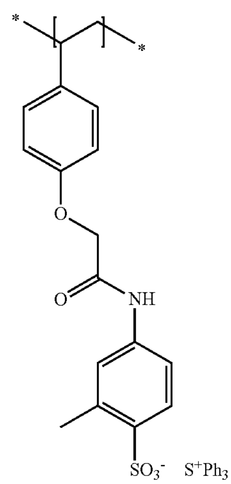
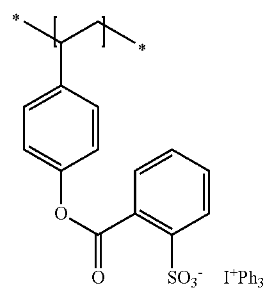
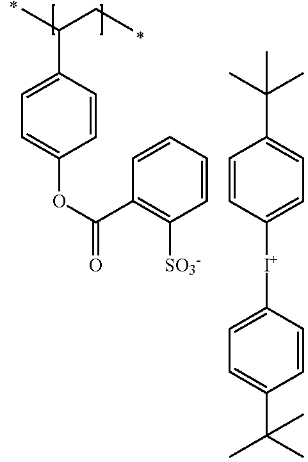

-continued
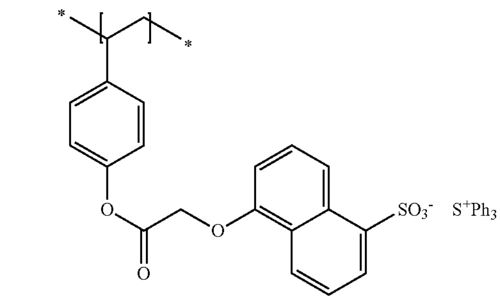
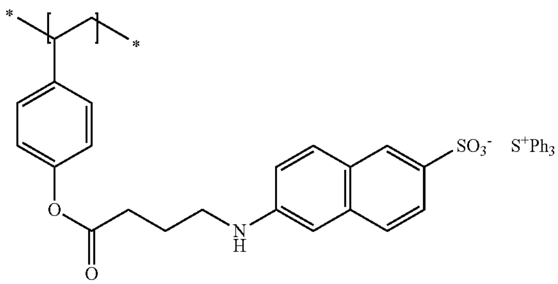
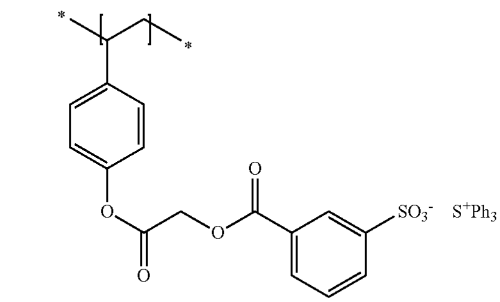
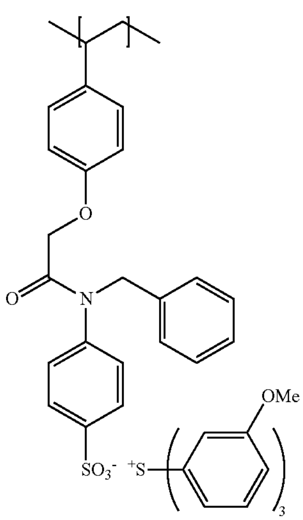
[Chem. 73]
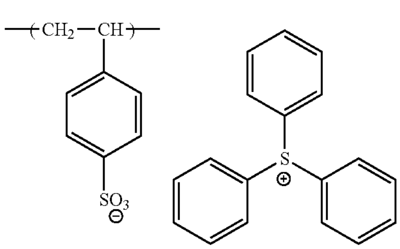
-continued
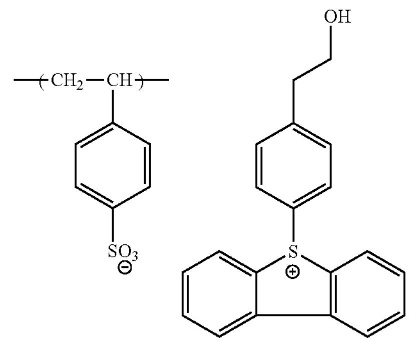
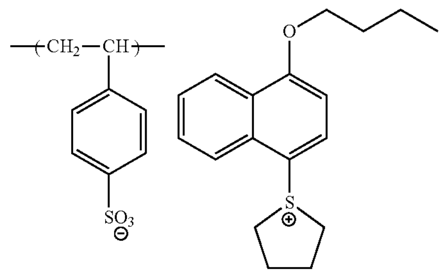
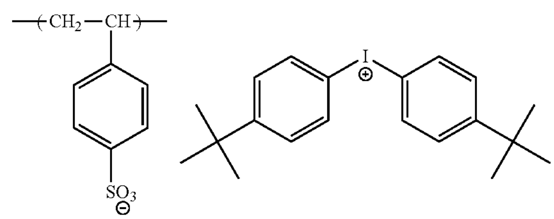
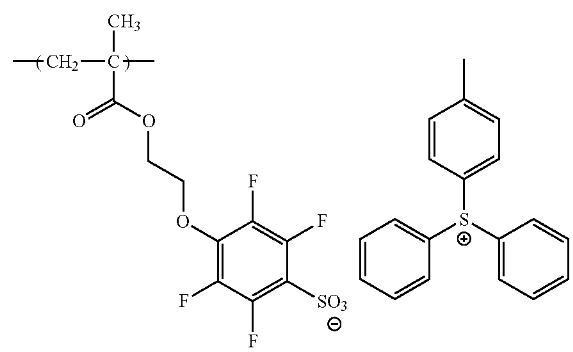
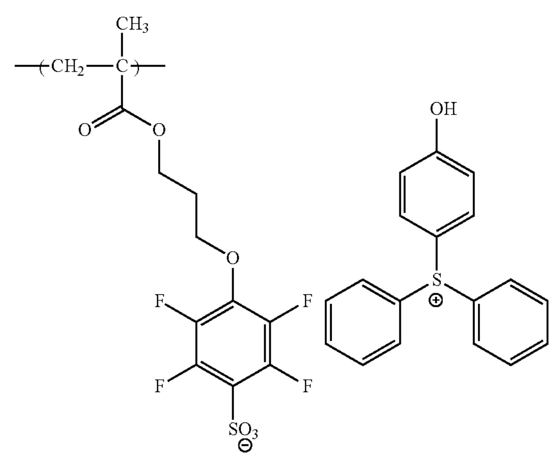

-continued
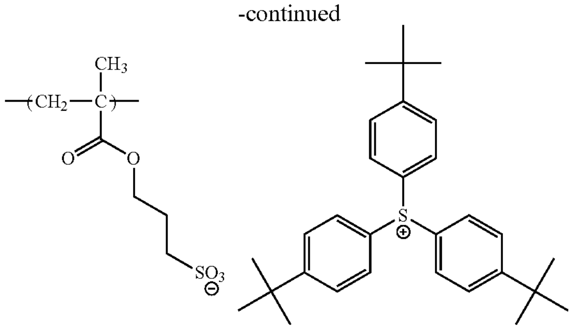
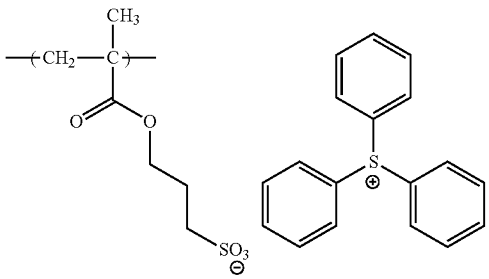
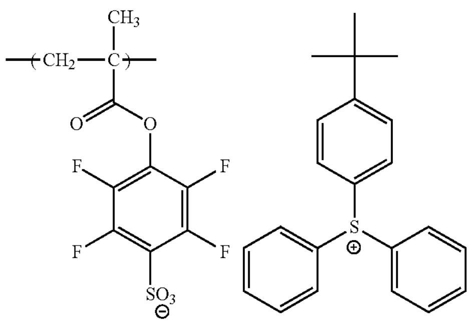
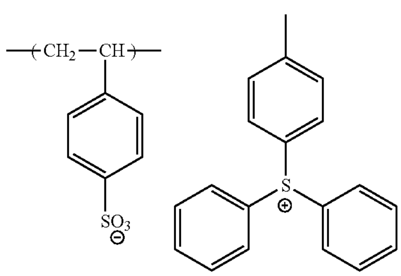
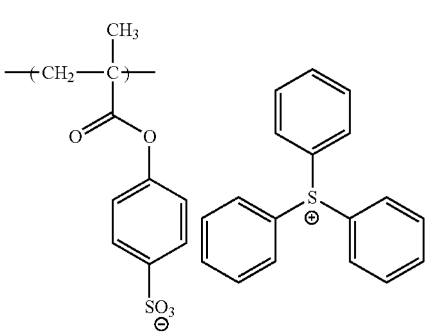
-continued
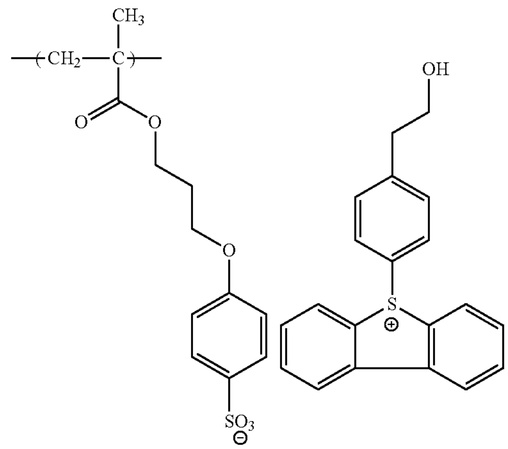
[Chem. 74]
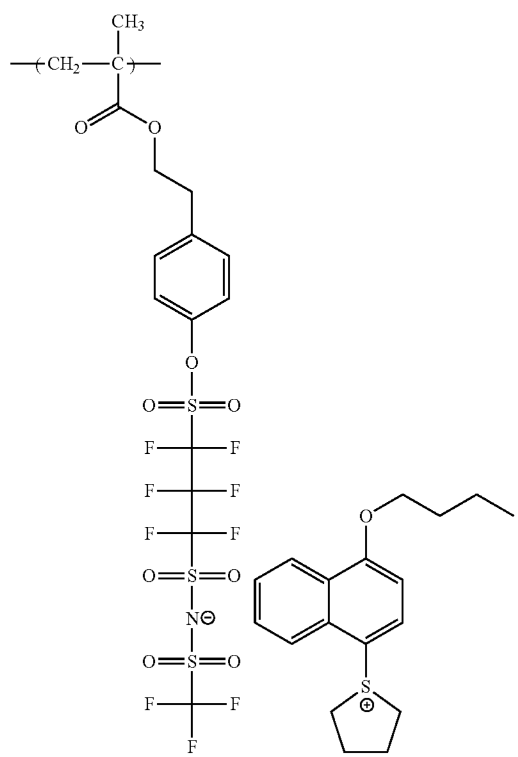

-continued
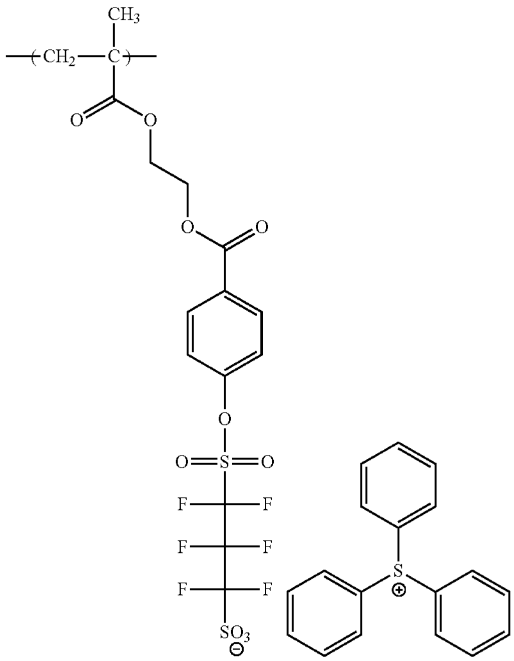
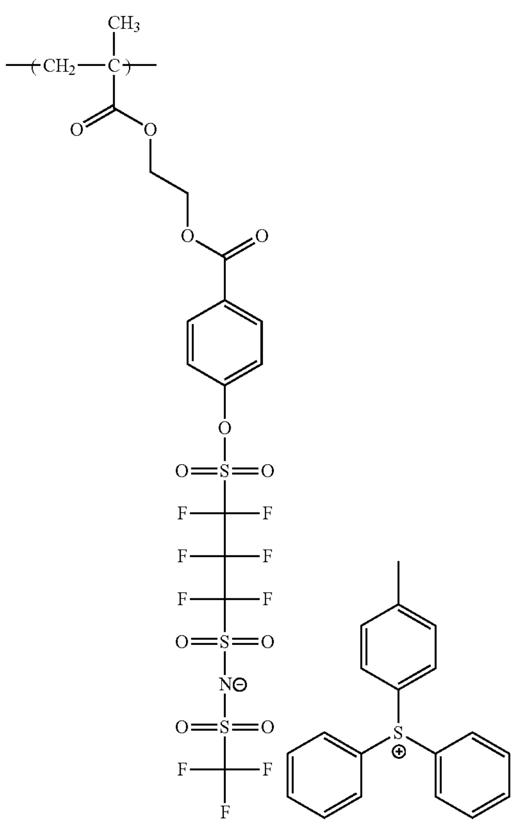
-continued
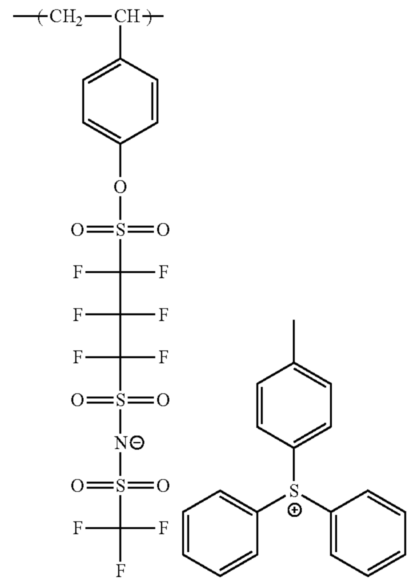
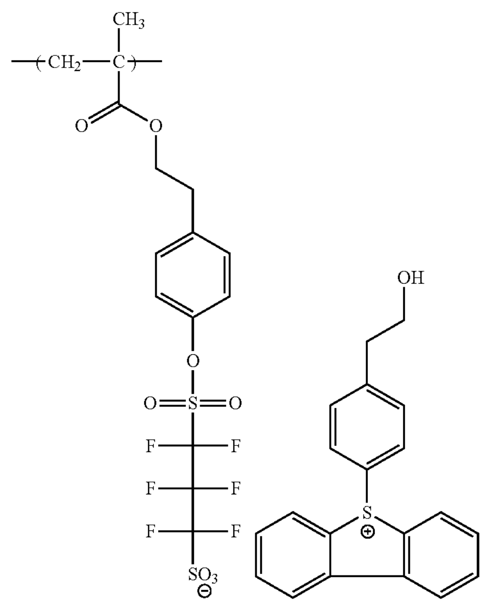
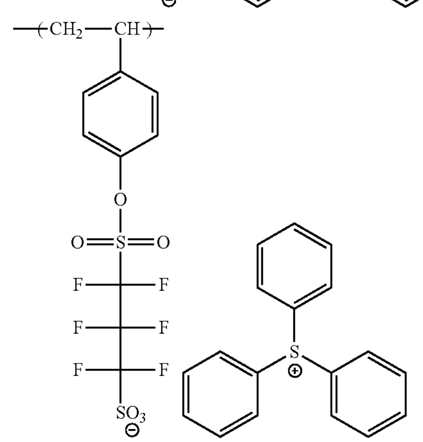

-continued
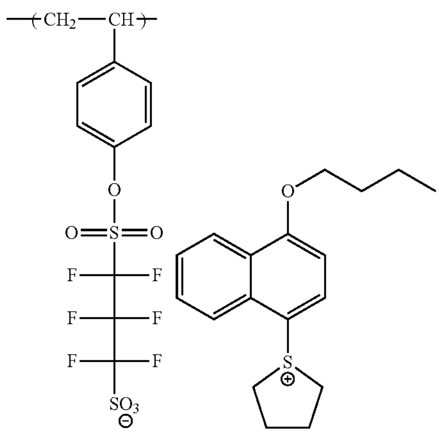
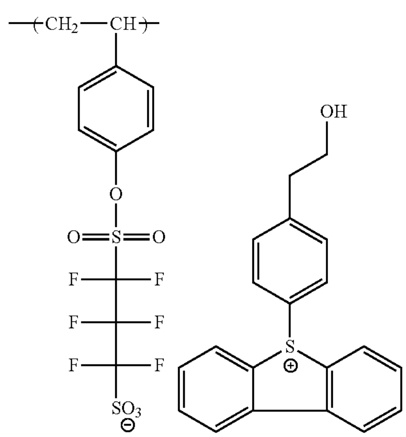
[Chem. 75]
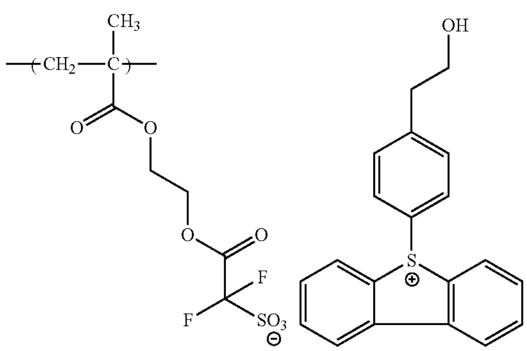
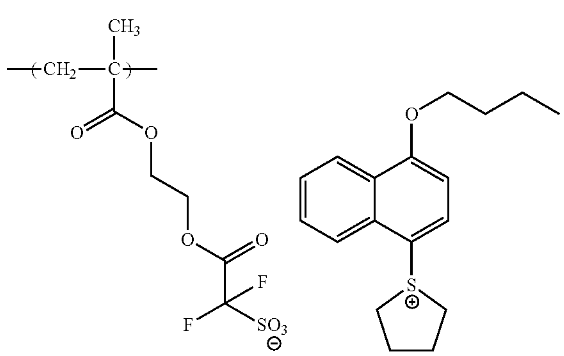
-continued
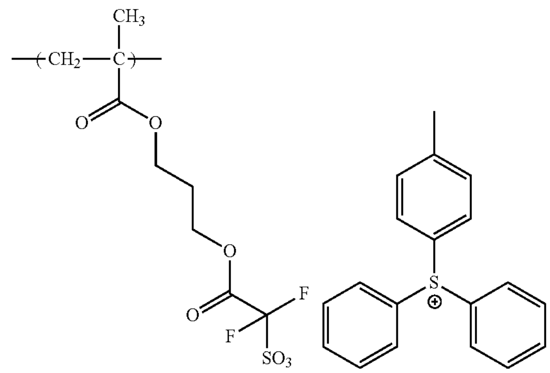
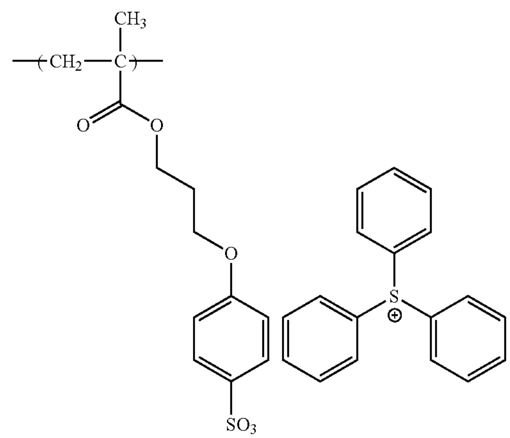
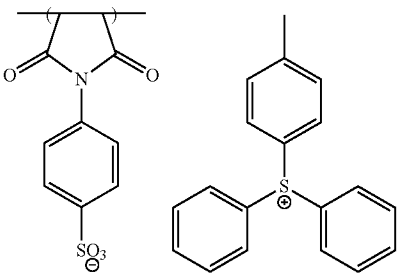
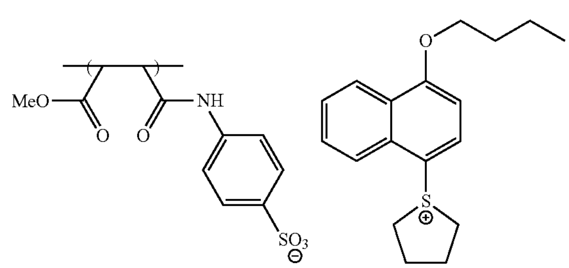
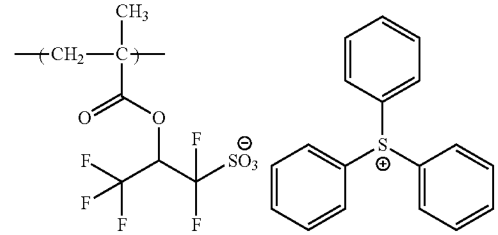

-continued
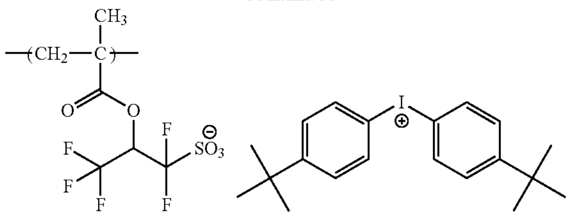
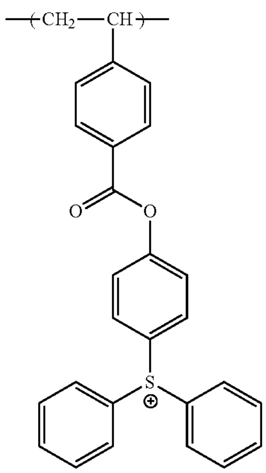
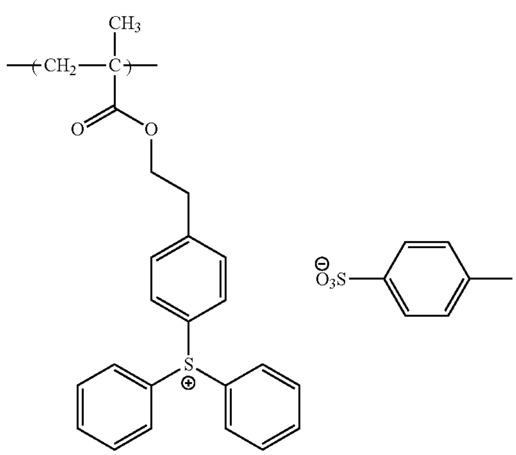
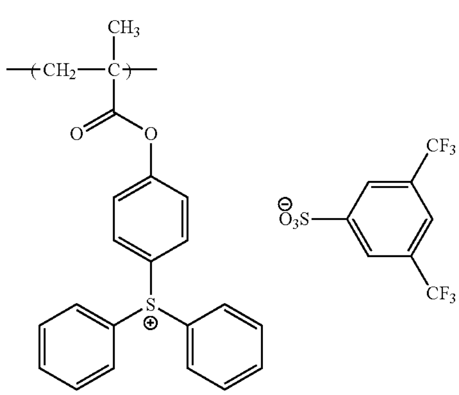
-continued
[Chem. 76]
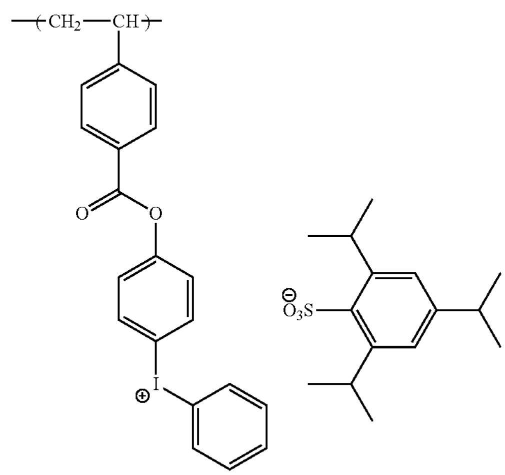
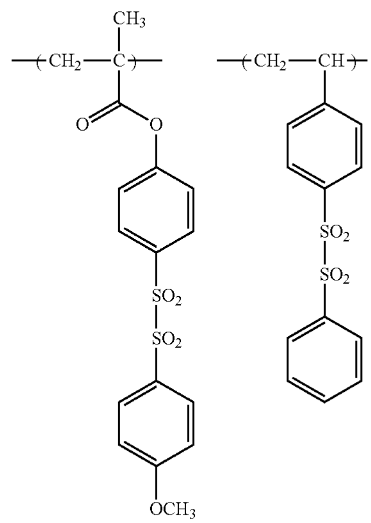
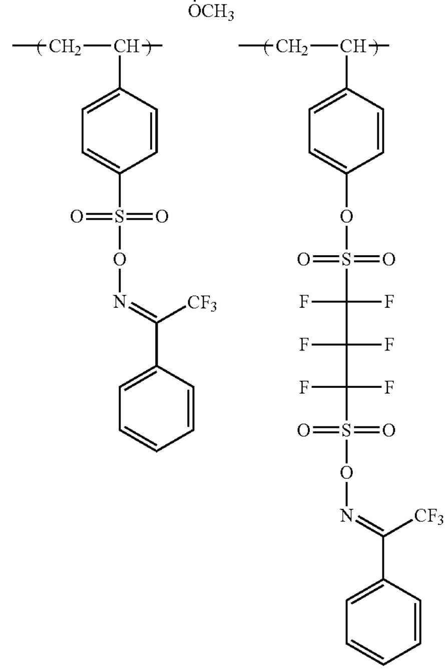

-continued
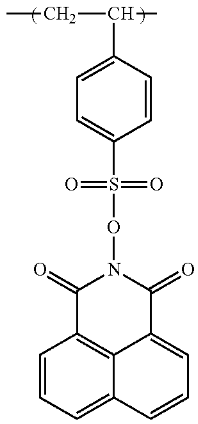
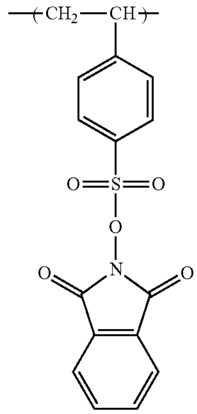
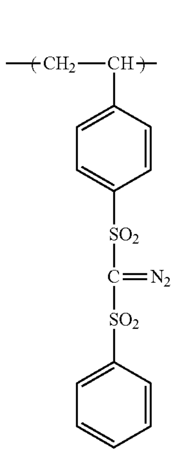
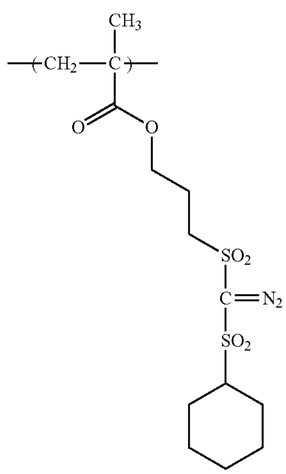
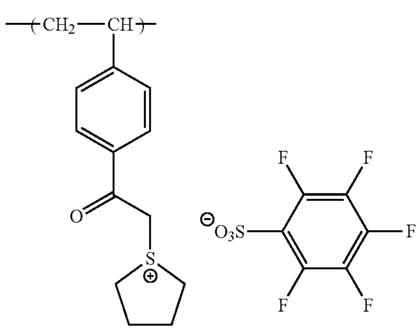
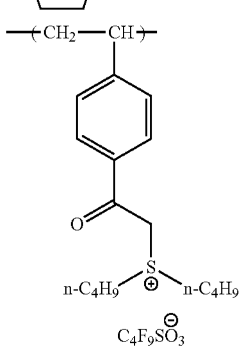
-continued
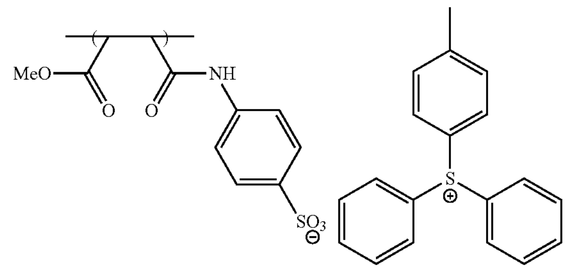
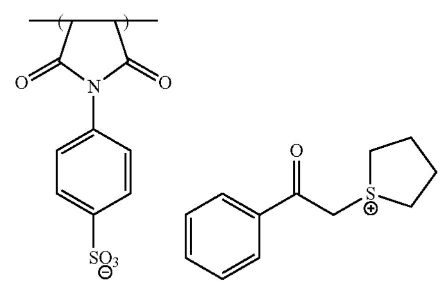
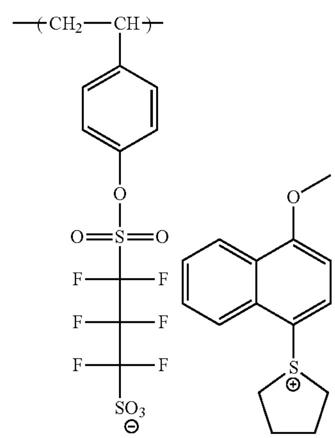
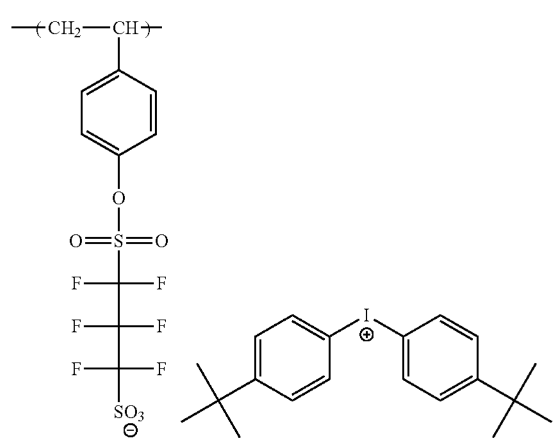

-continued
[Chem. 77]
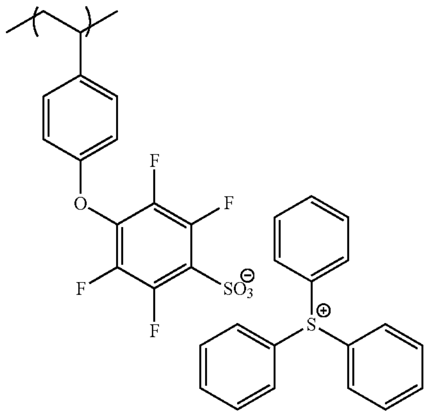
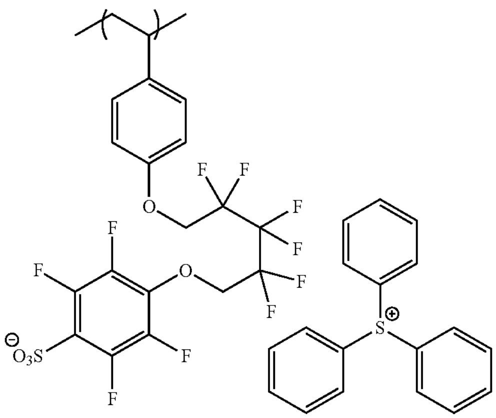
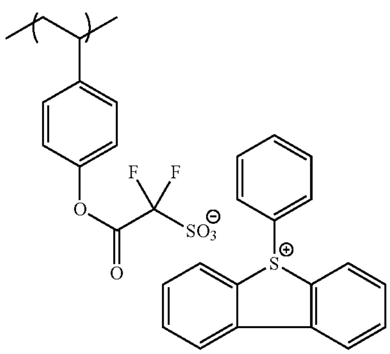
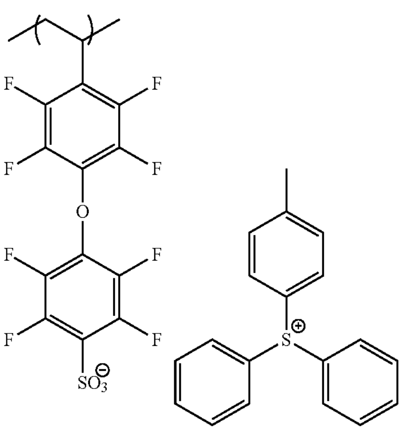
-continued
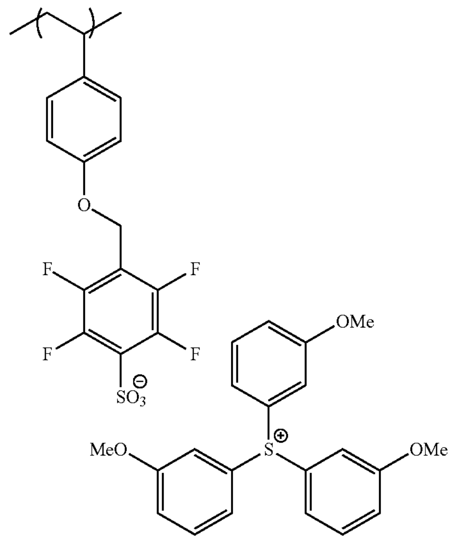
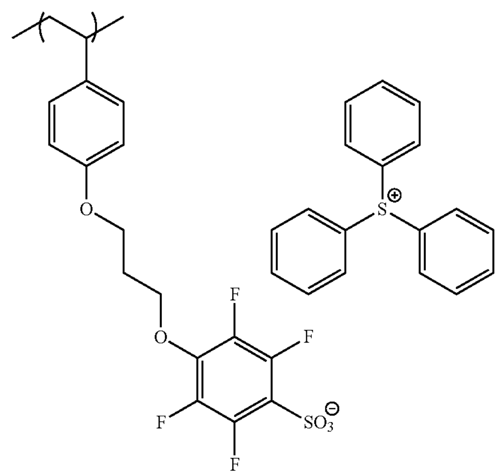
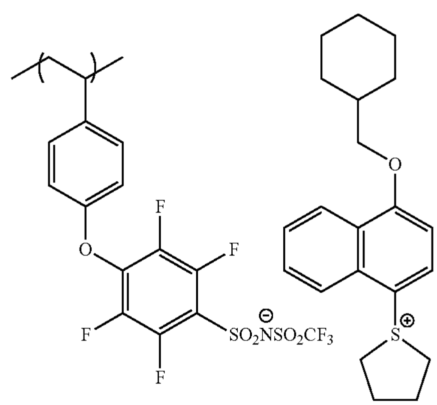

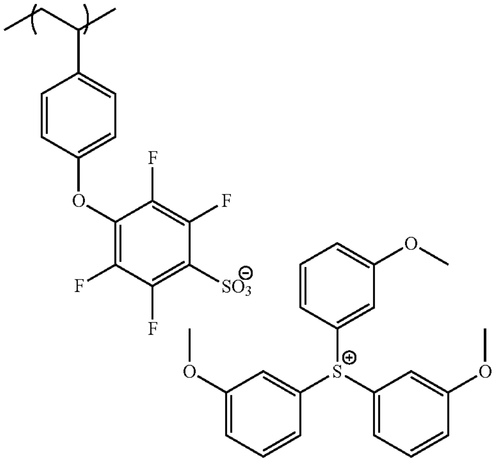
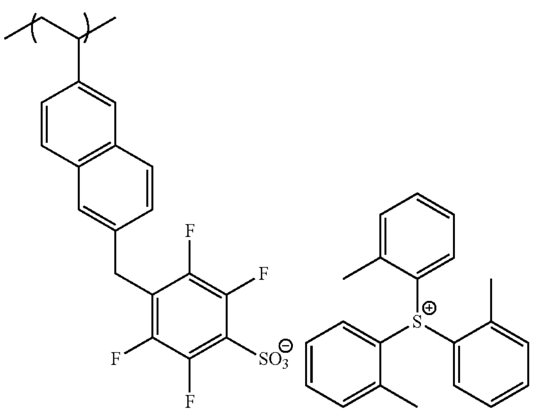
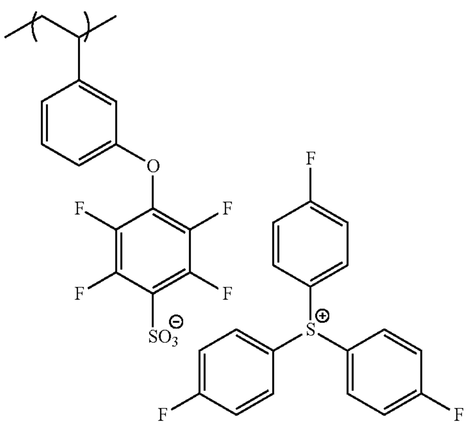
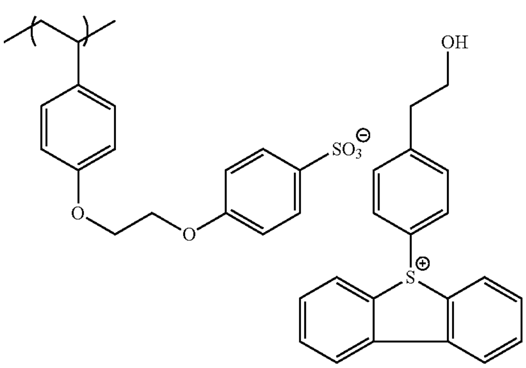
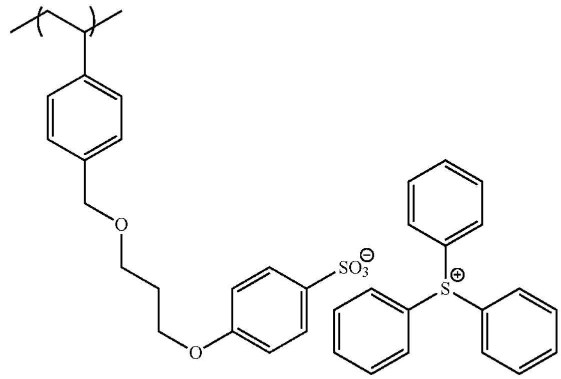
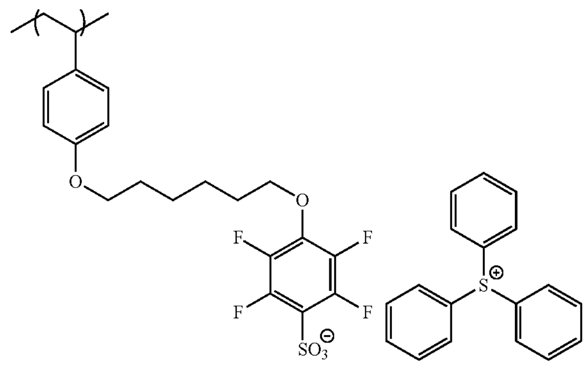
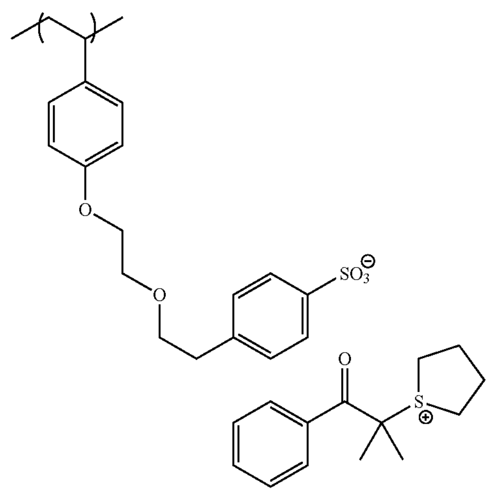
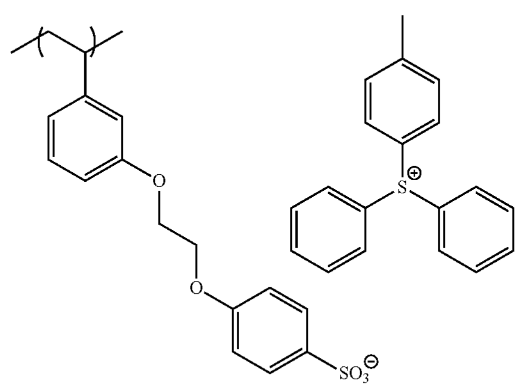

-continued

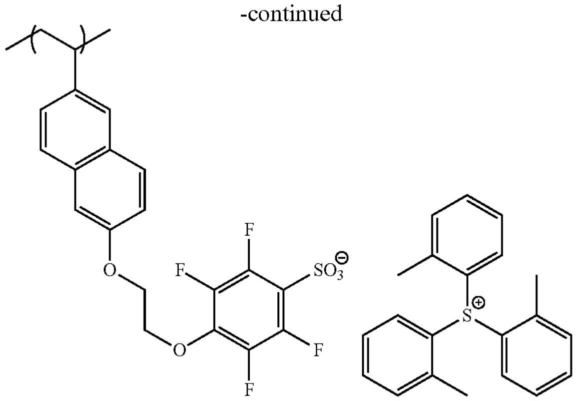

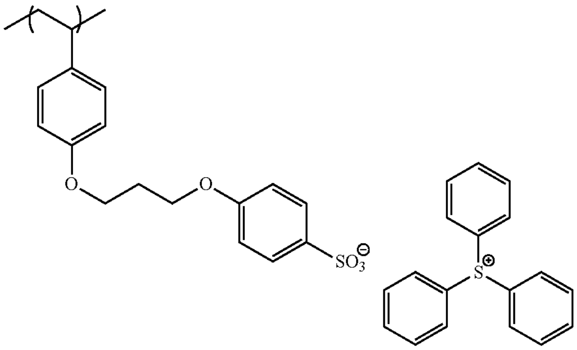

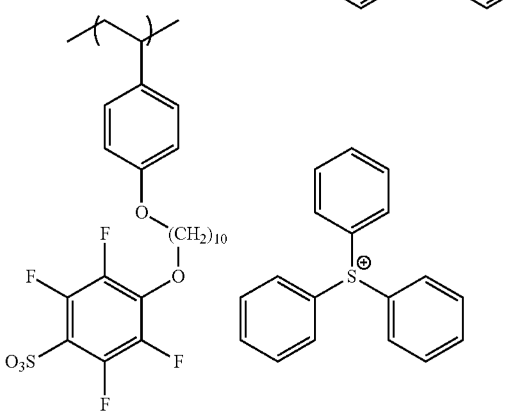

The content of the repeating unit represented by formula (P) in the resin (A) is preferably from 1 to 40% by mole, more preferably from 2 to 30% by mole, still more preferably from 5 to 25% by mole, based on the total repeating units in the resin (A).

Also, the resin (A) may contain the monomer component shown below, from the standpoint of enhancing Tg, increasing dry etching resistance and achieving the effect, for example, internal filter for the out-of-band light described above.

[Chem. 78]

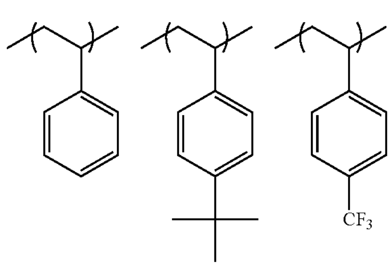

-continued

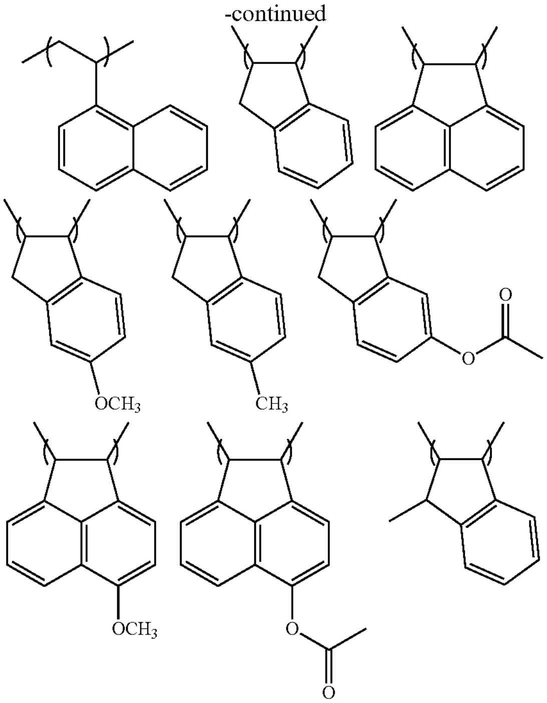

In the resin (A) for use in the composition according to the invention, the molar ratio of respective repeating structural units contained is appropriately set to control the dry etching resistance or suitability for standard developer of a resist, the adhesion property to a substrate, the resist profile and the performances commonly required of a resist, for example, resolution, heat resistance and sensitivity.

The form of the resin (A) according to the invention may be any of a random type, a block type, a comb type and a star type.

The resin (A) can be synthesized, for example, by radical, cationic or anionic polymerization of unsaturated monomers corresponding to the respective structures. It is also possible to obtain the desired resin by polymerizing unsaturated monomers corresponding to precursors of the respective structures and then performing a polymer reaction.

Examples of the common synthesis method include a batch polymerization method of dissolving unsaturated monomers and a polymerization initiator in a solvent and heating the solution to perform the polymerization, and a dropping polymerization method of adding dropwise a solution containing unsaturated monomers and a polymerization initiator to a solvent heated over a period from 1 to 10 hours. The dropping polymerization method is preferred.

The solvent used for the polymerization includes, for example, a solvent which can be used in the preparation of the electron beam-sensitive or extreme ultraviolet radiation-sensitive resin composition described later, and it is more preferred to perform the polymerization by using the same solvent as the solvent used in the composition according to the invention. Thus, generation of particles during storage can be suppressed.

The polymerization reaction is preferably performed in an inert gas atmosphere, for example, nitrogen or argon. As to the polymerization initiator, the polymerization is started using a commercially available radical initiator (for example, an azo initiator or a peroxide). The radical initiator is preferably an azo initiator, and an azo initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). If desired, the polymerization may be performed in the presence of a chain transfer agent (for example, an alkylmercaptan).

The concentration in the reaction is from 5 to 70% by mass, and preferably from 10 to 50% by mass. The reaction temperature is usually from 10 to 150° C., preferably from 30 to 120° C., and more preferably from 40 to 100° C.

The reaction time is usually from 1 to 48 hours, preferably from 1 to 24 hours, and more preferably from 1 to 12 hours.

After the completion of the reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution sate, for example, ultrafiltration of removing by extraction of only compounds having a molecular weight lower than a specific molecular weight, a reprecipitation method of adding dropwise the resin solution to a poor solvent to solidify the resin in the poor solvent, thereby removing residual monomers or the like, or a purification method in a solid state, for example, washing of the resin slurry with a poor solvent after separation of the slurry by filtration, may be applied. For example, the resin is precipitated as a solid by contacting the reaction solution with a solvent in which the resin is sparingly soluble or insoluble (poor solvent) and which is in a volume amount of 10 times or less, preferably in a volume amount from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer. Of the solvents, a solvent containing at least an alcohol (particularly, methanol or the like) or water is preferred as the precipitation or reprecipitation solvent.

The amount of the precipitation or reprecipitation solvent used can be appropriately selected by taking into consideration the efficiency, yield and the like, and in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation can be appropriately selected by taking into consideration the efficiency or operability, and is usually approximately from 0 to 50° C., preferably in the vicinity of room temperature (for example, approximately from 20 to 35° C.). The precipitation or reprecipitation operation can be performed by a known method, for example, a batch system or a continuous system using a mixing vessel in common use, for example, a stirring tank.

The polymer precipitated or reprecipitated is ordinarily subjected to solid-liquid separation in common use, for example, filtration or centrifugation, and dried to be used. The filtration is performed using a solvent-resistant filter element preferably under pressure. The drying is performed under an atmospheric pressure or a reduced pressure (preferably under a reduced pressure) at a temperature of approximately from 30 to 100° C., preferably approximately from 30 to 50° C.

After the resin is once precipitated and separated, the resin may be again dissolved in a solvent and then put into contact with a solvent in which the resin is sparingly soluble or insoluble. Specifically, there may be used a method including, after the completion of the radical polymerization reaction described above, bringing the polymer into contact with a solvent in which the polymer is sparingly soluble or insoluble, to precipitate a resin (step a), separating the resin from the solution (step b), anew dissolving the resin in a solvent to prepare resin solution A (step c), bringing the resin solution A into contact with a solvent in which the resin is sparingly soluble or insoluble and which is in a volume amount of less than 10 times (preferably in a volume amount of 5 times or less) the resin solution A, to precipitate a resin solid (step d), and separating the resin precipitated (step e).

The polymerization reaction is preferably performed in an inert gas atmosphere, for example, nitrogen or argon. As to the polymerization initiator, the polymerization is started using a commercially available radical initiator (for example, an azo initiator or a peroxide). The radical initiator is preferably an azo initiator, and an azo initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). The initiator is added additionally or separately, if desired. After the completion of the reaction, the reaction product is poured in a solvent, and the desired polymer is collected, for example, by a method for powder or solid recovery. The concentration in the reaction is from 5 to 50% by mass, and preferably from 10 to 30% by mass. The reaction temperature is usually from 10 to 150° C., preferably from 30 to 120° C., and more preferably from 60 to 100° C.

The molecular weight of the resin (A) according to the invention is not particularly limited, and the weight average molecular weight is preferably in a range from 1,000 to 100,000, more preferably in a range from 1,500 to 60,000, and particularly preferably in a range from 2,000 to 30,000. When the weight average molecular weight is in a range from 1,000 to 100,000, the deterioration of heat resistance and dry etching resistance can be prevented and also, the deterioration of developing property and the deterioration of film-forming property due to increase in the viscosity can be prevented. Here, the weight average molecular weight of the resin is indicated as a molecular weight calculated in terms of polystyrene measured by GPC (carrier: THF (tetrahydrofuran) or N-methyl-2-pyrrolidone (NMP)).

The polydispersity (Mw/Mn) is preferably from 1.00 to 5.00, more preferably from 1.00 to 3.50, and still more preferably from 1.00 to 2.50. As the molecular weight distribution is narrower, the resolution and resist profile are more excellent, the side wall of the resist pattern is smoother, and the roughness performance is more excellent.

The resin (A) can be used one kind alone or in combination of two or more kinds thereof. The content of the resin (A) is preferably from 20 to 99 by mass, more preferably from 30 to 99% by mass, still more preferably from 40 to 99% by mass, based on the total solid content in the electron beam-sensitive or extreme ultraviolet radiation-sensitive resin composition.

[2] Compound Capable of Generating Acid Upon Irradiation with Electron Beam or Extreme Ultraviolet Radiation (B)

The composition according to the invention preferably contains a compound capable of generating an acid upon irradiation with an electron beam or an extreme ultraviolet radiation (hereinafter, also referred to as an "acid generator").

The acid generator is not particularly limited as long as it is a known acid generator, and a compound capable of generating an organic acid, for example, at least any one of a sulfonic acid, a bis(alkylsulfonyl)imide and a tris(alkylsulfonyl)methide, upon irradiation with an electron beam or an extreme ultraviolet radiation is preferred.

More preferred compounds include compounds represented by formulae (ZI), (ZII) and (ZIII) shown below.

[Chem. 79]

(ZI) (ZII) (ZIII)

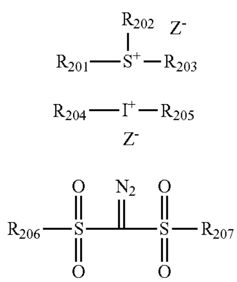

In formula (ZI), each of $R_{201}$, $R_{202}$ and $R_{203}$ independently represents an organic group.

The number of carbon atoms in the organic group for any of $R_{201}$, $R_{202}$ and $R_{203}$ is ordinarily from 1 to 30, and preferably from 1 to 20.

Also, two of $R_{201}$ to $R_{203}$ may be connected to form a ring structure, and the ring may contain therein an oxygen atom, a sulfur atom, an ester bond, an amide bond or a carbonyl group. The group formed by combining two of $R_{201}$ to $R_{203}$ includes an alkylene group (for example, a butylene group or a pentylene group).

$Z^-$ represents a non-nucleophilic anion (an anion having an extremely low ability of causing a nucleophilic reaction).

Examples of the non-nucleophilic anion include a sulfonate anion (for example, an aliphatic sulfonate anion, an aromatic sulfonate anion or camphorsulfonate anion), a carboxylate anion (for example, an aliphatic carboxylate anion, an aromatic carboxylate anion or an aralkylcarboxylate anion), a sulfonylimide anion, a bis(alkylsulfonyl)imide anion and a tris(alkylsulfonyl)methide anion.

The aliphatic moiety in the aliphatic sulfonate anion and aliphatic carboxylate anion may be an alkyl group or a cycloalkyl group, and preferably includes a straight-chain or branched alkyl group having from 1 to 30 carbon atoms or a cycloalkyl group having from 3 to 30 carbon atoms.

The aromatic group in the aromatic sulfonate anion and aromatic carboxylate anion preferably includes an aryl group having from 6 to 14 carbon atoms, for example, a phenyl group, a tolyl group or a naphthyl group.

The alkyl group, cycloalkyl group and aryl group described above may have a substituent. Specific examples of the substituent include a nitro group, a halogen atom, for example, a fluorine atom, a carboxyl group, a hydroxyl group, an amino group, a cyano group, an alkoxy group (preferably having from 1 to 15 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms), an alkylthio group (preferably having from 1 to 15 carbon atoms), an alkylsulfonyl group (preferably having from 1 to 15 carbon atoms), an alkyliminosulfonyl group (preferably having from 1 to 15 carbon atoms), an aryloxysulfonyl group (preferably having from 6 to 20 carbon atoms), an alkylaryloxysulfonyl group (preferably having from 7 to 20 carbon atoms), a cycloalkylaryloxysulfonyl group (preferably having from 10 to 20 carbon atoms), an alkyloxyalkyloxy group (preferably having from 5 to 20 carbon atoms) and a cycloalkylalkyloxyalkyloxy group (preferably having from 8 to 20 carbon atoms). The aryl group or ring structure, which each group has, may further have an alkyl group (preferably having from 1 to 15 carbon atoms) as a substituent.

The aralkyl group in the aralkylcarboxylate anion preferably includes an aralkyl group having from 7 to 12 carbon atoms, for example, a benzyl group, a phenethyl group, a naphthylmethyl group, a naphthylethyl group and a naphthylbutyl group.

The sulfonylimide anion includes, for example, a saccharin anion.

The alkyl group in the bis(alkylsulfonyl)imide anion and tris(alkylsulfonyl)methide anion is preferably an alkyl group having from 1 to 5 carbon atoms. The substituent on the alkyl group includes, for example, a halogen atom, an alkyl group substituted with a halogen atom, an alkoxy group, an alkylthio group, an alkyloxysulfonyl group, an aryloxysulfonyl group and a cycloalkylaryloxysulfonyl group, and is preferably a fluorine atom or an alkyl group substituted with a fluorine atom.

Also, the alkyl groups in the bis(alkylsulfonyl)imide anion may be connected to each other to form a ring structure. In this case, the acid strength is increased.

Other examples of the non-nucleophilic anion include fluorinated phosphorus (for example, $PF_6^-$), fluorinated boron (for example, $BF_4^-$) and fluorinated antimony (for example, $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom or a tris(alkylsulfonyl)methide anion in which the alkyl group is substituted with a fluorine atom. The non-nucleophilic anion is more preferably a perfluoroaliphatic sulfonate anion (still more preferably having from 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion or a 3,5-bis(trifluoromethyl)benzenesulfonate anion.

From the standpoint of acid strength, the pKa of the acid generated is preferably −1 or less for increasing the sensitivity.

An anion represented by formula (AN1) shown below is also a preferred embodiment of the non-nucleophilic anion.

[Chem. 80]

(AN1)

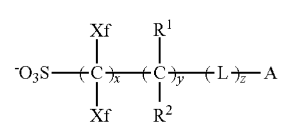

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$ and $R^2$ are present, each $R^1$ and $R^2$ may be the same as or different from every other $R^1$ and $R^2$.

L represents a divalent connecting group, and when a plurality of L are present, each L may be the same as or different from every other L.

A represents a cyclic organic group.

x represents an integer from 1 to 20, y represents an integer from 0 to 10, and z represents an integer from 0 to 10.

Formula (AN1) is described in more detail.

The alkyl group in the alkyl group substituted with a fluorine atom for Xf is preferably an alkyl group having from 1 to 10 carbon atoms, and more preferably an alkyl group having from 1 to 4 carbon atoms. Also, the alkyl group substituted with a fluorine atom for Xf is preferably a perfluoroalkyl group.

Xf is preferably a fluorine atom or a perfluoroalkyl group having from 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, a fluorine atom and $CF_3$ are preferred. In particular, it is preferred that both Xf are fluorine atoms.

The alkyl group for any of $R^1$ and $R^2$ may have a substituent (preferably a fluorine atom) and is preferably an alkyl group having from 1 to 4 carbon atoms, and more preferably a perfluoroalkyl group having from 1 to 4 carbon atoms. Specific examples of the alkyl group having a substituent for any of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, $CF_3$ is preferred.

Each of $R^1$ and $R^2$ is preferably a fluorine atom or $CF_3$.

x is preferably from 1 to 10, and more preferably from 1 to 5.

y is preferably from 0 to 4, and more preferably 0.

z is preferably from 0 to 5, and more preferably from 0 to 3.

The divalent connecting group for L is not particularly limited, includes, for example, —COO—, —OCO—, —CO—, —O—, —S—, —SO—, —$SO_2$—, an alkylene group, a cycloalkylene group, an alkenylene group and a connecting group composed of a combination of a plurality thereof, and is preferably a connecting group having a total number of carbon atoms of 12 or less. Among them, —COO—, —OCO—, —CO— and —O— are preferred, and —COO— and —OCO— are more preferred.

The cyclic organic group for A is not particularly limited as long as it has a cyclic structure, and includes, for example, an alicyclic group, an aryl group and a heterocyclic group (including not only those having aromaticity but also those having no aromaticity).

The alicyclic group may be monocyclic or polycyclic, and is preferably a monocyclic cycloalkyl group, for example, a cyclopentyl group, a cyclohexyl group or a cyclooctyl group, or a polycyclic cycloalkyl group, for example, a norbornyl group, a tricyclodecanyl group, a tetracyclodecanyl group, a tetracyclododecanyl group or an adamantyl group. Among them, an alicyclic group having 7 or more carbon atoms containing a bulky structure, for example, a norbornyl group, a tricyclodecanyl group, a tetracyclodecanyl group, a tetracyclododecanyl group or adamantyl group is preferred from the standpoint that the diffusion in the film during a heating step after exposure can be suppressed and MEEF can be improved.

The aryl group includes a benzene ring, a naphthalene ring, a phenanthrene ring and an anthracene ring.

Examples of the heterocyclic group include those derived from a furan ring, a thiophene ring, a benzofuran ring, a benzothiophene ring, a dibenzofuran ring, a dibenzothiophene ring and a pyridine ring. Among them, heterocyclic groups derived from a furan ring, a thiophene ring and a pyridine ring are preferred.

The cyclic organic group also includes a lactone structure. Specific examples thereof include the lactone structures represented by formulae (LC1-1) to (LC1-17) which may be contained in the resin (A) described above.

The cyclic organic group may have a substituent, and the substituent includes, for example, an alkyl group (may be any of straight-chain, branched or cyclic, preferably having from 1 to 12 carbon atoms), a cycloalkyl group (may be any of monocyclic, polycyclic or spirocyclic, preferably having from 3 to 20 carbon atoms), an aryl group (preferably having from 6 to 14 carbon atoms), a hydroxyl group, an alkoxy group, an ester group, an amido group, a urethane group, a ureido group, a thioether group, a sulfonamido group, and a sulfonic acid ester group. The carbon constituting the cyclic organic group (the carbon contributing to ring formation) may be a carbonyl carbon.

The organic group for any of $R_{201}$, $R_{202}$ and $R_{203}$ includes, for example, an aryl group, an alkyl group and a cycloalkyl group.

At least one of $R_{201}$, $R_{202}$ and $R_{203}$ is preferably an aryl group, and it is more preferred that all of $R_{201}$, $R_{202}$ and $R_{203}$ are aryl groups. The aryl group may be a heteroaryl group, for example, an indole residue or a pyrrole residue, other than a phenyl group, a naphthyl group and the like. The alkyl group and cycloalkyl group for any of $R_{201}$, $R_{202}$ and $R_{203}$ preferably includes a straight-chain or branched alkyl group having from 1 to 10 carbon atoms and a cycloalkyl group having from 3 to 10 carbon atoms. The alkyl group more preferably includes, for example, a methyl group, an ethyl group, an n-propyl group, an isopropyl group and an n-butyl group. The cycloalkyl group more preferably includes, for example, a cyclopropyl group, a cyclobutyl group, a cyclopentyl group, a cyclohexyl group and a cycloheptyl group. These groups may further have a substituent. The substituent includes, for example, a nitro group, a halogen atom, for example, a fluorine atom, a carboxyl group, a hydroxyl group, an amino group, a cyano group, an alkoxy group (preferably having from 1 to 15 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms) and an alkoxycarbonyloxy group (preferably having from 2 to 7 carbon atoms), but it should not be construed as being limited thereto.

In the case where two of $R_{201}$ to $R_{203}$ are connected to form a ring structure, the ring structure is preferably a structure represented by formula (A1) shown below.

[Chem. 81]

(A1)

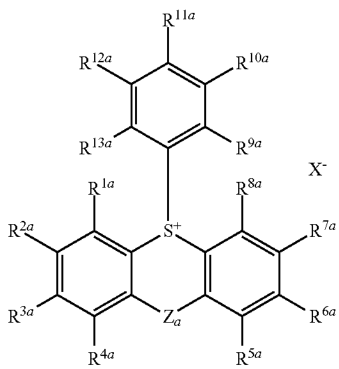

In formula (A1), each of $R^{1a}$ to $R^{13a}$ independently represents a hydrogen atom or a substituent.

It is preferred that from 1 to 3 of $R^{1a}$ to $R^{13a}$ are not hydrogen atoms, and it is more preferred that any one of $R^{9a}$ to $R^{13a}$ is not a hydrogen atom.

Za represents a single bond or a divalent connecting group.

$X^-$ has the same meaning as $Z^-$ in formula (ZI).

Specific examples of $R^{1a}$ to $R^{13a}$ when these are not hydrogen atoms include a halogen atom, a straight-chain, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$), and other known substituents.

In the case where $R^{1a}$ to $R^{13a}$ are not hydrogen atoms, a straight-chain, branched or cyclic alkyl group substituted with a hydroxyl group is preferred.

The divalent connecting group for Za includes, for example, an alkylene group, an arylene group, a carbonyl group, a sulfonyl group, a carbonyloxy group, a carbonylamino group, a sulfonylamido group, an ether bond, a thioether bond, an amino group, a disulfide group, $—(CH_2)_n—CO—$, $—(CH_2)_n—SO_2—$, $—CH=CH—$, an aminocarbonylamino group and an aminosulfonylamino group (n is an integer from 1 to 3).

When at least one of $R_{201}$, $R_{202}$ and $R_{203}$ is not an aryl group, preferred structures include cation structures, for example, in compounds described in paragraphs 0046 to 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group for any of $R_{204}$ to $R_{207}$ are the same as the aryl group described for the aryl group, alkyl group and cycloalkyl group for any of $R_{201}$ to $R_{203}$ in the compound (ZI) descried above.

The aryl group, alkyl group and cycloalkyl group for any of $R_{204}$ to $R_{207}$ may have a substituent. The substituent also includes those which the aryl group, alkyl group and cycloalkyl group for $R_{201}$ to $R_{203}$ in the compound (ZI) described above may have.

Z represents a non-nucleophilic anion, and includes the same as those of the non-nucleophilic anion for $Z^-$ in formula (ZI).

The acid generator further includes compounds represented by formulae (ZIV), (ZV) and (ZVI) shown below.

[Chem. 82]

(ZIV)

$$Ar_3—SO_2—SO_2—Ar_4$$

(ZV)

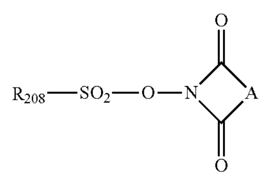

(ZVI)

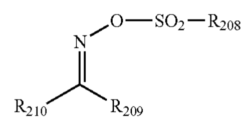

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group for any of $Ar_3$, $Ar_4$, $R_{208}$, $R_{209}$ and $R_{210}$ are the same as the specific examples of the aryl group for any of $R_{201}$, $R_{202}$ and $R_{203}$ in formula (ZI) described above.

Specific examples of the alkyl group and cycloalkyl group for any of $R_{208}$, $R_{209}$ and $R_{210}$ are the same as the specific examples of the alkyl group and cycloalkyl group for any of $R_{201}$, $R_{202}$ and $R_{203}$ in formula (ZI) described above.

The alkylene group for A includes an alkylene group having from 1 to 12 carbon atoms (for example, a methylene group, an ethylene group, a propylene group, an isopropylene group, a butylene group or an isobutylene group), the alkenylene group for A includes an alkenylene group having from 2 to 12 carbon atoms (for example, an ethenylene group, a propenylene group or a butenylene group), and the arylene group for A includes an arylene group having from 6 to 10 carbon atoms (for example, a phenylene group, a tolylene group or a naphthylene group).

Of the acid generators, particularly preferred examples thereof are set forth below.

[Chem. 83]
(z1)
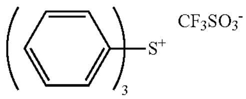
(z2)
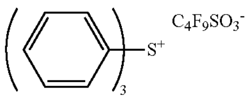
(z3)
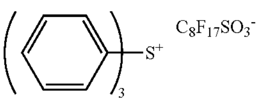
(z4)
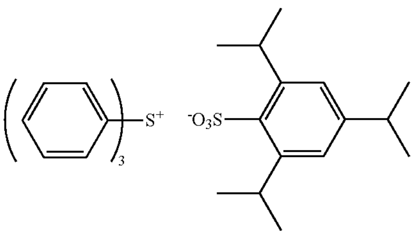
(z5)
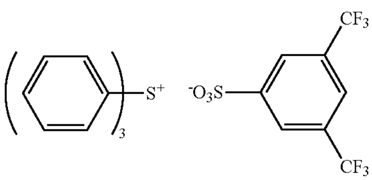
(z6)
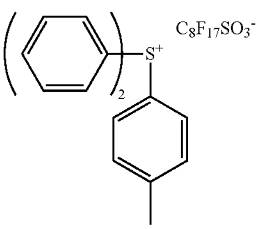
(z7)
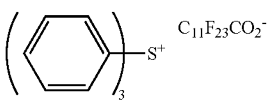
(z8)
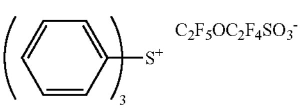
(z9)
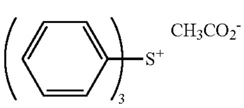
(z10)
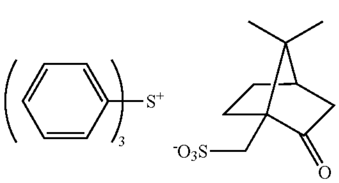
-continued
(z11)
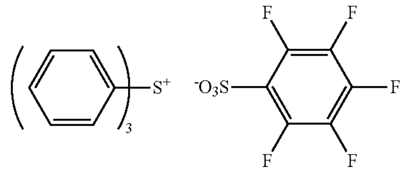
(z12)
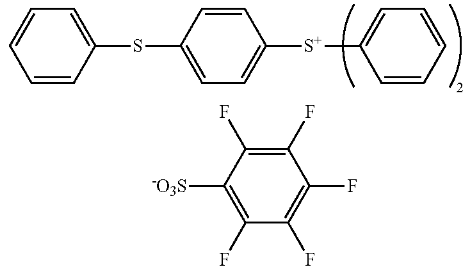
(z13)
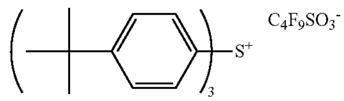
(z14)
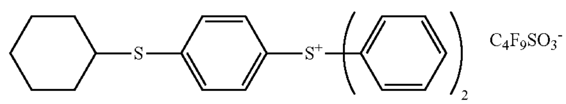
(z15)
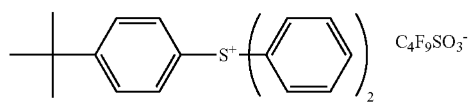
(z16)
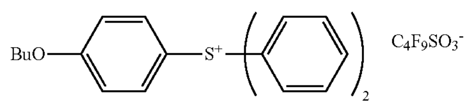
(z17)
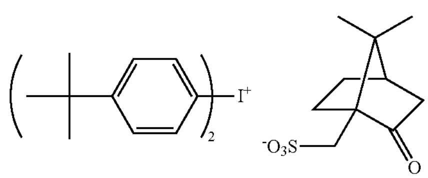
(z18)
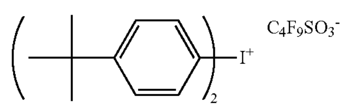
(z19)
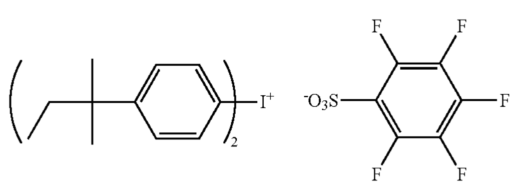
(z20)
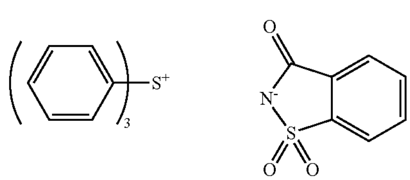

-continued
(z21)
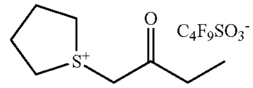
(z22)
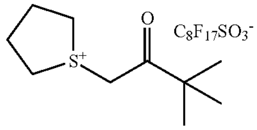
(z23)
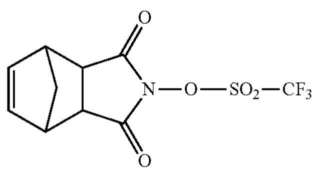
(z24)
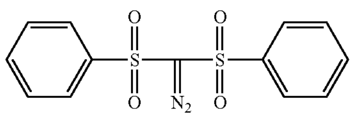
(z25)
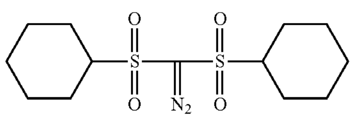
(z26)
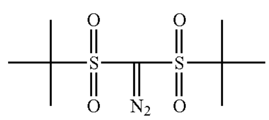
(z27)
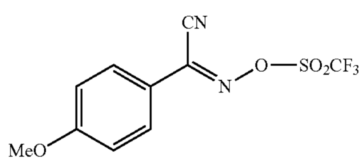
(z28)
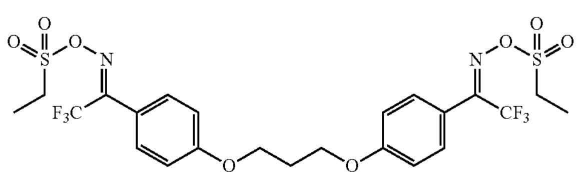
(z29)
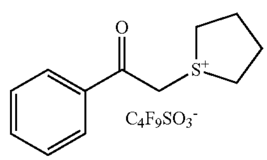
(z30)
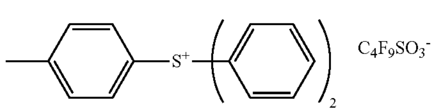
(z31)
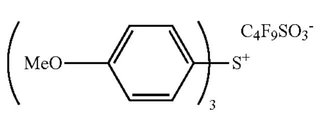
-continued
(z32)
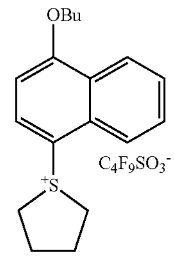
(z33)
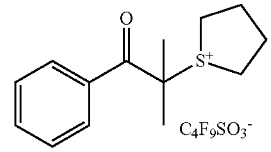
(z34)
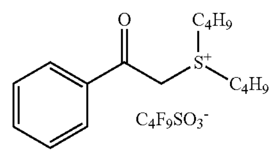
(z35)
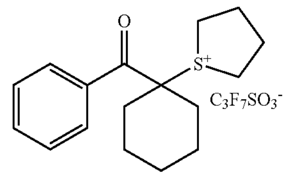
(z36)
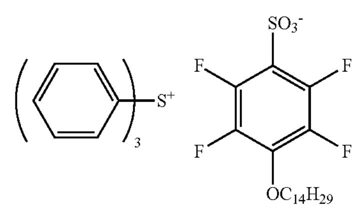
(z37)
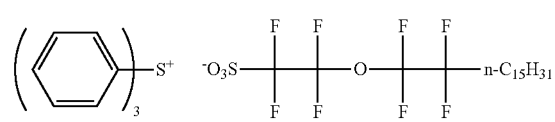
(z38)
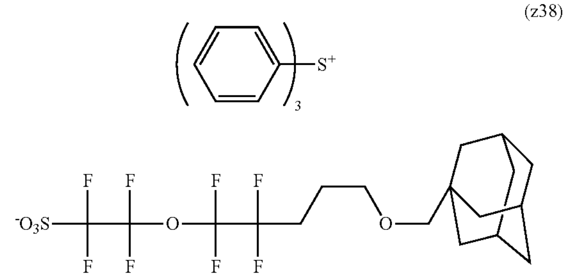
(z39)
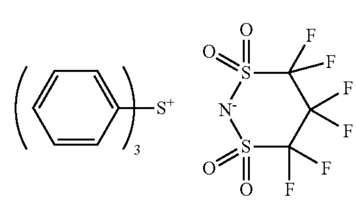

-continued
(z40)
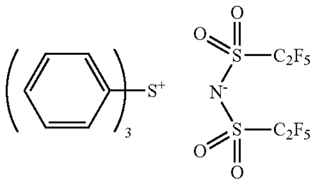
[Chem. 84]
(z41)
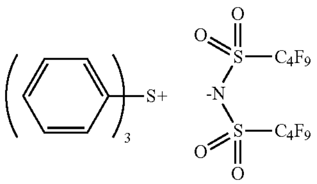
(z42)
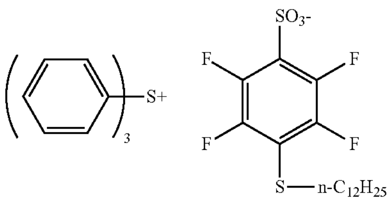
(z43)
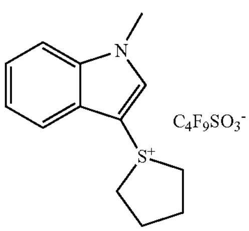
(z44)
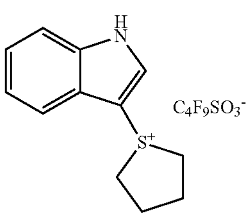
(z45)
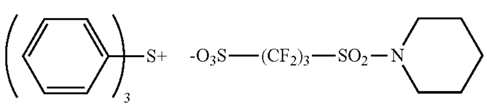
(z46)
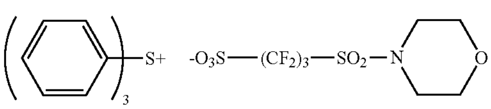
(z47)
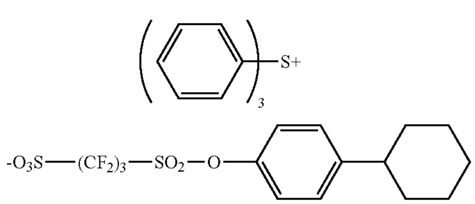
(z48)
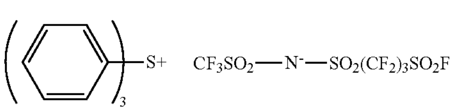
-continued
(z49)
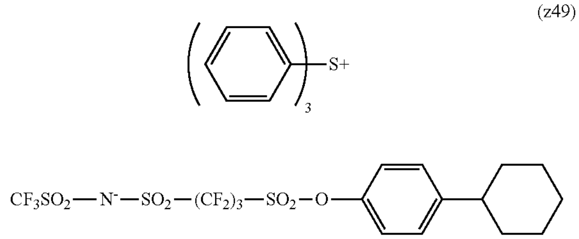
(z50)
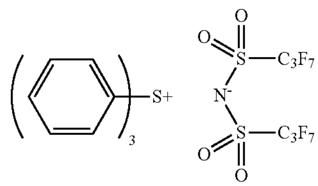
(z51)
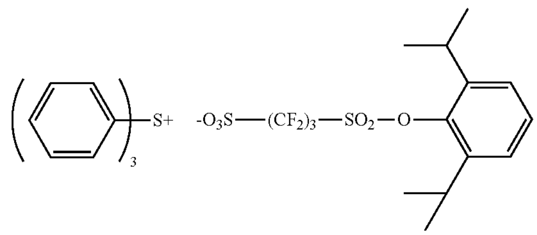
(z52)
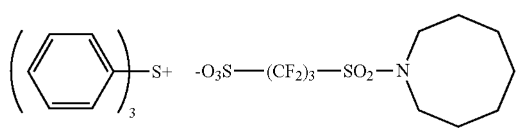
(z53)
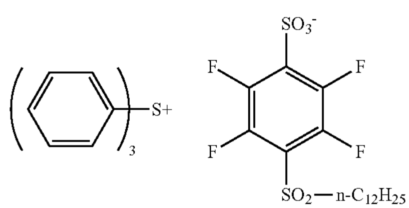
(z54)
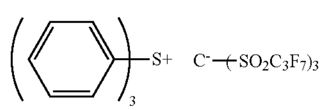
(z55)
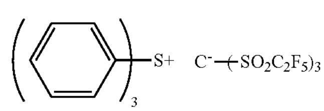
(z56)
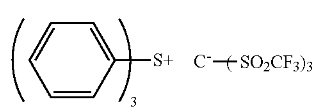
(z57)
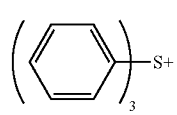

-continued
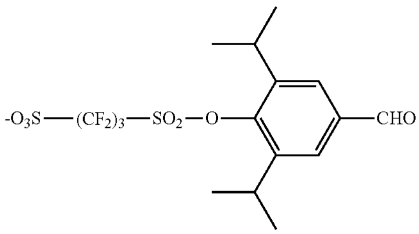
(z58)
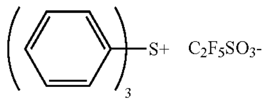
(z59)
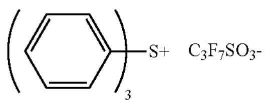
(z60)
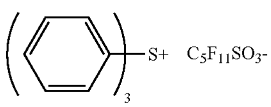
(z61)
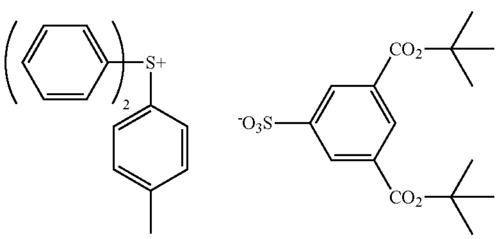
(z62)
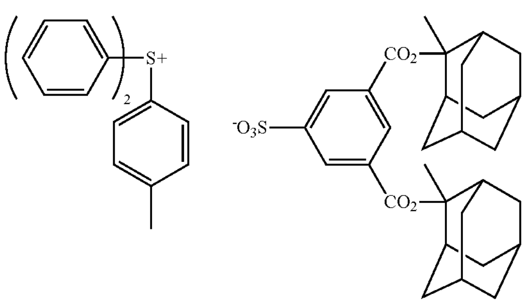
(z63)
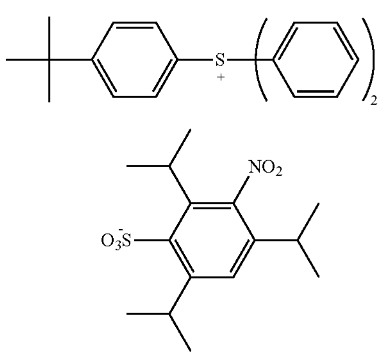
-continued
(z64)
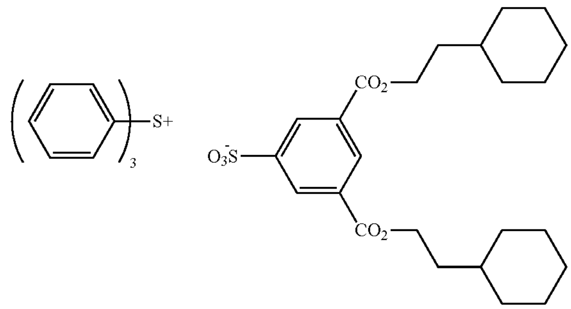
(z65)
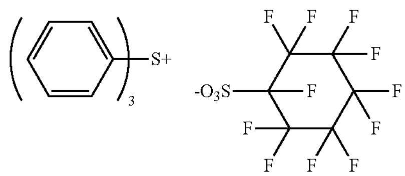
(z66)
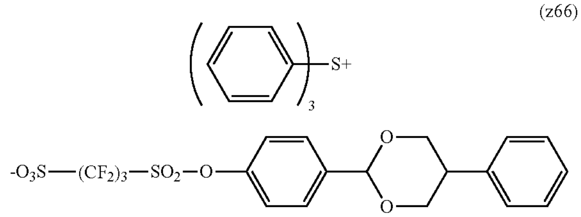
(z67)
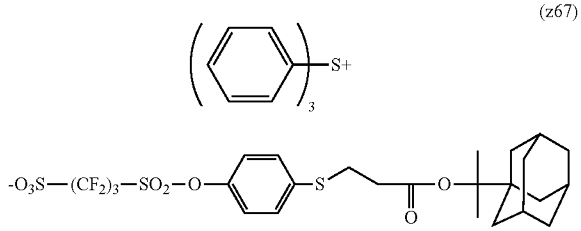
(z68)
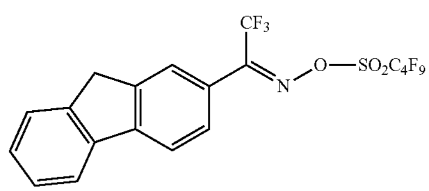
(z69)
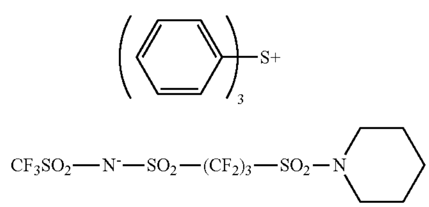
(z70)
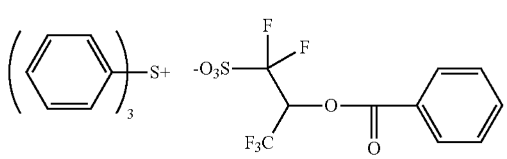

-continued
[Chem. 85]
(z71)
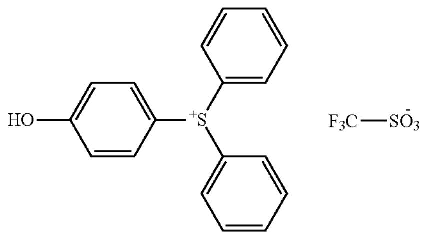
(z72)
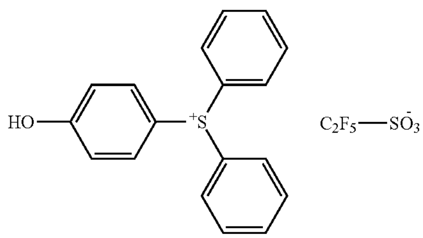
(z73)
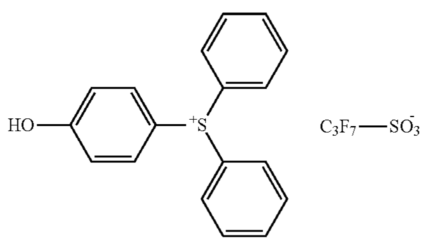
(z74)
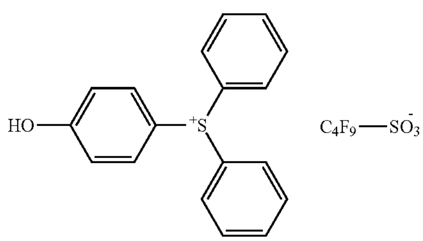
(z75)
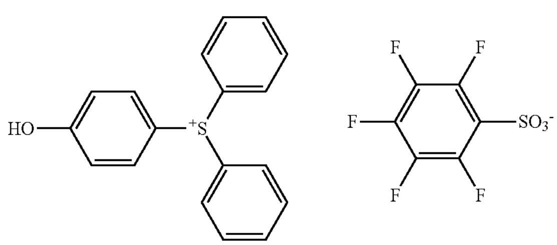
(z76)
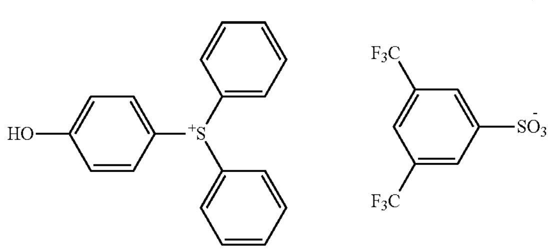
-continued
(z77)
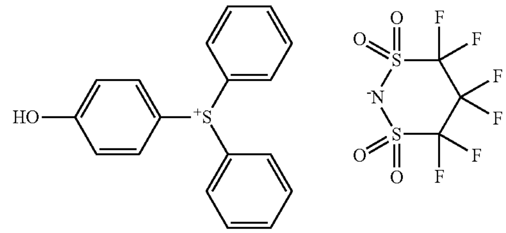
(z78)
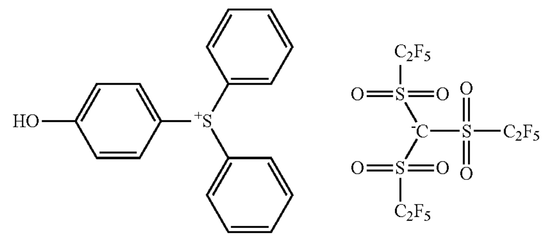
(z79)
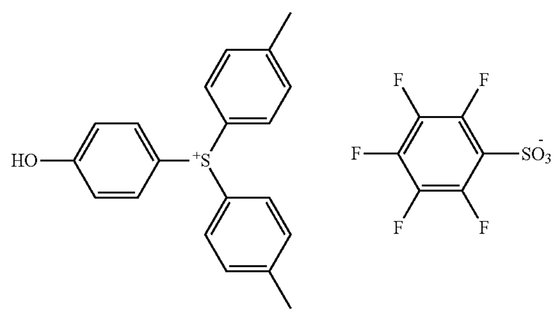
(z80)
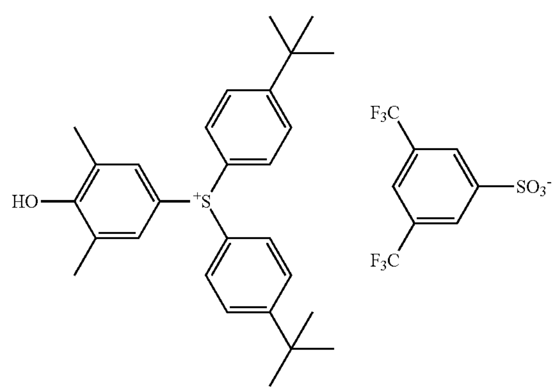
(z81)
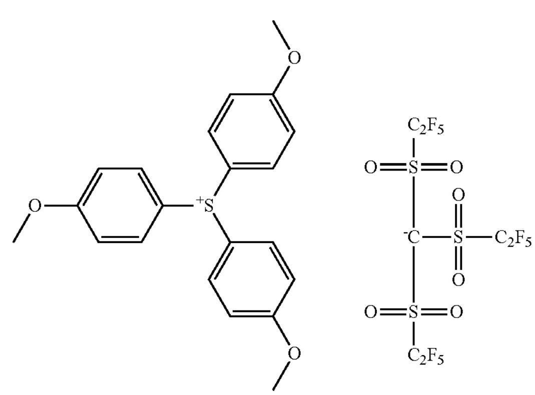

-continued
[Chem. 86]
(z82)
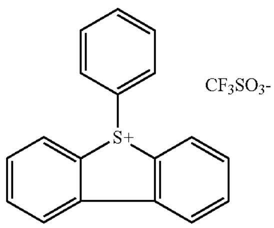
(z83)
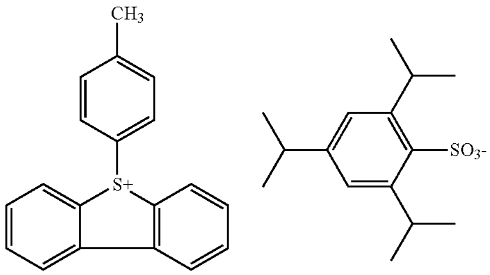
(z84)
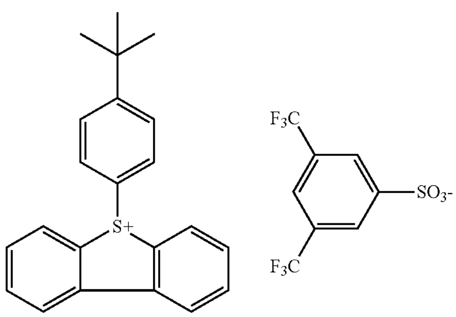
(z85)
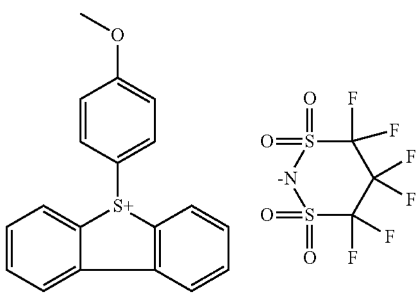
(z86)
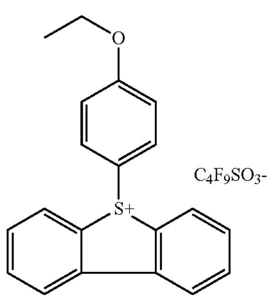
-continued
(z87)
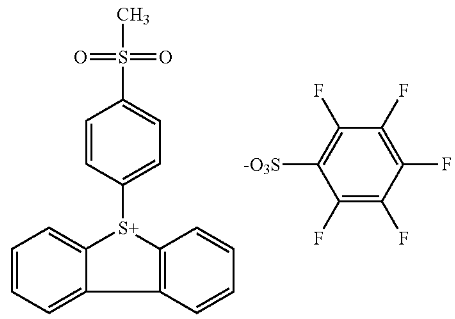
(z88)
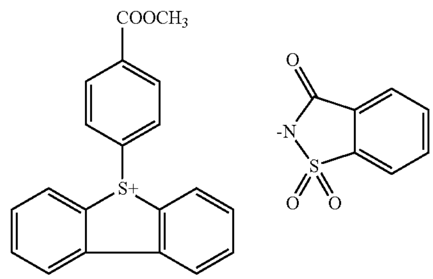
(z89)
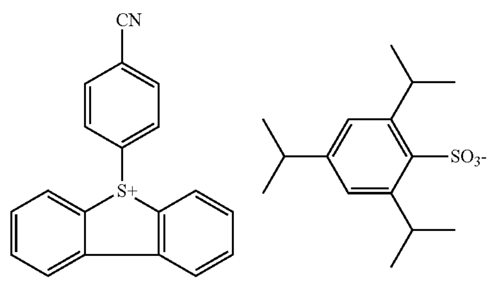
(z90)
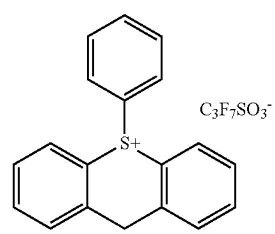
(z91)
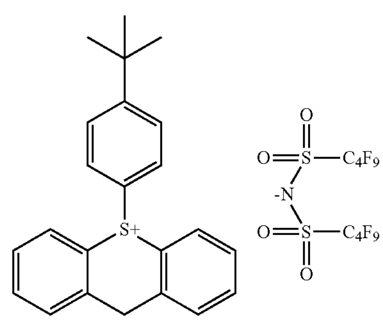

-continued
(z92)
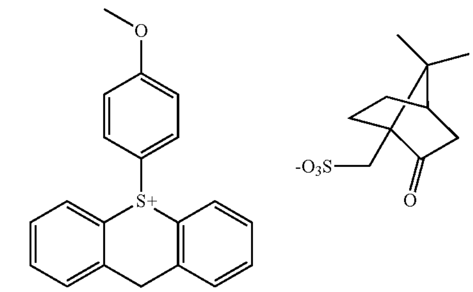
(z93)
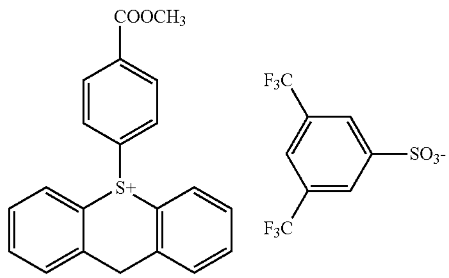
(z94)
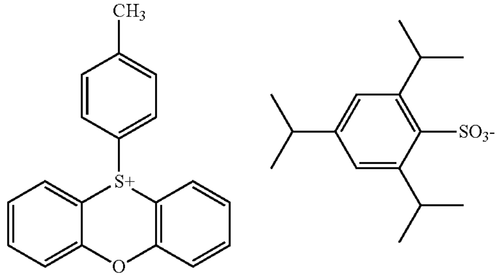
(z95)
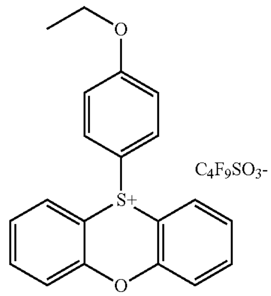
(z96)
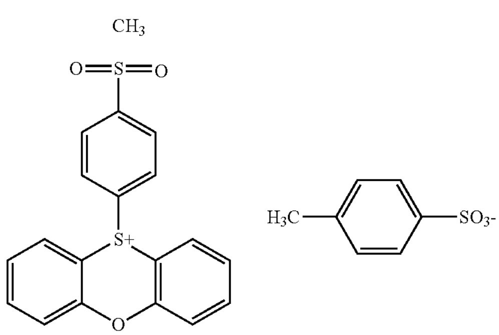
-continued
(z97)
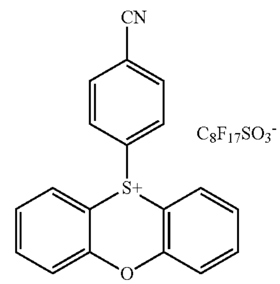
(z98)
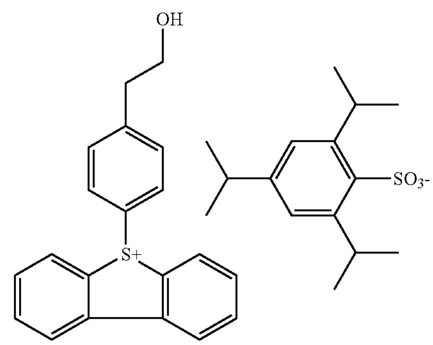
(z99)
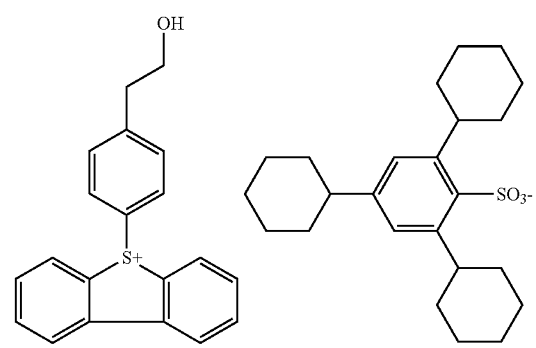
(z100)
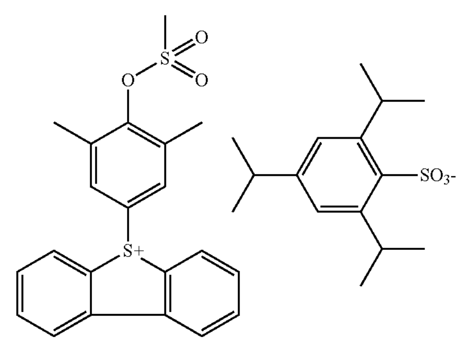
[Chem. 87]
(z101)
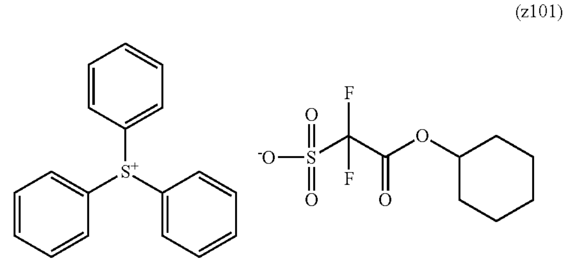

-continued
(z102)
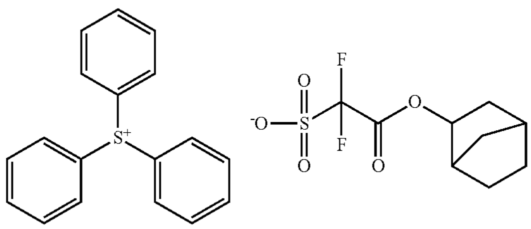
(z103)
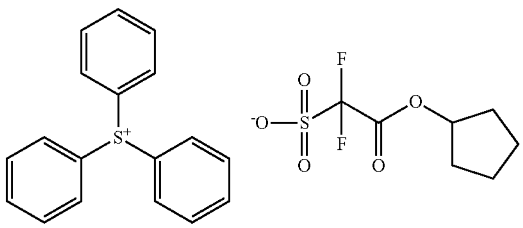
(z104)
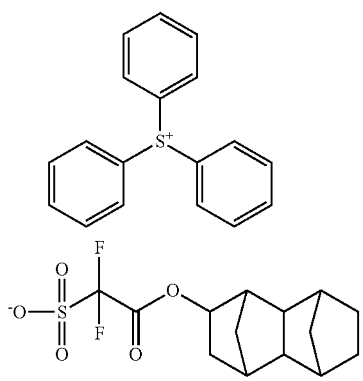
(z105)
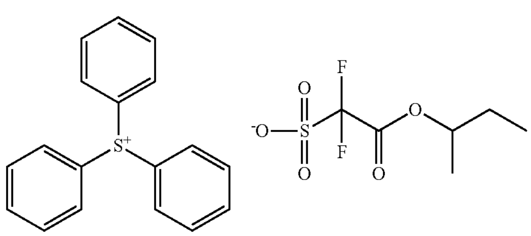
(z106)
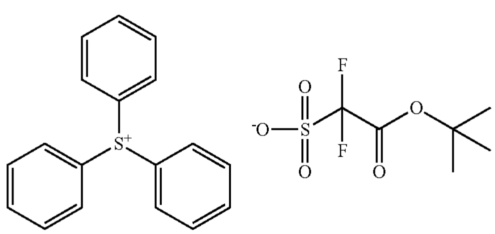
(z107)
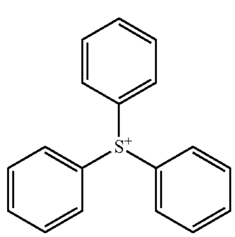
-continued
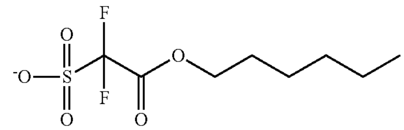
(z108)
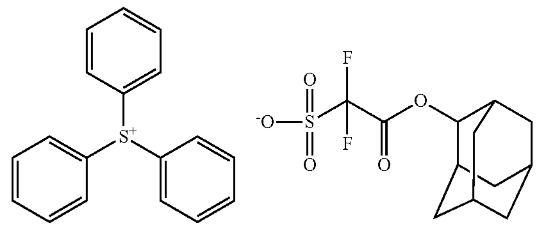
(z109)
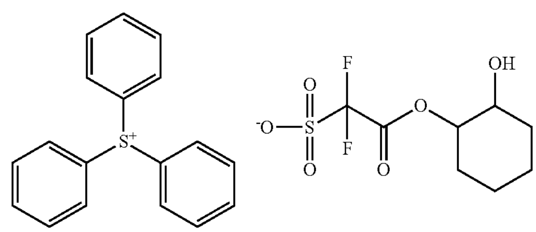
(z110)
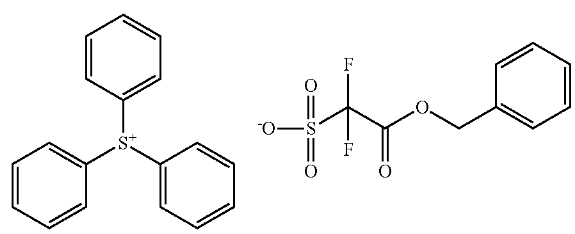
(z111)
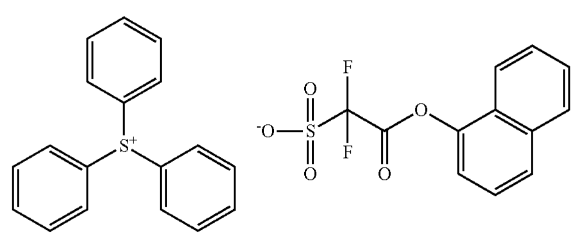
[Chem. 88]
(z112)
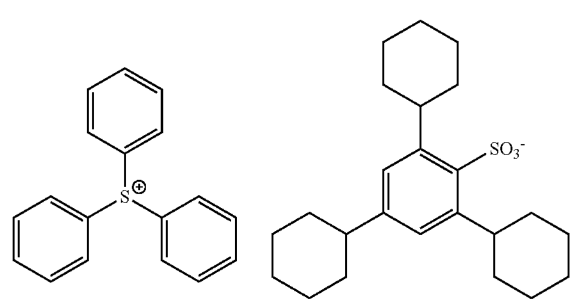

-continued
(z113)
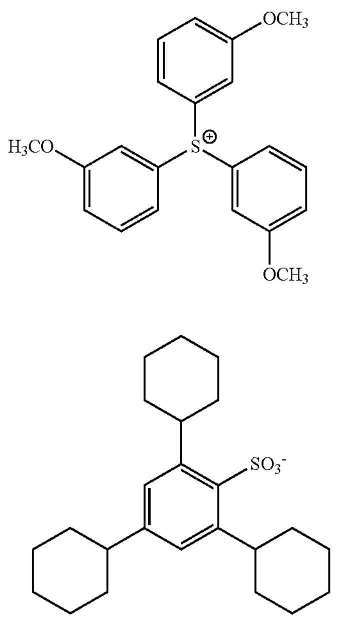
(z114)
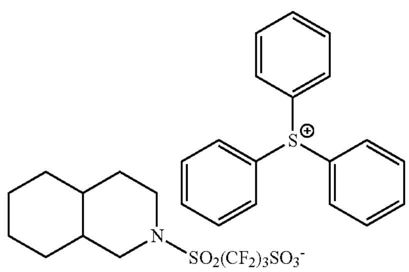
(z115)
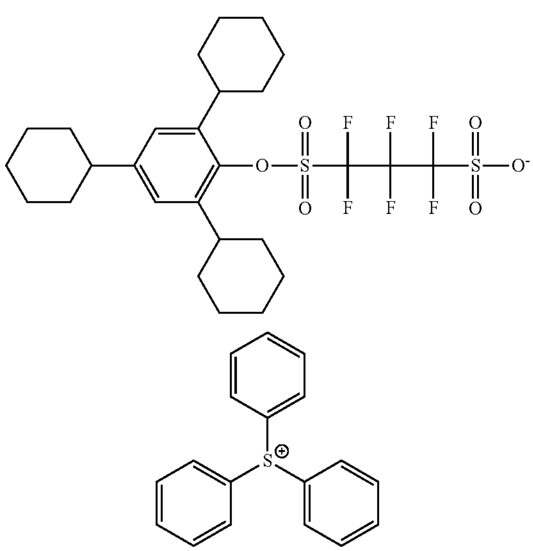
(z116)
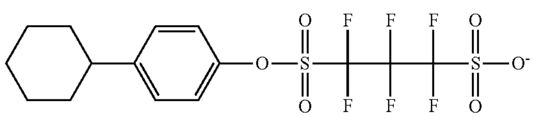
-continued
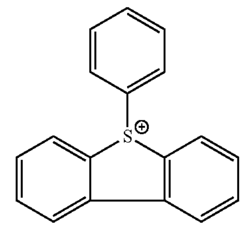
(z117)
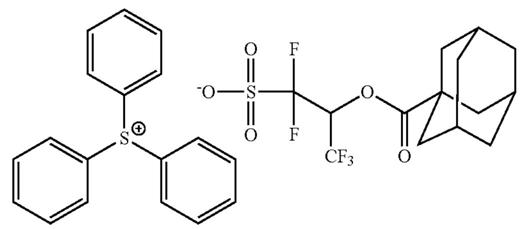
(z118)
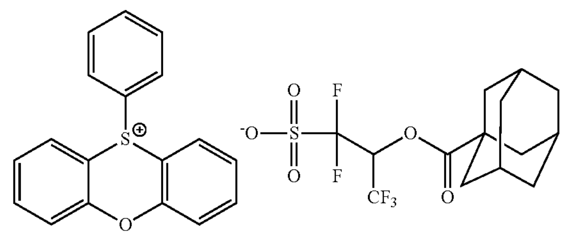
(z119)
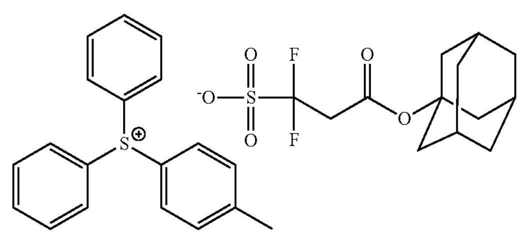
(z120)
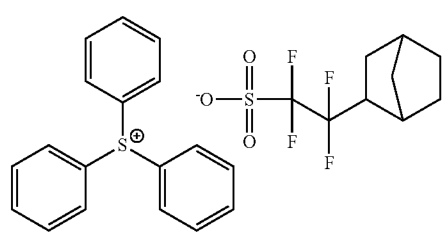
[Chem. 89]
(z121)
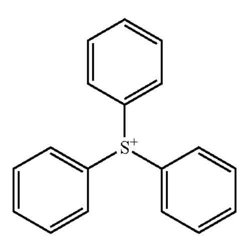

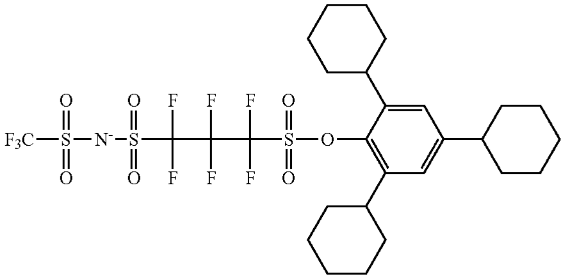
(z122)
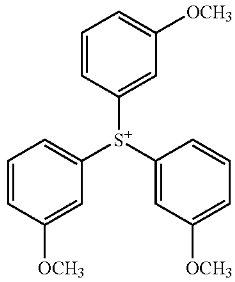
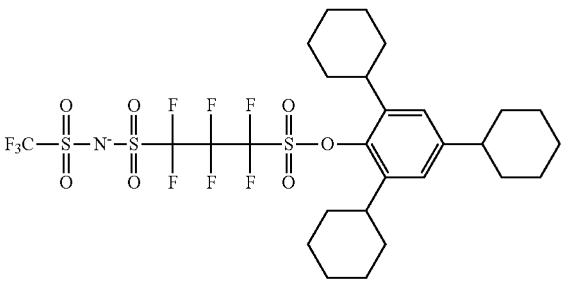
(z123)
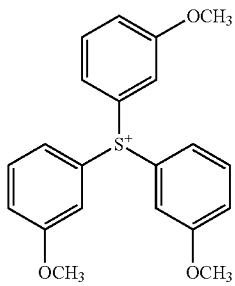
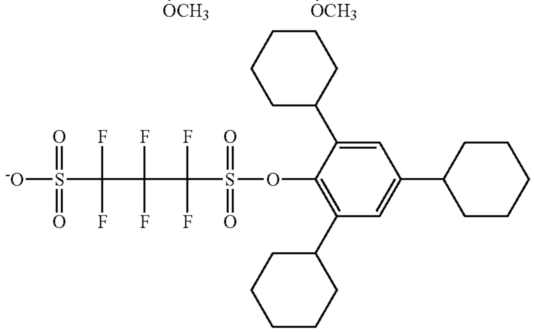
(z124)
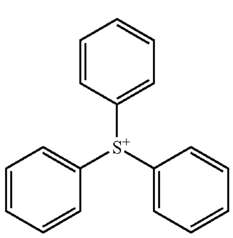
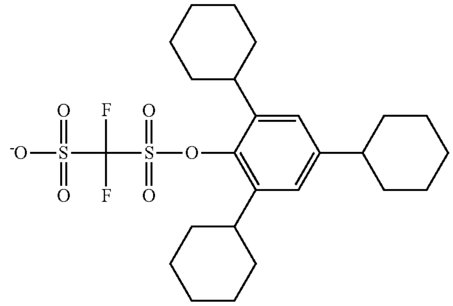
(z125)
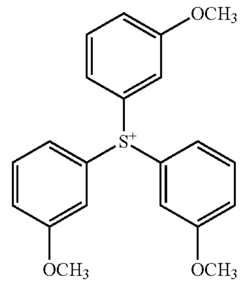
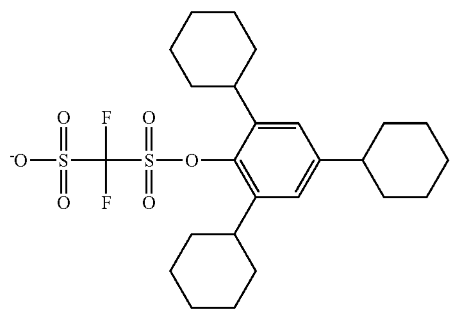
(z126)
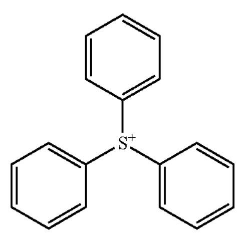
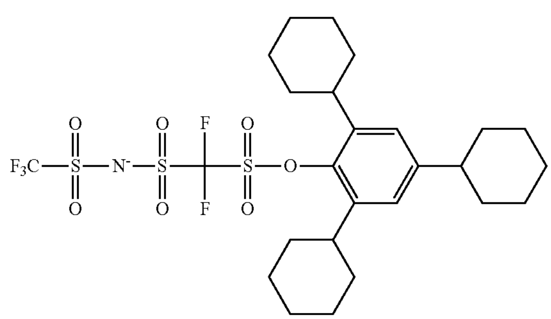

-continued
(z127)
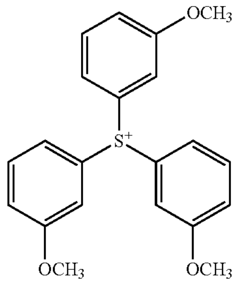
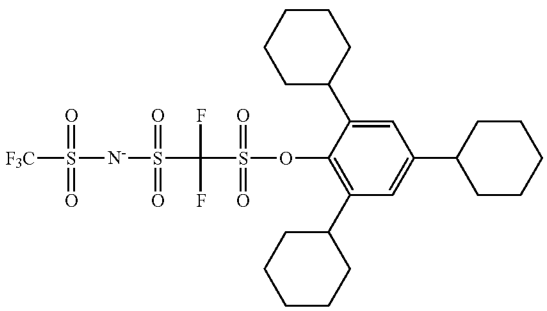
(z128)
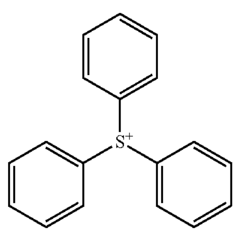
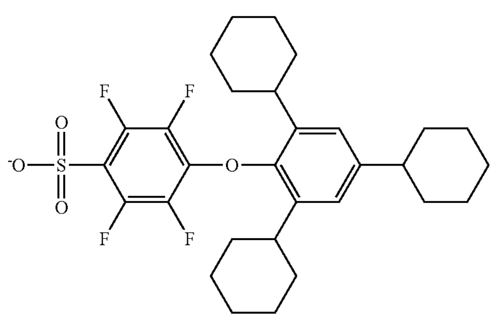
(z129)
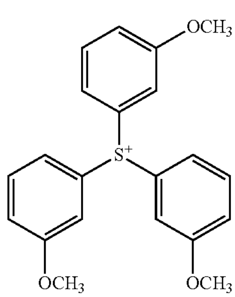
-continued
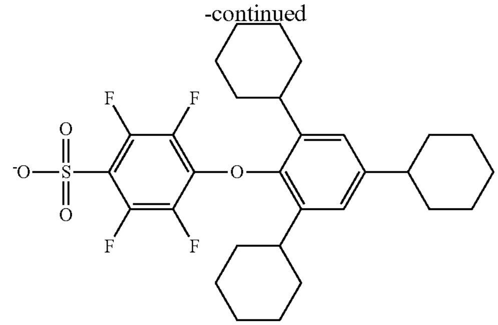
[Chem. 90]
(z130)
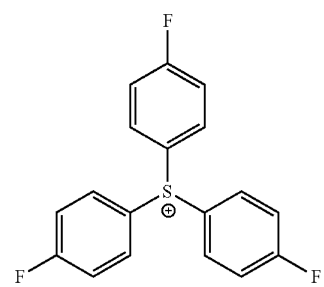
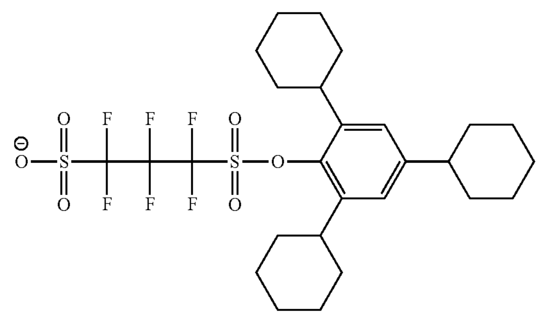
(z131)
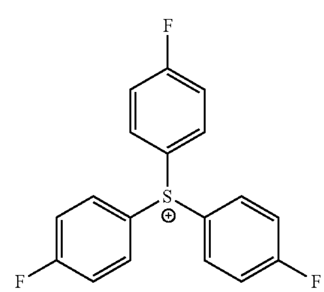
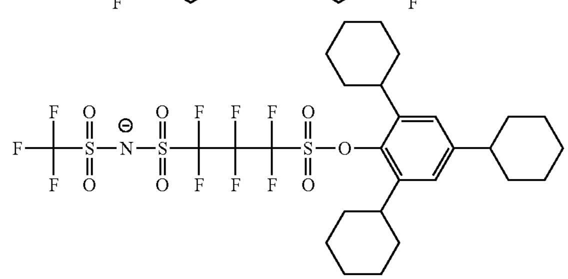

-continued
(z132)
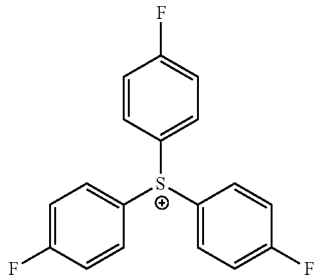
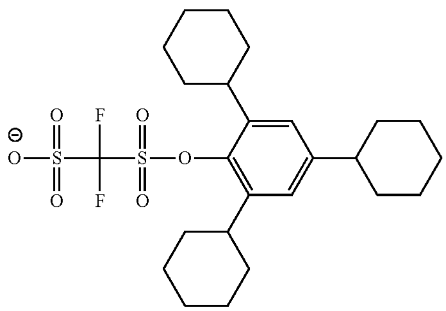
(z133)
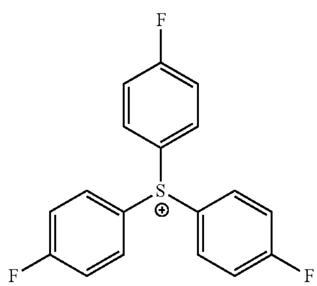
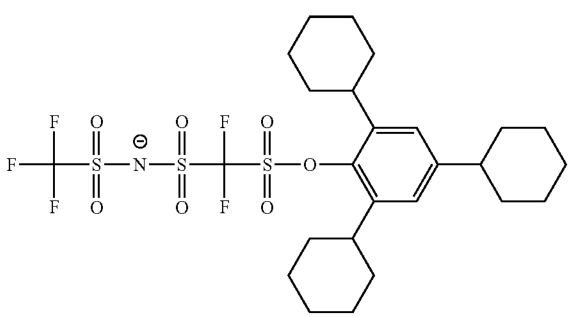
(z134)
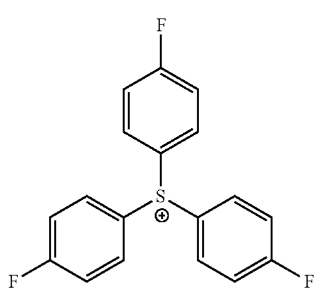
-continued
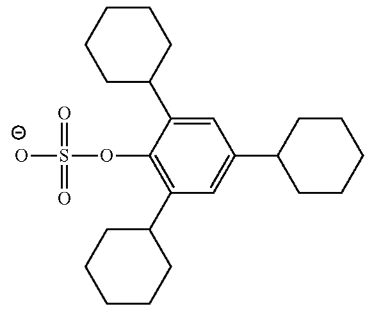
(z135)
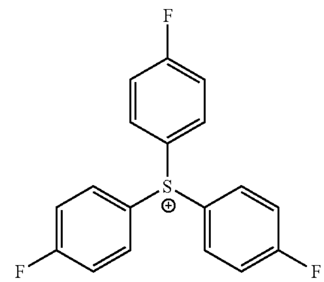
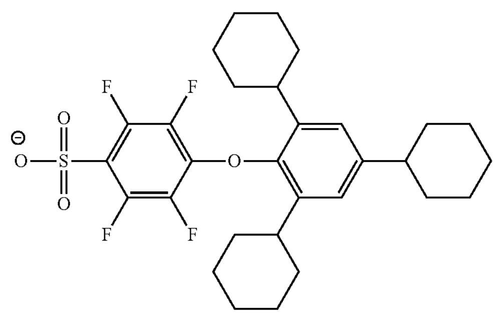
(z136)
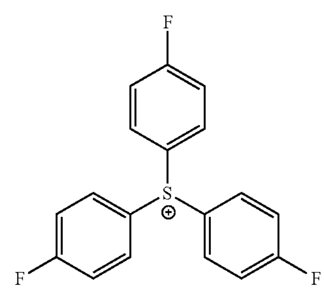
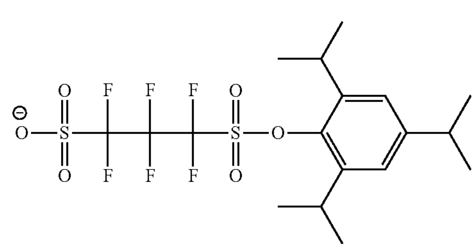

-continued (z137)

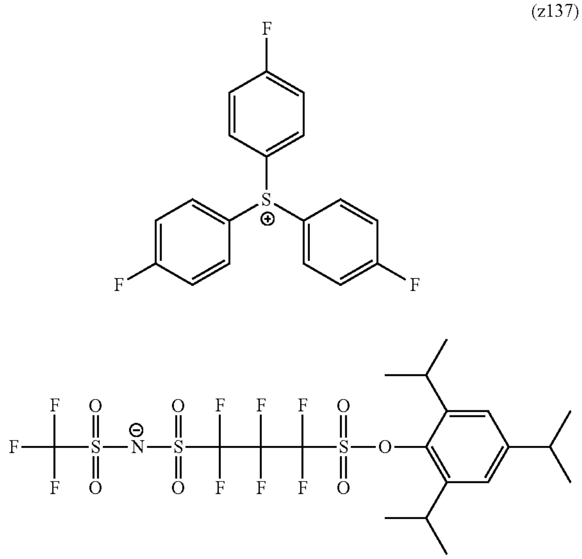

(z138)

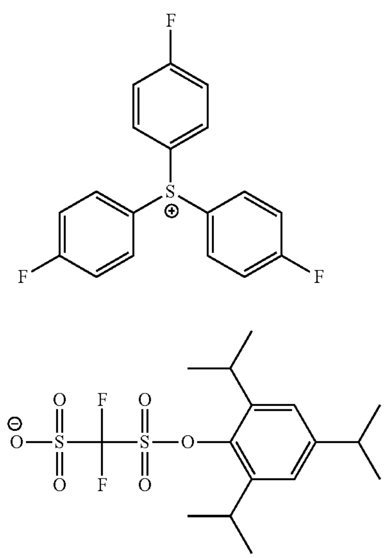

(z139)

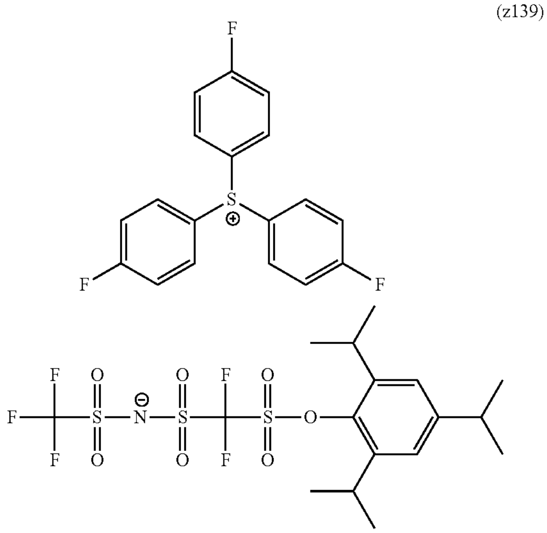

-continued (z140)

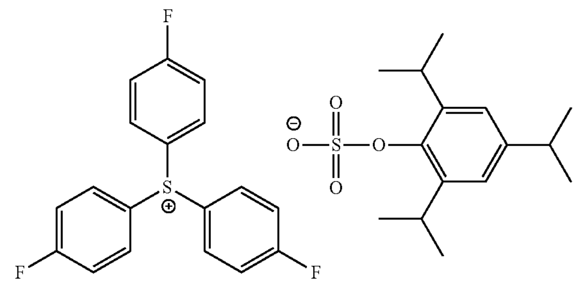

(z141)

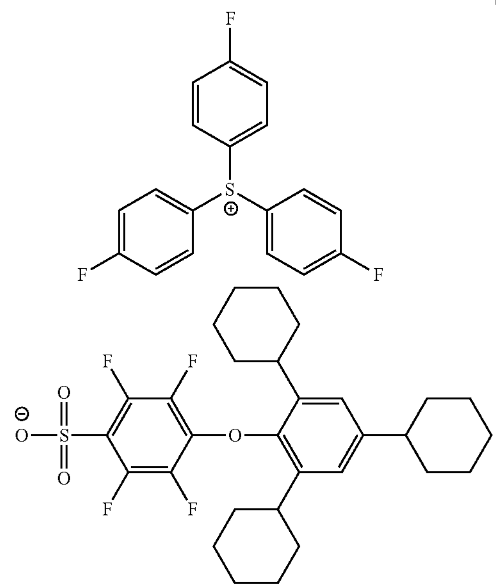

In the invention, from the standpoint of improving the resolution by preventing the acid generated upon exposure from diffusing into the unexposed area, the compound capable of generating an acid (B) is preferably a compound capable of generating an acid having a size of 240 $Å^3$ or more in volume upon irradiation with an electron beam or an extreme ultraviolet radiation, more preferably a compound capable of generating an acid having a size of 300 $Å^3$ or more in volume, still more preferably a compound capable of generating an acid having a size of 350 $Å^3$ or more in volume, and particularly preferably a compound capable of generating an acid having a size of 400 $Å^3$ or more in volume. However, from the standpoint of sensitivity and solubility in a coating solvent, the volume above is preferably 2,000 $Å^3$ or less, and more preferably 1,500 $Å^3$ or less. The value of the volume is determined using "WinMOPAC" produced by Fujitsu Ltd. More specifically, first, the chemical structure of the acid according to each example is input, and next, using this structure as the initial structure, the most stable conformation of each acid is determined by molecular force field calculation using an MM3 method. Then, with respect to the most stable conformation, molecular orbital calculation is performed using a PM3 method, whereby the "accessible volume" of each acid can be computed.

Examples of the acid generator particularly preferred in the invention are set forth below. In some of the examples, a computed value of volume (unit: $Å^3$) is shown together. The computed value determined here is a volume value of an acid in which a proton is connected to the anion moiety.

[Chem. 91]
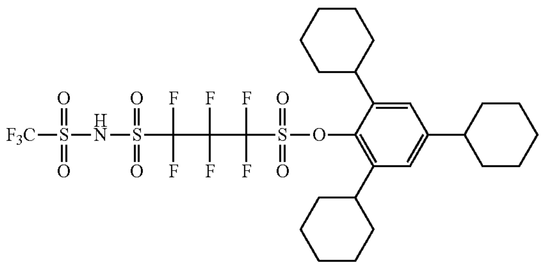
585 Å$^3$
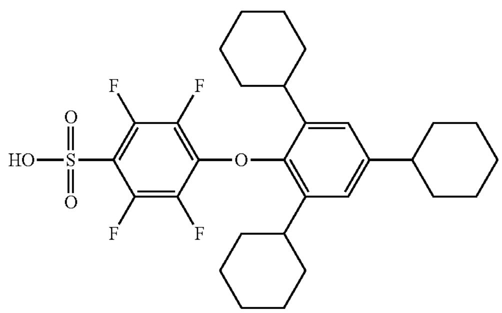
585 Å$^3$
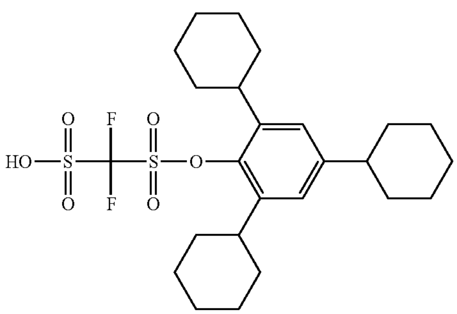
525 Å$^3$
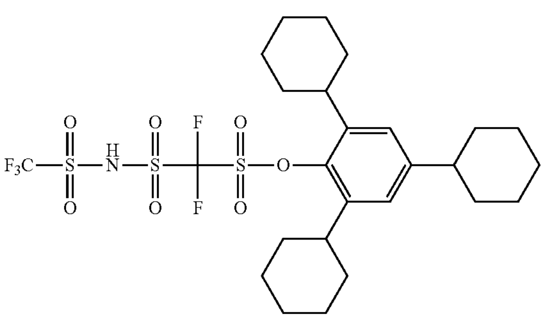
554 Å$^3$
-continued
[Chem. 92]
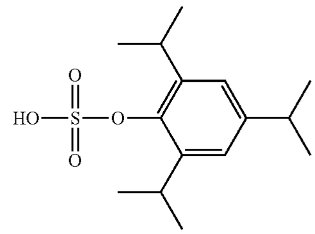
303 Å$^3$
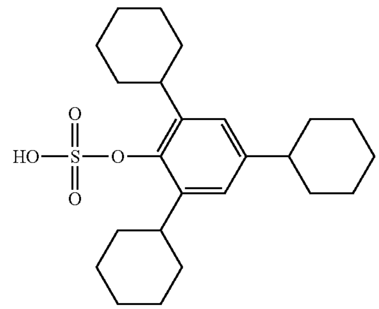
437 Å$^3$
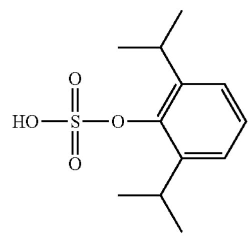
244 Å$^3$
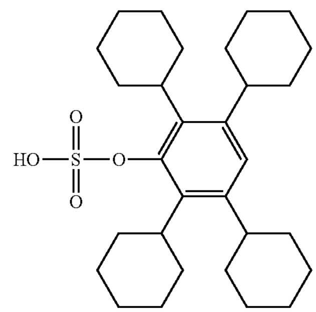
529 Å$^3$
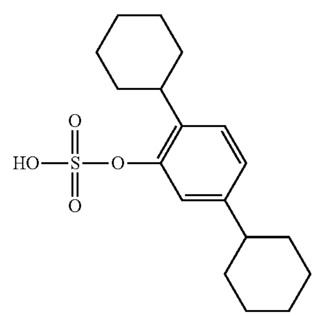
336 Å$^3$
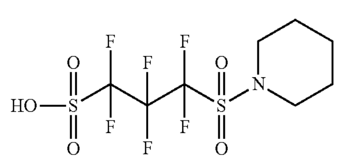
244 Å$^3$ -continued
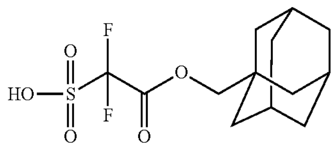
271 Å$^3$
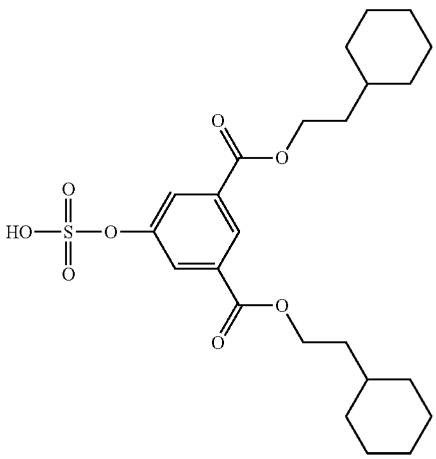
457 Å$^3$
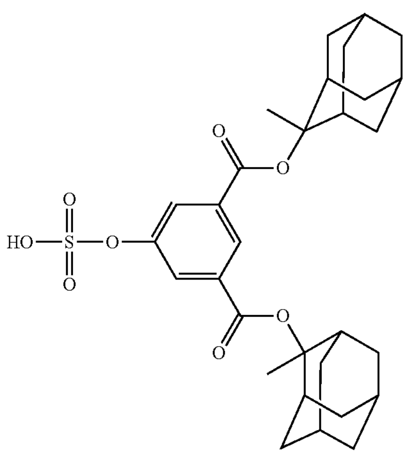
511 Å$^3$
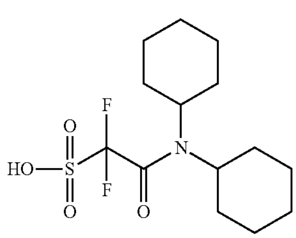
311 Å$^3$
-continued
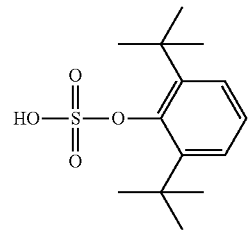
280 Å$^3$
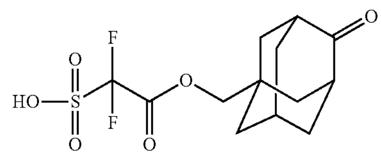
266 Å$^3$
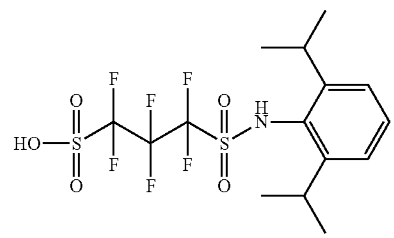
339 Å$^3$
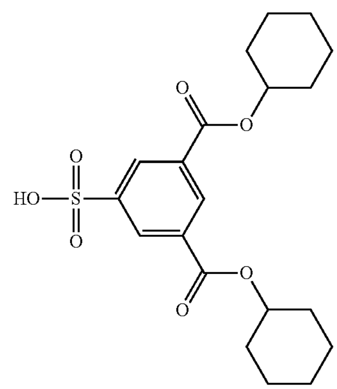
380 Å$^3$
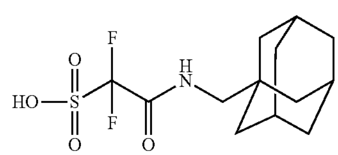
277 Å$^3$
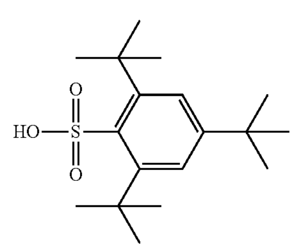
357 Å$^3$

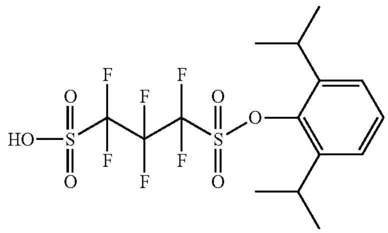
347 Å$^3$
[Chem. 93]
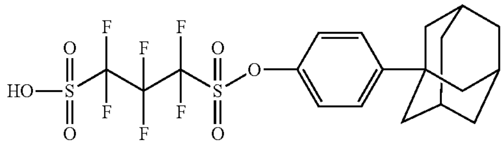
380 Å$^3$
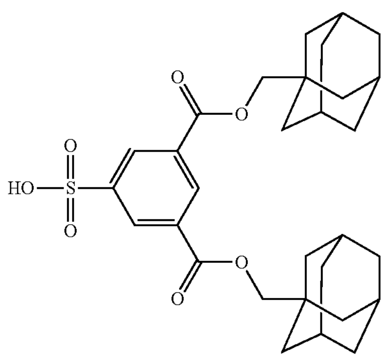
519 Å$^3$
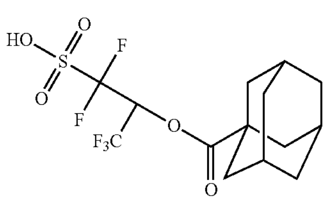
291 Å$^3$
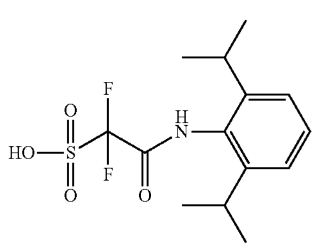
297 Å$^3$
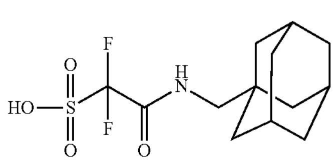
277 Å$^3$
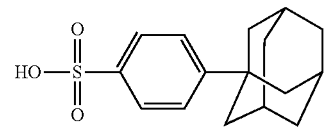
281 Å$^3$
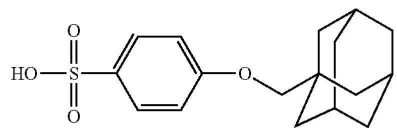
310 Å$^3$
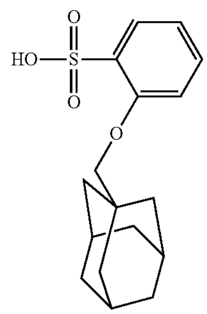
309 Å$^3$
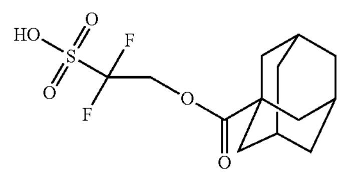
270 Å$^3$
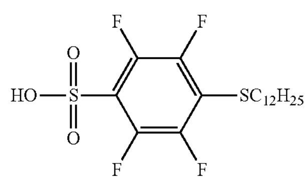
393 Å$^3$
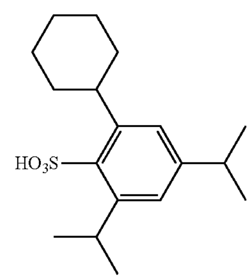
350 Å$^3$
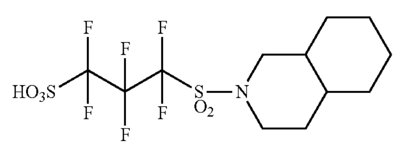
311 Å$^3$
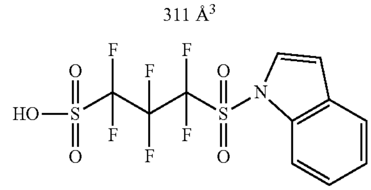
250 Å$^3$ -continued

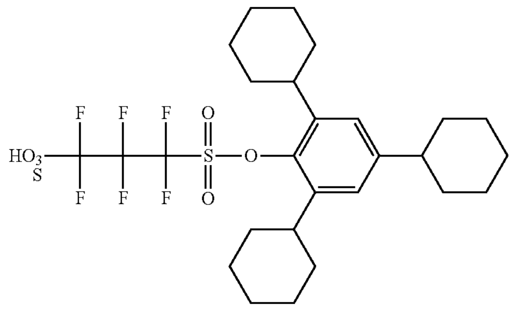

535 Å$^3$

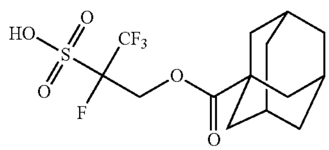

290 Å$^3$

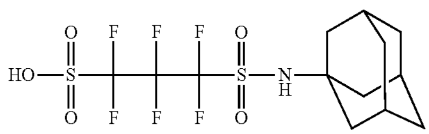

315 Å$^3$

The acid generators can be used one kind alone or in combination of two or more kinds thereof.

The content of the acid generator in the composition is preferably from 0.1 to 50% by mass, more preferably from 0.5 to 45% by mass, still more preferably from 1 to 40% by mass, based on the total solid content of the composition.

[3] Compound Capable of Decomposing by Action of Acid to Generate Acid

The actinic ray-sensitive or radiation-sensitive resin composition according to the invention may further contain one kind or two or more kinds of compounds capable of decomposing by the action of an acid to generate an acid. The acid generated from the compound capable of decomposing by the action of an acid to generate an acid is preferably a sulfonic acid, a methide acid or an imide acid.

Examples of the compound capable of decomposing by the action of an acid to generate an acid, which can be used in the present invention, are set forth below, but the invention should not be construed as being limited thereto.

[Chem. 94]

(PA-1)

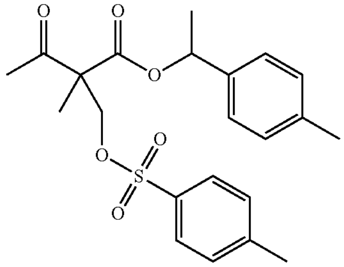

-continued (PA-2)

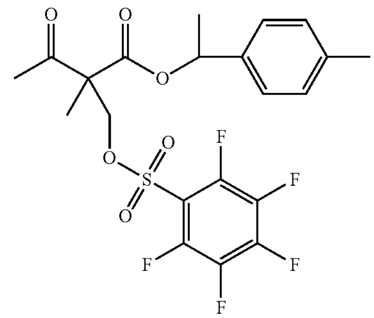

(PA-3)

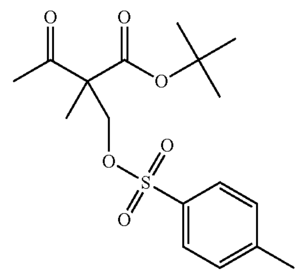

(PA-4)

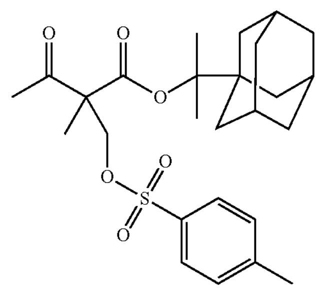

(PA-5)

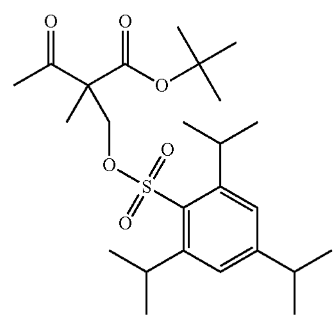

(PA-6)

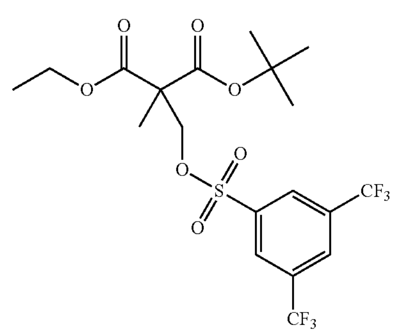

(PA-7)

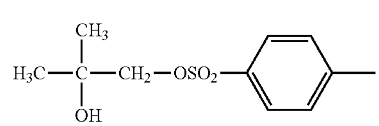

-continued (PA-8)

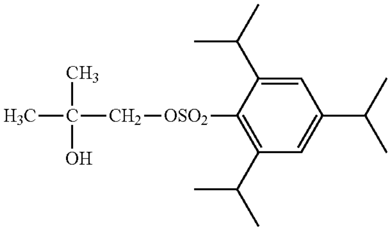

(PA-9)

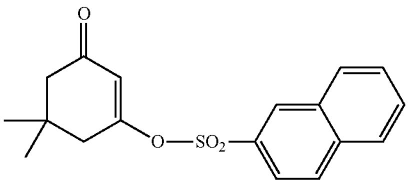

(PA-10)

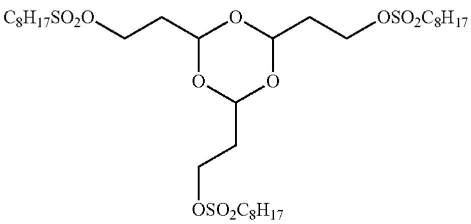

(PA-11)

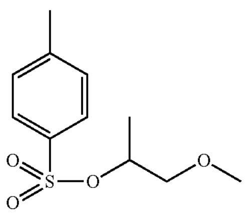

(PA-12)

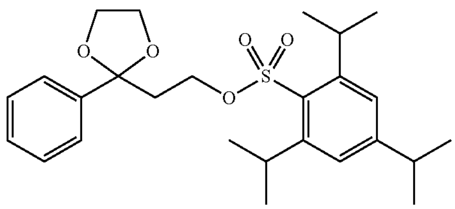

(PA-13)

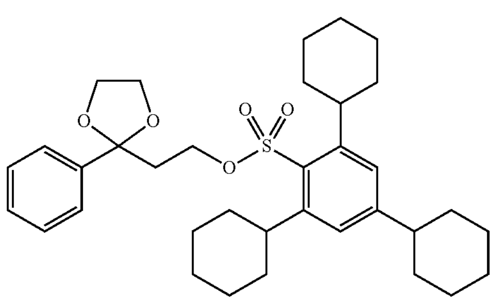

(PA-14)

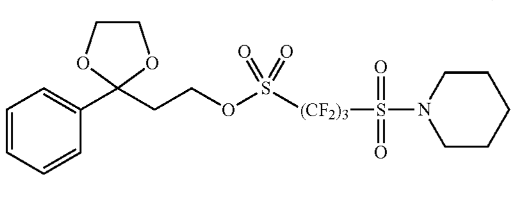

-continued (PA-15)

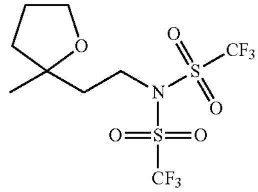

(PA-16)

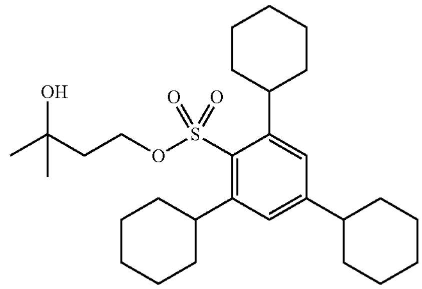

(PA-17)

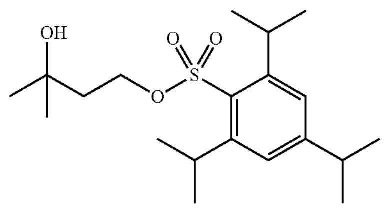

(PA-18)

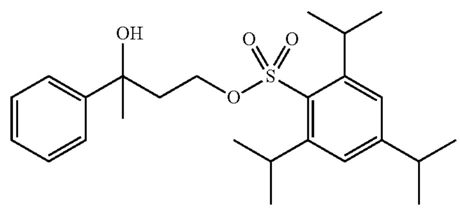

The compounds capable of decomposing by the action of an acid to generate an acid can be used one kind alone or in combination of two or more kinds thereof.

The content of the compound capable of decomposing by the action of an acid to generate an acid is preferably from 0.1 to 40% by mass, more preferably from 0.5 to 30% by mass, still more preferably from 1.0 to 20% by mass, based on the total solid content of the electron beam-sensitive or extreme ultraviolet radiation-sensitive resin composition.

[4] (C) Solvent (Coating Solvent)

The composition according to the invention preferably contains a solvent (C).

The solvent which can be used at the preparation of the composition is not particularly limited as long as it dissolves respective components, and includes, for example, an alkylene glycol monoalkyl ether carboxylate (for example, propylene glycol monomethyl ether acetate (PGMEA, another name: 1-methoxy-2-acetoxypropane)), an alkylene glycol monoalkyl ether (for example, propylene glycol monomethyl ether (PGME, another name: 1-methoxy-2-propanol)), a lactic acid alkyl ester (for example, ethyl lactate or methyl lactate), a cyclic lactone (for example, γ-butyrolactone, preferably having from 4 to 10 carbon atoms), a chain or cyclic ketone (for example, 2-heptanone or cyclohexanone, preferably having from 4 to 10 carbon atoms), an alkylene carbonate (for example, ethylene carbonate or propylene carbonate), an alkyl carboxylate (preferably an alkyl acetate, for example, butyl acetate), and an alkyl alkoxyacetate (for example, ethyl ethoxypropionate). Other solvents which can be used include solvents described in paragraph 0244 et seq. of U.S. Patent Application Publication No. 2008/0248425A1.

Of the solvents described above, an alkylene glycol monoalkyl ether carboxylate and an alkylene glycol monoalkyl ether are preferred.

The solvents may be used alone or as a mixture of two or more kinds thereof. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, and more preferably from 20/80 to 60/40.

The solvent having a hydroxyl group is preferably an alkylene glycol monoalkyl ether, and the solvent having no hydroxyl group is preferably an alkylene glycol monoalkyl ether carboxylate.

[5] Basic Compound

The electron beam-sensitive or extreme ultraviolet radiation-sensitive resin composition according to the invention may further contain a basic compound. The basic compound is preferably a compound having basicity stronger than that of phenol. The basic compound is preferably an organic basic compound, and more preferably a nitrogen-containing basic compound.

The nitrogen-containing basic compound which can be used is not particularly limited, and, for example, compounds classified into (1) to (7) shown below can be used.

(1) Compound Represented by Formula (BS-1)

[Chem. 95]

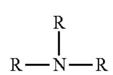

(BS-1)

In formula (BS-1), each R independently represents a hydrogen atom or an organic group, provided that at least one of three R is an organic group. The organic group is a straight-chain or branched alkyl group, a monocyclic or polycyclic cycloalkyl group, an aryl group or an aralkyl group.

The number of carbon atoms in the alkyl group for R is not particularly limited, and is ordinarily from 1 to 20, and preferably from 1 to 12.

The number of carbon atoms in the cycloalkyl group for R is not particularly limited, and is ordinarily from 3 to 20, and preferably from 5 to 15.

The number of carbon atoms in the aryl group for R is not particularly limited, and is ordinarily from 6 to 20, and preferably from 6 to 10. The aryl group specifically includes a phenyl group and a naphthyl group.

The number of carbon atoms in the aralkyl group for R is not particularly limited, and is ordinarily from 7 to 20, and preferably from 7 to 11. The aralkyl group specifically includes a benzyl group.

In the alkyl group, cycloalkyl group, aryl group and aralkyl group for R, a hydrogen atom may be substituted with a substituent. The substituent includes, for example, an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that at least two R are organic groups.

Specific examples of the compound represented by formula (BS-1) include tri-n-butylamine, tri-n-pentylamine, tri-n-octylamine, tri-n-decylamine, triisodecylamine, dicyclohexylmethylamine, tetradecyl amine, pentadecylamine, hexadecylamine, octadecyl amine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, the preferred basic compound represented by formula (BS-1) includes a compound where at least one R is an alkyl group substituted with a hydroxtl group. Specific examples thereof include triethanolamine and N,N-dihydroxyethylaniline.

The alkyl group for R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and compounds described in column 3, line 60 et seq. of U.S. Pat. No. 6,040,112.

Of the basic compounds represented by formula (BS-1), examples of the compounds having a hydroxyl group, an oxygen atom or the like include the followings.

[Chem. 96]

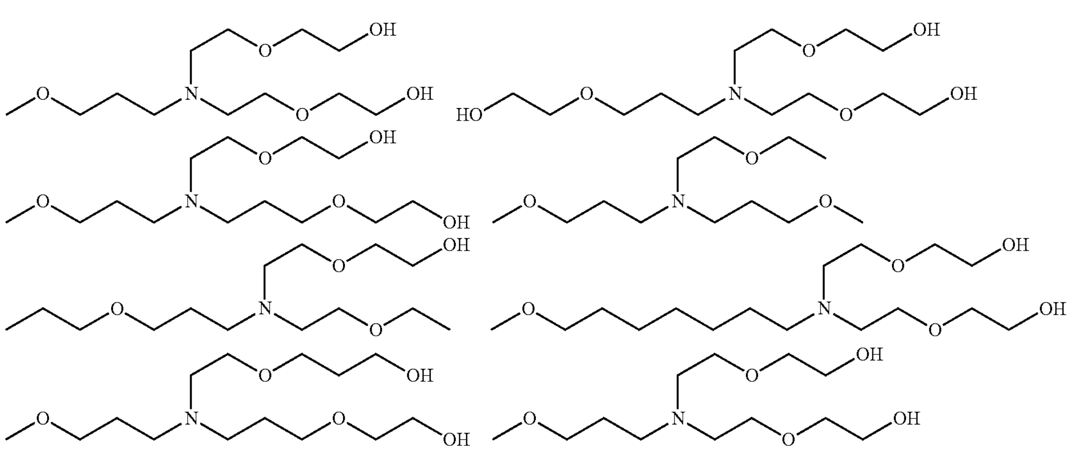

-continued

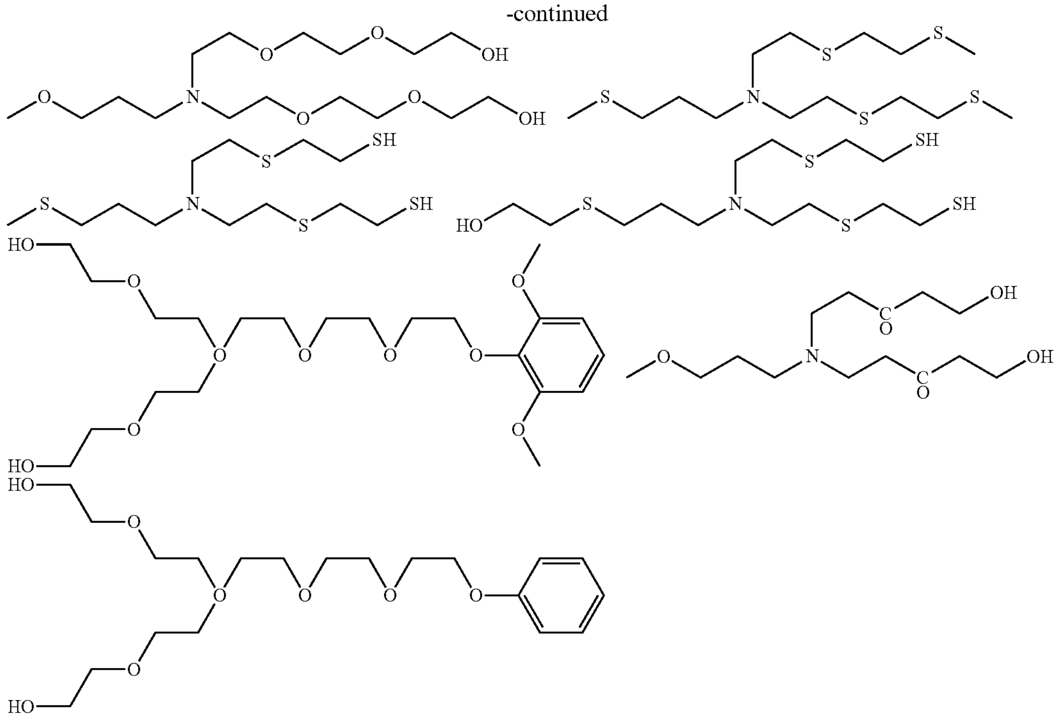

[Chem. 97]

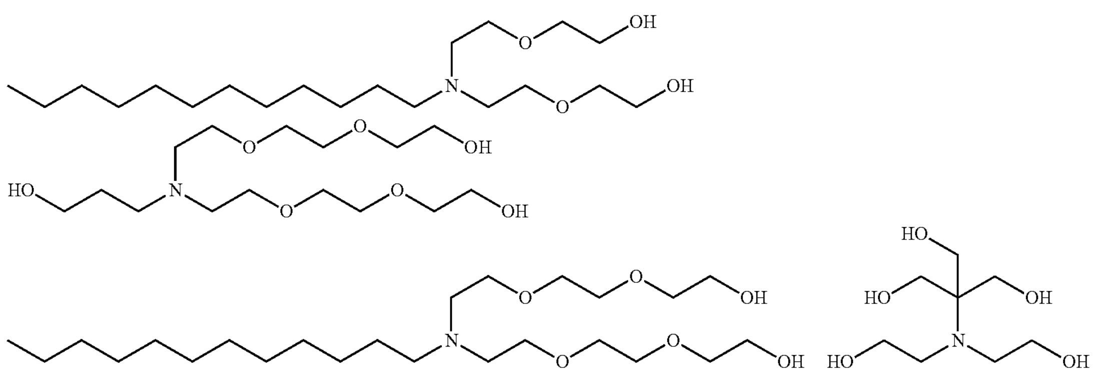

(2) Compound Having Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (for example, 2-phenylbenzimidazole or 2,4,5-triphenylimidazole), a compound having a piperidine structure (for example, N-hydroxyethylpiperidine or bis(1,2,2,6,6-pentamethyl-4-piperidyl)sebacate), a compound having a pyridine structure (for example, 4-dimethylaminopyridine), and a compound having an antipyrine structure (for example, antipyrine or hydroxyantipyrine).

Preferred examples of the compound having a nitrogen-containing heterocyclic structure include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the basic compound include imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A compound having two or more ring structures is also suitably used. Specific examples thereof include 1,5-diazabicyclo[4.3.0]non-5-ene and 1,8-diazabicyclo[5.4.0]undec-7-ene.

(3) Amine Compound Having Phenoxy Group

The amine compound having a phenoxy group is a compound where the alkyl group contained in the amine compound has a phenoxy group at the terminal opposite the N atom. The phenoxy group may have a substituent, for example, an alkyl group, an alkoxy group, a halogen atom, a cyano group, a nitro group, a carboxyl group, a carboxylic acid ester group, a sulfonic acid ester group, an aryl group, an aralkyl group, an acyloxy group or an aryloxy group.

The compound preferably has at least one oxyalkylene chain between the phenoxy group and the nitrogen atom. The number of the oxyalkylene chains per molecule is preferably from 3 to 9, and more preferably from 4 to 6. Of the oxyalkylene chains, —$CH_2CH_2O$— is particularly preferred.

Specific examples of the compound include 2-[2-{2-(2,2-dimethoxyphenoxyethoxy)ethyl}-bis(2-methoxyethyl)]amine and Compounds (C1-1) to (C3-3) described in paragraph [0066] of U.S. Patent Application Publication No. 2007/0224539A1.

The amine compound having a phenoxy group is obtained, for example, by reacting a primary or secondary amine having a phenoxy group with a haloalkyl ether under heating, and after adding an aqueous solution of a strong base, for example, sodium hydroxide, potassium hydroxide or a tetraalkyl ammonium, extracting the reaction product with an organic solvent, for example, ethyl acetate or chloroform. The amine compound having a phenoxy group can also be obtained by reacting a primary or secondary amine with a haloalkyl ether having a phenoxy group at the terminal under heating, and after adding an aqueous solution of a strong base, for example, sodium hydroxide, potassium hydroxide or tetraalkylammonium, extracting the reaction product with an organic solvent, for example, ethyl acetate or chloroform.

(4) Ammonium Salt

An ammonium salt may also be appropriately used as the basic compound.

The cation of the ammonium salt is preferably a tetraalkylammonium cation substituted with an alkyl group having from 1 to 18 carbon atoms, more preferably a tetramethylammonium cation, a tetraethylammonium cation, a tetra(n-butyl)ammonium cation, a tetra(n-heptyl)ammonium cation, a tetra(n-octyl)ammonium cation, a dimethylhexadecylammonium cation, a benzyltrimethyl cation or the like, and most preferably a tetra(n-butyl)ammonium cation.

The anion of the ammonium salt includes, for example, a hydroxide, a carboxylate, a halide, a sulfonate, a borate and a phosphate. Among them, a hydroxide or a carboxylate is particularly preferred.

The halide is particularly preferably a chloride, a bromide or an iodide.

The sulfonate is particularly preferably an organic sulfonate having from 1 to 20 carbon atoms. The organic sulfonate includes, for example, an alkylsulfonate having from 1 to 20 carbon atoms and an arylsulfonate.

The alkyl group contained in the alkylsulfonate may have a substituent. The substituent includes, for example, a fluorine atom, a chlorine atom, a bromine atom, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethane sulfonate and nonafluorobutanesulfonate.

The aryl group contained in the arylsulfonate includes, for example, a phenyl group, a naphthyl group and an anthryl group. The aryl group may have a substituent. The substituent is preferably, for example, a straight-chain or branched alkyl group having from 1 to 6 carbon atoms or a cycloalkyl group having from 3 to 6 carbon atoms. Specifically, for example, a methyl group, an ethyl group, an n-propyl group, an isopropyl group, an n-butyl group, an isobutyl group, a tert-butyl group, an n-hexyl group and a cyclohexyl group are preferred. Other substituents include an alkoxy group having from 1 to 6 carbon atoms, a halogen atom, a cyano group, a nitro group, an acyl group and an acyloxy group.

The carboxylate may be an aliphatic carboxylate or an aromatic carboxylate, and includes an acetate, a lactate, a pyruvate, a trifluoroacetate, an adamantanecarboxylate, a hydroxyadamantanecarboxylate, a benzoate, a naphthoate, a salicylate, a phthalate and a phenolate. In particular, a benzoate, a naphthoate, a phenolate and the like are preferred, and a benzoate is most preferred.

In this case, the ammonium salt is preferably, for example, tetra(n-butyl)ammonium benzoate or tetra(n-butyl)ammonium phenolate.

In the case of a hydroxide, the ammonium salt is particularly preferably a tetraalkylammonium hydroxide, for example, a tetraalkylammonium hydroxide having from 1 to 8 carbon atoms (for example, tetramethylammonium hydroxide, tetraethylammonium hydroxide or tetra-(n-butyl) ammonium hydroxide).

(5) Compound Having Proton Acceptor Functional Group and Undergoing Decomposition Upon Irradiation with Electron Beam or Extreme Ultraviolet Radiation to Generate a Compound Reduced in or Deprived of Proton Acceptor Property or Changed to be Acidic from being the Proton Acceptor Functioning (PA)

The composition according to the invention may further contain, as the basic compound, a compound having a proton acceptor functional group and undergoing decomposition upon irradiation with an electron beam or an extreme ultraviolet radiation to generate a compound reduced in or deprived of the proton acceptor property or changed to be acidic from being the proton acceptor functioning (hereinafter, also referred to as a "compound (PA)").

The proton acceptor functional group is a functional group having a group or electron capable of electrostatically interacting with a proton and means, for example, a functional group having a macrocyclic structure, for example, a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by formulae shown below.

[Chem. 98]

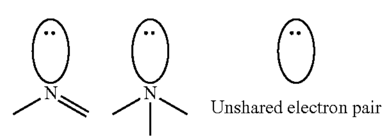

Preferred partial structure of the proton acceptor functional group includes, for example, a crown ether structure, an aza-crown ether structure, a primary to tertiary amine structure, a pyridine structure, an imidazole structure and a pyrazine structure.

The compound (PA) decomposes upon irradiation with an electron beam or an extreme ultraviolet radiation to generate a compound reduced in or deprived of the proton acceptor property or changed to be acidic from being proton acceptor functioning. The "reduced in or deprived of the proton acceptor property or changed to be acidic from being proton acceptor functioning" as used herein indicates a change in the proton acceptor property due to addition of a proton to the proton acceptor functional group and specifically means that when a proton adduct is produced from the proton acceptor functional group-containing compound (PA) and a proton, the equilibrium constant in the chemical equilibrium decreases.

Specific examples of the compound (PA) are set forth below, but the invention should not be construed as being limited thereto.

[Chem. 99]

(PA-1)

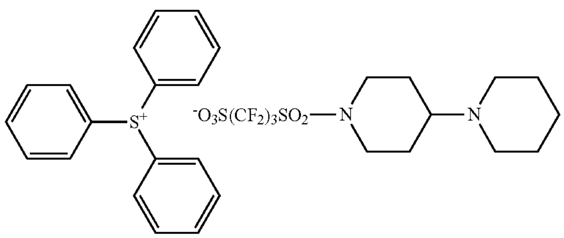

(PA-2)

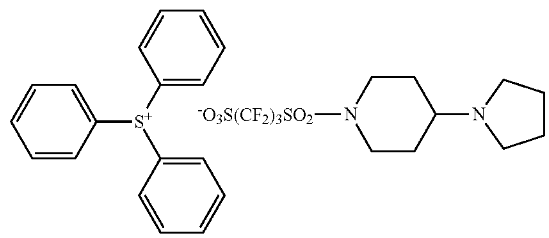

(PA-3)

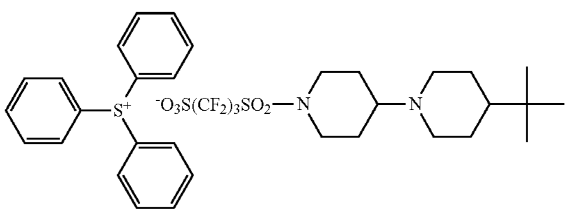

(PA-4)

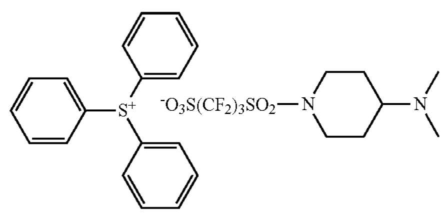

(PA-5)

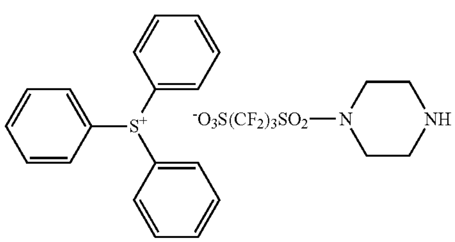

(PA-6)

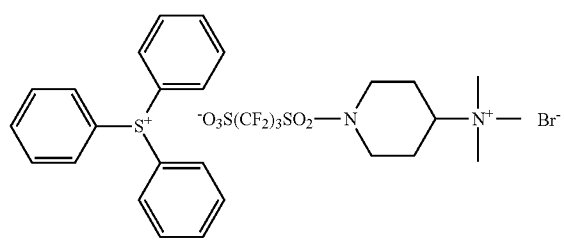

(PA-7)

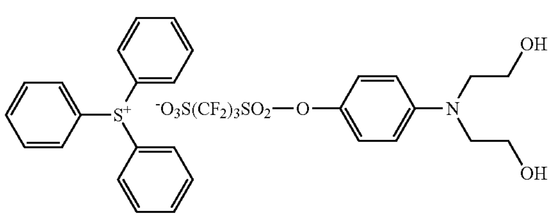

(PA-8)

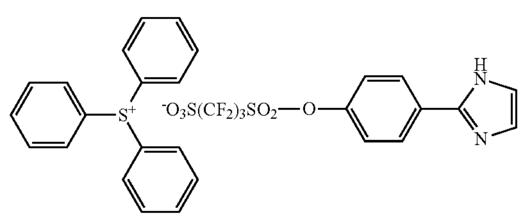

(PA-9)

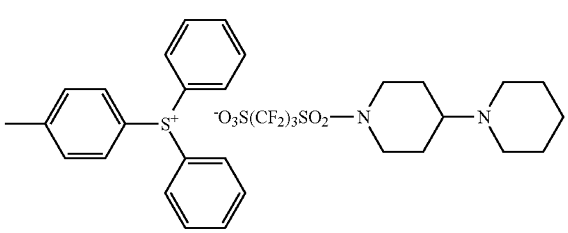

(PA-10)

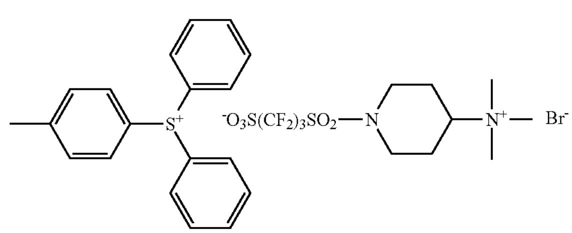

-continued
(PA-11)
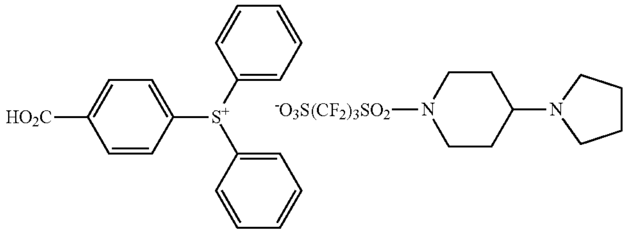
(PA-12)
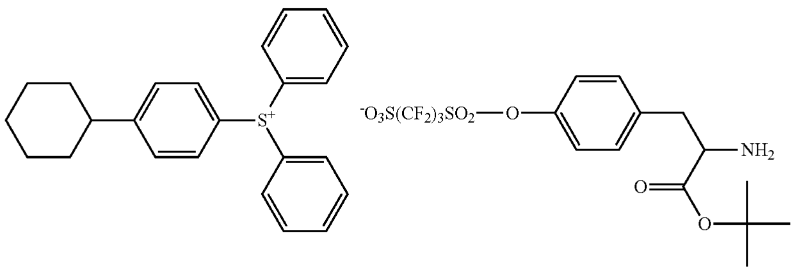
(PA-13)
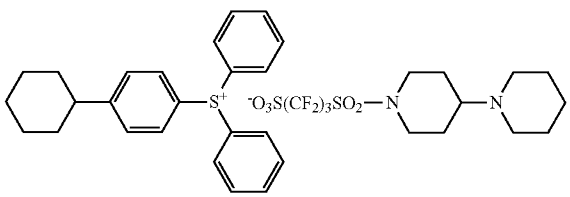
(PA-14)
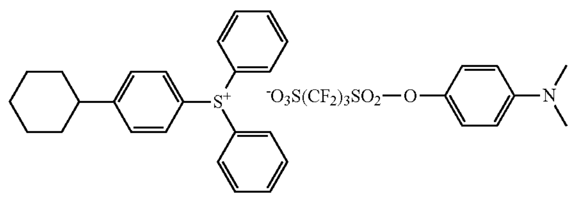
(PA-15)
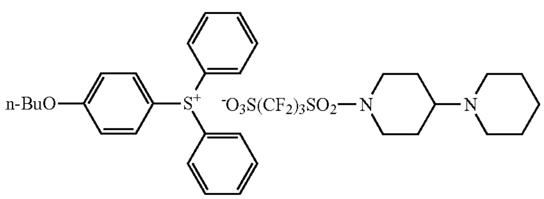
(PA-16)
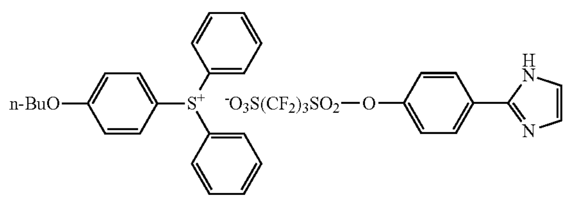
[Chem. 100]
(PA-17)
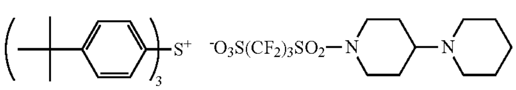
(PA-18)
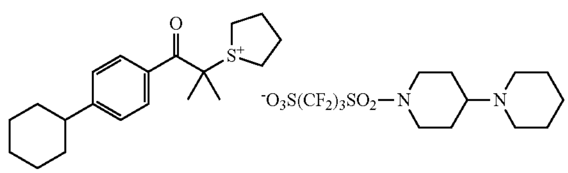
(PA-19)
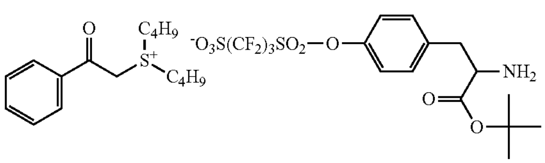
(PA-20)
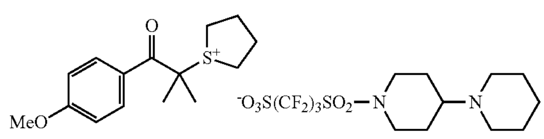
(PA-21)
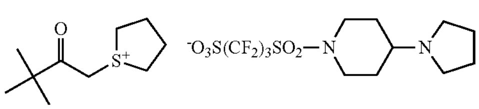
(PA-22)
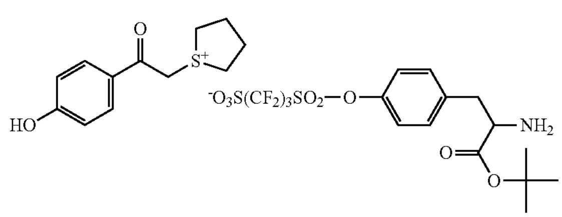

-continued
(PA-23)
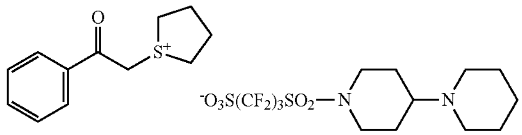
(PA-24)
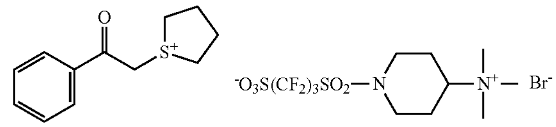
(PA-25)
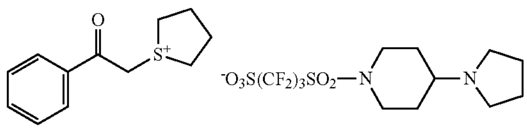
(PA-26)
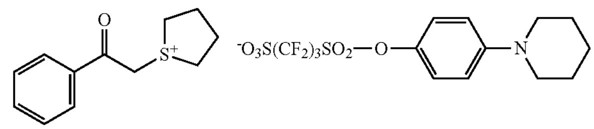
(PA-27)
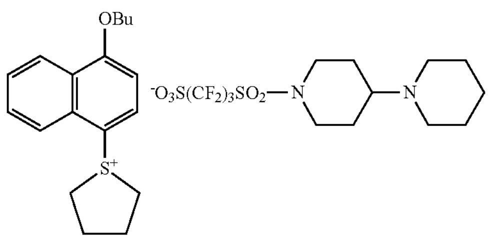
(PA-28)
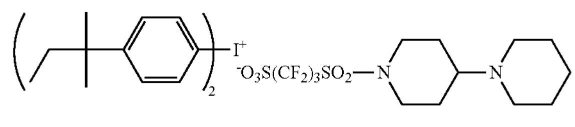
(PA-29)
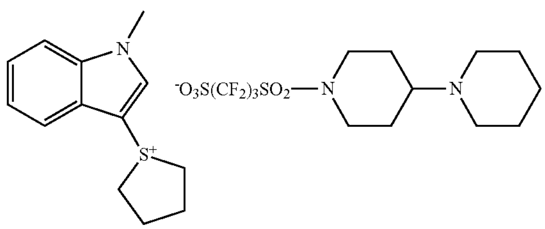
(PA-30
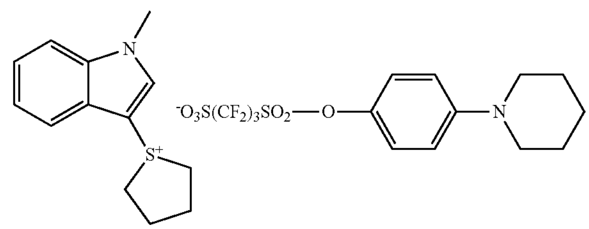
(PA-31)
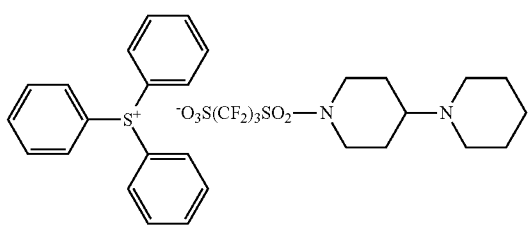
(PA-32)
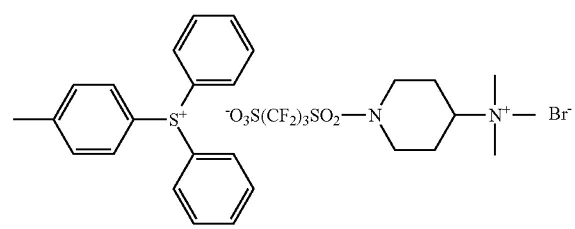
[Chem. 101]
(PA-33)
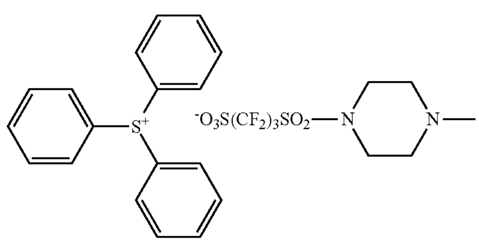
(PA-34)
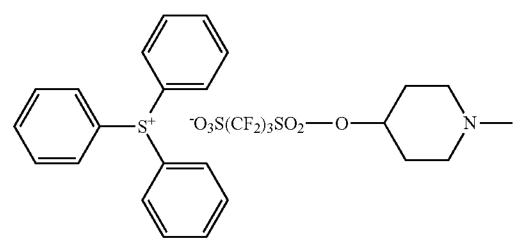
(PA-35)
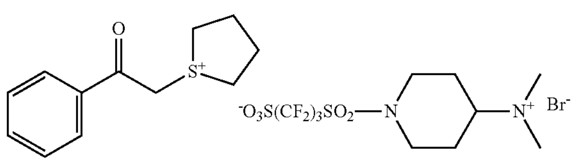
(PA-36)
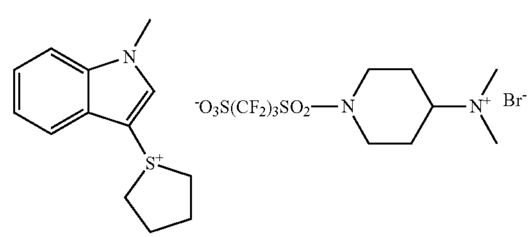

-continued
(PA-37)
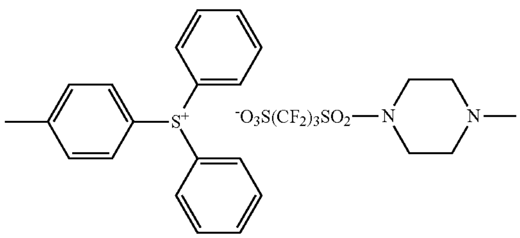
(PA-38)
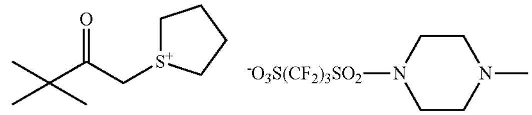
(PA-39)
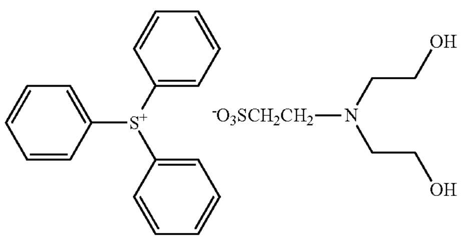
(PA-40)
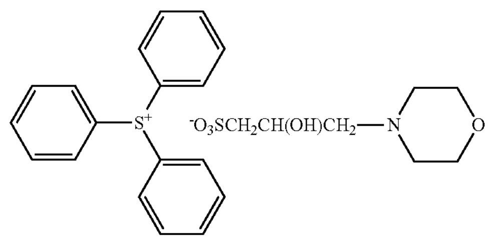
(PA-41)
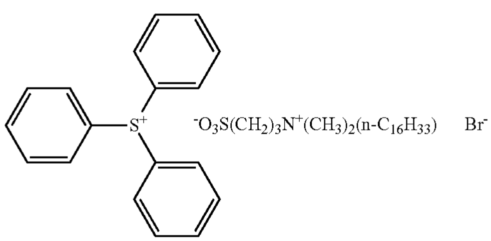
(PA-42)
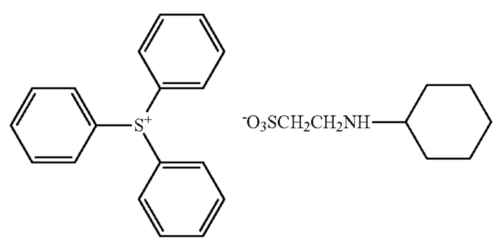
(PA-43)
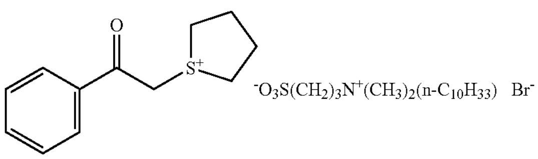
(PA-44)
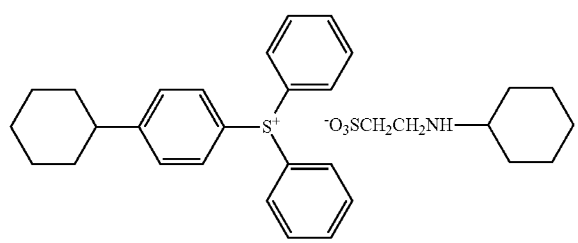
(PA-45)
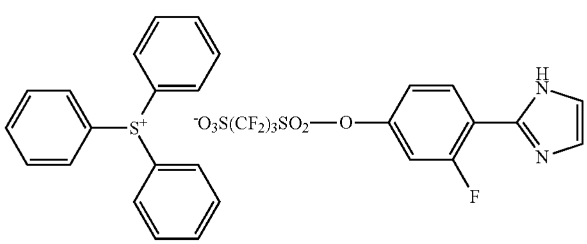
(PA-46)
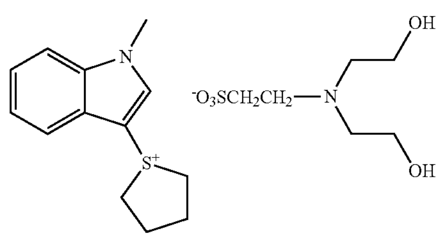
(PA-47)
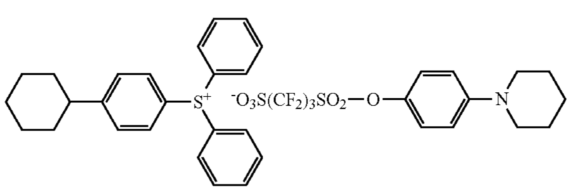
(PA-48)
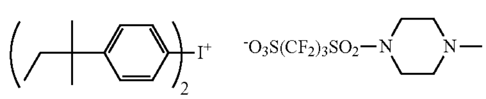

-continued
[Chem. 102]
(PA-49)
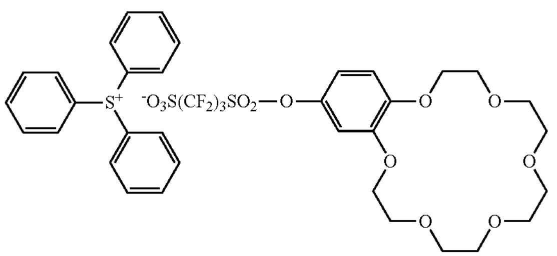
(PA-50)
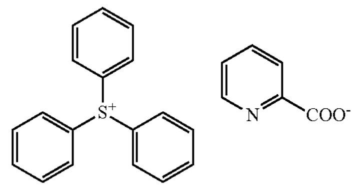
(PA-51)
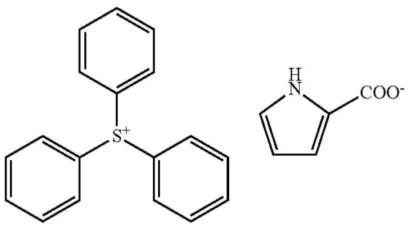
(PA-52)
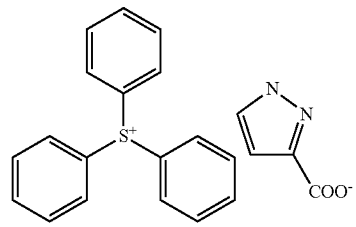
(PA-53)
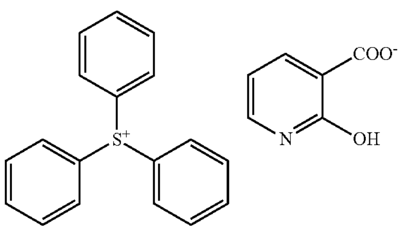
(PA-54)
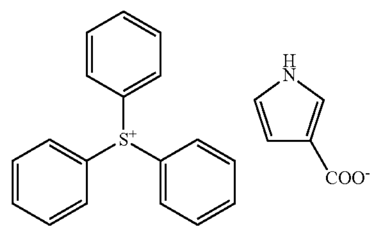
(PA-55)
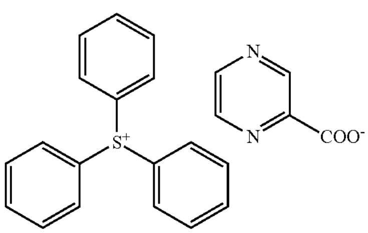
(PA-56)
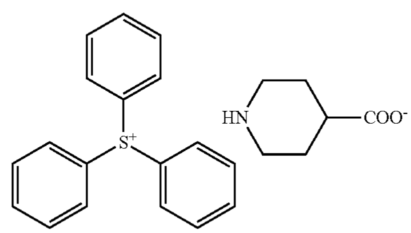
(PA-57)
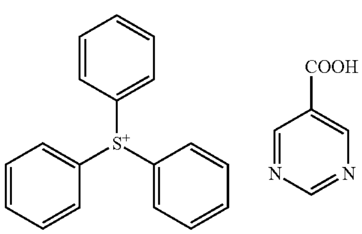
(PA-58)
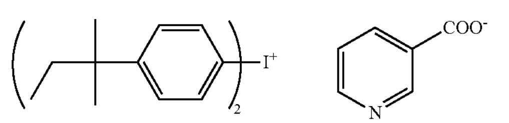
[Chem. 103]
(PA-59)
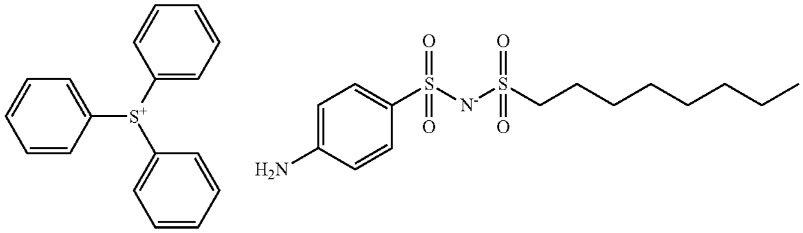

-continued
(PA-60)
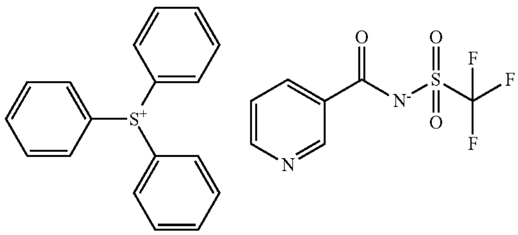
(PA-61)
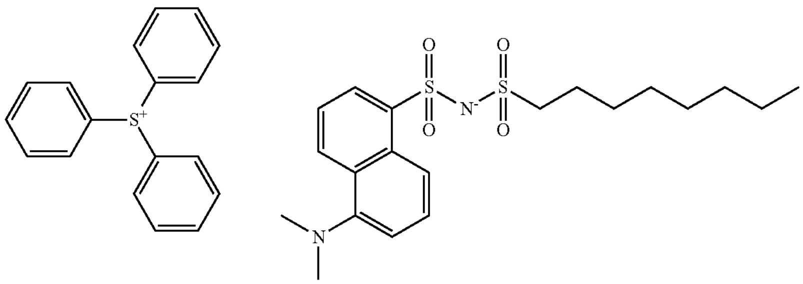
(PA-62)
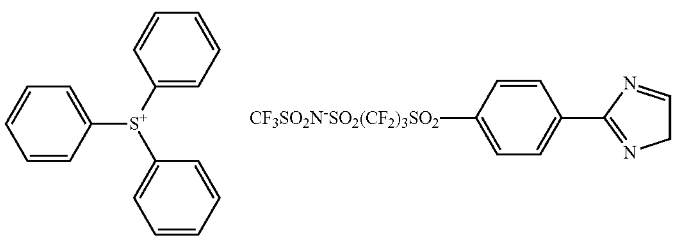
(PA-63)
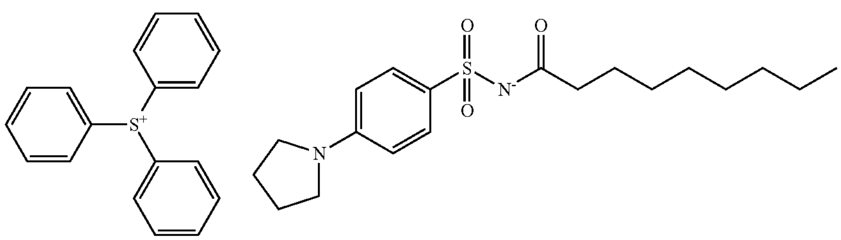
(PA-64)
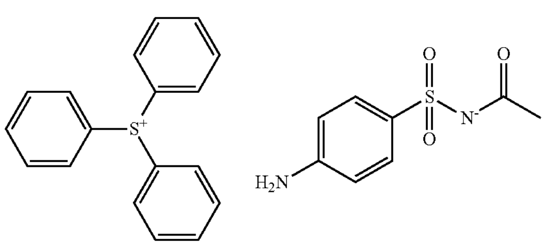
(PA-65)
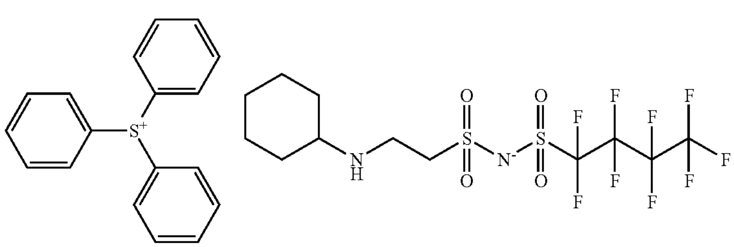

-continued
(PA-66)
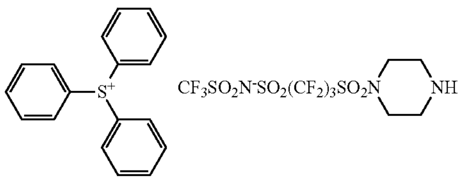
(PA-67)
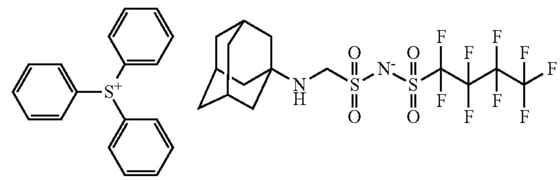
(PA-68)
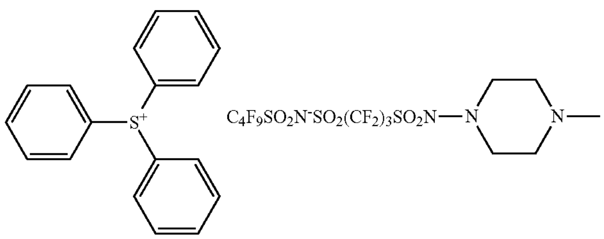
(PA-69)
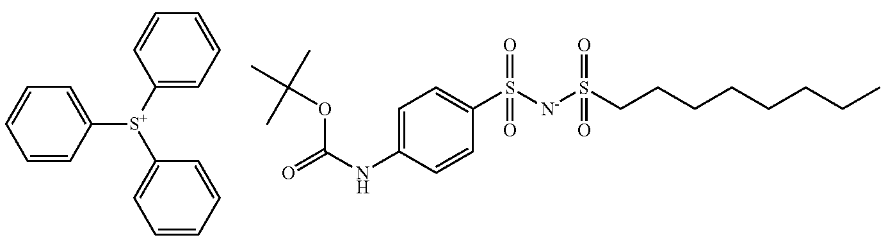
(PA-70)
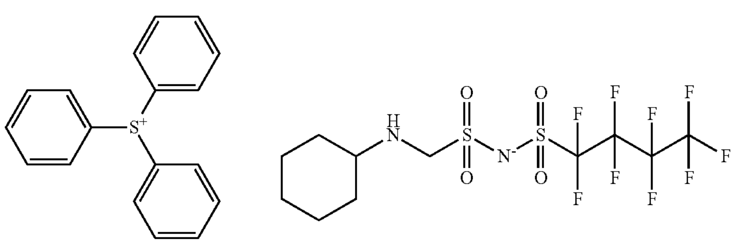
[Chem. 104]
(PA-71)
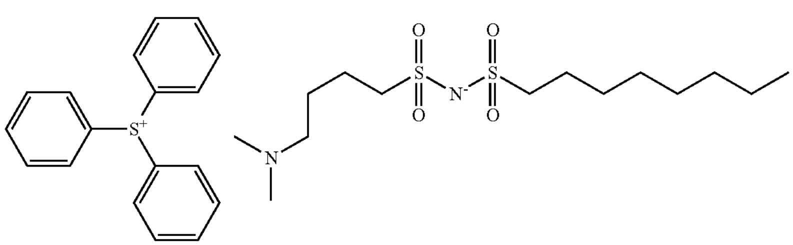
(PA-72)
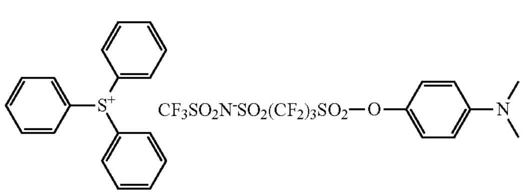
(PA-73)
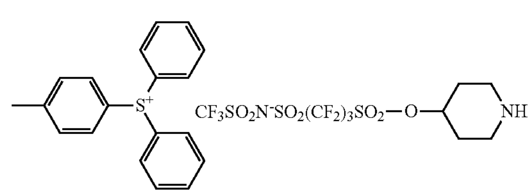

-continued
(PA-74)
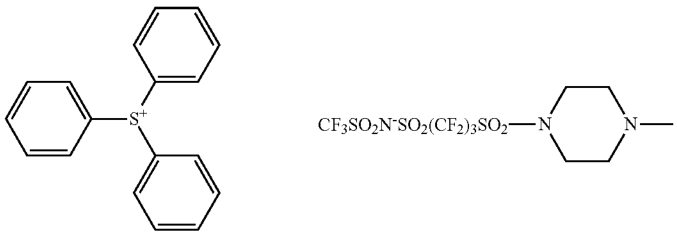
[Chem. 105]
(PA-75)
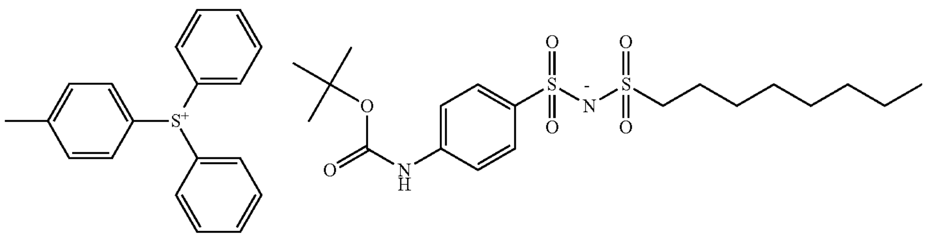
(PA-76)
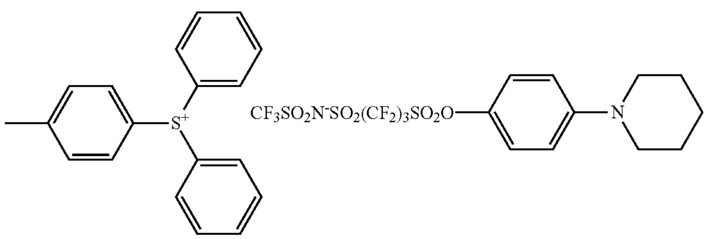
(PA-77)
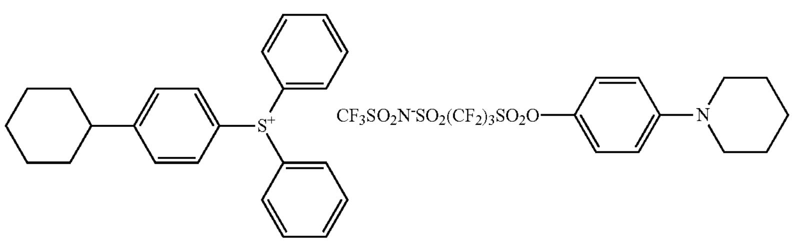
(PA-78)
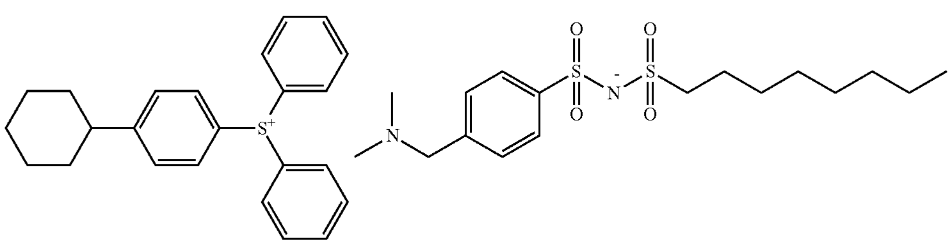
(PA-79)
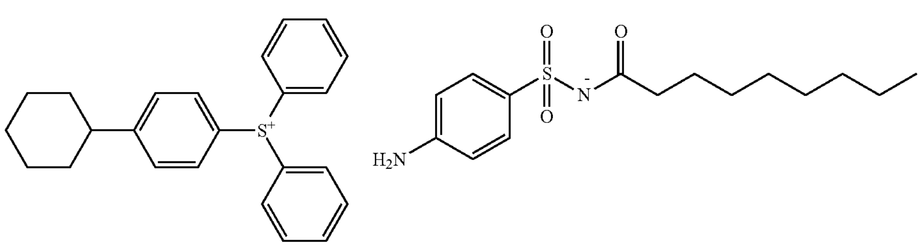

-continued
(PA-80)
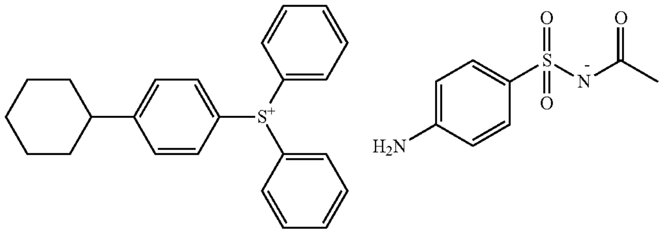
(PA-81)
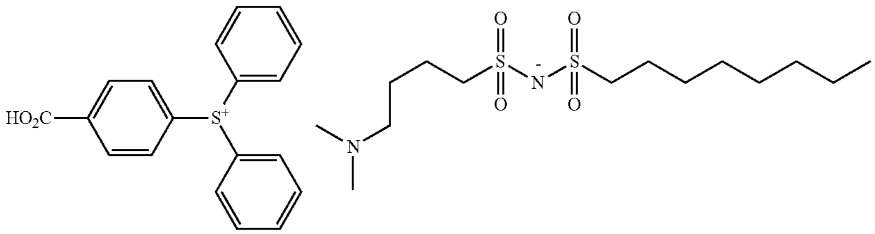
(PA-82)
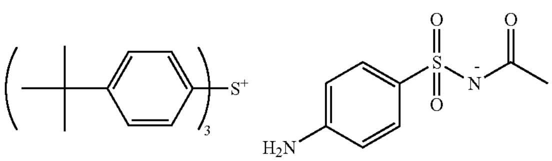
(PA-83)
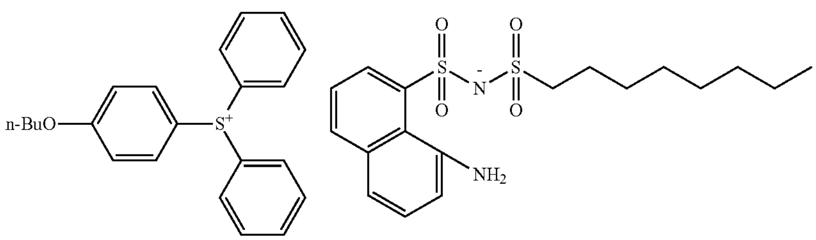
(PA-84)
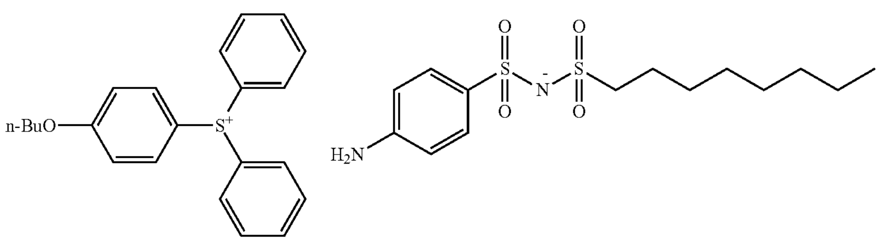
(PA-85)
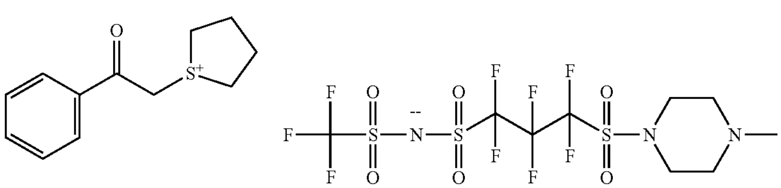
(PA-86)
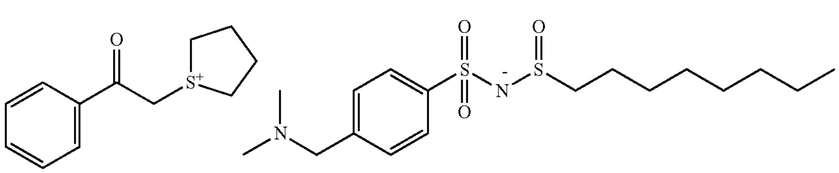

-continued
(PA-87)
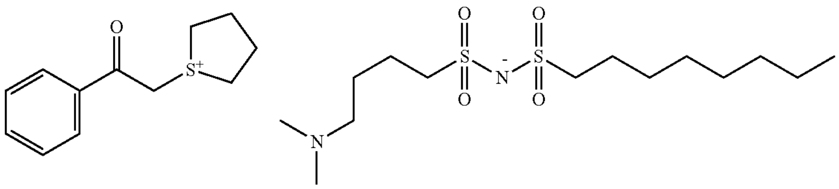
(PA-88)
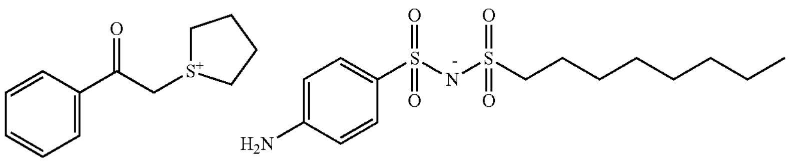
(PA-89)
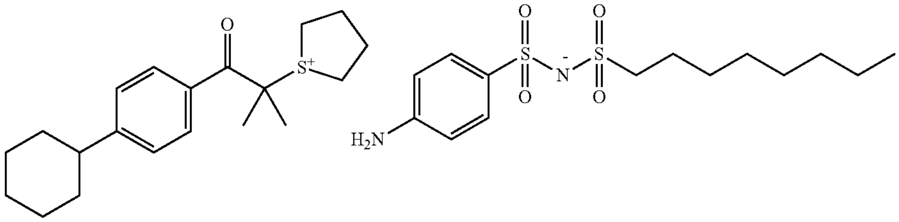
(PA-90)
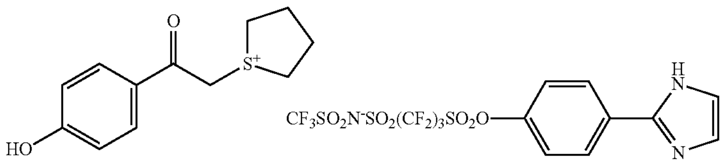
[Chem. 106]
(PA-91)
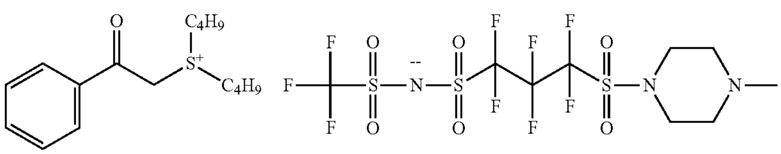
(PA-92)
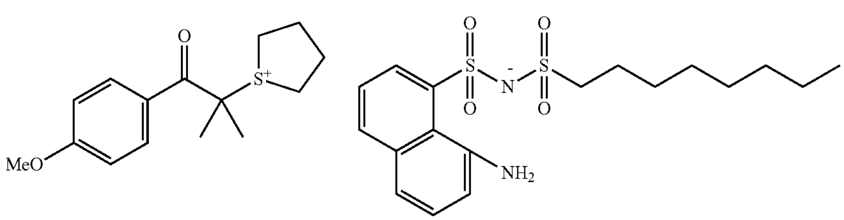
(PA-93)
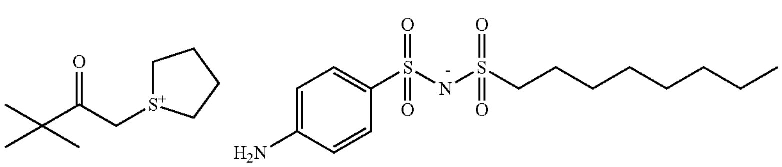
(PA-94)
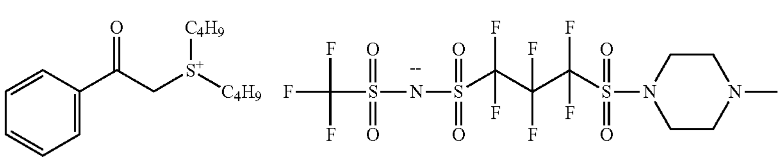

-continued (PA-95)

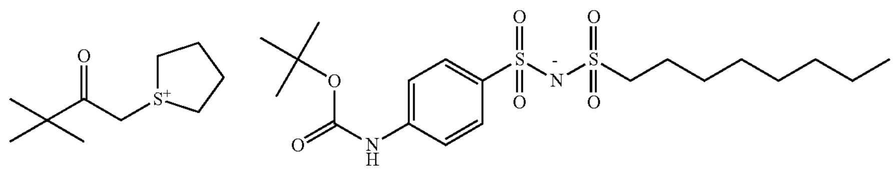

(PA-96)

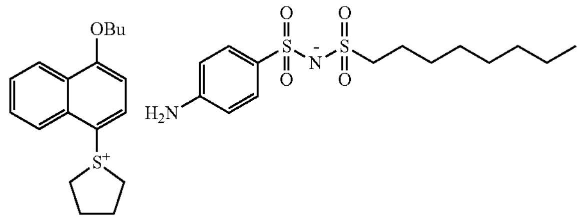

(PA-97)

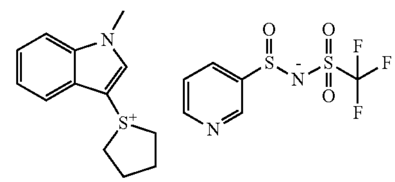

(PA-98)

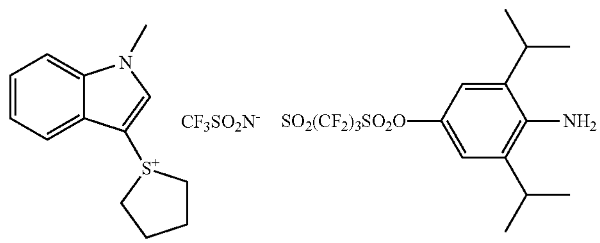

(PA-99)

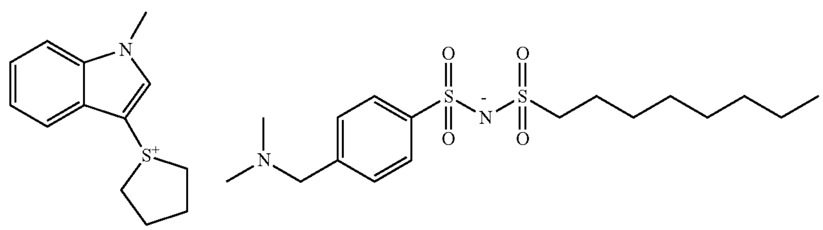

(PA-100)

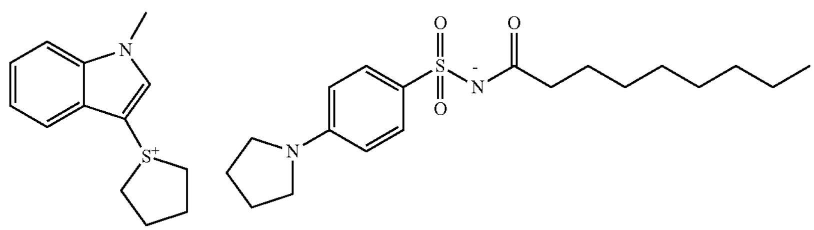

(PA-101)

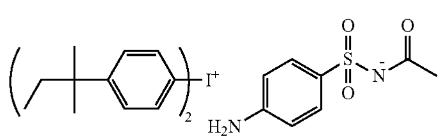

(PA-102)

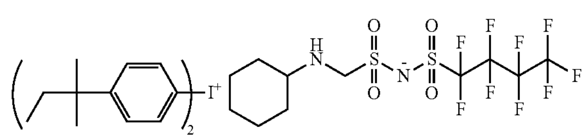

In the invention, a compound (PA) other than the compound capable of generating a compound represented by formula (PA-1) can also be appropriately selected. For example, a compound which is an ionic compound and has a proton acceptor site in the cation moiety may be used. More specifically, the compound includes a compound represented by formula (7) shown below.

[Chem. 107]

(7)

$$\begin{matrix} X^- \\ (R)_m - A^+ - (R_N)_n \end{matrix}$$

In the formula, A represents a sulfur atom or an iodine atom.

m represents 1 or 2, and n represents 1 or 2, provided that when A is a sulfur atom, m+n=3, and when A is an iodine atom, m+n=2.

R represents an aryl group.

$R_N$ represents an aryl group substituted with a proton acceptor functional group.

$X^-$ represents a counter anion.

Specific examples of $X^-$ are the same as those of $Z^-$ in formula (ZI) described above.

Specific examples of the aryl group for each of R and $R_N$ preferably include a phenyl group.

Specific examples of the proton acceptor functional group contained in $R_N$ are the same as those of the proton acceptor functional group described in formula (PA-1) above.

In the composition according to the invention, the blending ratio of the compound (PA) in the entire composition is preferably from 0.1 to 10% by mass, more preferably from 1 to 8% by mass, based on the total solid content.

(6) Guanidine Compound

The composition according to the invention may further contain a guanidine compound having a structure represented by the formula shown below.

[Chem. 108]

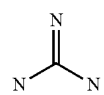

The guanidine compound exhibits strong basicity because due to three nitrogens, dispersion of positive electric charges of a conjugate acid is stabilized.

As to the basicity of the guanidine compound (A) for use in the invention, the pKa of the conjugate acid is preferably 6.0 or more, preferably from 7.0 to 20.0, from the standpoint of high neutralization reactivity with an acid and excellent roughness performance, and more preferably from 8.0 to 16.0.

Such strong basicity makes it possible to suppress diffusibility of an acid and to contribute to formation of an excellent pattern profile.

The "pKa" as used herein stands for pKa in an aqueous solution and is described, for example, in Kagaku Binran (II) (4th revised edition, compiled by The Chemical Society of Japan, Maruzen Co., Ltd. (1993)), and as the value is lower, the acid strength is higher. Specifically, the pKa in an aqueous solution can be actually determined by measuring the acid dissociation constant at 25° C. using an aqueous infinite dilution solution. Alternatively, a value based on Hammett's substituent constants and data base containing values known in publications can be determined by computation using Software Package 1 described below. All of the pKa values described in the specification are values determined by computation using the software package.

Software Package 1: Advanced Chemistry Development (ACD/Labs) Software V8.14 for Solaris (1994-2007 ACD/Labs).

In the invention, the log P is a logarithmic value of the n-octanol/water partition coefficient (P), and is an effective parameter capable of characterizing the hydrophilicity/hydrophobicity for compounds over a wide range. The partition coefficient is commonly determined by computation but not from experiments and in the invention, a value computed using CS ChemDraw Ultra Ver. 8.0 software package (Crippen's fragmentation method) is employed.

The log P of the guanidine compound (A) is preferably 10 or less. With this value or less, the compound can be uniformly incorporated in the resist film.

The log P of the guanidine compound (A) for use in the invention is preferably from 2 to 10, more preferably from 3 to 8, and still more preferably 4 to 8.

Also, the guanidine compound (A) for use in the invention preferably contains no nitrogen atom except for the guanidine structure.

Specific examples of the guanidine compound are set forth below, but the invention should not be construed as being limited thereto.

[Chem. 109]

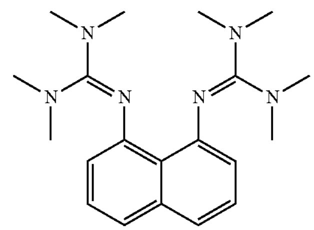

Log P: 4.29

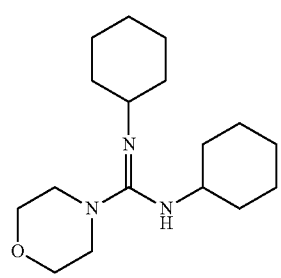

Log P: 3.32

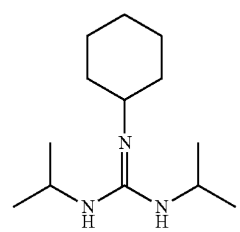

Log P: 3.1

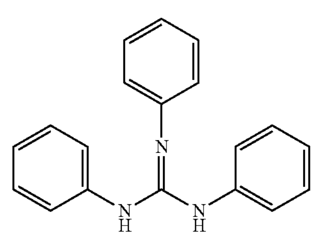

Log P: 5.24

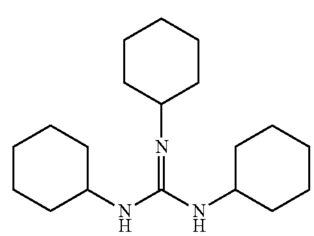

Log P: 4.89

-continued

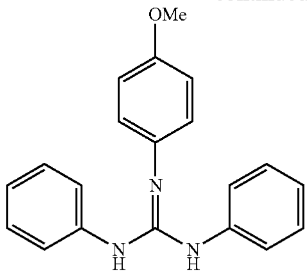

Log P: 5.11

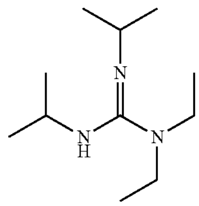

Log P: 2.61

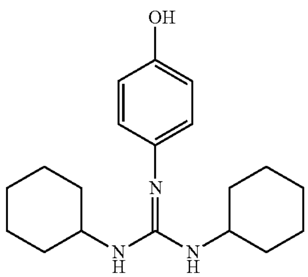

Log P: 4.61

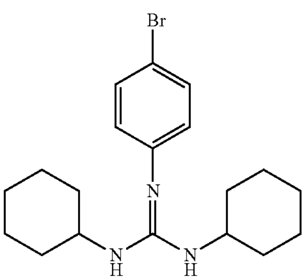

Log P: 5.83

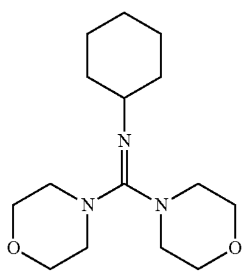

Log P: 1.75

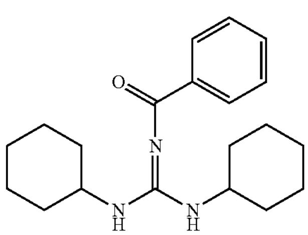

Log P: 4.95

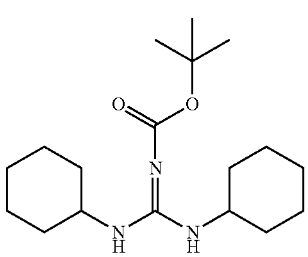

Log P: 4.51

-continued

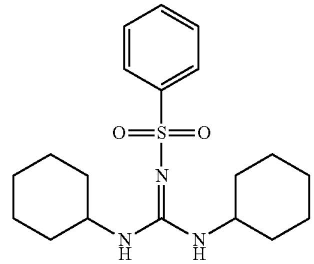

Log P: 4.55

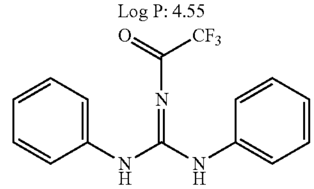

Log P: 4.43

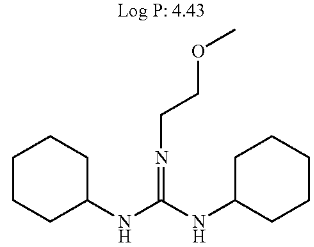

Log P: 3.18

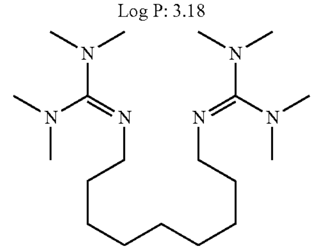

Log P: 4.4

(7) Low Molecular Compound Having Nitrogen Atom and Having Group Capable of Leaving by Action of Acid The composition according to the invention can contain a low molecular compound having a nitrogen atom and having a group capable of leaving by the action of an acid (hereinafter, also referred to as "low molecular compound (D)" or "compound (D)"). The low molecular compound (D) preferably exhibits basicity after the group capable of leaving by the action of an acid is eliminated.

The group capable of leaving by the action of an acid is not particularly limited, and is preferably an acetal group, a carbonate group, a carbamate group, a tertiary ester group, a tertiary hydroxyl group or a hemiaminal ether group, and particularly preferably a carbamate group or a hemiaminal ether group.

The molecular weight of the low molecular compound (D) having a group capable of leaving by the action of an acid is preferably from 100 to 1,000, more preferably from 100 to 700, and particularly preferably from 100 to 500.

The compound (D) is preferably an amine derivative having on the nitrogen atom a group capable of leaving by the action of an acid.

The compound (D) may have a carbamate group containing a protective group on the nitrogen atom. The protective group constituting the carbamate group can be represented by formula (d-1) shown below.

[Chem. 110]

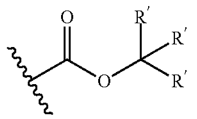

(d-1)

In formula (d-1), each R' independently represents a hydrogen atom, a straight-chain or branched alkyl group, a cycloalkyl group, an aryl group, an aralkyl group or an alkoxyalkyl group. R' may be connected to each other to form a ring.

R' is preferably a straight-chain or branched alkyl group, a cycloalkyl group or an aryl group, and more preferably a straight-chain or branched alkyl group or a cycloalkyl group.

Specific structures of such a group are set forth below.

[Chem. 111]

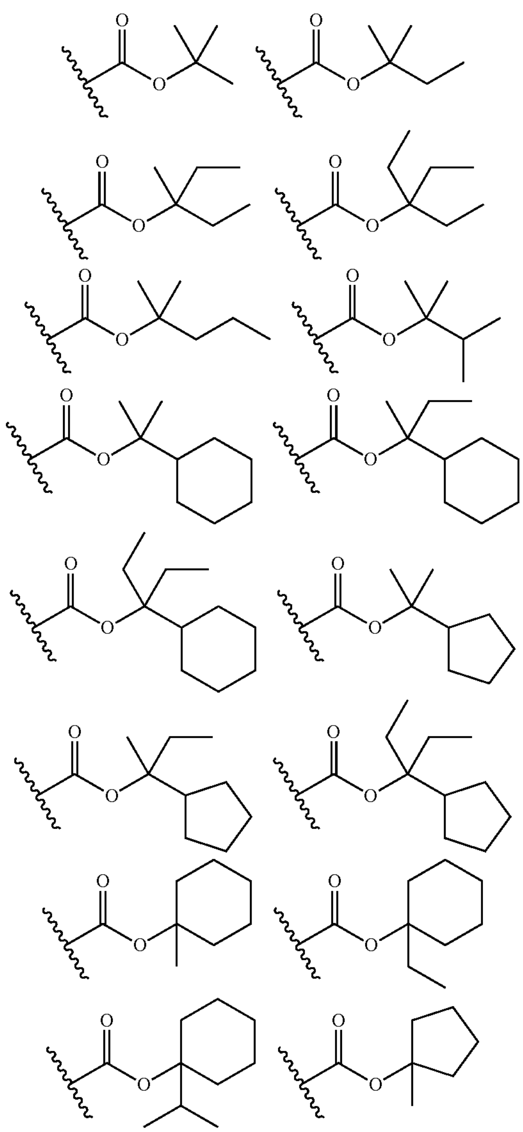

-continued

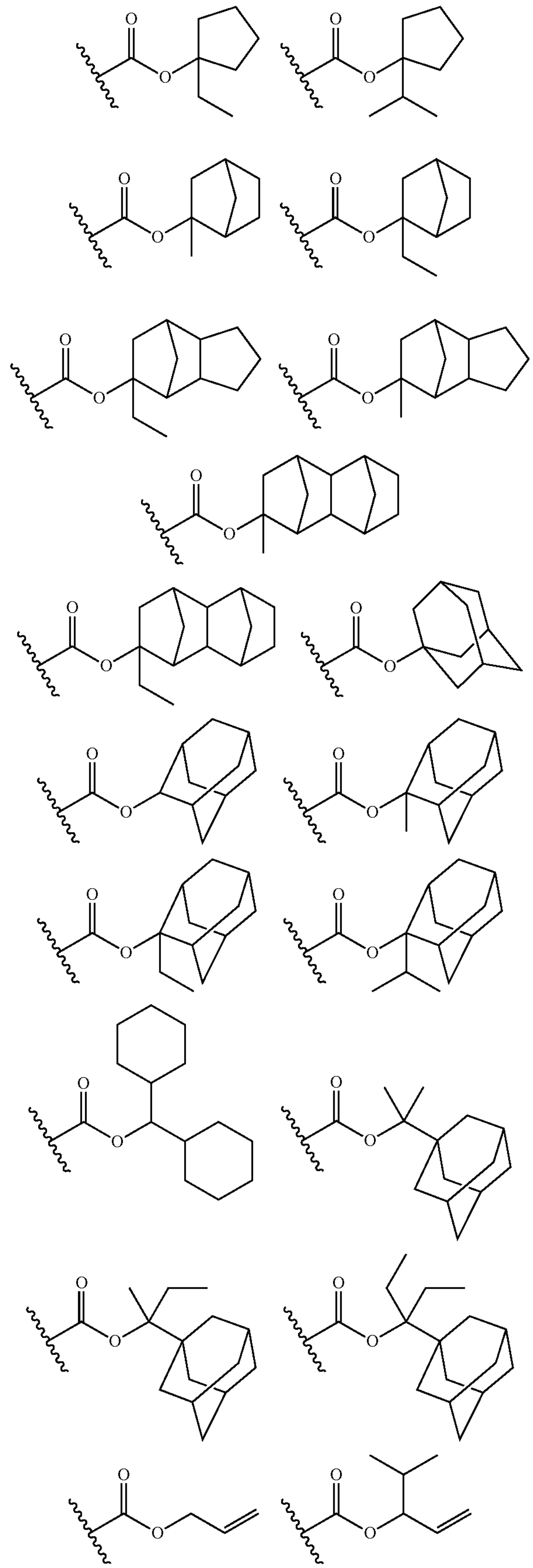

-continued

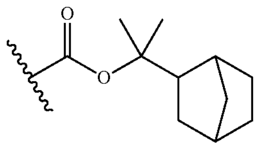

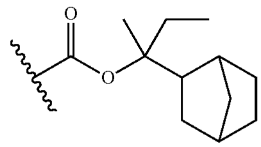

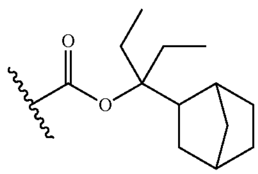

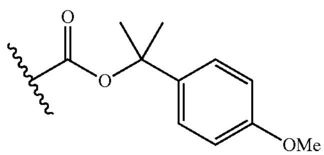

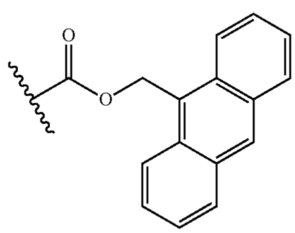

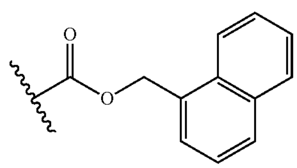

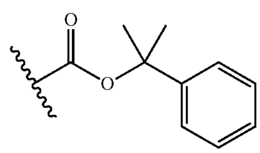

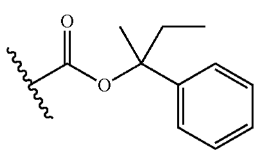

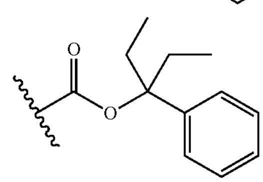

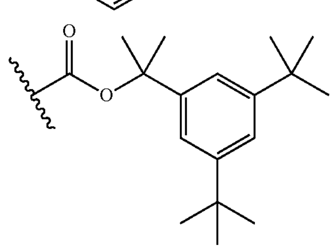

The compound (D) may also be composed by appropriately combining the basic compound and the structure represented by formula (d-1).

The compound (D) is particularly preferably a compound having a structure represented by the formula (A) shown below.

The compound (D) may be a compound corresponding to the basic compound described above as long as it is a low molecular compound having a group capable of leaving by the action of an acid.

[Chem. 112]

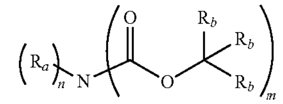

(A)

In formula (A), Ra represents a hydrogen atom, an alkyl group, a cycloalkyl group, an aryl group or an aralkyl group. Also, when n=2, each Ra may be the same as or different from the other Ra, and two Ra may be connected to each other to form a divalent heterocyclic hydrocarbon group (preferably having 20 or less carbon atoms) or a derivative thereof.

Each Rb independently represents a hydrogen atom, an alkyl group, a cycloalkyl group, an aryl group, an aralkyl group or an alkoxyalkyl group, provided that in —C(Rb)(Rb)(Rb), when one or more Rb are a hydrogen atom, at least one of the remaining Rb is a cyclopropyl group, a 1-alkoxyalkyl group or an aryl group.

At least two Rb may be connected to form an alicyclic hydrocarbon group, an aromatic hydrocarbon group, a heterocyclic hydrocarbon group or a derivative thereof.

n represents an integer from 0 to 2, m represents an integer from 1 to 3, and n+m=3.

In formula (A), the alkyl group, cycloalkyl group, aryl group and aralkyl group represented by each of Ra and Rb may be substituted with a functional group, for example, a hydroxyl group, a cyano group, an amino group, a pyrrolidino group, a piperidino group, a morpholino group or an oxo group, an alkoxy group or a halogen atom. The same applies to the alkoxyalkyl group represented by Rb.

Examples of the alkyl group, cycloalkyl group, aryl group and aralkyl group (the alkyl, cycloalkyl, aryl and aralkyl groups may be substituted with the functional group, alkoxy group or halogen atom described above) for Ra and/or Rb include:

a group derived from a straight-chain or branched alkane, for example, methane, ethane, propane, butane, pentane, hexane, heptane, octane, nonane, decane, undecane or dodecane, or a group where the group derived from an alkane is substituted with one or more kinds of or one or more groups of cycloalkyl groups, for example, a cyclobutyl group, a cyclopentyl group or a cyclohexyl group;

a group derived from a cycloalkane, for example, cyclobutane, cyclopentane, cyclohexane, cycloheptane, cyclooctane, norbornane, adamantane or noradamantane, or a group where the group derived from a cycloalkane is substituted with one or more kinds of or one or more groups of straight-chain or branched alkyl groups, for example, a methyl group, an ethyl group, a n-propyl group, an isopropyl group, a n-butyl group, a 2-methylpropyl group, a 1-methylpropyl group or a tert-butyl group;

a group derived from an aromatic compound, for example, benzene, naphthalene or anthracene, or a group where the group derived from an aromatic compound is substituted with one or more kinds of or one or more groups of straight-chain or branched alkyl groups, for example, a methyl group, an ethyl group, a n-propyl group, an isopropyl group, a n-butyl group, a 2-methylpropyl group, a 1-methylpropyl group or a tert-butyl group;

a group derived from a heterocyclic compound, for example, pyrrolidine, piperidine, morpholine, tetrahydrofuran, tetrahydropyran, indole, indoline, quinoline, perhydroquinoline, indazole or benzimidazole, or a group where the group derived from a heterocyclic compound is substituted with one or more kinds of or one or more groups of groups derived from straight-chain or branched alkyl groups or groups derived from an aromatic compound; a group where the group derived from a straight-chain or branched alkane or the group derived from a cycloalkane is substituted with one or more kinds of or one or more groups derived from an aromatic compound, for example, a phenyl group, a naphthyl group or an anthracenyl group; and a group where the substituent described above is substituted with a functional group, for example, a hydroxyl group, a cyano group, an amino group, a pyrrolidino group, a piperidino group, a morpholino group or oxo group.

Also, examples of the divalent heterocyclic hydrocarbon group (preferably having from of 1 to 20 carbon atoms) formed by connecting Ra to each other or a derivative thereof include a group derived from a heterocyclic compound, for example, pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline or 1,5,9-triazacyclododecane, and a group where the group derived from a heterocyclic compound is substituted with one or more kinds of or one or more groups of groups derived from straight-chain or branched alkane, groups derived from cycloalkane, groups derived from aromatic compound, groups derived from heterocyclic compound and functional groups, for example, a hydroxyl group, a cyano group, an amino group, a pyrrolidino group, a piperidino group, a morpholino group or an oxo group.

Specific examples of the compound (D) particularly preferred in the invention are set forth below, but the invention should not be construed as being limited thereto.

[Chem. 113]

(D-1)

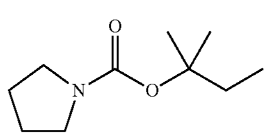

(D-2)

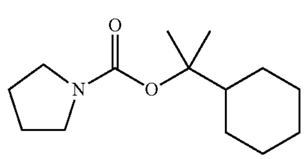

(D-3)

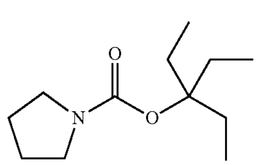

(D-4)

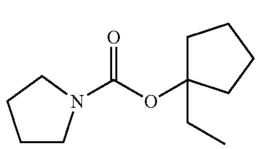

-continued (D-5)

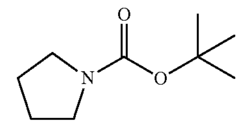

(D-6)

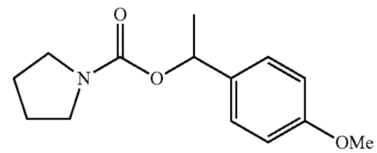

(D-7)

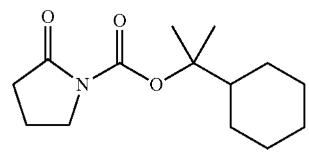

(D-8)

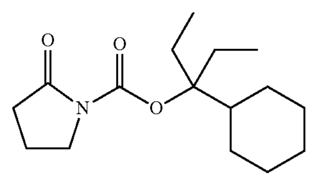

(D-9)

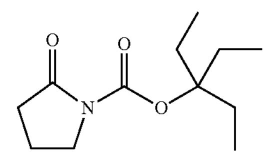

(D-10)

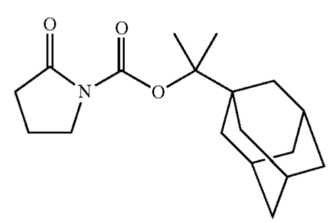

(D-11)

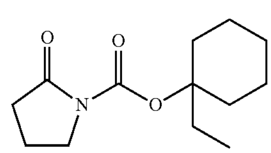

(D-12)

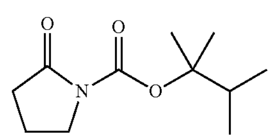

(D-13)

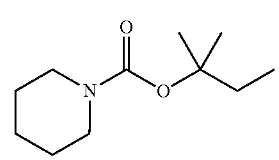

(D-14)

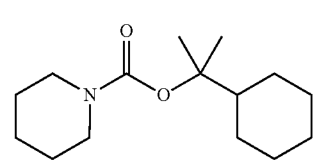

-continued
(D-15)
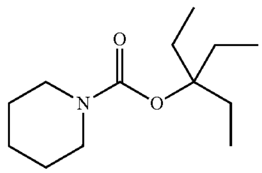
(D-16)
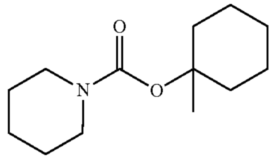
(D-17)
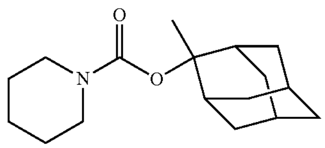
(D-18)
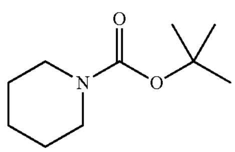
(D-19)
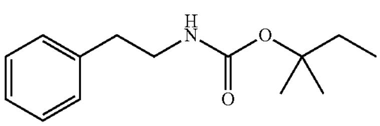
(D-20)
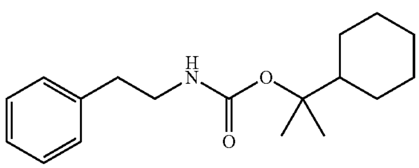
(D-21)
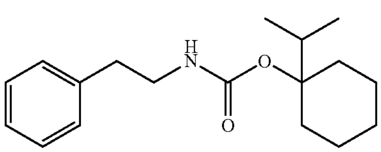
(D-22)
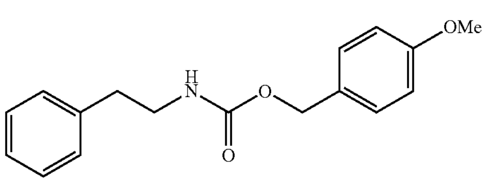
(D-23)
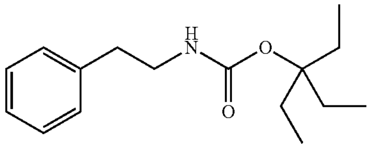
-continued
(D-24)
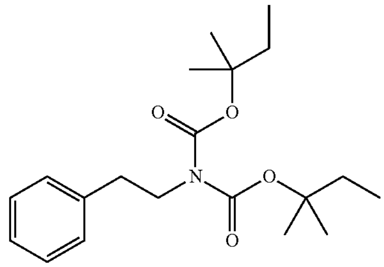
(D-25)
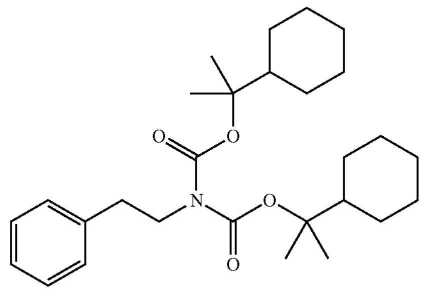
(D-26)
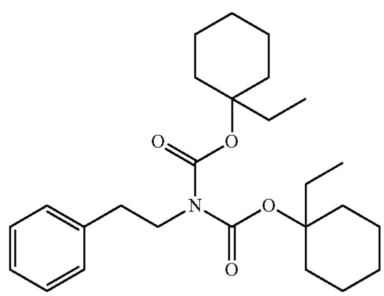
(D-27)
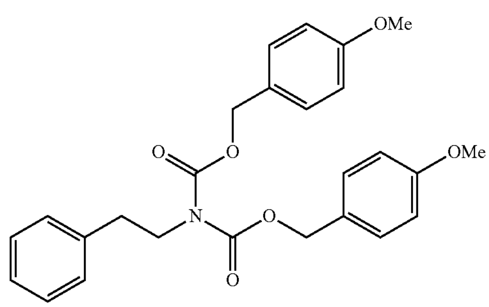
(D-28)
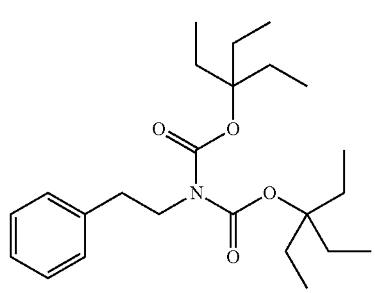

(D-29)
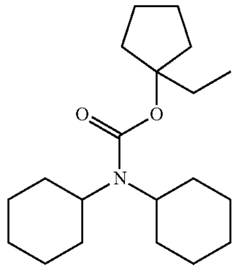
(D-30)
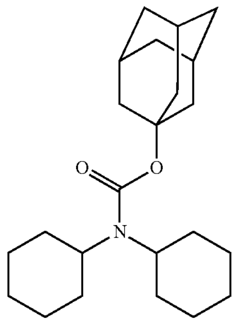
(D-31)
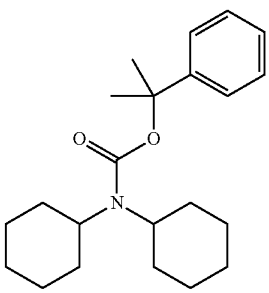
(D-32)
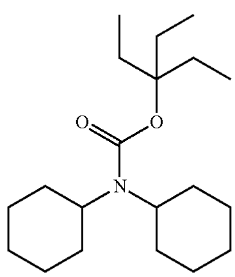
(D-33)
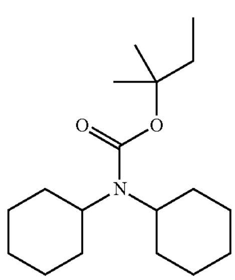
[Chem. 114]
(D-34)
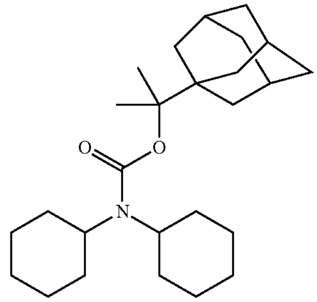
(D-35)
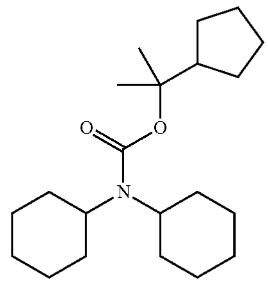
(D-36)
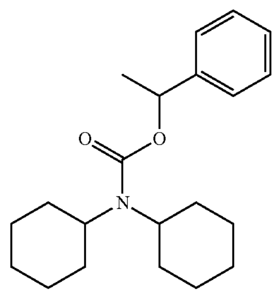
(D-37)
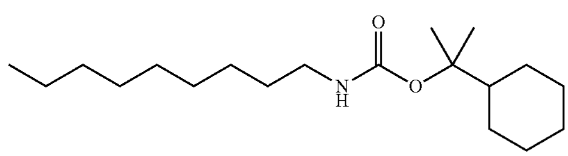
(D-38)
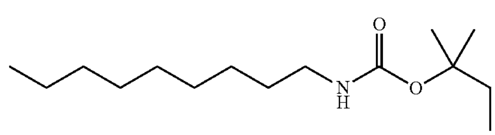
(D-39)
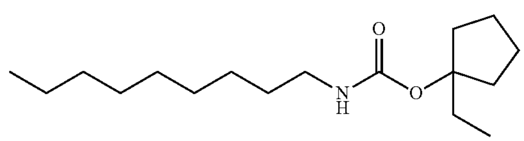
(D-40)
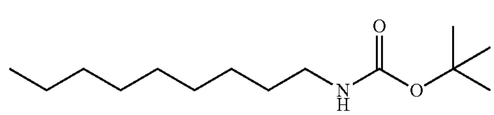

-continued
(D-41)
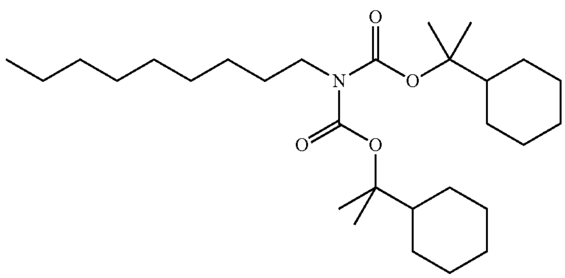
(D-42)
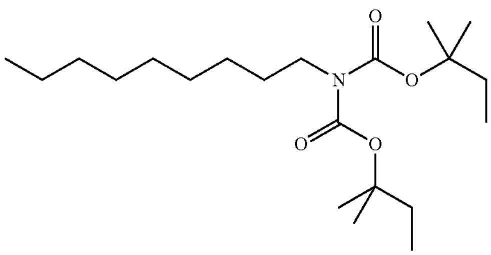
(D-43)
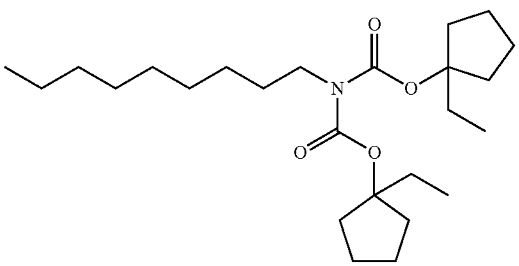
(D-44)
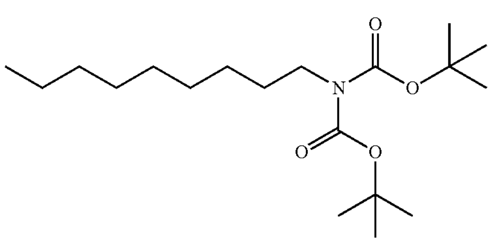
(D-45)
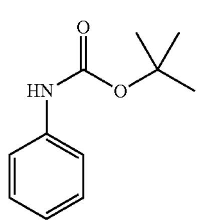
(D-46)
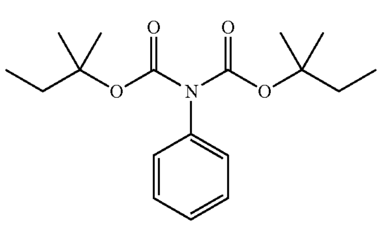
-continued
(D-47)
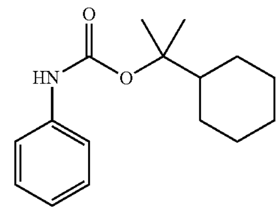
(D-48)
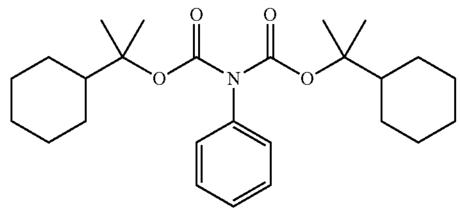
(D-49)
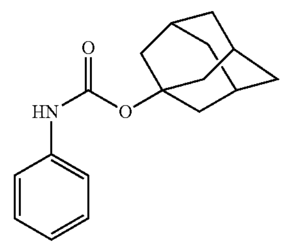
(D-50)
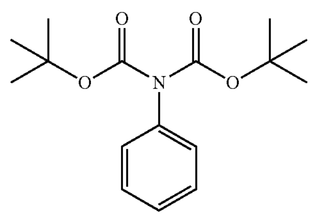
(D-51)
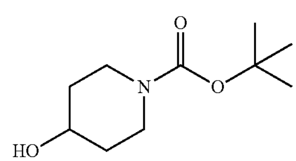
(D-52)
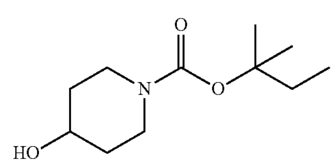
(D-53)
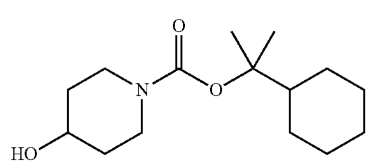
(D-54)
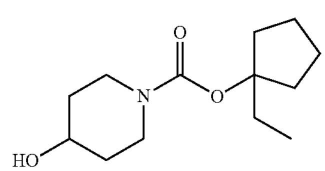

-continued (D-55)

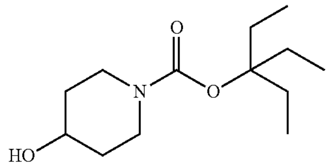

[Chem. 115]

(D-56)

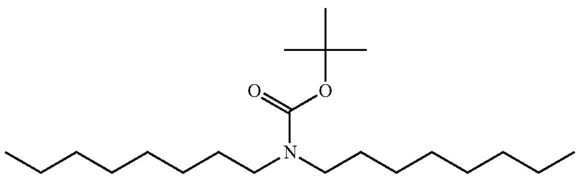

(D-57)

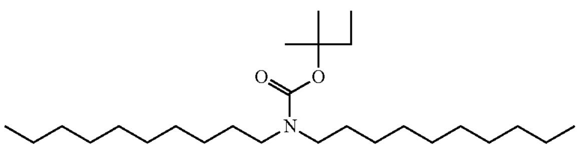

(D-58)

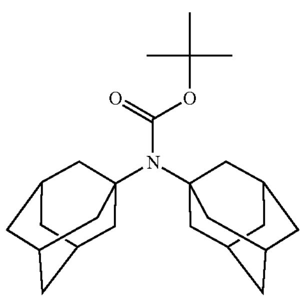

(D-59)

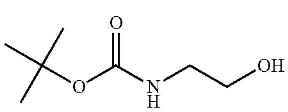

(D-60)

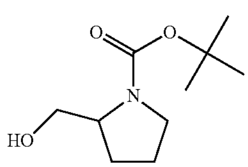

(D-61)

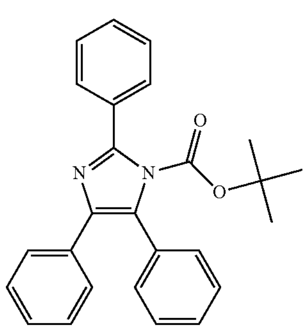

-continued (D-62)

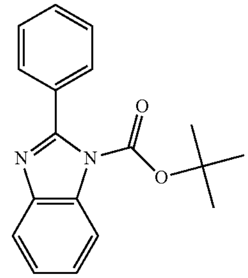

(D-63)

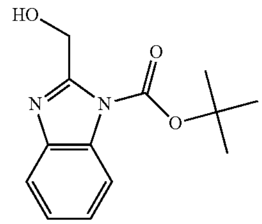

(D-64)

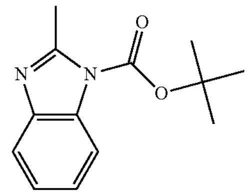

(D-65)

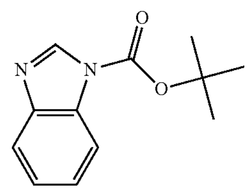

The compound represented by formula (A) can be synthesized in accordance with, for example, JP-A-2007-298569 and JP-A-2009-199021.

In the invention, the low molecular compound (D) can be used one kind alone or as a mixture of two or more kinds thereof.

The composition according to the invention may or may not contain the low molecular compound (D), and in the case of containing the compound (D), the content thereof is ordinarily from 0.001 to 20% by mass, preferably from 0.001 to 10% by mass, more preferably from 0.01 to 5% by mass, based on the total solid content of the composition combined with the basic compound described above.

In the case where the composition according to the invention contains an acid generator, the ratio between the acid generator and the compound (D) used in the composition is preferably acid generator/[compound (D)+basic compound] (in molar ratio)=from 2.5 to 300. That is, the molar ratio is preferably 2.5 or more from the standpoint of sensitivity and resolution and is preferably 300 or less from the standpoint of suppressing the reduction in resolution due to thickening of the resist pattern with a lapse of time after exposure until heat treatment. The acid generator/[compound (D)+basic compound] (in molar ratio) is more preferably from 5.0 to 200, and still more preferably from 7.0 to 150.

Other examples of the basic compound which can be used in the composition according to the invention include compounds synthesized in Examples of JP-A-2002-363146 and compounds described in paragraph 0108 of JP-A-2007-298569.

A photosensitive basic compound may also be used as the basic compound. The photosensitive basic compound which can be used includes, for example, compounds described in JP-T-2003-524799 and *J. Photopolym. Sci. & Tech.*, Vol. 8, pp. 543-553 (1995).

The molecular weight of the basic compound is ordinarily from 100 to 1,500, preferably from 150 to 1,300, and more preferably from 200 to 1,000.

The basic compound may be used one kind alone or in combination of two or more kinds thereof.

In the case where the composition according to the invention contains the basic compound, the content thereof is preferably from 0.01 to 10.0% by mass, more preferably from 0.1 to 8.0% by mass, particularly preferably from 0.2 to 5.0% by mass, based on the total solid content of the composition.

The molar ratio of the basic compound to the photo-acid generator is preferably from 0.01 to 10, more preferably from 0.05 to 5, and still more preferably from 0.1 to 3. When the molar ratio is excessively large, the sensitivity and/or resolution may be reduced in some cases, whereas when the molar ratio is excessively small, thinning of the pattern may be possible to occur between exposure and heating (post-baking). The molar ratio is more preferably from 0.05 to 5, and still more preferably from 0.1 to 3. The proportion of the photo-acid generator in the molar ratio is based on the total amount of the repeating unit (B) of the resin described above and the photo-acid generator which may be further contained in the resin.

[6] Hydrophobic Resin (HR)

The electron beam-sensitive or extreme ultraviolet radiation-sensitive resin composition according to the invention may contain a hydrophobic resin (HR) separately from the resin (A) described above.

The hydrophobic resin (HR) preferably contains a group having a fluorine atom, a group having a silicon atom or a hydrocarbon group having 5 or more carbon atoms so as to be unevenly distributed to the film surface. Such a group may be present in the main chain of the resin or may be substituted on the side chain. Specific examples of the hydrophobic resin (HR) are set forth below.

[Chem. 116]

(HR-1)

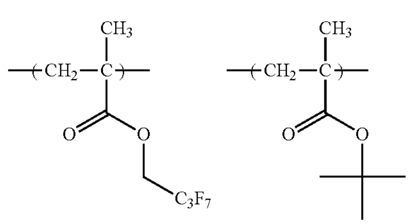

(HR-2)

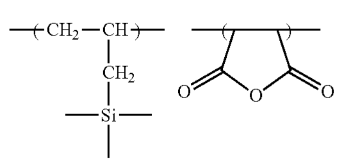

-continued (HR-3)

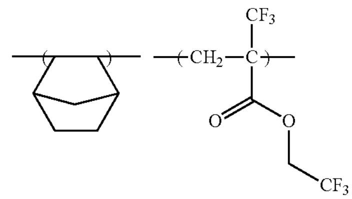

(HR-4)

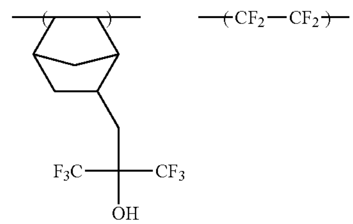

(HR-5)

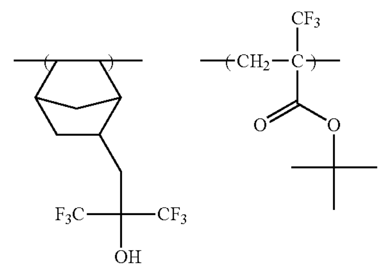

(HR-6)

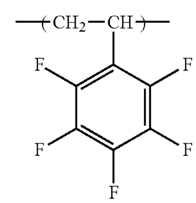

(HR-7)

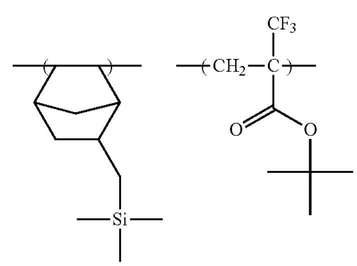

(HR-8)

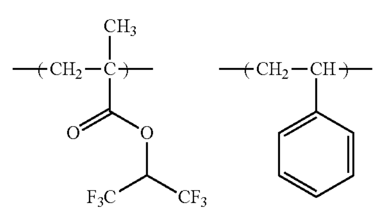

-continued
(HR-9)
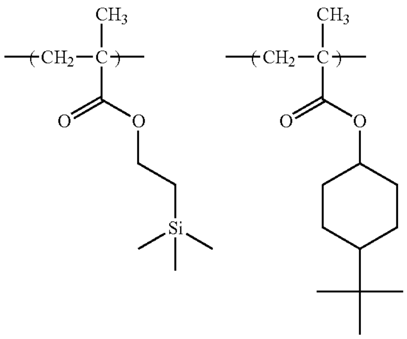
(HR-10)
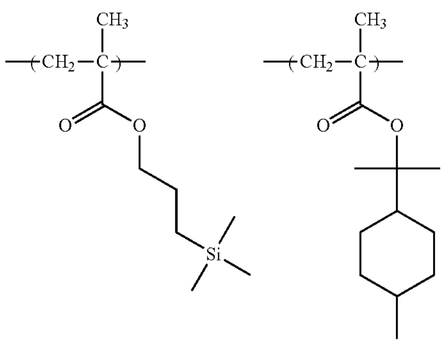
(HR-11)
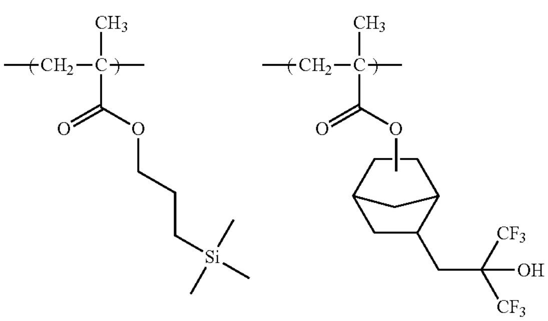
(HR-12)
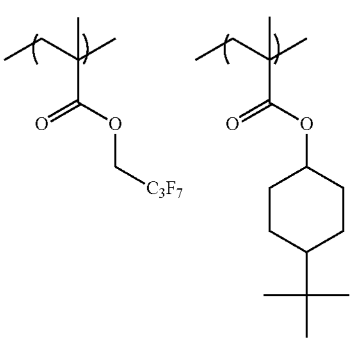
-continued
(HR-13)
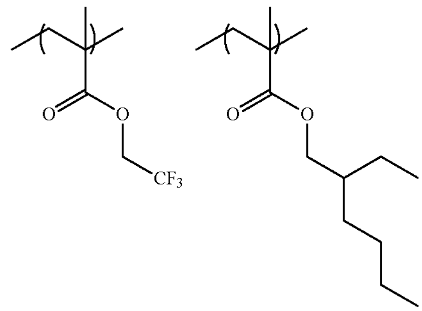
(HR-14)
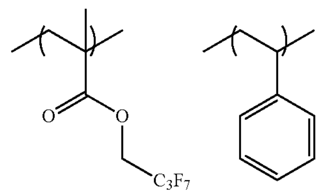
(HR-15)
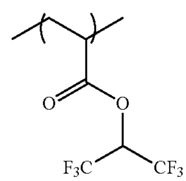
(HR-16)
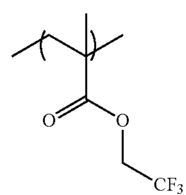
(HR-17)
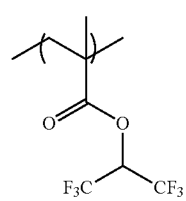
(HR-18)
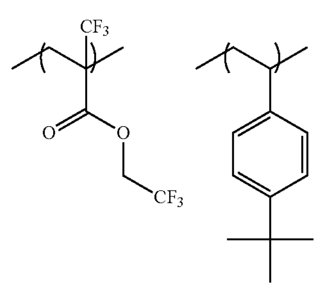

-continued
(HR-19)
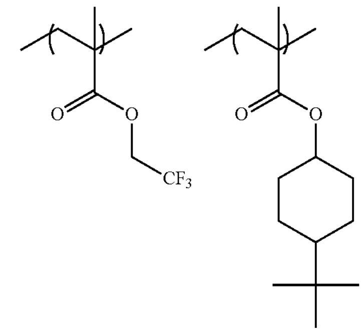
(HR-20)
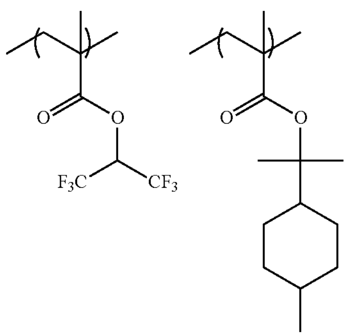
(HR-21)
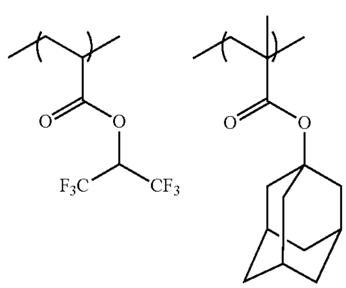
(HR-22)
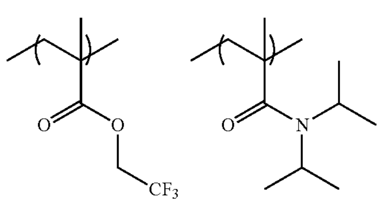
(HR-23)
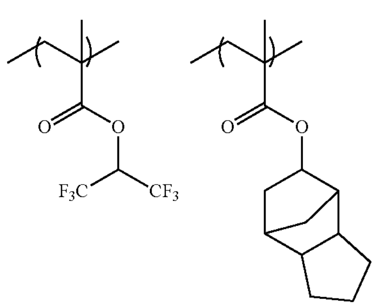
-continued
(HR-24)
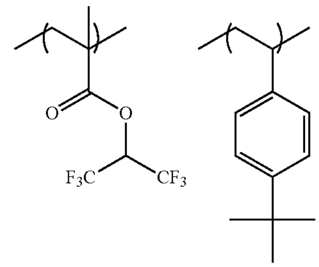
(HR-25)
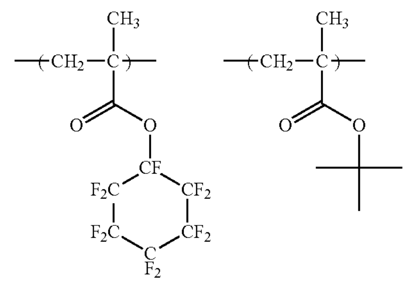
(HR-26)
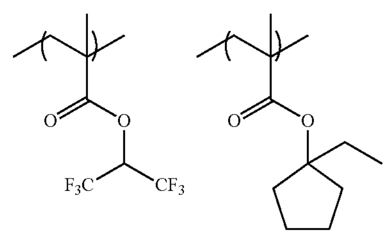
[Chem. 117]
(HR-27)
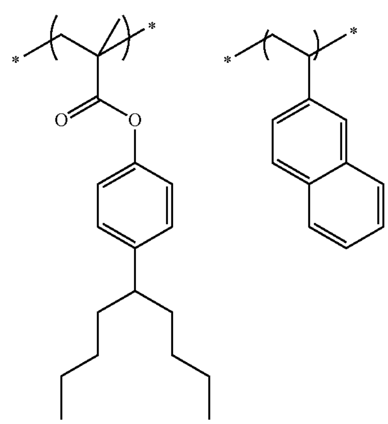
(HR-28)
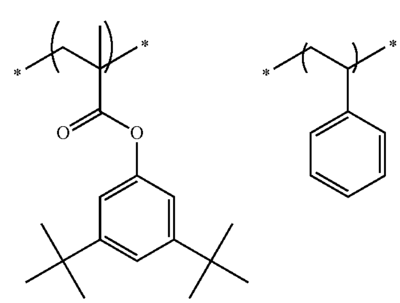
As the hydrophobic resin, in addition, those described in JP-A-2011-248019, JP-A-2010-175859 and JP-A-2012-32544 can also be preferably used.

[7] Surfactant

The composition according to the invention may further contain a surfactant. By containing a surfactant, when an exposure light source having a wavelength of 250 nm or less, particularly 220 nm or less, is used, a pattern of good adhesion property and less development defects can be formed with good sensitivity and resolution.

As to the surfactant, it is particularly preferred to use a fluorine-containing and/or silicon-containing surfactant.

Examples of the fluorine-containing and/or silicon-containing surfactant include surfactants described in paragraph 0276 of U.S. Patent Application Publication No. 2008/0248425. Also, Eftop EF301 and EF303 (produced by Shin-Akita Kasei K.K.); Fluorad FC430, 431 and 4430 (produced by Sumitomo 3M Inc.); Megafac F171, F173, F176, F189, F113, F110, F177, F120 and R08 (produced by DIC Corp.); Surflon S-382, SC101, 102, 103, 104, 105 and 106 (produced by Asahi Glass Co., Ltd.); Troysol S-366 (produced by Troy Corp.); GF-300 and GF-150 (produced by Toagosei Chemical Industry Co., Ltd.); Surflon S-393 (produced by AGC Seimi Chemical Co., Ltd.); Eftop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA Solutions Inc.); and FTX-204G, 208G, 218G, 230G, 204D, 208D, 212D, 218D and 222D (produced by NEOS Co., Ltd.) may be used. Polysiloxane Polymer KP-341 (produced by Shin-Etsu Chemical Co., Ltd.) may also be used as the silicon-containing surfactant.

In addition to known surfactants as shown above, the surfactant may also be synthesized by using a fluoroaliphatic compound produced by a telomerization process (also called a telomer process) or an oligomerization process (also called an oligomer process). Specifically, a polymer having a fluoroaliphatic group derived from the fluoroaliphatic compound may be used as the surfactant. The fluoroaliphatic compound can be synthesized, for example, by the method described in JP-A-2002-90991.

The polymer having a fluoroaliphatic group is preferably a copolymer of a monomer having a fluoroaliphatic group with a (poly(oxyalkylene)) acrylate or methacrylate and/or a (poly(oxyalkylene)) methacrylate, and the monomers may be irregularly distributed in the polymer or may form a block copolymer.

The poly(oxyalkylene) group includes, for example, a poly(oxyethylene) group, a poly(oxypropylene) group and a poly(oxybutylene) group. The poly(oxyalkylene) group may also be a unit having alkylenes differing in the chain length in the same chain, for example, a poly(oxyethylene, oxypropylene and oxyethylene) block or a poly(oxyethylene and oxypropylene) block.

Further, the copolymer of a monomer having a fluoroaliphatic group and a (poly(oxyalkylene)) acrylate or methacrylate may also be a ternary or higher copolymer obtained by simultaneously copolymerizing, for example, two or more different monomers having a fluoroaliphatic group and two or more different (poly(oxyalkylene)) acrylates or methacrylates.

Examples thereof include, as the commercially available surfactant, Megafac F178, F-470, F-473, F-475, F-476 and F-472 (produced by DIC Corp.). Further examples thereof include, for example, a copolymer of a acrylate or methacrylate having a $C_6F_{13}$ group with a (poly(oxyalkylene)) acrylate or methacrylate, a copolymer of a acrylate or methacrylate having a $C_6F_{13}$ group with a (poly(oxyethylene)) acrylate or methacrylate and a (poly(oxypropylene)) acrylate or methacrylate, a copolymer of a acrylate or methacrylate having a $C_8F_{17}$ group with a (poly(oxyalkylene)) acrylate or methacrylate, and a copolymer of a acrylate or methacrylate having a $C_8F_{17}$ group with a (poly(oxyethylene)) acrylate or methacrylate and a (poly(oxypropylene)) acrylate or methacrylate.

Surfactants other than the fluorine-containing and/or silicon-containing surfactant described in paragraph 0280 of U.S. Patent Application Publication No. 2008/0248425 may also be used.

The surfactants may be used one kind alone or in combination of two or more kinds thereof.

In the case where the composition according to the invention contains a surfactant, the content of the surfactant is preferably from 0 to 2% by mass, more preferably from 0.0001 to 2% by mass, still more preferably from 0.0005 to 1% by mass, based on the total solid content of the composition.

[8] Other Additives

The composition according to the invention can appropriately contain, in addition to the components described above, a carboxylic acid, an onium carboxylate, a dissolution-inhibiting compound having a molecular weight of 3,000 or less described, for example, in *Proceeding of SPIE*, 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid, for example, benzoic acid or naphthoic acid.

The content of the carboxylic acid is preferably from 0.01 to 10% by mass, more preferably from 0.01 to 5% by mass, still more preferably from 0.01 to 3% by mass, based on the total solid content concentration of the composition.

The solid content concentration in the electron beam-sensitive or extreme ultraviolet radiation-sensitive resin composition according to the invention is ordinarily from 1.0 to 10% by mass, preferably from 2.0 to 5.7% by mass, and more preferably from 2.0 to 5.3% by mass. By setting the solid content concentration to the range described above, the resist solution can be uniformly coated on a substrate and further, a resist pattern excellent in the line width roughness can be formed. The reason therefor is not clearly known, but it is considered that probably by setting the solid content concentration to 10% by mass or less, preferably 5.7% by mass or less, aggregation of materials, particularly, a photo-acid generator, in the resist solution is suppressed and as a result, a uniform resist film can be formed.

The solid content concentration is a weight percentage of the weight of resist components excluding the solvent, based on the total weight of the electron beam-sensitive or extreme ultraviolet radiation-sensitive resin composition.

The electron beam-sensitive or extreme ultraviolet radiation-sensitive resin composition according to the invention is used by dissolving the components described above in a predetermined organic solvent, preferably in the mixed solvent described above, filtering the solution through a filter, and coating the filtrate on a predetermined support (substrate). The filter used for filtration through a filter is preferably a polytetrafluoroethylene-made, polyethylene-made or nylon-made filter having a pore size of 0.1 μm or less, more preferably 0.05 μm or less, and still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Further, a deaeration treatment or the like may be applied to the composition before and after the filtration through a filter.

<Composition Kit>

The present invention also relates to a composition kit containing the top coat composition and the electron beam-sensitive or extreme ultraviolet radiation-sensitive resin composition described above.

The composition kit is suitably applicable to the pattern forming method according to the invention.

Further, the present invention also relates to a resist film formed by using the composition kit described above.

(Immersion Exposure)

With respect to the film formed from the resist composition according to the invention, the exposure (immersion exposure) may also be performed by filling a liquid (immersion medium) having a refractive index higher than that of air between the film and a lens at the irradiation with an electron beam or an extreme ultraviolet radiation. By the immersion exposure, the resolution can be enhanced. The immersion medium used can be any liquid as long as it has a refractive index higher than that of air, and is preferably pure water.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used from the standpoint of easy availability and easy handle-ability in addition to the aspects described above.

Further, a medium having a refractive index of 1.5 or more can be also used from the standpoint that the refractive index can be more enhanced. The medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By adding the alcohol having a refractive index nearly equal to that of water, even when the alcohol component in water is evaporated and its content concentration is changed, the change in the refractive index of the entire liquid can be advantageously made very small. On the other hand, when an impurity greatly differing in the refractive index from water is mixed into the water, distortion of the optical image projected on the resist film is incurred. Thus, the water used is preferably distilled water. Pure water obtained by further filtering the distilled water through an ion exchange filter or the like may also be used.

The electrical resistance of water is desirably 18.3 MΩcm or more, and TOC (organic concentration) is desirably 20 ppb or less. Also, the water is desirably subjected to a deaeration treatment.

The lithography performance can be enhanced by increasing the refractive index of the immersion liquid. From such a standpoint, an additive for increasing the refractive index may be added to water, or heavy water ($D_2O$) may be used in place of water.

[Usage]

The pattern forming method according to the invention is suitably used for the formation of a semiconductor fine circuit, for example, in the production of VLSI or a high-capacity microchip. At the formation of a semiconductor fine circuit, the resist film having formed therein a pattern is subjected to circuit formation or etching and the remaining resist film portion is finally removed with a solvent or the like. Thus, unlike a so-called permanent resist used for a printed board and the like, the resist film derived from the electron beam-sensitive or extreme ultraviolet radiation-sensitive resin composition according to the invention does not remain in the final product, for example, a microchip.

The present invention also relates to a method for producing an electronic device containing the pattern forming method according to the invention described above, and an electronic device produced by the producing method.

The electronic device according to the invention is suitably mounted on an electric/electronic equipment (for example, home electronics, OA•media related equipment, optical equipment or communication equipment).

EXAMPLE

The present invention will be described more specifically with reference to the examples, but the invention should not be construed as being limited thereto.

Synthesis Example 1: Synthesis of Resin (P-1)

20.0 g of poly(p-hydroxystyrene) (VP-2500, produced by Nippon Soda Co., Ltd.) was dissolved in 80.0 g of propylene glycol monomethyl ether acetate (PGMEA). To the resulting solution were added 10.3 g of 2-cyclohexylethyl vinyl ether and 10 mg of camphorsulfonic acid, and the mixture was stirred at room temperature (25° C.) for 3 hours. 84 mg of triethylamine was added thereto and after stirring for a while, the reaction solution was moved to a separatory funnel containing 100 ml of ethyl acetate. The organic layer was washed three times with each 50 ml of distilled water, and the organic layer was concentrated in an evaporator. The polymer obtained was dissolved in 300 ml of acetone and the solution was dropwise added to 3,000 g of hexane to reprecipitate. The precipitate was collected by filtration to obtain 17.5 g of Resin (P-1).

[Chem. 118]

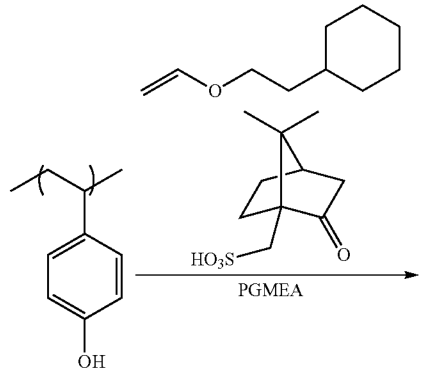

-continued

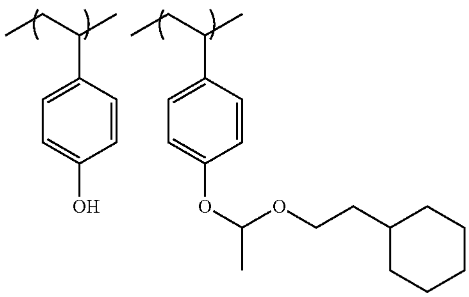

(P-1)

-continued

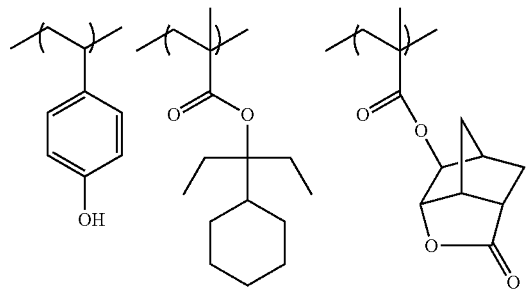

(P-2)

Synthesis Example 2: Synthesis of Resin (P-2)

10.00 g of p-acetoxystyrene was dissolved in 40 g of ethyl acetate, and the solution was cooled to 0° C., 4.76 g of sodium methoxide (28% by mass methanol solution) was dropwise added thereto over a period of 30 minutes, followed by stirring at room temperature for 5 hours. Ethyl acetate was added to the reaction mixture, and the organic phase was washed 3 times with distilled water and dried over anhydrous sodium sulfate. The solvent was distilled off to obtain 13.17 g of p-hydroxystyrene (compound represented by formula (1) shown below, 54% by mass ethyl acetate solution). 8.89 g of 54% by mass ethyl acetate solution of p-hydroxystyrene (1) obtained (containing 4.8 g of p-hydroxystyrene (1)), 11.9 g of a compound represented by formula (2) shown below (produced by KNC Laboratories Co., Ltd.), 2.2 g of a compound represented by formula (3) shown below (produced by Daicel Corp.) and 2.3 g of a polymerization initiator (V-601 produced by Wako Pure Chemical Industries, Ltd.) were dissolved in 14.2 g of propylene glycol monomethyl ether (PGME) to prepare a solution. Into a reaction vessel was put 3.6 g of PGME, and under nitrogen gas atmosphere at 85° C. the solution prepared above was added dropwise over a period of 4 hours. The reaction solution was stirred by heating for 2 hours and then allowed to cool to room temperature. The resulting reaction solution was dropwise added to 889 g of a mixed solution of hexane/ethyl acetate (8/2 (mass ratio)) to reprecipitate. The precipitate was collected by filtration to obtain 15.0 g of Resin (P-2).

[Chem. 119]

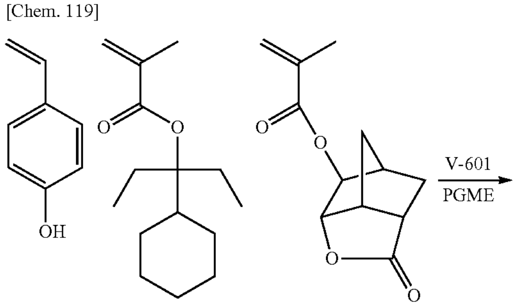

(1) (2) (3)

Resins P-3 to P-14 were synthesized using the same method as in Synthesis Examples 1 and 2.

The polymer structure, weight average molecular weight (Mw) and polydispersity (Mw/Mn) of each of Resins P-1 to P-14 are shown below. Also, the composition ratio of respective repeating units in the polymer structure shown below is indicated by a molar ratio.

[Chem. 120]

P-1

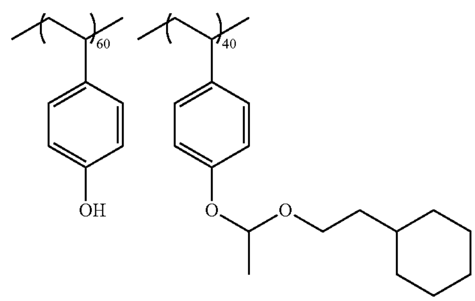

Mw: 4800
Mw/Mn: 1.20

P-2

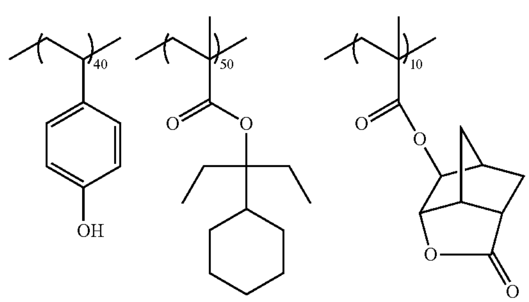

Mw: 13400
Mw/Mn: 1.57

-continued
P-3
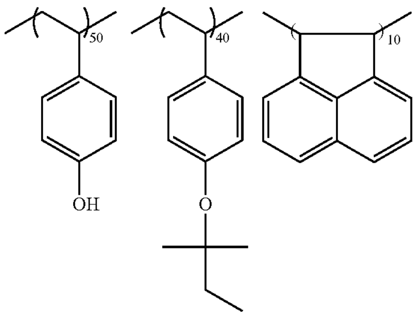
Mw: 13500
Mw/Mn: 1.61
P-4
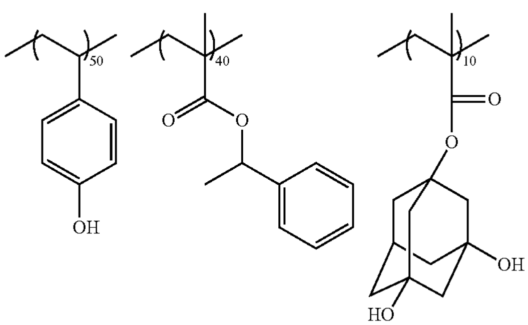
Mw: 15400
Mw/Mn: 1.72
[Chem. 121]
P-5
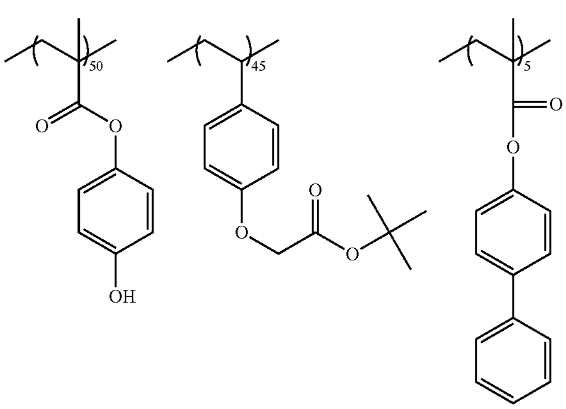
Mw: 10500
Mw/Mn: 1.81
-continued
P-6
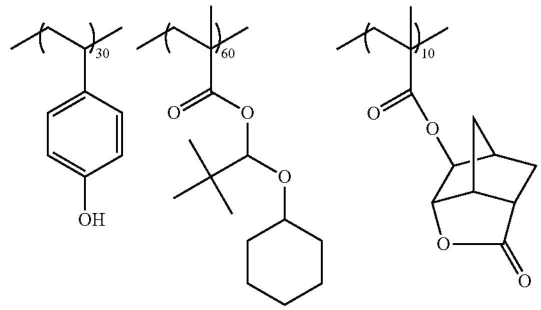
Mw: 13000
Mw/Mn: 1.47
P-7
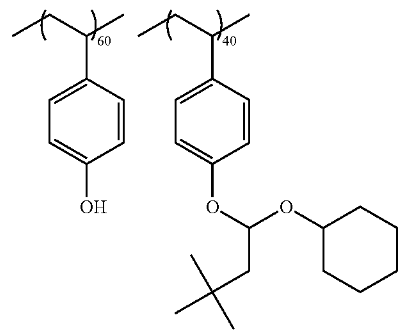
Mw: 4800
Mw/Mn: 1.18
P-8
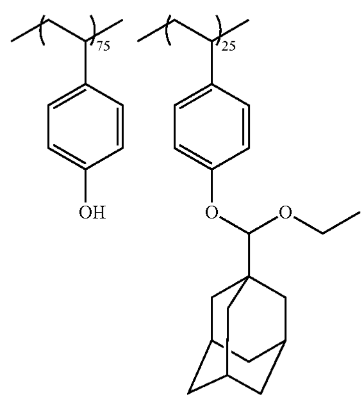
Mw: 9500
Mw/Mn: 1.21
[Chem. 122]
P-9
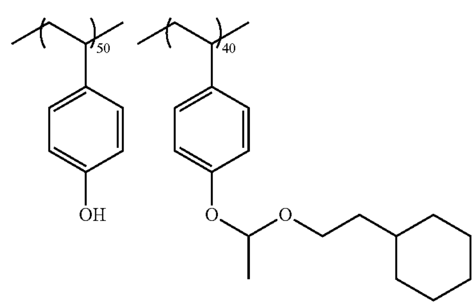

-continued
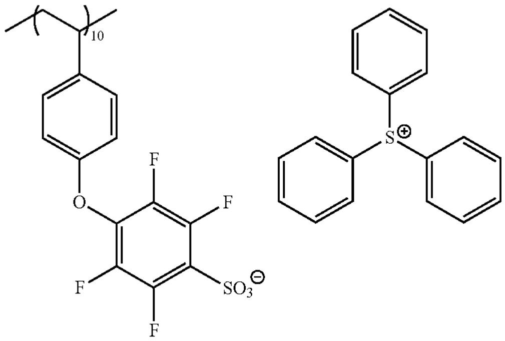
Mw: 12200
Mw/Mn: 1.79
P-10
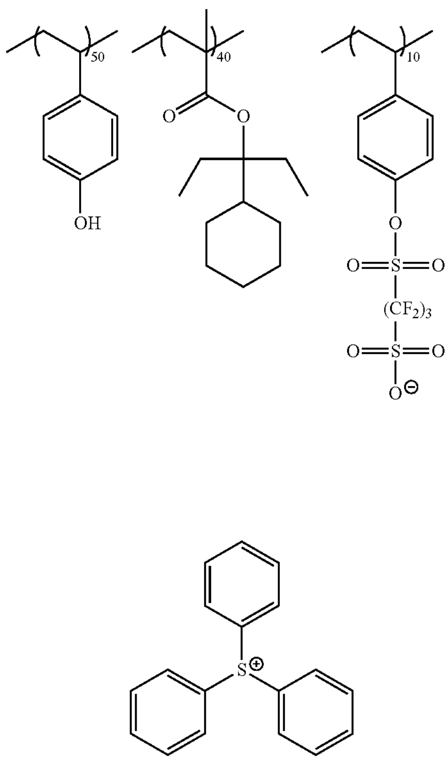
Mw: 12200
Mw/Mn: 1.74
P-11
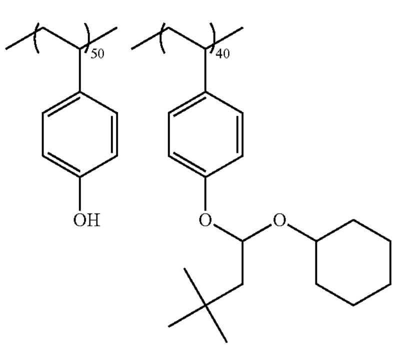
-continued
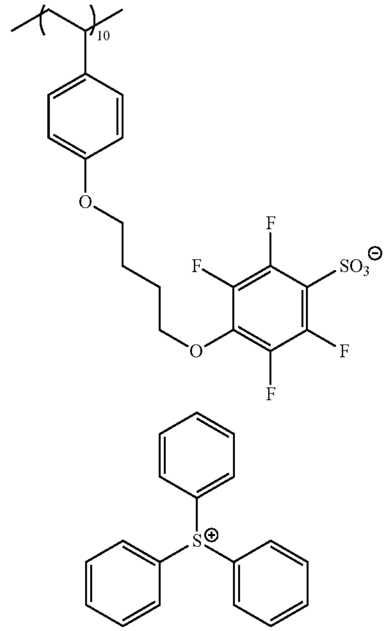
Mw: 10200
Mw/Mn: 1.21
P-12
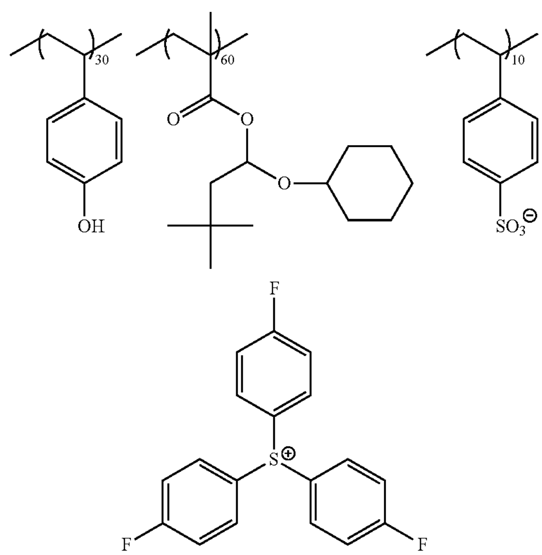
Mw: 13000
Mw/Mn: 1.82
P-13
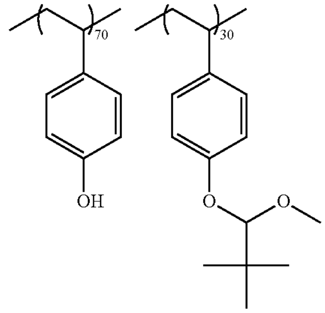
Mw: 4600
Mw/Mn: 1.18

-continued

P-14

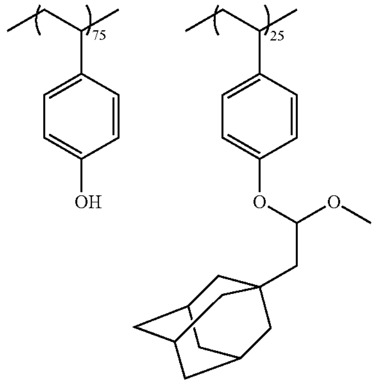

Mw: 6700
Mw/Mn: 1.18

Synthesis Example 3: Synthesis of Resin T-4 for Top Coat

The synthesis was performed according to the scheme shown below.

[Chem. 123]

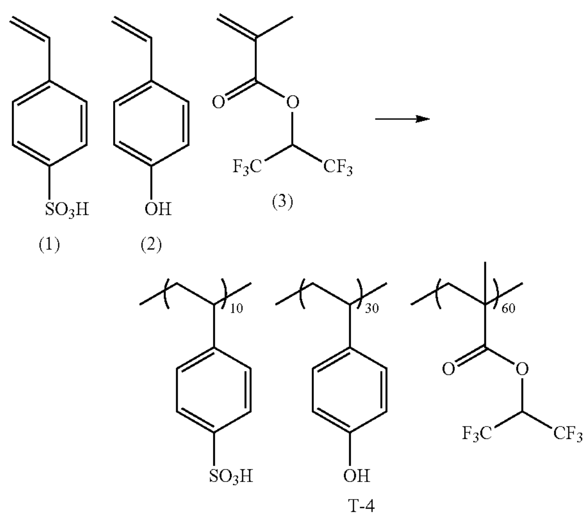

32.5 g of 1-methoxy-2-propanol was heated to 80° C. under nitrogen stream. To the solution was added dropwise a mixed solution containing 1.53 g of Monomer (1), 3.00 g of Monomer (2), 11.81 g of Monomer (3), 32.5 g of 1-methoxy-2-propanol and 1.61 g of dimethyl 2,2'-azobis (isobutyrate) (V-601 produced by Wako Pure Chemical Industries, Ltd.) with stirring over a period of 2 hours. After the completion of the dropwise addition, the mixture was further stirred at 80° C. for 4 hours. After allowing to cool, the reaction solution was reprecipitated with a large volume of hexane, and the precipitate was subjected to vacuum drying to obtain 20.5 g of Resin T-4 for top coat.

Resins T-1, T-2, T-3, T-7, T-10, T-13, T-14, T-16, T-17, T-18, T-21, T-23 and T-25 were synthesized in the same manner as for Resin T-4. The polymer structures of the resins synthesized are same as those shown above as the specific examples of Resin (T).

The weight average molecular weight (Mw) and polydispersity (Mw/Mn) of each resin synthesized as described above and used in the example described below are shown in the table below.

TABLE 1

| | Weight Average Molecular Weight | Polydispersity |
|---|---|---|
| T-1 | 15500 | 1.45 |
| T-2 | 14000 | 1.68 |
| T-3 | 16000 | 1.50 |
| T-4 | 13000 | 1.45 |
| T-7 | 18000 | 1.40 |
| T-10 | 12000 | 1.52 |
| T-13 | 11500 | 1.54 |
| T-14 | 11000 | 1.48 |
| T-16 | 13500 | 1.43 |
| T-17 | 14000 | 1.55 |
| T-18 | 20000 | 1.75 |
| T-21 | 14000 | 1.76 |
| T-23 | 8000 | 1.49 |
| T-25 | 13000 | 1.65 |

As the top coat resins for the comparative examples, Resins RT-1 and RT-2 shown below were used.

RT-1: Poly(N-vinylpyrrolidone) (Luviskol K90 produced by BASF Japan Ltd.)

RT-2: Vinyl alcohol/vinyl acetate (60/40) copolymer (SMR-8M produced by Shin-Etsu Chemical Co., Ltd.)

[Photo-Acid Generator]

The photo-acid generator was used by appropriately selecting from Photo-acid Generators z1 to z141 set forth above.

[Basic Compound]

As the basic compound, any of Compounds (N-1) to (N-11) shown below was used.

[Chem. 124]

N-1

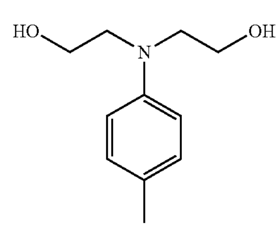

N-2

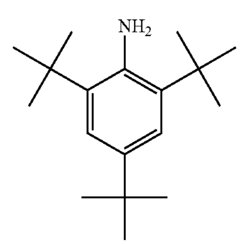

N-3

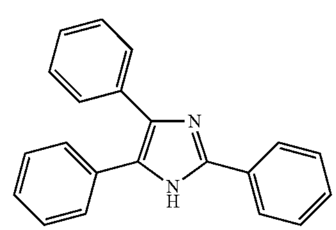

-continued

N-4

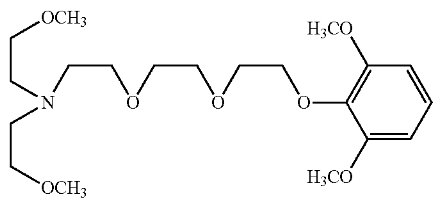

N-5

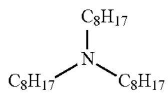

N-6

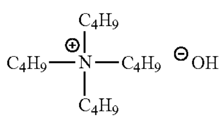

N-7

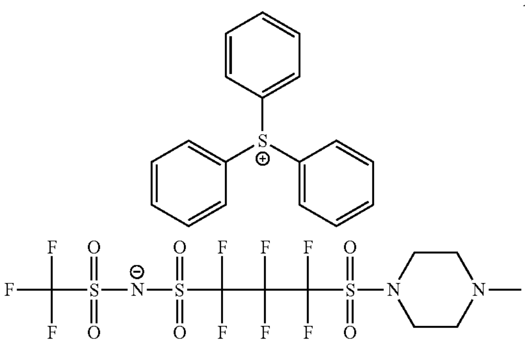

[Chem. 125]

N-8

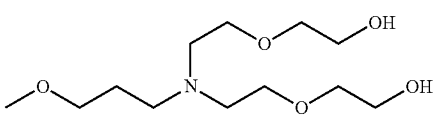

N-9

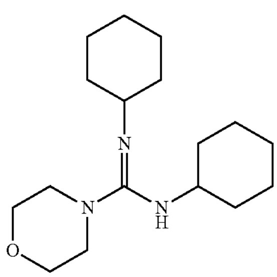

N-10

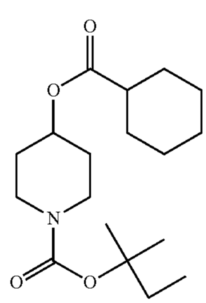

-continued

N-11

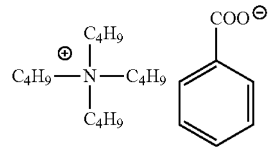

Compound (N-7) described above falls into the compound (PA) described above, and it was synthesized based on the description in paragraph 0354 of JP-A-2006-330098.

[Surfactant]

As the surfactant, W-1 to W-4 shown below were used.

W-1: Megafac R08 (produced by DIC Corp., fluorine- and silicon-containing)

W-2: Polysiloxane Polymer KP-341 (produced by Shin-Etsu Chemical Co., Ltd.; silicon-containing)

W-3: Troysol S-366 (produced by Troy Corp; fluorine-containing)

W-4: PF6320 (produced by OMNOVA Solutions Inc.; fluorine-containing)

[Coating Solvent]

As the coating solvent, those shown below were used.

S1: Propylene glycol monomethyl ether acetate (PGMEA)

S2: Propylene glycol monomethyl ether (PGME)

S-3: Ethyl lactate

S-4: Cyclohexanone

Examples 101 to 119 and Comparative Examples 101 to 107 (Electron Beam (EB) Exposure (Alkali Development, Positive))

(1) Preparation of Top Coat Composition

The resin for top coat shown in the table below was dissolved in methanol, water or a mixed solvent thereof, and the solution was filtered through a polytetrafluoroethylene filter having a pour size of 0.1 μm to prepare a top coat composition having a solid content concentration of 1% by mass.

(2) Preparation and Coating of Coating Solution of Electron Beam-Sensitive or Extreme Ultraviolet Radiation-Sensitive Resin Composition A coating solution composition having the composition shown in the table below and having a solid content concentration of 3% by mass was microfiltered through a membrane filter having a pore size of 0.1 μm to obtain an electron beam-sensitive or extreme ultraviolet radiation-sensitive resin composition (resist composition) solution.

The electron beam-sensitive or extreme ultraviolet radiation-sensitive resin composition was coated on a 6-inch Si wafer previously subjected to a hexamethyldisilazane (HMDS) treatment, by using a spin coater (Mark 8 produced by Tokyo Electron Ltd.) and dried on a hot plate at 100° C. for 60 seconds to obtain a resist film having a film thickness of 100 nm.

The top coat composition prepared above was uniformly coated on the resist film by a spin coater and dried by heating on a hot plate at 120° C. for 90 seconds, thereby forming a layer having a layer thickness of 140 nm as the total film thickness of the resist film and the top coat layer.

(3) EB Exposure and Development

The wafer having the resist film with the top coat layer coated thereon obtained in (2) above was patternwise irradiated by using an electron beam lithography apparatus (HL750 produced by Hitachi, Ltd., accelerating voltage: 50

KeV). In this case, the lithography was performed to form a 1:1 line-and-space pattern. After the electron beam lithography, the wafer was heated on a hot plate at 110° C. for 60 seconds, then immersed in a 2.38% by mass aqueous solution of tetramethylammonium hydroxide (TMAH) for 60 seconds, rinsed with water for 30 seconds, and dried to form a resist pattern of a 1:1 line-and-space pattern having a line width of 60 nm.

(4) Evaluation of Resist Pattern

Using a scanning electron microscope (S-9220 produced by Hitachi Ltd.), the resist pattern obtained was evaluated for sensitivity, resolution, LWR and pattern profile according to the methods described below.

(4-1) Sensitivity

The irradiation energy for resolving a pattern of line/space=1:1 having a line width of 60 nm was taken as the sensitivity (Eop). The smaller value indicates the higher performance.

(4-2) Resolution

The limiting resolution (the minimum line width capable of separation-resolving the line and space) of a line and space pattern (line/pace=1:1) in the Eop described above was determined and the value was taken as the resolution (nm). The smaller value indicates the higher performance.

(4-3) LWR

As to LWR, the line width was measured at arbitrary 50 points in the longitudinal direction 0.5 μm of the resist pattern of line/pace=1:1, the standard deviation thereof was found and 3σ was computed. The smaller value indicates the higher performance.

(4-4) Pattern Profile Evaluation

The cross-sectional profile of the 1:1 line-and-space pattern having a line width of 60 nm at the irradiation dose providing the sensitivity described above was observed using a scanning electron microscope (S-4300 produced by Hitachi Ltd.) and evaluated on a scale of three grades of rectangular, tapered and reverse tapered.

The evaluation results are shown in the table below.

TABLE 2

Evaluation result by EB exposure (alkali development, positive)

| | Resin (A) | Concentration | Acid Generator | Concentration | Basic Compound | Concentration | Solvent (C) | Mass Ratio | Surfactant | Concentration |
|---|---|---|---|---|---|---|---|---|---|---|
| Example 101 | P-1 | 66.95 | z113 | 30 | N-11 | 3 | S1/S2 | 40/60 | W-1 | 0.05 |
| Example 102 | P-1 | 66.95 | z128 | 30 | N-6 | 3 | S1/S2 | 40/60 | W-2 | 0.05 |
| Example 103 | P-2 | 56.95 | z132 | 40 | N-11 | 3 | S1/S2 | 40/60 | W-1 | 0.05 |
| Example 104 | P-3 | 76.95 | z1 | 20 | N-8 | 3 | S1/S3 | 40/60 | W-1 | 0.05 |
| Example 105 | P-4 | 71.95 | z115 | 25 | N-10 | 3 | S1/S2 | 40/60 | W-2 | 0.05 |
| Example 106 | P-5 | 83.00 | z108 | 15 | N-9 | 2 | S1/S2/S3 | 30/60/10 | None | — |
| Example 107 | P-6 | 66.95 | z134 | 30 | N-11 | 3 | S1/S2 | 40/60 | W-1 | 0.05 |
| Example 108 | P-6 | 66.95 | z135 | 30 | N-11 | 3 | S1/S2 | 40/60 | W-4 | 0.05 |
| Example 109 | P-7 | 66.95 | z113 | 30 | N-11 | 3 | S1/S2 | 40/60 | W-1 | 0.05 |
| Example 110 | P-7 | 64.95 | z113/z4 = 1:1 (mass ratio) | 30 | N-7 | 5 | S1/S4 | 40/60 | W-1 | 0.05 |
| Example 111 | P-8 | 75.95 | z99 | 20 | N-3 | 4 | S1/S2 | 40/60 | W-2 | 0.05 |
| Example 112 | P-8 | 61.95 | z134 | 35 | N-6 | 3 | S1/S2 | 40/60 | W-1/W-2 (1/1) (mass ratio) | 0.05 |
| Example 113 | P-9 | 96.95 | None | — | N-4 | 3 | S1/S2 | 40/60 | W-3 | 0.05 |
| Example 114 | P-10 | 96.95 | None | — | N-1 | 3 | S1/S2 | 40/60 | W-1 | 0.05 |
| Example 115 | P-11 | 96.95 | None | — | N-2 | 3 | S1/S2 | 40/60 | W-1 | 0.05 |
| Example 116 | P-12 | 96.95 | None | — | N-3 | 3 | S1/S2 | 40/60 | W-1 | 0.05 |
| Example 117 | P-13 | 66.95 | z113 | 30 | N-11 | 3 | S1/S4 | 40/60 | W-1 | 0.05 |
| Example 118 | P-13 | 56.95 | z132 | 40 | N-6 | 3 | S1/S4 | 40/60 | W-1 | 0.05 |
| Example 119 | P-14/P-7 = 1:1 (mass ratio) | 66.95 | z99 | 30 | N-5 | 3 | S1/S2 | 40/60 | W-1 | 0.05 |
| Comparative Example 101 | P-1 | 66.95 | z113 | 30 | N-11 | 3 | S1/S2 | 40/60 | W-1 | 0.05 |
| Comparative Example 102 | P-1 | 66.95 | z113 | 30 | N-11 | 3 | S1/S2 | 40/60 | W-1 | 0.05 |
| Comparative Example 103 | P-1 | 66.95 | z113 | 30 | N-11 | 3 | S1/S2 | 40/60 | W-1 | 0.05 |
| Comparative Example 104 | P-6 | 66.95 | z134 | 30 | N-11 | 3 | S1/S2 | 40/60 | W-1 | 0.05 |
| Comparative Example 105 | P-6 | 66.95 | z134 | 30 | N-11 | 3 | S1/S2 | 40/60 | W-1 | 0.05 |
| Comparative Example 106 | P-9 | 96.95 | None | — | N-4 | 3 | S1/S2 | 40/60 | W-1 | 0.05 |
| Comparative Example 107 | P-9 | 96.95 | None | — | N-4 | 3 | S1/S2 | 40/60 | W-1 | 0.05 |

| | Top Coat Polymer | Sensitivity ($\mu C/cm^2$) | Resolution (nm) | LWR (nm) | Pattern Profile |
|---|---|---|---|---|---|
| Example 101 | T-2 | 27.0 | 40 | 3.8 | Rectangular |
| Example 102 | T-4 | 27.5 | 40 | 3.8 | Rectangular |
| Example 103 | T-14 | 28.0 | 40 | 3.9 | Rectangular |
| Example 104 | T-21 | 30.0 | 45 | 4.3 | Rectangular |
| Example 105 | T-16 | 29.5 | 45 | 4.1 | Rectangular |
| Example 106 | T-23 | 30.0 | 45 | 4.2 | Rectangular |
| Example 107 | T-4 | 27.0 | 40 | 3.8 | Rectangular |

TABLE 2-continued

| Evaluation result by EB exposure (alkali development, positive) | | | | | |
|---|---|---|---|---|---|
| Example 108 | T-14 | 28.0 | 40 | 3.9 | Rectangular |
| Example 109 | T-10/T-13 = 1:1 (mass ratio) | 27.0 | 40 | 3.8 | Rectangular |
| Example 110 | T-1 | 28.5 | 40 | 3.9 | Rectangular |
| Example 111 | T-17 | 28.0 | 40 | 3.9 | Rectangular |
| Example 112 | T-2 | 27.0 | 40 | 3.8 | Rectangular |
| Example 113 | T-10 | 28.0 | 40 | 3.9 | Rectangular |
| Example 114 | T-7 | 29.5 | 45 | 4.1 | Rectangular |
| Example 115 | T-4 | 28.0 | 40 | 3.9 | Rectangular |
| Example 116 | T-25/T-18 = 1:1 (mass ratio) | 29.0 | 45 | 4.0 | Rectangular |
| Example 117 | T-2 | 27.5 | 40 | 3.7 | Rectangular |
| Example 118 | T-4 | 27.0 | 40 | 3.8 | Rectangular |
| Example 119 | T-3 | 29.5 | 45 | 4.1 | Rectangular |
| Comparative Example 101 | None | 32.0 | 50 | 4.4 | Reverse Tapered |
| Comparative Example 102 | RT-1 | 32.5 | 55 | 4.5 | Reverse Tapered |
| Comparative Example 103 | RT-2 | 33.0 | 55 | 4.6 | Reverse Tapered |
| Comparative Example 104 | None | 33.5 | 55 | 4.6 | Reverse Tapered |
| Comparative Example 105 | RT-1 | 34.0 | 60 | 4.7 | Reverse Tapered |
| Comparative Example 106 | None | 31.0 | 55 | 4.5 | Reverse Tapered |
| Comparative Example 107 | RT-2 | 32.0 | 60 | 4.5 | Reverse Tapered |

The concentration of each component represents concentration (% by mass) based on the total solid concentration.

As is apparent from the results shown in the table above, in Comparative Examples 101, 104 and 106 in which the top coat layer is not used and Comparative Examples 102, 103, 105 and 107 in which the resin of the top coat layer does not contain a repeating unit satisfying any one of formulae (I-1) to (I-5), the sensitivity, resolution and LWR are poor and the pattern profile is reverse tapered.

On the other hand, it can be understood that in Examples 101 to 109 using the top coat layer containing the resin containing a repeating unit satisfying any one of formulae (I-1) to (I-5), the sensitivity, resolution and LWR are excellent and the pattern profile is rectangular.

It is assumed that the reason for the excellent sensitivity is because the solubility in developer is increased by incorporating the resin containing a repeating unit satisfying any one of formulae (I-1) to (I-5) into the top coat layer.

Also, it is assumed that the reason for the excellent resolution and LWR is because the formation of T-top (reverse tapered) profile is suppressed and collapse of pattern or bridge is suppressed by incorporating the resin containing a repeating unit satisfying any one of formulae (I-1) to (I-5) into the top coat layer. It is also assumed that by using a resin having a small surface active energy as the resin (A), the capillary force between the patterns is small, thereby suppressing the collapse of pattern.

Also, it is assumed that the reason for obtaining the rectangular pattern profile is because the solubility in developer is increased and the formation of reverse tapered profile is suppressed by incorporating the resin containing a repeating unit satisfying any one of formulae (I-1) to (I-5) into the top coat layer.

Further, from the comparison between the examples, the tendency can be seen that the top coat layer resin containing a repeating unit satisfying formula (I-1) or (I-2) is more excellent in the sensitivity, resolution and LWR than the top coat layer resin containing a repeating unit satisfying formula (I-3) and the top coat layer resin containing a repeating unit satisfying formula (I-1) is particularly excellent in the sensitivity, resolution and LWR than the top coat layer resin containing a repeating unit satisfying formula (I-2).

Moreover, from the comparison between Example 101 and Example 110, the tendency can be seen that the sensitivity and LWR are improved by incorporating a repeating unit having an aromatic ring into the top coat layer resin.

Furthermore, it can be understood that Examples 101 to 103 and 105 to 119 wherein the acid generator is a compound capable of generating an acid having a size of 240 $Å^3$ or more are more excellent in the LWR.

Examples 201 to 219 and Comparative Examples 201 to 207 (EUV Exposure (Alkali Development, Positive))

(1) Preparation of Top Coat Composition

The resin for top coat shown in the table below was dissolved in methanol, water or a mixed solvent thereof, and the solution was filtered through a polytetrafluoroethylene filter having a pour size of 0.1 μm to prepare a top coat composition having a solid content concentration of 1% by mass.

(2) Preparation and Coating of Coating Solution of Electron Beam-Sensitive or Extreme Ultraviolet Radiation-Sensitive Resin Composition A coating solution composition having the composition shown in the table below and having a solid content concentration of 3% by mass was microfiltered through a membrane filter having a pore size of 0.1 μm to obtain an electron beam-sensitive or extreme ultraviolet radiation-sensitive resin composition (resist composition) solution.

The electron beam-sensitive or extreme ultraviolet radiation-sensitive resin composition was coated on a 6-inch Si wafer previously subjected to a hexamethyldisilazane (HMDS) treatment, by using a spin coater (Mark 8 produced by Tokyo Electron Ltd.) and dried on a hot plate at 100° C. for 60 seconds to obtain a resist film having a film thickness of 50 nm.

The top coat composition prepared above was uniformly coated on the resist film by a spin coater and dried by heating on a hot plate at 120° C. for 90 seconds, thereby forming a layer having a layer thickness of 90 nm as the total film thickness of the resist film and the top coat layer.

(3) EUV Exposure and Development

The wafer having the resist film with the top coat layer coated thereon obtained in (2) above was patternwise exposed through an exposure mask (line/space=1/1) by using an EUV exposure apparatus (Micro Exposure Tool produced by Exitech Ltd., NA: 0.3, Quadrupole, outer sigma: 0.68, inner sigma: 0.36). After the irradiation, the wafer was heated on a hot plate at 110° C. for 60 seconds, then immersed in a 2.38% by mass aqueous solution of tetramethylammonium hydroxide (TMAH) for 60 seconds, rinsed with water for 30 seconds, and dried to form a resist pattern of a 1:1 line-and-space pattern having a line width of 30 nm.

(4) Evaluation of Resist Pattern

Using a scanning electron microscope (S-9220 produced by Hitachi Ltd.), the resist pattern obtained was evaluated for sensitivity, resolution, LWR and pattern profile according to the methods described below.

(4-1) Sensitivity

The irradiation energy for resolving a pattern of line/space=1:1 having a line width of 30 nm was taken as the sensitivity (Eop). The smaller value indicates the higher performance.

(4-2) Resolution

The limiting resolution (the minimum line width capable of separation-resolving the line and space) of a line and space pattern (line/pace=1:1) in the Eop described above was determined and the value was taken as the resolution (nm). The smaller value indicates the higher performance.

(4-3) LWR

As to LWR, the line width was measured at arbitrary 50 points in the longitudinal direction 0.5 μm of the resist pattern of line/pace=1:1, the standard deviation thereof was found and 3σ was computed. The smaller value indicates the higher performance.

(4-4) Pattern Profile Evaluation

The cross-sectional profile of the 1:1 line-and-space pattern having a line width of 30 nm at the irradiation dose providing the sensitivity described above was observed using a scanning electron microscope (S-4300 produced by Hitachi Ltd.) and evaluated on a scale of three grades of rectangular, tapered and reverse tapered.

The evaluation results are shown in the table below.

TABLE 3

Evaluation result by EUV exposure (alkali development, positive)

| | Resin | Concentration | Acid Generator | Concentration | Basic Compound | Concentration | Solvent (C) | Mass Ratio | Surfactant | Concentration |
|---|---|---|---|---|---|---|---|---|---|---|
| Example 201 | P-1 | 66.95 | z113 | 30 | N-11 | 3 | S1/S2 | 40/60 | W-1 | 0.05 |
| Example 202 | P-1 | 66.95 | z128 | 30 | N-6 | 3 | S1/S2 | 40/60 | W-2 | 0.05 |
| Example 203 | P-2 | 56.95 | z132 | 40 | N-11 | 3 | S1/S2 | 40/60 | W-1 | 0.05 |
| Example 204 | P-3 | 76.95 | z1 | 20 | N-8 | 3 | S1/S3 | 40/60 | W-1 | 0.05 |
| Example 205 | P-4 | 71.95 | z115 | 25 | N-10 | 3 | S1/S2 | 40/60 | W-2 | 0.05 |
| Example 206 | P-5 | 83.00 | z108 | 15 | N-9 | 2 | S1/S2/S3 | 30/60/10 | None | — |
| Example 207 | P-6 | 66.95 | z134 | 30 | N-11 | 3 | S1/S2 | 40/60 | W-1 | 0.05 |
| Example 208 | P-6 | 66.95 | z135 | 30 | N-11 | 3 | S1/S2 | 40/60 | W-4 | 0.05 |
| Example 209 | P-7 | 66.95 | z113 | 30 | N-11 | 3 | S1/S2 | 40/60 | W-1 | 0.05 |
| Example 210 | P-7 | 64.95 | z113/z4 = 1:1 (mass ratio) | 30 | N-7 | 5 | S1/S4 | 40/60 | W-1 | 0.05 |
| Example 211 | P-8 | 75.95 | z99 | 20 | N-3 | 4 | S1/S2 | 40/60 | W-2 | 0.05 |
| Example 212 | P-8 | 61.95 | z134 | 35 | N-6 | 3 | S1/S2 | 40/60 | W-1/W-2 (1/1) (mass ratio) | 0.05 |
| Example 213 | P-9 | 96.95 | None | — | N-4 | 3 | S1/S2 | 40/60 | W-3 | 0.05 |
| Example 214 | P-10 | 96.95 | None | — | N-1 | 3 | S1/S2 | 40/60 | W-1 | 0.05 |
| Example 215 | P-11 | 96.95 | None | — | N-2 | 3 | S1/S2 | 40/60 | W-1 | 0.05 |
| Example 216 | P-12 | 96.95 | None | — | N-3 | 3 | S1/S2 | 40/60 | W-1 | 0.05 |
| Example 217 | P-13 | 66.95 | z113 | 30 | N-11 | 3 | S1/S4 | 40/60 | W-1 | 0.05 |
| Example 218 | P-13 | 56.95 | z132 | 40 | N-6 | 3 | S1/S4 | 40/60 | W-1 | 0.05 |
| Example 219 | P-14/P-7 = 1:1 (mass ratio) | 66.95 | z99 | 30 | N-5 | 3 | S1/S2 | 40/60 | W-1 | 0.05 |
| Comparative Example 201 | P-1 | 66.95 | z113 | 30 | N-11 | 3 | S1/S2 | 40/60 | W-1 | 0.05 |
| Comparative Example 202 | P-1 | 66.95 | z113 | 30 | N-11 | 3 | S1/S2 | 40/60 | W-1 | 0.05 |
| Comparative Example 203 | P-1 | 66.95 | z113 | 30 | N-11 | 3 | S1/S2 | 40/60 | W-1 | 0.05 |
| Comparative Example 204 | P-6 | 66.95 | z134 | 30 | N-11 | 3 | S1/S2 | 40/60 | W-1 | 0.05 |
| Comparative Example 205 | P-6 | 66.95 | z134 | 30 | N-11 | 3 | S1/S2 | 40/60 | W-1 | 0.05 |
| Comparative Example 206 | P-9 | 96.95 | None | — | N-4 | 3 | S1/S2 | 40/60 | W-1 | 0.05 |
| Comparative Example 207 | P-9 | 96.95 | None | — | N-4 | 3 | S1/S2 | 40/60 | W-1 | 0.05 |

TABLE 3-continued

| Evaluation result by EUV exposure (alkali development, positive) | | | | | |
|---|---|---|---|---|---|
| | Top Coat Polymer | Sensitivity (mJ/cm$^2$) | Resolution (nm) | LWR (nm) | Pattern Profile |
| Example 201 | T-2 | 20.0 | 24 | 4.0 | Rectangular |
| Example 202 | T-4 | 21.0 | 24 | 4.1 | Rectangular |
| Example 203 | T-14 | 22.0 | 25 | 4.2 | Rectangular |
| Example 204 | T-21 | 25.5 | 27 | 4.6 | Rectangular |
| Example 205 | T-16 | 24.0 | 26 | 4.4 | Rectangular |
| Example 206 | T-23 | 26.0 | 27 | 4.5 | Rectangular |
| Example 207 | T-4 | 21.0 | 24 | 4.1 | Rectangular |
| Example 208 | T-14 | 21.5 | 25 | 4.2 | Rectangular |
| Example 209 | T-10/T-13 = 1:1 (mass ratio) | 19.0 | 23 | 4.0 | Rectangular |
| Example 210 | T-1 | 22.5 | 25 | 4.3 | Rectangular |
| Example 211 | T-17 | 20.0 | 24 | 4.2 | Rectangular |
| Example 212 | T-2 | 19.0 | 23 | 4.1 | Rectangular |
| Example 213 | T-10 | 22.0 | 14 | 4.2 | Rectangular |
| Example 214 | T-7 | 23.5 | 26 | 4.4 | Rectangular |
| Example 215 | T-4 | 22.0 | 24 | 4.2 | Rectangular |
| Example 216 | T-25/T-18 = 1:1 (mass ratio) | 23.0 | 25 | 4.3 | Rectangular |
| Example 217 | T-2 | 19.0 | 22 | 3.9 | Rectangular |
| Example 218 | T-4 | 20.0 | 22 | 4.0 | Rectangular |
| Example 219 | T-3 | 23.5 | 26 | 4.4 | Rectangular |
| Comparative Example 201 | None | 27.0 | 28 | 4.7 | Reverse Tapered |
| Comparative Example 202 | RT-1 | 29.0 | 30 | 4.8 | Reverse Tapered |
| Comparative Example 203 | RT-2 | 28.0 | 30 | 4.8 | Reverse Tapered |
| Comparative Example 204 | None | 29.0 | 30 | 4.9 | Reverse Tapered |
| Comparative Example 205 | RT-1 | 30.0 | 32 | 5.0 | Reverse Tapered |
| Comparative Example 206 | None | 26.0 | 28 | 4.8 | Reverse Tapered |
| Comparative Example 207 | RT-2 | 28.0 | 30 | 4.8 | Reverse Tapered |

The concentration of each component represents concentration (% by mass) based on the total solid concentration.

As is apparent from the results shown in the table above, in Comparative Examples 201, 204 and 206 in which the top coat layer is not used and Comparative Examples 202, 203, 205 and 207 in which the resin of the top coat layer does not contain a repeating unit satisfying any one of formulae (I-1) to (I-5), the sensitivity, resolution and LWR are poor and the pattern profile is T-top (reverse tapered).

On the other hand, it can be understood that in Examples 201 to 209 using the top coat layer containing the resin containing a repeating unit satisfying any one of formulae (I-1) to (I-5), the sensitivity, resolution and LWR are excellent and the pattern profile is rectangular.

It is assumed that the reason for the excellent sensitivity is because the solubility in developer is increased by incorporating the resin containing a repeating unit satisfying any one of formulae (I-1) to (I-5) into the top coat layer.

Also, it is assumed that the reason for the excellent resolution and LWR is because the formation of reverse tapered profile is suppressed and collapse of pattern or bridge is suppressed by incorporating the resin containing a repeating unit satisfying any one of formulae (I-1) to (I-5) into the top coat layer. It is also assumed that by using a resin having a small surface active energy as the resin (A), the capillary force between the patterns is small, thereby suppressing the collapse of pattern.

Also, it is assumed that the reason for obtaining the rectangular pattern profile is because the solubility in developer is increased and the formation of reverse tapered profile is suppressed by incorporating the resin containing a repeating unit satisfying any one of formulae (I-1) to (I-5) into the top coat layer.

Further, from the comparison between the examples, the tendency can be seen that the top coat layer resin containing a repeating unit satisfying formula (I-1) or (I-2) is more excellent in the sensitivity, resolution and LWR than the top coat layer resin containing a repeating unit satisfying formula (I-3) and the top coat layer resin containing a repeating unit satisfying formula (I-1) is particularly excellent in the sensitivity, resolution and LWR than the top coat layer resin containing a repeating unit satisfying formula (I-2).

Moreover, from the comparison between Example 201 and Example 210, the tendency can be seen that the sensitivity and LWR are improved by incorporating a repeating unit having an aromatic ring into the top coat layer resin.

Furthermore, it can be understood that Examples 201 to 203 and 205 to 219 wherein the acid generator is a compound capable of generating an acid having a size of 240 Å$^3$ or more are more excellent in the LWR.

When the constitution according to the invention (a top coat layer is formed using a top coat composition containing the resin (T) containing at least any one of repeating units represented by formulae (I-1) to (I-5) on a resist film) was applied to an ArF exposure system, the significant superiority as to the sensitivity, resolution LER and pattern profile was not obtained in comparison with the system in which the constitution according to the invention was not used (system in which the top coat layer described above was not formed).

INDUSTRIAL APPLICABILITY

According to the pattern forming method, the composition kit, the resist film using the same, the method for producing an electronic device of the invention, the excellent sensitivity, resolution LWR and pattern profile can be obtained in the formation of fine pattern having a line width of 60 nm or less.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 15, 2013 (Japanese Patent Application No. 2013-53055), and the contents thereof are incorporated herein by reference.

The invention claimed is:

1. A pattern forming method comprising:

(a) a step of forming a film on a substrate using an electron beam-sensitive or extreme ultraviolet radiation-sensitive resin composition, (b) a step of forming a top coat layer on the film using a top coat composition containing a resin (T) containing at least any one of repeating units represented by formulae (I-1) to (I-5) shown below, and at least any one of repeating units derived from p-hydroxystyrene, phenyl acrylate and phenyl methacrylate, respectively, (c) a step of exposing the film having the top coat layer using an electron beam or an extreme ultraviolet radiation, and (d) a step of developing the film having the top coat layer after the exposure to form a pattern:

Formula (I-1)

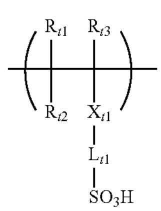

Formula (I-2)

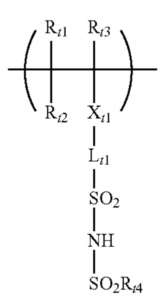

Formula (I-3)

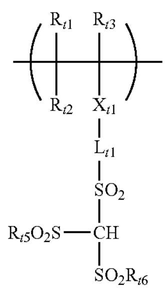

-continued

Formula (I-4)

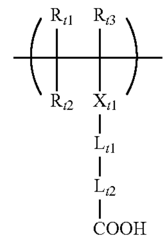

Formula (I-5)

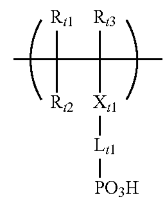

wherein in formulae (I-1) to (I-5) above, each of $R_{t1}$, $R_{t2}$ and $R_{t3}$ independently represents a hydrogen atom, an alkyl group, a cycloalkyl group, a halogen atom, a cyano group or an alkoxycarbonyl group, provided that $R_{t2}$ may be connected to $L_{t1}$ to form a ring, each $X_{t1}$ independently represents a single bond, —COO— or CONHR$_{t7}$—, $R_{t7}$ represents a hydrogen atom or an alkyl group, each $L_{t1}$ independently represents a single bond, an alkylene group, an arylene group or a combination thereof, and may be intervened with —O— or —COO—, when $L_{t1}$ is connected to $L_{t2}$, $L_{t1}$ may be connected to $L_{t2}$ through —O—, each of $R_{t4}$, $R_{t5}$ and $R_{t6}$ independently represents an alkyl group or an aryl group, and $L_{t2}$ represents an alkylene group or arylene group having at least one electron withdrawing group.

2. The pattern forming method as claimed in claim 1, wherein the electron beam-sensitive or extreme ultraviolet radiation-sensitive resin composition contains (A) a resin capable of decomposing by an action of an acid to change dissolution rate in a developer.

3. The pattern forming method as claimed in claim 2, wherein the electron beam-sensitive or extreme ultraviolet radiation-sensitive resin composition further contains (B) a compound capable of generating an acid by an electron beam or an extreme ultraviolet radiation, and the compound (B) is a compound capable of generating an acid having a size of 240 Å$^3$ or more.

4. The pattern forming method as claimed in claim 3, wherein the compound (B) is a compound having a non-nucleophilic anion represented by formula (AN1) shown below:

(AN1)

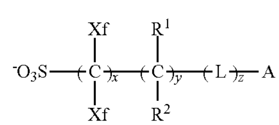

in the formula, each $X_f$ independently represents a fluorine atom or an alkyl group substituted with at least one fluorine atom, each of $R^1$ and $R^2$ independently represents a hydrogen atom, a fluorine atom or an alkyl group, when a plurality of $R^1$ and $R^2$ are present, each $R^1$ and $R^2$ may be the same as or different from every other $R^1$ and $R^2$, L represents a divalent connecting group, when a plurality of L are present, each L may be the same as or different from every other L, A represents a cyclic organic group, x represents an integer from 1 to 20, y represents an integer from 0 to 10, and z represents an integer from 0 to 10.

5. The pattern forming method as claimed in claim 2, wherein the resin (A) is a resin containing a repeating unit represented by formula (1) shown below and a repeating unit represented by formula (3) or (4) shown below:

(1)

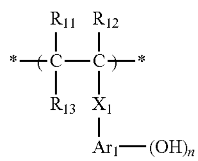

wherein in formula (1) above, each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may be connected to $Ar_1$ to form a ring and in this case $R_{13}$ represents an alkylene group, $X_1$ represents a single bond or a divalent connecting group, $Ar_1$ represents an (n+1) valent aromatic ring group, when $Ar_1$ is connected to $R_{13}$ to form a ring, $Ar_1$ represents an (n+2) valent aromatic ring group, and n represents an integer from 1 to 4:

(3)

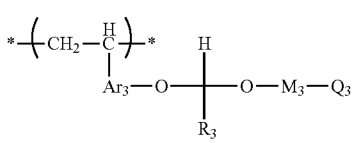

in formula (3), $Ar_3$ represents an aromatic ring group, $R_3$ represents an alkyl group, a cycloalkyl group, an aryl group, an aralkyl group, an alkoxy group, an acyl group or a heterocyclic group, $M_3$ represents a single bond or a divalent connecting group, $Q_3$ represents an alkyl group, a cycloalkyl group, an aryl group or a heterocyclic group, at least two of $Q_3$, $M_3$ and $R_3$ may be connected to form a ring:

(4)

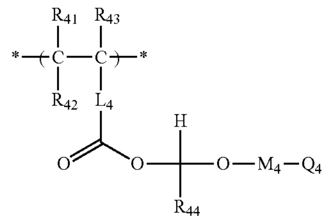

in formula (4), each of $R_{41}$, $R_{42}$ and $R_{43}$ independently represents a hydrogen atom, an alkyl group, a cycloalkyl group, a halogen atom, a cyano group or an alkoxycarbonyl group, $R_{42}$ may be connected to $L_4$ to form a ring and in this case $R_{42}$ represents an alkylene group, $L_4$ represents a single bond or a divalent connecting group, when $L_4$ is connected to $R_{42}$ to form a ring, $L_4$ represents a trivalent connecting group, $R_{44}$ represents an alkyl group, a cycloalkyl group, an aryl group, an aralkyl group, an alkoxy group, an acyl group or a heterocyclic group, $M_4$ represents a single bond or a divalent connecting group, $Q_4$ represents an alkyl group, a cycloalkyl group, an aryl group or a heterocyclic group, at least two of $Q_4$, $M_4$ and $R_{44}$ may be connected to form a ring.

6. The pattern forming method as claimed in claim 5, wherein the resin (A) is a resin containing a repeating unit represented by formula (1) shown above and a repeating unit represented by formula (3) shown above, and $R_3$ in formula (3) is a group having 2 or more carbon atoms.

7. The pattern forming method as claimed in claim 6, wherein the resin (A) is a resin containing a repeating unit represented by formula (1) shown above and a repeating unit represented by formula (3) shown above, and $R_3$ in formula (3) is a group represented by formula (3-2) shown below:

(3-2)

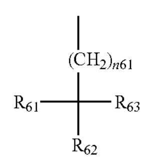

wherein in formula (3-2) above, each of $R_{61}$, $R_{62}$ and $R_{63}$ independently represents an alkyl group, an alkenyl group, a cycloalkyl group or an aryl group, n61 represents 0 or 1, at least two of $R_{61}$ to $R_{63}$ may be connected to each other to form a ring.

8. The pattern forming method as claimed in claim 1, wherein an optical image by the exposure is an optical image having a line portion having a line width of 60 nm or less or a hole portion having a hole diameter of 60 nm or less as an exposed area or an unexposed area.

9. A method for producing an electronic device containing the pattern forming method as claimed in claim 1.

10. An electronic device produced by the method for producing an electronic device as claimed in claim 9.

11. A pattern forming method comprising:

(a) a step of forming a film on a substrate using an electron beam-sensitive or extreme ultraviolet radiation-sensitive resin composition, (b) a step of forming a top coat layer on the film using a top coat composition containing a resin (T) containing at least any one of repeating units represented by formulae (I-1) to (I-3) and (I-5) shown below, (c) a step of exposing the film having the top coat layer using an electron beam or an extreme ultraviolet radiation, and (d) a step of developing the film having the top coat layer after the exposure to form a pattern:

Formula (I-1)

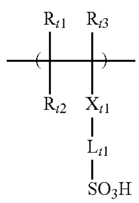

Formula (I-2)

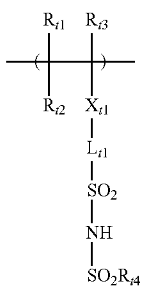

Formula (I-3)

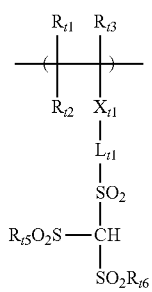

Formula (I-5)

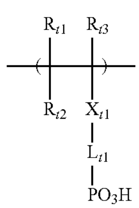

wherein in formulae (I-1) to (1-3) and (I-5) above, each of $R_{t1}$, $R_{t2}$ and $R_{t3}$ independently represents a hydrogen atom, an alkyl group, a cycloalkyl group, a halogen atom, a cyano group or an alkoxycarbonyl group, provided that $R_{t2}$ may be connected to $L_{t1}$ to form a ring, each $X_{t1}$ independently represents —COO—, each $L_{t1}$ independently represents a single bond, an alkylene group, an arylene group or a combination thereof, and may be intervened with —O— or —COO—, and each of $R_{t4}$, $R_{t5}$ and $R_{t6}$ independently represents an alkyl group or an aryl group.

12. The pattern forming method as claimed in claim 11, wherein the resin (T) contains a repeating unit having an aromatic ring.

13. The pattern forming method as claimed in claim 11, wherein the electron beam-sensitive or extreme ultraviolet radiation-sensitive resin composition contains (A) a resin capable of decomposing by an action of an acid to change dissolution rate in a developer.

14. The pattern forming method as claimed in claim 13, wherein the electron beam-sensitive or extreme ultraviolet radiation-sensitive resin composition further contains (B) a compound capable of generating an acid by an electron beam or an extreme ultraviolet radiation, and the compound (B) is a compound capable of generating an acid having a size of 240 $Å^3$ or more.

15. The pattern forming method as claimed in claim 14, wherein the compound (B) is a compound having a non-nucleophilic anion represented by formula (AN1) shown below:

(AN1)

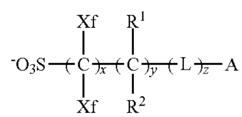

in the formula, each $X_f$ independently represents a fluorine atom or an alkyl group substituted with at least one fluorine atom, each of $R^1$ and $R^2$ independently represents a hydrogen atom, a fluorine atom or an alkyl group, when a plurality of $R^1$ and $R^2$ are present, each $R^1$ and $R^2$ may be the same as or different from every other $R^1$ and $R^2$, L represents a divalent connecting group, when a plurality of L are present, each L may be the same as or different from every other L, A represents a cyclic organic group, x represents an integer from 1 to 20, y represents an integer from 0 to 10, and z represents an integer from 0 to 10.

16. The pattern forming method as claimed in claim 13, wherein the resin (A) is a resin containing a repeating unit represented by formula (1) shown below and a repeating unit represented by formula (3) or (4) shown below:

(1)

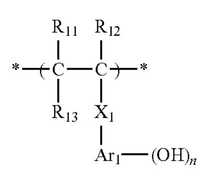

wherein in formula (1) above, each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may be connected to $Ar_1$ to form a ring and in this case $R_{13}$ represents an alkylene group, $X_1$ represents a single bond or a divalent connecting group, $Ar_1$ represents an (n+1) valent aromatic ring group, when $Ar_1$ is connected to $R_{13}$ to form a ring, $Ar_1$ represents an (n+2) valent aromatic ring group, and n represents an integer from 1 to 4:

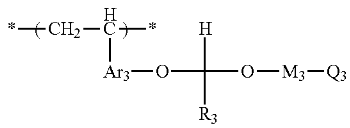

(3)

in formula (3), $Ar_3$ represents an aromatic ring group, $R_3$ represents an alkyl group, a cycloalkyl group, an aryl group, an aralkyl group, an alkoxy group, an acyl group or a heterocyclic group, $M_3$ represents a single bond or a divalent connecting group, $Q_3$ represents an alkyl group, a cycloalkyl group, an aryl group or a heterocyclic group, at least two of $Q_3$, $M_3$ and $R_3$ may be connected to form a ring:

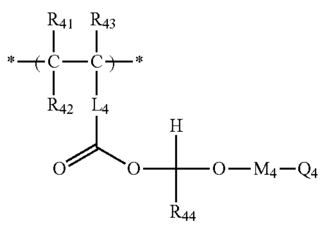

(4)

in formula (4), each of $R_{41}$, $R_{42}$ and $R_{43}$ independently represents a hydrogen atom, an alkyl group, a cycloalkyl group, a halogen atom, a cyano group or an alkoxycarbonyl group, $R_{42}$ may be connected to $L_4$ to form a ring and in this case $R_{42}$ represents an alkylene group, $L_4$ represents a single bond or a divalent connecting group, when $L_4$ is connected to $R_{42}$ to form a ring, $L_4$ represents a trivalent connecting group, $R_{44}$ represents an alkyl group, a cycloalkyl group, an aryl group, an aralkyl group, an alkoxy group, an acyl group or a heterocyclic group, $M_4$ represents a single bond or a divalent connecting group, $Q_4$ represents an alkyl group, a cycloalkyl group, an aryl group or a heterocyclic group, at least two of $Q_4$, $M_4$ and $R_{44}$ may be connected to form a ring.

17. The pattern forming method as claimed in claim 16, wherein the resin (A) is a resin containing a repeating unit represented by formula (1) shown above and a repeating unit represented by formula (3) shown above, and $R_3$ in formula (3) is a group having 2 or more carbon atoms.

18. The pattern forming method as claimed in claim 17, wherein the resin (A) is a resin containing a repeating unit represented by formula (1) shown above and a repeating unit represented by formula (3) shown above, and $R_3$ in formula (3) is a group represented by formula (3-2) shown below:

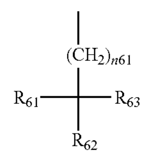

(3-2)

wherein in formula (3-2) above, each of $R_{61}$, $R_{62}$ and $R_{63}$ independently represents an alkyl group, an alkenyl group, a cycloalkyl group or an aryl group, n61 represents 0 or 1, at least two of $R_{61}$ to $R_{63}$ may be connected to each other to form a ring.

* * * * *